US011523381B2

(12) United States Patent
Cirik et al.

(10) Patent No.: US 11,523,381 B2
(45) Date of Patent: Dec. 6, 2022

(54) DOWNLINK RECEPTION AND BEAM MANAGEMENT

(71) Applicant: Comcast Cable Communications, LLC, Philadelphia, PA (US)

(72) Inventors: Ali Cirik, Herndon, VA (US); Esmael Hejazi Dinan, McLean, VA (US); Yunjung Yi, Vienna, VA (US); Hua Zhou, Herndon, VA (US); Youngwoo Kwak, Vienna, VA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 125 days.

(21) Appl. No.: 17/039,168

(22) Filed: Sep. 30, 2020

(65) Prior Publication Data
US 2021/0099981 A1 Apr. 1, 2021

Related U.S. Application Data

(60) Provisional application No. 62/908,471, filed on Sep. 30, 2019.

(51) Int. Cl.
*H04W 72/04* (2009.01)
*H03M 13/09* (2006.01)

(52) U.S. Cl.
CPC ......... *H04W 72/042* (2013.01); *H03M 13/09* (2013.01); *H04W 72/0446* (2013.01)

(58) Field of Classification Search
CPC ........... H04W 72/042; H04W 72/0446; H04W 72/1289; H03M 13/09; H04L 5/001; H04L 5/0048; H04L 5/0051; H04L 5/0055; H04L 27/2602; H04L 27/26025; H04L 5/0044; H04L 5/0053; H04L 5/0035
See application file for complete search history.

(56) References Cited

U.S. PATENT DOCUMENTS

| 10,701,696 | B2 | 6/2020 | Shi et al. |
| 2019/0254009 | A1 | 8/2019 | Hwang et al. |
| 2019/0296956 | A1 | 9/2019 | John Wilson et al. |
| 2019/0373450 | A1 | 12/2019 | Zhou et al. |
| 2020/0214084 | A1 | 7/2020 | Panteleev et al. |
| 2020/0229156 | A1* | 7/2020 | Park ...................... H04L 5/0051 |

(Continued)

FOREIGN PATENT DOCUMENTS

WO WO-2020240868 A1 * 12/2020 ............ H04W 28/04

OTHER PUBLICATIONS

3GPP TS 38.213 V15.6.0 (Jun. 2019), Technical Specification, 3rd Generation Partnership Project; Technical Specification Group Radio Access Network; NR; Physical layer procedures for control (Release 15).

(Continued)

*Primary Examiner* — Steven H Nguyen
(74) *Attorney, Agent, or Firm* — Banner & Witcoff, Ltd.

(57) ABSTRACT

Wireless communications may comprise communications between a base station and a wireless device. The base station may send and/or schedule one or more transmissions to the wireless device that may overlap in time. The wireless device may receive and/or decode overlapping transmissions that are associated with a different indication and/or the wireless device may not receive at least one of overlapping transmissions that are associated with the same indications.

20 Claims, 25 Drawing Sheets

(56) References Cited

U.S. PATENT DOCUMENTS

2021/0022167 A1* 1/2021 Khoshnevisan ....... H04B 7/022
2022/0022237 A1* 1/2022 Kim ..................... H04B 7/0408

OTHER PUBLICATIONS

3GPP TS 38.214 V15.6.0 (Jun. 2019), Technical Specification, 3rd Generation Partnership Project; Technical Specification Group Radio Access Network; NR; Physical layer procedures for data (Release 15).
3GPP TS 38.300 V15.6 0 (Jun. 2019) 3rd Generation Partnership Project; Technical Specification Group Radio Access Netwrok; NR; NR and NG-RAN Overall Description; Stage 2 (Release 15).
3GPP TS 38.321 V15.6 0 (Jun. 2019) 3rd Generation Partnership Project; Technical Specification Group Radio Access Network; NR; Medium Access Control (MAC) protocol specation (Relesae 15).
3GPP TS 38.331 V15.6.0 (Jun. 2019), Technical Specification, 3rd Generation Partnership Project; Technical Specification Group Radio Access Network; NR; Radio Resource Control (RRC) protocol specification (Release 15).
R1-190xxxx 3GPP TSG RAN WG1 Meeting #98bis, Chongqing, China, Oct. 14-18, 2019, Source: MCC Support, Title: Draft Report of 3GPP TSG RAN WG1 #98 v0.2.0 (Prague, Czech Rep, Aug. 26-30, 2019).
R4-xxxxxxx 3GPP TSG RAN WG4 Meeting #92bis, Chongqing, China, Oct. 14-18, 2019, Title: RAN4 #92 Meeting Report.
R1-19xxxxx 3GPP TSG-RAN WG1 Meeting #98bis, Chongqing, China, Oct. 14-20, 2019, Source: Nokia, Title: Introduction of NR enhanced MIMO.
R1-180xxxx 3GPP TSG RAN WG1 Meeting #92bis, Sanya, China, Apr. 16-20, 2018, Source: Ericsson, Title: Feature lead summary on beam measurement and reporting.
R1-1803817 3GPP TSG RAN WG1 Meeting #92bis, Sanya, China, Apr. 16-20, 2018, Source: vivo, Title: Remaining issues on beam measurement and reporting.
R1-1804787 3GPP TSG RAN WG1 Meeting #92bis, Sanya, China, Apr. 16-20, 2018, Source: Qualcomm Incorporated, Title: Beam management for NR.
R1-1804809 3GPP TSG RAN WG1 Meeting #92bis, Sanya, China, Apr. 16-20, 2018, Source: Qualcomm Incorporated, Title: Remaining Issues on BWP.
R1-1805952 3GPP TSG RAN WG1 Meeting #93, Busan, Korea, May 21-25, 2018, Source: Huawei, HiSilicon, Title: Remaining issues on beam management.
R1-1806044 3GPP TSG RAN WG1 Meeting #93, Busan, Korea, May 21-25, 2018, Source: vivo, Title: Remaining issues on beam measurement and reporting.
R1-1806507 3GPP TSG RAN WG1 Meeting #93, Busan, Korea, May 21-25, 2018, Source: Intel Corporation, Title: Remaining Issues on Beam Management.
R1-1807210 3GPP TSG RAN WG1 Meeting #93, Busan, Korea, May 21-25, 2018, Source: ASUSTeK, Title: Remaining issues on beam management.
R1-1807341 3GPP TSG RAN WG1 Meeting #93, Busan, Korea, May 21-25, 2018, Source: Qualcomm Incorporated, Title: Beam management for NR.
R1-1807782 3GPP TSG RAN WG1 Meeting #93, Busan, Korea, May 21-25, 2018, Source: Ericsson, Title: Feature lead summary 3 for beam measurement and reporting.
R1-1809864 3GPP TSG-RAN WG1 Meeting #94, Gothenburg, Sweden, Aug. 20-24, 2018, Source: Ericsson, Title: Feature lead summary for beam management—Thursday.
R4-1905590 3GPP TSG-RAN WG4 Meeting #91, Reno, USA, May 13-17, 2019, Source: Huawei, HiSilicon, Title: Discussion on the remaining issues on BWP switch delay.
R4-1907901 3GPP TSG-RAN WG4 Meeting #92, Ljubljana, Slovenia, Aug. 26-30, 2019, Title: RAN4 #91 Meeting report.
R4-1908181 3GPP TSG-RAN WG4 Meeting #92, Ljubljana, Slovenia, Aug. 26-30, 2019, Source: MediaTek Inc., Title: Clarifications in BWP switch requirements.
R4-1908182 3GPP TSG-RAN WG4 Meeting #92, Ljubljana, Slovenia, Aug. 26-30, 2019, Source: MediaTek Inc., Title: Clarification CR on BWP switch delay requirements (8.6).
R4-1909037 3GPP TSG-RAN WG4 Meeting #92, Ljubljana, Slovenia, Aug. 26-30, 2019, Source: Huawei, HiSilicon, Title: Discussion on the TCI state assumption after BWP switch.
R4-1909039 3GPP TSG-RAN WG4 Meeting #92, Ljubljana, Slovenia, Aug. 26-30, 2019, Source: Huawei, HiSilicon, Title: draftCR on TCI state assumption after BWP switch (section 8.6).
R4-1909506 3GPP TSG-RAN WG4 Meeting #92, Ljubljana, Slovenia, Aug. 26-30, 2019, Source: Ericsson, Title: Analysis of TCI states under BWP switching requirements.
R4-1909507 3GPP TSG-RAN WG4 Meeting #92, Ljubljana, Slovenia, Aug. 26-30, 2019, Source: Ericsson, Title: TCI states under BWP switching requirements (8.6.3).
R4-1910564 3GPP TSG-RAN WG4 Meeting #92, Ljubljana, Slovenia, Aug. 26-30, 2019, Source: MediaTek Inc, Title: Clarification CR on BWP switch delay requirements (8.6).
OPPO: "Enhancements on multi-TRP and multi-panel transmission", 3GPP Draft; RI-1906287 vol. RAN WGI, May 13, 2019.
ZTE: "On multi-PDCCH design for multi-TRP", 3GPP Draft; RI-1904019 vol. RAN WGI, Apr. 7, 2019.
Feb. 9, 2021—Extended European Search Report—EP 20199391.2.

* cited by examiner

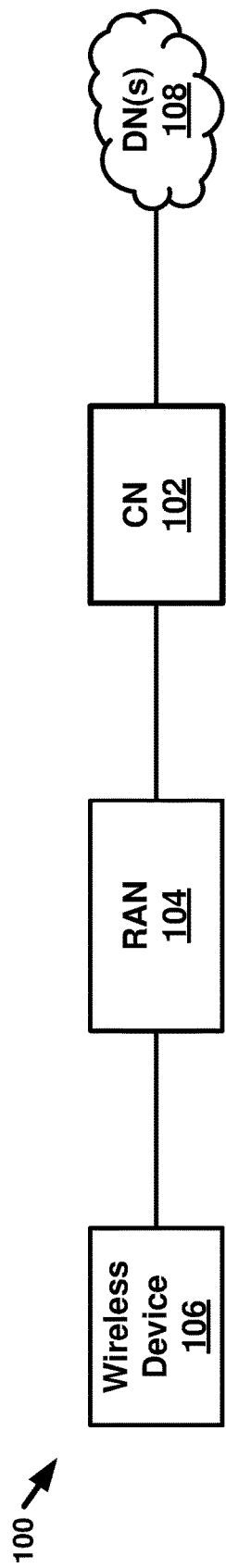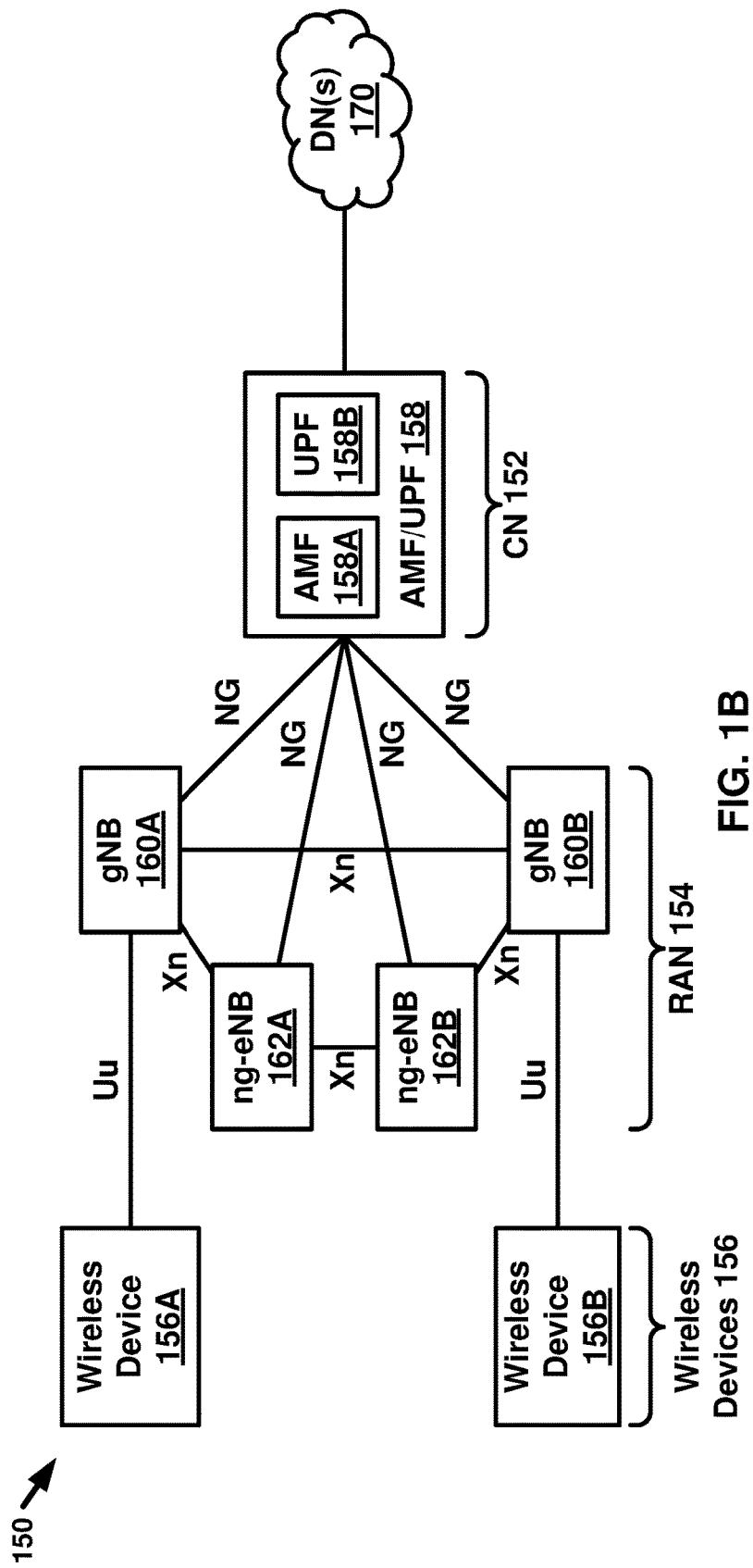
FIG. 1A
FIG. 1B

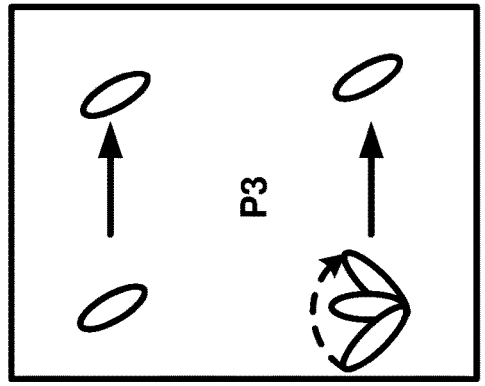
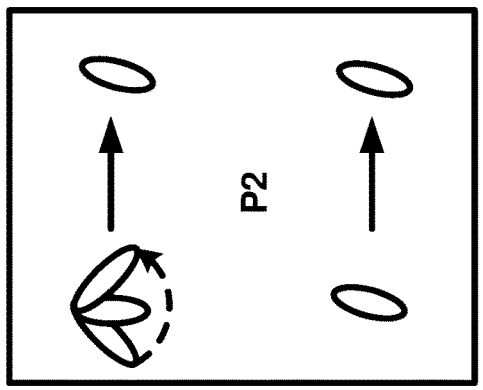
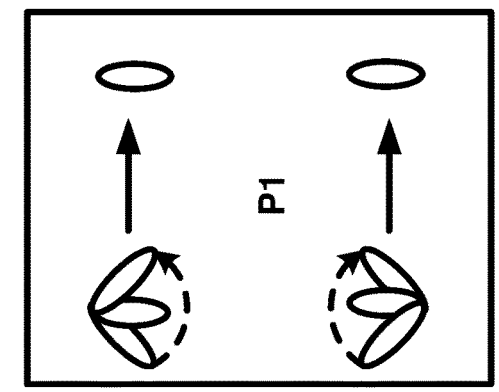
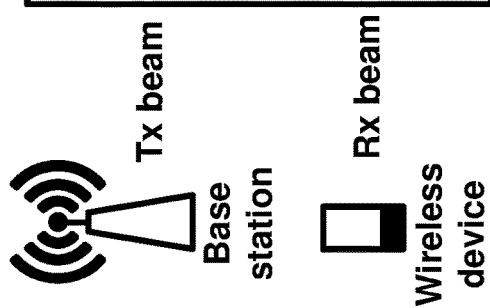
FIG. 12A
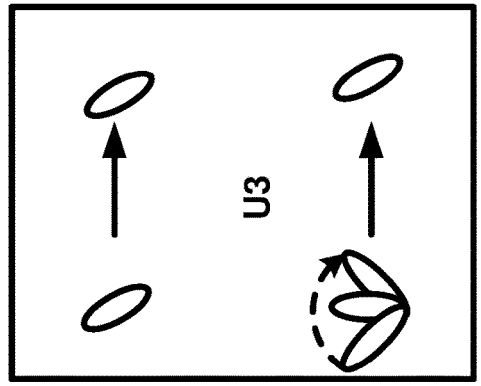
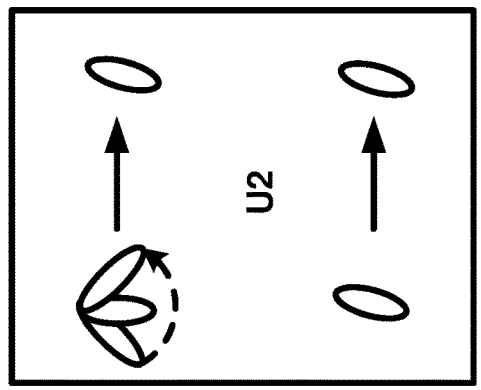
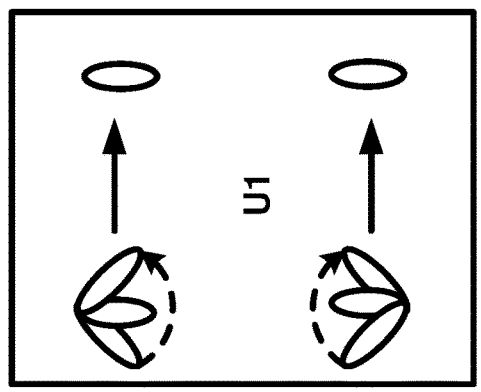
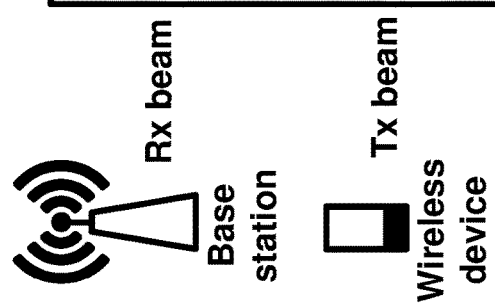
FIG. 12B

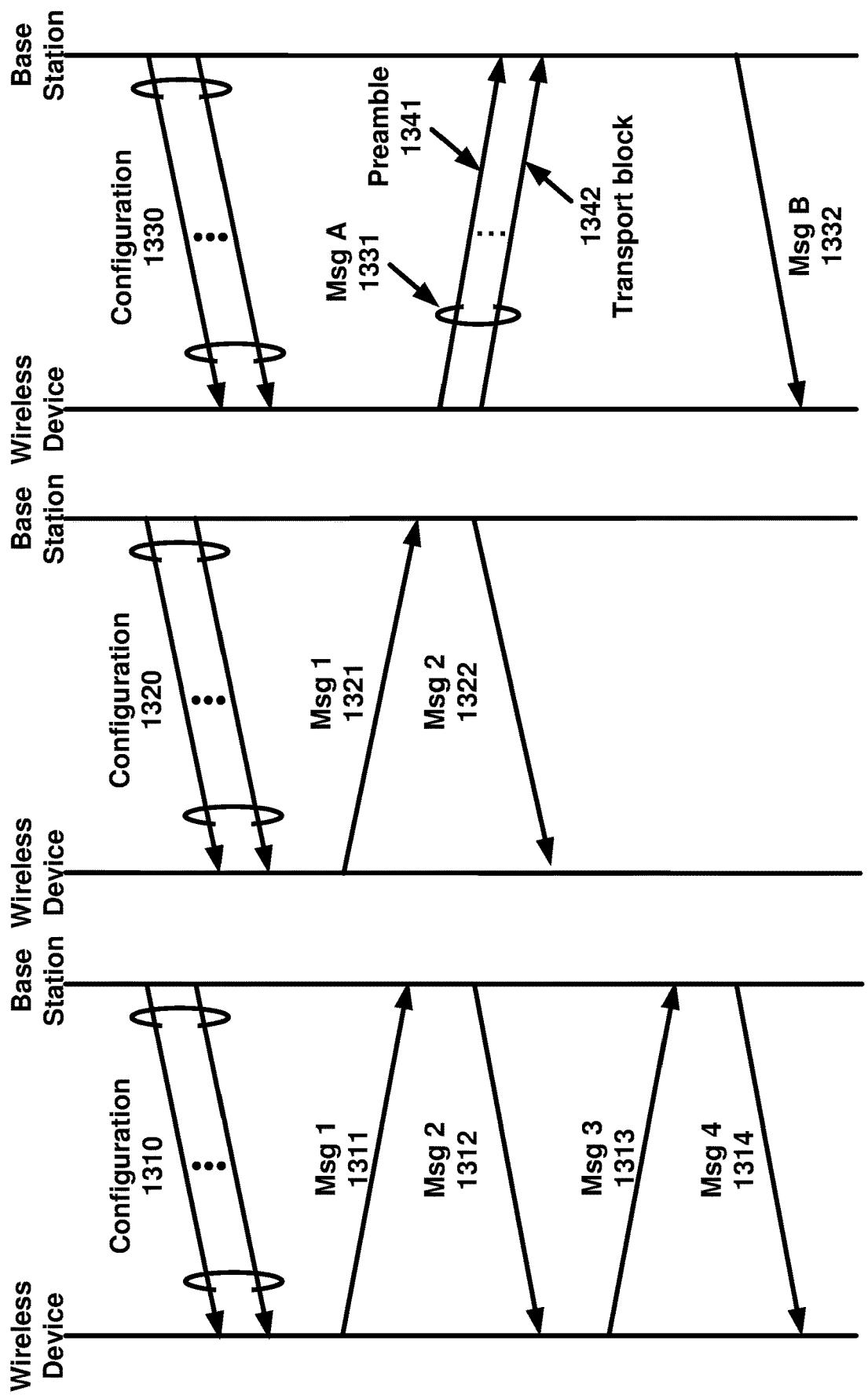

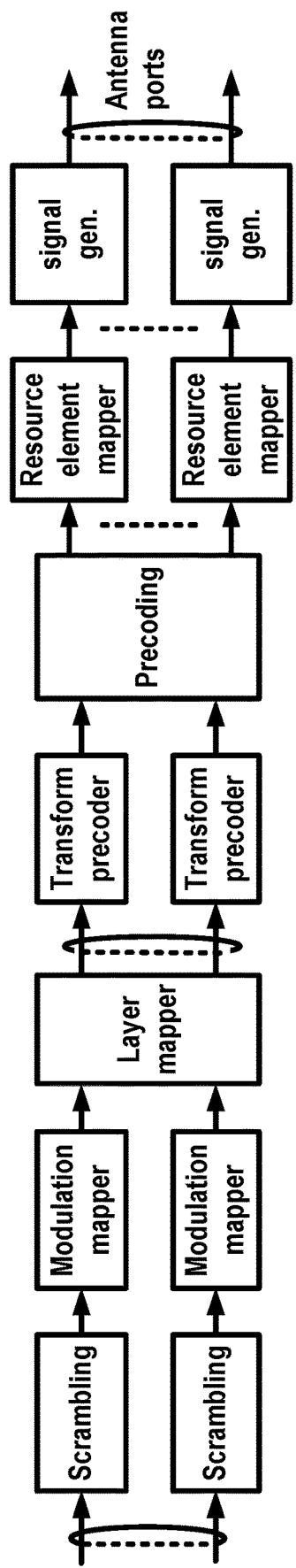
FIG. 16A
FIG. 16B
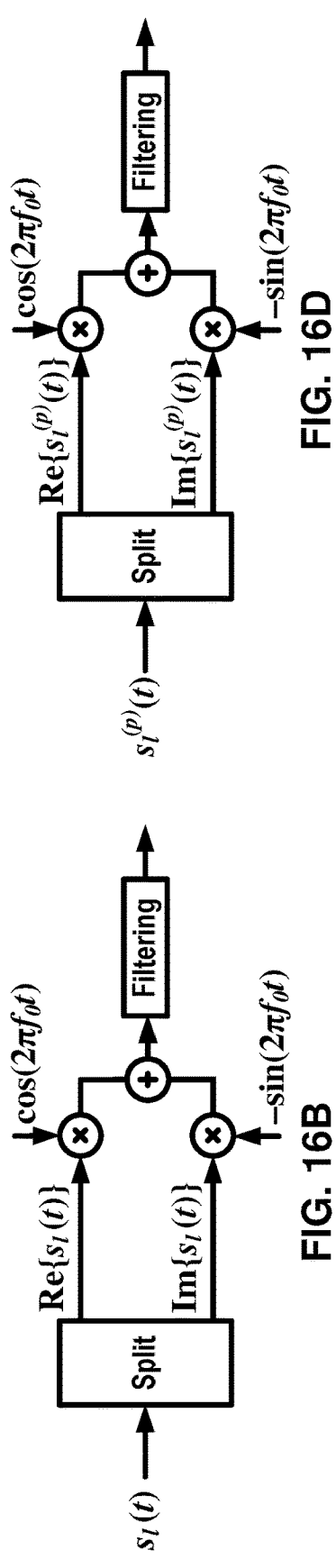
FIG. 16D
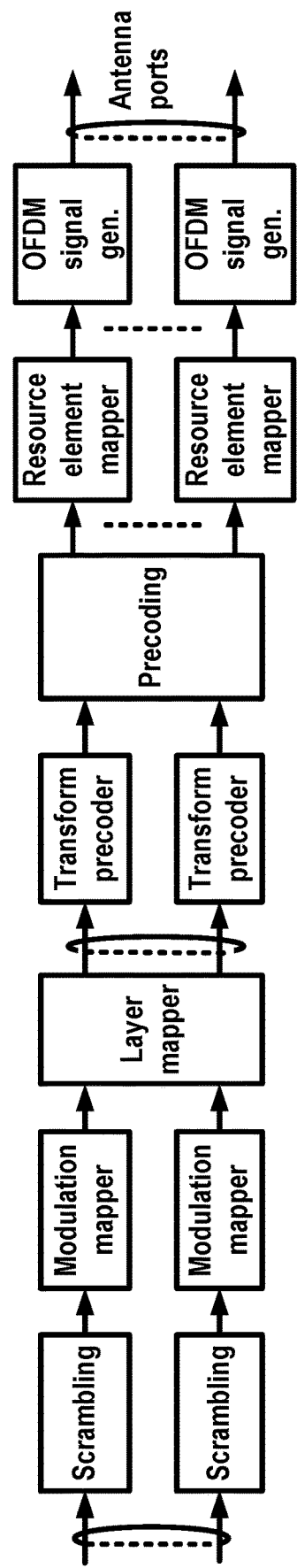
FIG. 16C

```
┌─────────────────────────────────────────────┐
│ Receive first activation command(s) activating a plurality │
│ of TCI states for first CORESET(s) of 1st BWP of a cell │
│                    2002                     │
└─────────────────────────────────────────────┘
                      │
                      ▼
┌─────────────────────────────────────────────┐
│        Determine a BWP switching event      │
│                    2004                     │
└─────────────────────────────────────────────┘
                      │
                      ▼
┌─────────────────────────────────────────────┐
│  Select/Determine an activated TCI state among the │
│  plurality of TCI states for second CORESET(s) of 2nd │
│                    BWP                      │
│                    2006                     │
└─────────────────────────────────────────────┘
                      │
                      ▼
┌─────────────────────────────────────────────┐
│   Receive, via the second CORESET(s), a     │
│     DCI based on the activated TCI state    │
│                    2008                     │
└─────────────────────────────────────────────┘
```

FIG. 20

DOWNLINK RECEPTION AND BEAM MANAGEMENT

CROSS-REFERENCE TO RELATED APPLICATIONS

This application claims the benefit of U.S. Provisional Application No. 62/908,471, filed on Sep. 30, 2019. The above-referenced application is hereby incorporated by reference in its entirety.

BACKGROUND

A base station and a wireless device communicate via uplink and/or downlink communications. The wireless device monitors for configuration communications from the base station.

SUMMARY

The following summary presents a simplified summary of certain features. The summary is not an extensive overview and is not intended to identify key or critical elements.

Wireless communications may comprise communications between a base station and a wireless device. The base station may send and/or schedule one or more transmissions to the wireless device that may overlap in time. For example, the base station may send and/or schedule overlapping transmissions across multiple devices and/or locations (e.g., antennas, transmission and reception points (TRPs), etc.). At least some wireless devices may have a capability to receive and/or decode some overlapping transmissions (e.g., a processing capability; multiple antennas; configurations for multiple TRPs, states, and/or groups; etc.), but if the wireless device is not be able to determine whether such capability is sufficient for each instance of overlapping transmissions, the wireless device may drop at least one (e.g., some or all) of the overlapping transmission(s). Rather than defaulting to drop overlapping transmissions, a wireless device may determine whether to receive and/or decode an overlapping transmission, based on an indication (e.g., a CORESET group index) associated with each transmission. For example, the wireless device may receive and/or decode overlapping transmissions that are associated with a different CORESET group index (e.g., sent by the base station from different TRPs). Conversely, the wireless device may drop overlapping transmissions that are associated with the same CORESET group indexes (e.g., sent by the base station from the same TRP). By using CORESET group indexes (or other indications), a wireless device may efficiently receive and/or decode overlapping transmissions.

Wireless resources may be switched for wireless communications. Resource switching, such as bandwidth part (BWP) switching, may cause a wireless device to delay using one or more new resources prior to a communication between the wireless device and a base station for synchronizing the use of the new resource(s). The wireless device may be required to wait for an indication (e.g., a medium access control (MAC) control element (CE)) to use the new resources. During this waiting, the wireless device may not know which beams to monitor for receiving one or more messages from the base station. Rather than waiting or using an incorrect resource (e.g., TCI state, beam, etc.), the wireless device may apply a rule to select a resource (e.g., TCI state, beam, etc.), among the TCI states used in the previously active BWP, and use that resource to monitor coresets in the new active BWP for the one or more messages from the base station. By applying the rule to select a resource, and described further herein, advantages may result from increased synchronization between a base station and a wireless device for resource switching.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

FIG. 1A and FIG. 1B show example communication networks.

FIG. 12A shows examples of downlink beam management procedures.

FIG. 12B shows examples of uplink beam management procedures.

FIG. 13A shows an example four-step random access procedure.

FIG. 13B shows an example two-step random access procedure.

FIG. 13C shows an example two-step random access procedure.

FIG. 16A, FIG. 16B, FIG. 16C, and FIG. 16D show examples of uplink and downlink signal transmission.

FIG. 20 shows an example of a beam management procedure.

DETAILED DESCRIPTION

Figure 2A:
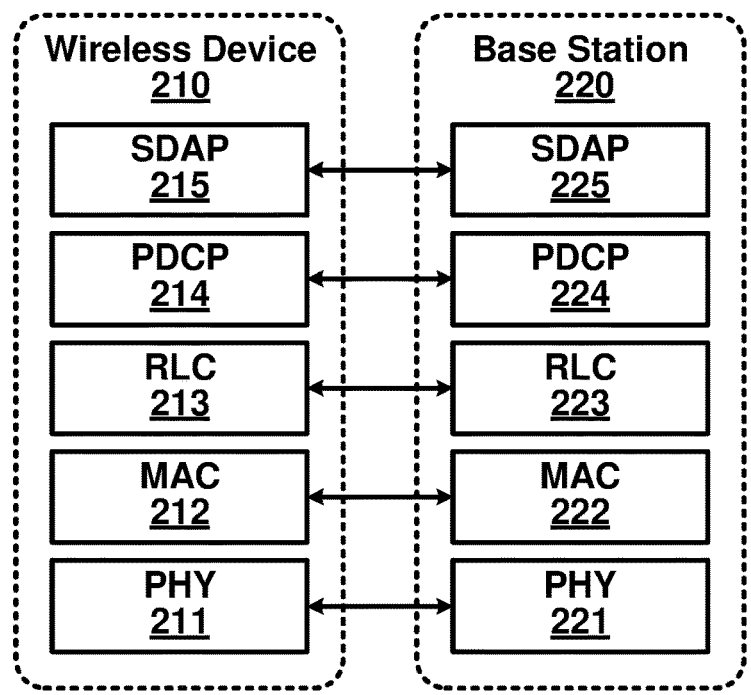
FIG. 2A shows an example user plane.

The accompanying drawings and descriptions provide examples. It is to be understood that the examples shown in the drawings and/or described are non-exclusive, and that features shown and described may be practiced in other examples. Examples are provided for operation of wireless communication systems, which may be used in the technical field of multicarrier communication systems. More particularly, the technology disclosed herein may relate to downlink reception and beam management.

FIG. 1A shows an example communication network 100. The communication network 100 may comprise a mobile communication network). The communication network 100 may comprise, for example, a public land mobile network (PLMN) operated/managed/run by a network operator. The communication network 100 may comprise one or more of a core network (CN) 102, a radio access network (RAN) 104, and/or a wireless device 106. The communication network 100 may comprise, and/or a device within the communication network 100 may communicate with (e.g., via CN 102), one or more data networks (DN(s)) 108. The wireless device 106 may communicate with one or more DNs 108, such as public DNs (e.g., the Internet), private DNs, and/or intra-operator DNs. The wireless device 106 may communicate with the one or more DNs 108 via the RAN 104 and/or via the CN 102. The CN 102 may provide/configure the wireless device 106 with one or more interfaces to the one or more DNs 108. As part of the interface functionality, the CN 102 may set up end-to-end connections between the wireless device 106 and the one or more DNs 108, authenticate the wireless device 106, provide/configure charging functionality, etc.

The wireless device 106 may communicate with the RAN 104 via radio communications over an air interface. The RAN 104 may communicate with the CN 102 via various communications (e.g., wired communications and/or wireless communications). The wireless device 106 may establish a connection with the CN 102 via the RAN 104. The RAN 104 may provide/configure scheduling, radio resource management, and/or retransmission protocols, for example, as part of the radio communications. The communication direction from the RAN 104 to the wireless device 106 over/via the air interface may be referred to as the downlink and/or downlink communication direction. The communication direction from the wireless device 106 to the RAN 104 over/via the air interface may be referred to as the uplink and/or uplink communication direction. Downlink transmissions may be separated and/or distinguished from uplink transmissions, for example, based on at least one of: frequency division duplexing (FDD), time-division duplexing (TDD), any other duplexing schemes, and/or one or more combinations thereof.

As used throughout, the term "wireless device" may comprise one or more of: a mobile device, a fixed (e.g., non-mobile) device for which wireless communication is configured or usable, a computing device, a node, a device capable of wirelessly communicating, or any other device capable of sending and/or receiving signals. As non-limiting examples, a wireless device may comprise, for example: a telephone, a cellular phone, a Wi-Fi phone, a smartphone, a tablet, a computer, a laptop, a sensor, a meter, a wearable device, an Internet of Things (IoT) device, a hotspot, a cellular repeater, a vehicle road side unit (RSU), a relay node, an automobile, a wireless user device (e.g., user equipment (UE), a user terminal (UT), etc.), an access terminal (AT), a mobile station, a handset, a wireless transmit and receive unit (WTRU), a wireless communication device, and/or any combination thereof.

The RAN 104 may comprise one or more base stations (not shown). As used throughout, the term "base station" may comprise one or more of: a base station, a node, a Node B (NB), an evolved NodeB (eNB), a gNB, an ng-eNB, a relay node (e.g., an integrated access and backhaul (IAB) node), a donor node (e.g., a donor eNB, a donor gNB, etc.), an access point (e.g., a Wi-Fi access point), a transmission and reception point (TRP), a computing device, a device capable of wirelessly communicating, or any other device capable of sending and/or receiving signals. A base station may comprise one or more of each element listed above. For example, a base station may comprise one or more TRPs. As other non-limiting examples, a base station may comprise for example, one or more of: a Node B (e.g., associated with Universal Mobile Telecommunications System (UMTS) and/or third-generation (3G) standards), an Evolved Node B (eNB) (e.g., associated with Evolved-Universal Terrestrial Radio Access (E-UTRA) and/or fourth-generation (4G) standards), a remote radio head (RRH), a baseband processing unit coupled to one or more remote radio heads (RRHs), a repeater node or relay node used to extend the coverage area of a donor node, a Next Generation Evolved Node B (ng-eNB), a Generation Node B (gNB) (e.g., associated with NR and/or fifth-generation (5G) standards), an access point (AP) (e.g., associated with, for example, Wi-Fi or any other suitable wireless communication standard), any other generation base station, and/or any combination thereof. A base station may comprise one or more devices, such as at least one base station central device (e.g., a gNB Central Unit (gNB-CU)) and at least one base station distributed device (e.g., a gNB Distributed Unit (gNB-DU)).

A base station (e.g., in the RAN 104) may comprise one or more sets of antennas for communicating with the wireless device 106 wirelessly (e.g., via an over the air interface). One or more base stations may comprise sets (e.g., three sets or any other quantity of sets) of antennas to respectively control multiple cells or sectors (e.g., three cells, three sectors, any other quantity of cells, or any other quantity of sectors). The size of a cell may be determined by a range at which a receiver (e.g., a base station receiver) may successfully receive transmissions from a transmitter (e.g., a wireless device transmitter) operating in the cell. One or more cells of base stations (e.g., by alone or in combination with other cells) may provide/configure a radio coverage to the wireless device 106 over a wide geographic area to support wireless device mobility. A base station comprising three sectors (e.g., or n-sector, where n refers to any quantity n) may be referred to as a three-sector site (e.g., or an n-sector site) or a three-sector base station (e.g., an n-sector base station).

One or more base stations (e.g., in the RAN 104) may be implemented as a sectored site with more or less than three sectors. One or more base stations of the RAN 104 may be implemented as an access point, as a baseband processing device/unit coupled to several RRHs, and/or as a repeater or relay node used to extend the coverage area of a node (e.g., a donor node). A baseband processing device/unit coupled to RRHs may be part of a centralized or cloud RAN architecture, for example, where the baseband processing device/unit may be centralized in a pool of baseband processing devices/units or virtualized. A repeater node may amplify and send (e.g., transmit, retransmit, rebroadcast, etc.) a radio signal received from a donor node. A relay node may perform the substantially the same/similar functions as a repeater node. The relay node may decode the radio signal received from the donor node, for example, to remove noise before amplifying and sending the radio signal.

The RAN 104 may be deployed as a homogenous network of base stations (e.g., macrocell base stations) that have similar antenna patterns and/or similar high-level transmit powers. The RAN 104 may be deployed as a heterogeneous network of base stations (e.g., different base stations that have different antenna patterns). In heterogeneous networks, small cell base stations may be used to provide/configure small coverage areas, for example, coverage areas that overlap with comparatively larger coverage areas provided/configured by other base stations (e.g., macrocell base stations). The small coverage areas may be provided/configured in areas with high data traffic (or so-called "hotspots") or in areas with a weak macrocell coverage. Examples of small cell base stations may comprise, in order of decreasing coverage area, microcell base stations, picocell base stations, and femtocell base stations or home base stations.

Examples described herein may be used in a variety of types of communications. For example, communications may be in accordance with the Third-Generation Partnership Project (3GPP) (e.g., one or more network elements similar to those of the communication network 100), communications in accordance with Institute of Electrical and Electronics Engineers (IEEE), communications in accordance with International Telecommunication Union (ITU), communications in accordance with International Organization for Standardization (ISO), etc. The 3GPP has produced specifications for multiple generations of mobile networks: a 3G network known as UMTS, a 4G network known as Long-Term Evolution (LTE) and LTE Advanced (LTE-A), and a 5G network known as 5G System (5GS) and NR system. 3GPP may produce specifications for additional generations of communication networks (e.g., 6G and/or any other generation of communication network). Examples may be described with reference to one or more elements (e.g., the RAN) of a 3GPP 5G network, referred to as a next-generation RAN (NG-RAN), or any other communication network, such as a 3GPP network and/or a non-3GPP network. Examples described herein may be applicable to other communication networks, such as 3G and/or 4G networks, and communication networks that may not yet be finalized/specified (e.g., a 3GPP 6G network), satellite communication networks, and/or any other communication network. NG-RAN implements and updates 5G radio access technology referred to as NR and may be provisioned to implement 4G radio access technology and/or other radio access technologies, such as other 3GPP and/or non-3GPP radio access technologies.

FIG. 1B shows an example communication network 150. The communication network may comprise a mobile communication network. The communication network 150 may comprise, for example, a PLMN operated/managed/run by a network operator. The communication network 150 may comprise one or more of: a CN 152 (e.g., a 5G core network (5G-CN)), a RAN 154 (e.g., an NG-RAN), and/or wireless devices 156A and 156B (collectively wireless device(s) 156). The communication network 150 may comprise, and/or a device within the communication network 150 may communicate with (e.g., via CN 152), one or more data networks (DN(s)) 170. These components may be implemented and operate in substantially the same or similar manner as corresponding components described with respect to FIG. 1A.

The CN 152 (e.g., 5G-CN) may provide/configure the wireless device(s) 156 with one or more interfaces to one or more DNs 170, such as public DNs (e.g., the Internet), private DNs, and/or intra-operator DNs. As part of the interface functionality, the CN 152 (e.g., 5G-CN) may set up end-to-end connections between the wireless device(s) 156 and the one or more DNs, authenticate the wireless device(s) 156, and/or provide/configure charging functionality. The CN 152 (e.g., the 5G-CN) may be a service-based architecture, which may differ from other CNs (e.g., such as a 3GPP 4G CN). The architecture of nodes of the CN 152 (e.g., 5G-CN) may be defined as network functions that offer services via interfaces to other network functions. The network functions of the CN 152 (e.g., 5G CN) may be implemented in several ways, for example, as network elements on dedicated or shared hardware, as software instances running on dedicated or shared hardware, and/or as virtualized functions instantiated on a platform (e.g., a cloud-based platform).

The CN 152 (e.g., 5G-CN) may comprise an Access and Mobility Management Function (AMF) device 158A and/or a User Plane Function (UPF) device 158B, which may be separate components or one component AMF/UPF device 158. The UPF device 158B may serve as a gateway between a RAN 154 (e.g., NG-RAN) and the one or more DNs 170. The UPF device 158B may perform functions, such as: packet routing and forwarding, packet inspection and user plane policy rule enforcement, traffic usage reporting, uplink classification to support routing of traffic flows to the one or more DNs 170, quality of service (QoS) handling for the user plane (e.g., packet filtering, gating, uplink/downlink rate enforcement, and uplink traffic verification), downlink packet buffering, and/or downlink data notification triggering. The UPF device 158B may serve as an anchor point for intra-/inter-Radio Access Technology (RAT) mobility, an external protocol (or packet) data unit (PDU) session point of interconnect to the one or more DNs, and/or a branching point to support a multi-homed PDU session. The wireless device(s) 156 may be configured to receive services via a PDU session, which may be a logical connection between a wireless device and a DN.

The AMF device 158A may perform functions, such as: Non-Access Stratum (NAS) signaling termination, NAS signaling security, Access Stratum (AS) security control, inter-CN node signaling for mobility between access networks (e.g., 3GPP access networks and/or non-3GPP networks), idle mode wireless device reachability (e.g., idle mode UE reachability for control and execution of paging retransmission), registration area management, intra-system and inter-system mobility support, access authentication, access authorization including checking of roaming rights, mobility management control (e.g., subscription and policies), network slicing support, and/or session management function (SMF) selection. NAS may refer to the functionality operating between a CN and a wireless device, and AS may refer to the functionality operating between a wireless device and a RAN.

The CN 152 (e.g., 5G-CN) may comprise one or more additional network functions that may not be shown in FIG. 1B. The CN 152 (e.g., 5G-CN) may comprise one or more devices implementing at least one of: a Session Management Function (SMF), an NR Repository Function (NRF), a Policy Control Function (PCF), a Network Exposure Function (NEF), a Unified Data Management (UDM), an Application Function (AF), an Authentication Server Function (AUSF), and/or any other function.

The RAN 154 (e.g., NG-RAN) may communicate with the wireless device(s) 156 via radio communications (e.g., an over the air interface). The wireless device(s) 156 may communicate with the CN 152 via the RAN 154. The RAN 154 (e.g., NG-RAN) may comprise one or more first-type base stations (e.g., gNBs comprising a gNB 160A and a gNB 160B (collectively gNBs 160)) and/or one or more second-type base stations (e.g., ng eNBs comprising an ng-eNB 162A and an ng-eNB 162B (collectively ng eNBs 162)). The RAN 154 may comprise one or more of any quantity of types of base station. The gNBs 160 and ng eNBs 162 may be referred to as base stations. The base stations (e.g., the gNBs 160 and ng eNBs 162) may comprise one or more sets of antennas for communicating with the wireless device(s) 156 wirelessly (e.g., an over an air interface). One or more base stations (e.g., the gNBs 160 and/or the ng eNBs 162) may comprise multiple sets of antennas to respectively control multiple cells (or sectors). The cells of the base stations (e.g., the gNBs 160 and the ng-eNBs 162) may provide a radio coverage to the wireless device(s) 156 over a wide geographic area to support wireless device mobility.

The base stations (e.g., the gNBs 160 and/or the ng-eNBs 162) may be connected to the CN 152 (e.g., 5G CN) via a first interface (e.g., an NG interface) and to other base stations via a second interface (e.g., an Xn interface). The NG and Xn interfaces may be established using direct physical connections and/or indirect connections over an underlying transport network, such as an internet protocol (IP) transport network. The base stations (e.g., the gNBs 160 and/or the ng-eNBs 162) may communicate with the wireless device(s) 156 via a third interface (e.g., a Uu interface). A base station (e.g., the gNB 160A) may communicate with the wireless device 156A via a Uu interface. The NG, Xn, and Uu interfaces may be associated with a protocol stack. The protocol stacks associated with the interfaces may be used by the network elements shown in FIG. 1B to exchange data and signaling messages. The protocol stacks may comprise two planes: a user plane and a control plane. Any other quantity of planes may be used (e.g., in a protocol stack). The user plane may handle data of interest to a user. The control plane may handle signaling messages of interest to the network elements.

One or more base stations (e.g., the gNBs 160 and/or the ng-eNBs 162) may communicate with one or more AMF/UPF devices, such as the AMF/UPF 158, via one or more interfaces (e.g., NG interfaces). A base station (e.g., the gNB 160A) may be in communication with, and/or connected to, the UPF 158B of the AMF/UPF 158 via an NG-User plane (NG-U) interface. The NG-U interface may provide/perform delivery (e.g., non-guaranteed delivery) of user plane PDUs between a base station (e.g., the gNB 160A) and a UPF device (e.g., the UPF 158B). The base station (e.g., the gNB 160A) may be in communication with, and/or connected to, an AMF device (e.g., the AMF 158A) via an NG-Control plane (NG-C) interface. The NG-C interface may provide/perform, for example, NG interface management, wireless device context management (e.g., UE context management), wireless device mobility management (e.g., UE mobility management), transport of NAS messages, paging, PDU session management, configuration transfer, and/or warning message transmission.

A wireless device may access the base station, via an interface (e.g., Uu interface), for the user plane configuration and the control plane configuration. The base stations (e.g., gNBs 160) may provide user plane and control plane protocol terminations towards the wireless device(s) 156 via the Uu interface. A base station (e.g., the gNB 160A) may provide user plane and control plane protocol terminations toward the wireless device 156A over a Uu interface associated with a first protocol stack. A base station (e.g., the ng-eNBs 162) may provide Evolved UMTS Terrestrial Radio Access (E UTRA) user plane and control plane protocol terminations towards the wireless device(s) 156 via a Uu interface (e.g., where E UTRA may refer to the 3GPP 4G radio-access technology). A base station (e.g., the ng-eNB 162B) may provide E UTRA user plane and control plane protocol terminations towards the wireless device 156B via a Uu interface associated with a second protocol stack. The user plane and control plane protocol terminations may comprise, for example, NR user plane and control plane protocol terminations, 4G user plane and control plane protocol terminations, etc.

The CN 152 (e.g., 5G-CN) may be configured to handle one or more radio accesses (e.g., NR, 4G, and/or any other radio accesses). It may also be possible for an NR network/device (or any first network/device) to connect to a 4G core network/device (or any second network/device) in a non-standalone mode (e.g., non-standalone operation). In a non-standalone mode/operation, a 4G core network may be used to provide (or at least support) control-plane functionality (e.g., initial access, mobility, and/or paging). Although only one AMF/UPF 158 is shown in FIG. 1B, one or more base stations (e.g., one or more gNBs and/or one or more ng-eNBs) may be connected to multiple AMF/UPF nodes, for example, to provide redundancy and/or to load share across the multiple AMF/UPF nodes.

An interface (e.g., Uu, Xn, and/or NG interfaces) between network elements (e.g., the network elements shown in FIG. 1B) may be associated with a protocol stack that the network elements may use to exchange data and signaling messages. A protocol stack may comprise two planes: a user plane and a control plane. Any other quantity of planes may be used (e.g., in a protocol stack). The user plane may handle data associated with a user (e.g., data of interest to a user). The control plane may handle data associated with one or more network elements (e.g., signaling messages of interest to the network elements).

The communication network 100 in FIG. 1A and/or the communication network 150 in FIG. 1B may comprise any quantity/number and/or type of devices, such as, for example, computing devices, wireless devices, mobile devices, handsets, tablets, laptops, internet of things (IoT) devices, hotspots, cellular repeaters, computing devices, and/or, more generally, user equipment (e.g., UE). Although one or more of the above types of devices may be referenced herein (e.g., UE, wireless device, computing device, etc.), it should be understood that any device herein may comprise any one or more of the above types of devices or similar devices. The communication network, and any other network referenced herein, may comprise an LTE network, a 5G network, a satellite network, and/or any other network for wireless communications (e.g., any 3GPP network and/or any non-3GPP network). Apparatuses, systems, and/or methods described herein may generally be described as implemented on one or more devices (e.g., wireless device, base station, eNB, gNB, computing device, etc.), in one or more networks, but it will be understood that one or more features and steps may be implemented on any device and/or in any network.

Figure 2B:
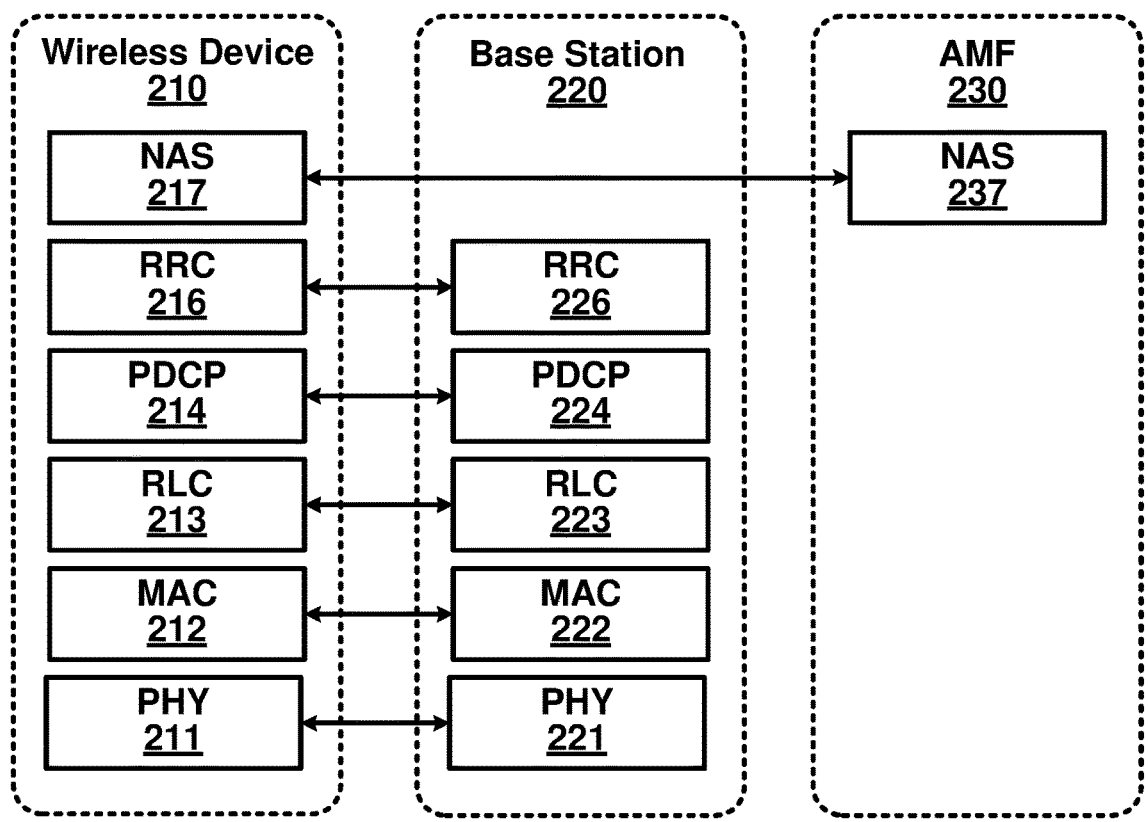
FIG. 2B shows an example control plane configuration.

FIG. 2A shows an example user plane configuration. The user plane configuration may comprise, for example, an NR user plane protocol stack. FIG. 2B shows an example control plane configuration. The control plane configuration may comprise, for example, an NR control plane protocol stack. One or more of the user plane configuration and/or the control plane configuration may use a Uu interface that may be between a wireless device 210 and a base station 220. The protocol stacks shown in FIG. 2A and FIG. 2B may be substantially the same or similar to those used for the Uu interface between, for example, the wireless device 156A and the base station 160A shown in FIG. 1B.

A user plane configuration (e.g., an NR user plane protocol stack) may comprise multiple layers (e.g., five layers or any other quantity of layers) implemented in the wireless device 210 and the base station 220 (e.g., as shown in FIG. 2A). At the bottom of the protocol stack, physical layers (PHYs) 211 and 221 may provide transport services to the higher layers of the protocol stack and may correspond to layer 1 of the Open Systems Interconnection (OSI) model. The protocol layers above PHY 211 may comprise a medium access control layer (MAC) 212, a radio link control layer (RLC) 213, a packet data convergence protocol layer (PDCP) 214, and/or a service data application protocol layer (SDAP) 215. The protocol layers above PHY 221 may comprise a medium access control layer (MAC) 222, a radio link control layer (RLC) 223, a packet data convergence protocol layer (PDCP) 224, and/or a service data application protocol layer (SDAP) 225. One or more of the four protocol layers above PHY 211 may correspond to layer 2, or the data link layer, of the OSI model. One or more of the four protocol layers above PHY 221 may correspond to layer 2, or the data link layer, of the OSI model.

Figure 3:
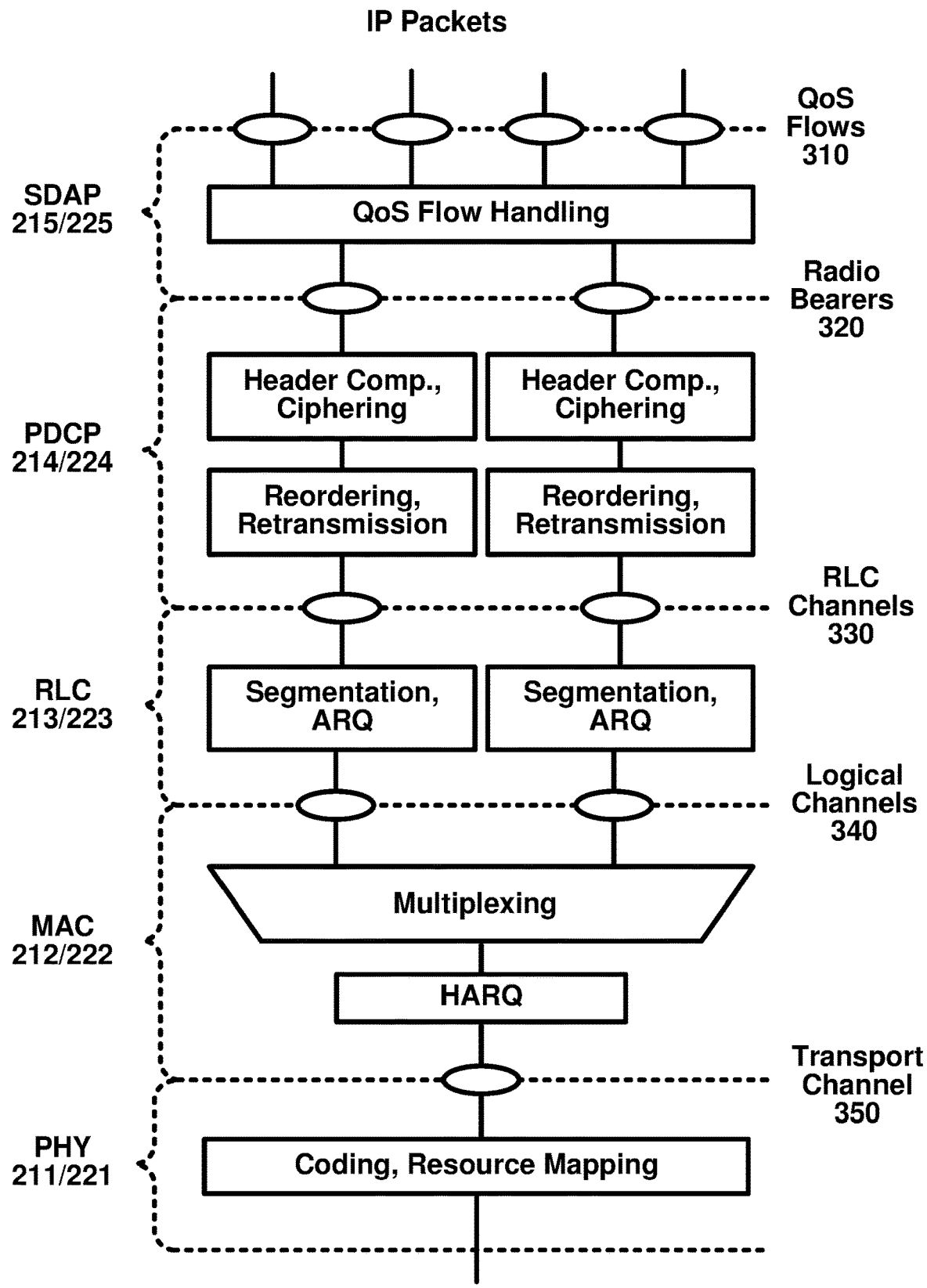
FIG. 3 shows example of protocol layers.

FIG. 3 shows an example of protocol layers. The protocol layers may comprise, for example, protocol layers of the NR user plane protocol stack. One or more services may be provided between protocol layers. SDAPs (e.g., SDAPS 215 and 225 shown in FIG. 2A and FIG. 3) may perform Quality of Service (QoS) flow handling. A wireless device (e.g., the wireless devices 106, 156A, 156B, and 210) may receive services through/via a PDU session, which may be a logical connection between the wireless device and a DN. The PDU session may have one or more QoS flows 310. A UPF (e.g., the UPF 158B) of a CN may map IP packets to the one or more QoS flows of the PDU session, for example, based on one or more QoS requirements (e.g., in terms of delay, data rate, error rate, and/or any other quality/service requirement). The SDAPs 215 and 225 may perform mapping/de-mapping between the one or more QoS flows 310 and one or more radio bearers 320 (e.g., data radio bearers). The mapping/de-mapping between the one or more QoS flows 310 and the radio bearers 320 may be determined by the SDAP 225 of the base station 220. The SDAP 215 of the wireless device 210 may be informed of the mapping between the QoS flows 310 and the radio bearers 320 via reflective mapping and/or control signaling received from the base station 220. For reflective mapping, the SDAP 225 of the base station 220 may mark the downlink packets with a QoS flow indicator (QFI), which may be monitored/detected/identified/indicated/observed by the SDAP 215 of the wireless device 210 to determine the mapping/de-mapping between the one or more QoS flows 310 and the radio bearers 320.

PDCPs (e.g., the PDCPs 214 and 224 shown in FIG. 2A and FIG. 3) may perform header compression/decompression, for example, to reduce the amount of data that may need to be transmitted over the air interface, ciphering/deciphering to prevent unauthorized decoding of data transmitted over the air interface, and/or integrity protection (e.g., to ensure control messages originate from intended sources). The PDCPs 214 and 224 may perform retransmissions of undelivered packets, in-sequence delivery and reordering of packets, and/or removal of packets received in duplicate due to, for example, a handover (e.g., an intra-gNB handover). The PDCPs 214 and 224 may perform packet duplication, for example, to improve the likelihood of the packet being received. A receiver may receive the packet in duplicate and may remove any duplicate packets. Packet duplication may be useful for certain services, such as services that require high reliability.

The PDCP layers (e.g., PDCPs 214 and 224) may perform mapping/de-mapping between a split radio bearer and RLC channels (e.g., RLC channels 330) (e.g., in a dual connectivity scenario/configuration). Dual connectivity may refer to a technique that allows a wireless device to communicate with multiple cells (e.g., two cells) or, more generally, multiple cell groups comprising: a master cell group (MCG) and a secondary cell group (SCG). A split bearer may be configured and/or used, for example, if a single radio bearer (e.g., such as one of the radio bearers provided/configured by the PDCPs 214 and 224 as a service to the SDAPs 215 and 225) is handled by cell groups in dual connectivity. The PDCPs 214 and 224 may map/de-map between the split radio bearer and RLC channels 330 belonging to the cell groups.

RLC layers (e.g., RLCs 213 and 223) may perform segmentation, retransmission via Automatic Repeat Request (ARQ), and/or removal of duplicate data units received from MAC layers (e.g., MACs 212 and 222, respectively). The RLC layers (e.g., RLCs 213 and 223) may support multiple transmission modes (e.g., three transmission modes: transparent mode (TM); unacknowledged mode (UM); and acknowledged mode (AM)). The RLC layers may perform one or more of the noted functions, for example, based on the transmission mode an RLC layer is operating. The RLC configuration may be per logical channel. The RLC configuration may not depend on numerologies and/or Transmission Time Interval (TTI) durations (or other durations). The RLC layers (e.g., RLCs 213 and 223) may provide/configure RLC channels as a service to the PDCP layers (e.g., PDCPs 214 and 224, respectively), such as shown in FIG. 3.

The MAC layers (e.g., MACs 212 and 222) may perform multiplexing/demultiplexing of logical channels and/or mapping between logical channels and transport channels. The multiplexing/demultiplexing may comprise multiplexing/demultiplexing of data units/data portions, belonging to the one or more logical channels, into/from Transport Blocks (TBs) delivered to/from the PHY layers (e.g., PHYs 211 and 221, respectively). The MAC layer of a base station (e.g., MAC 222) may be configured to perform scheduling, scheduling information reporting, and/or priority handling between wireless devices via dynamic scheduling. Scheduling may be performed by a base station (e.g., the base station 220 at the MAC 222) for downlink/or and uplink. The MAC layers (e.g., MACs 212 and 222) may be configured to perform error correction(s) via Hybrid Automatic Repeat Request (HARQ) (e.g., one HARQ entity per carrier in case of Carrier Aggregation (CA)), priority handling between logical channels of the wireless device 210 via logical channel prioritization and/or padding. The MAC layers (e.g., MACs 212 and 222) may support one or more numerologies and/or transmission timings. Mapping restrictions in a logical channel prioritization may control which numerology and/or transmission timing a logical channel may use. The MAC layers (e.g., the MACs 212 and 222) may provide/configure logical channels 340 as a service to the RLC layers (e.g., the RLCs 213 and 223).

The PHY layers (e.g., PHYs 211 and 221) may perform mapping of transport channels to physical channels and/or digital and analog signal processing functions, for example, for sending and/or receiving information (e.g., via an over the air interface). The digital and/or analog signal processing functions may comprise, for example, coding/decoding and/or modulation/demodulation. The PHY layers (e.g., PHYs 211 and 221) may perform multi-antenna mapping. The PHY layers (e.g., the PHYs 211 and 221) may provide/configure one or more transport channels (e.g., transport channels 350) as a service to the MAC layers (e.g., the MACs 212 and 222, respectively).

Figure 4A:
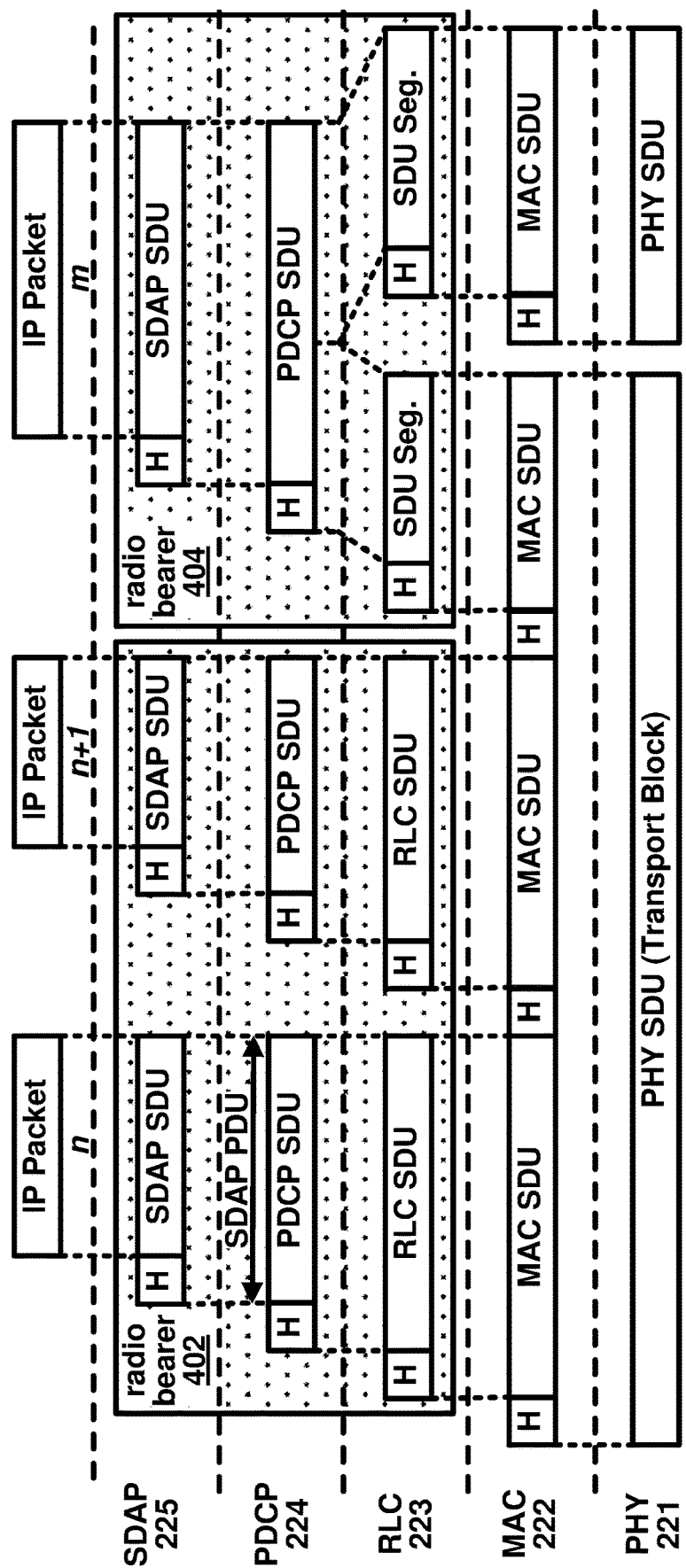
FIG. 4A shows an example downlink data flow for a user plane configuration.

FIG. 4A shows an example downlink data flow for a user plane configuration. The user plane configuration may comprise, for example, the NR user plane protocol stack shown in FIG. 2A. One or more TBs may be generated, for example, based on a data flow via a user plane protocol stack. As shown in FIG. 4A, a downlink data flow of three IP packets (n, n+1, and m) via the NR user plane protocol stack may generate two TBs (e.g., at the base station 220). An uplink data flow via the NR user plane protocol stack may be similar to the downlink data flow shown in FIG. 4A. The three IP packets (n, n+1, and m) may be determined from the two TBs, for example, based on the uplink data flow via an NR user plane protocol stack. A first quantity of packets (e.g., three or any other quantity) may be determined from a second quantity of TBs (e.g., two or another quantity).

The downlink data flow may begin, for example, if the SDAP 225 receives the three IP packets (or other quantity of IP packets) from one or more QoS flows and maps the three packets (or other quantity of packets) to radio bearers (e.g., radio bearers 402 and 404). The SDAP 225 may map the IP packets n and n+1 to a first radio bearer 402 and map the IP packet m to a second radio bearer 404. An SDAP header (labeled with "H" preceding each SDAP SDU shown in FIG. 4A) may be added to an IP packet to generate an SDAP PDU, which may be referred to as a PDCP SDU. The data unit transferred from/to a higher protocol layer may be referred to as a service data unit (SDU) of the lower protocol layer, and the data unit transferred to/from a lower protocol layer may be referred to as a protocol data unit (PDU) of the higher protocol layer. As shown in FIG. 4A, the data unit from the SDAP 225 may be an SDU of lower protocol layer PDCP 224 (e.g., PDCP SDU) and may be a PDU of the SDAP 225 (e.g., SDAP PDU).

Each protocol layer (e.g., protocol layers shown in FIG. 4A) or at least some protocol laters may: perform its own function(s) (e.g., one or more functions of each protocol layer described with respect to FIG. 3), add a corresponding header, and/or forward a respective output to the next lower layer (e.g., its respective lower layer). The PDCP 224 may perform an IP-header compression and/or ciphering. The PDCP 224 may forward its output (e.g., a PDCP PDU, which is an RLC SDU) to the RLC 223. The RLC 223 may optionally perform segmentation (e.g., as shown for IP packet m in FIG. 4A). The RLC 223 may forward its outputs (e.g., two RLC PDUs, which are two MAC SDUs, generated by adding respective subheaders to two SDU segments (SDU Segs)) to the MAC 222. The MAC 222 may multiplex a number of RLC PDUs (MAC SDUs). The MAC 222 may attach a MAC subheader to an RLC PDU (MAC SDU) to form a TB. The MAC subheaders may be distributed across the MAC PDU (e.g., in an NR configuration as shown in FIG. 4A). The MAC subheaders may be entirely located at the beginning of a MAC PDU (e.g., in an LTE configuration) . The NR MAC PDU structure may reduce a processing time and/or associated latency, for example, if the MAC PDU subheaders are computed before assembling the full MAC PDU.

Figure 4B:
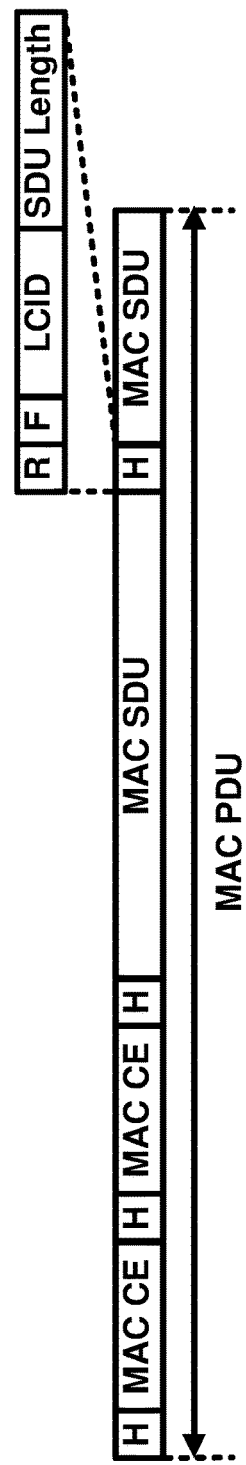
FIG. 4B shows an example format of a Medium Access Control (MAC) subheader in a MAC Protocol Data Unit (PDU).

FIG. 4B shows an example format of a MAC subheader in a MAC PDU. A MAC PDU may comprise a MAC subheader (H) and a MAC SDU. Each of one or more MAC subheaders may comprise an SDU length field for indicating the length (e.g., in bytes) of the MAC SDU to which the MAC subheader corresponds; a logical channel identifier (LCID) field for identifying/indicating the logical channel from which the MAC SDU originated to aid in the demultiplexing process; a flag (F) for indicating the size of the SDU length field; and a reserved bit (R) field for future use.

One or more MAC control elements (CEs) may be added to, or inserted into, the MAC PDU by a MAC layer, such as MAC 223 or MAC 222. As shown in FIG. 4B, two MAC CEs may be inserted/added before two MAC PDUs. The MAC CEs may be inserted/added at the beginning of a MAC PDU for downlink transmissions (as shown in FIG. 4B). One or more MAC CEs may be inserted/added at the end of a MAC PDU for uplink transmissions. MAC CEs may be used for in band control signaling. Example MAC CEs may comprise scheduling-related MAC CEs, such as buffer status reports and power headroom reports; activation/deactivation MAC CEs (e.g., MAC CEs for activation/deactivation of PDCP duplication detection, channel state information (CSI) reporting, sounding reference signal (SRS) transmission, and prior configured components); discontinuous reception (DRX)-related MAC CEs; timing advance MAC CEs; and random access-related MAC CEs. A MAC CE may be preceded by a MAC subheader with a similar format as described for the MAC subheader for MAC SDUs and may be identified with a reserved value in the LCID field that indicates the type of control information included in the corresponding MAC CE.

Figure 5B:
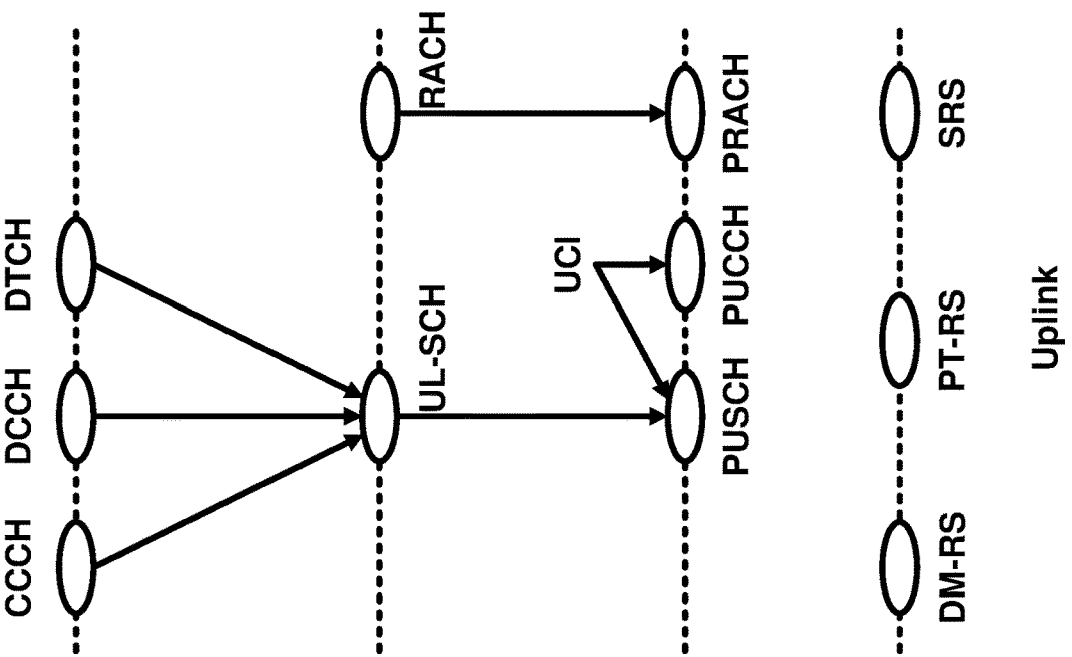
FIG. 5B shows an example mapping for uplink channels.
Figure 5A:
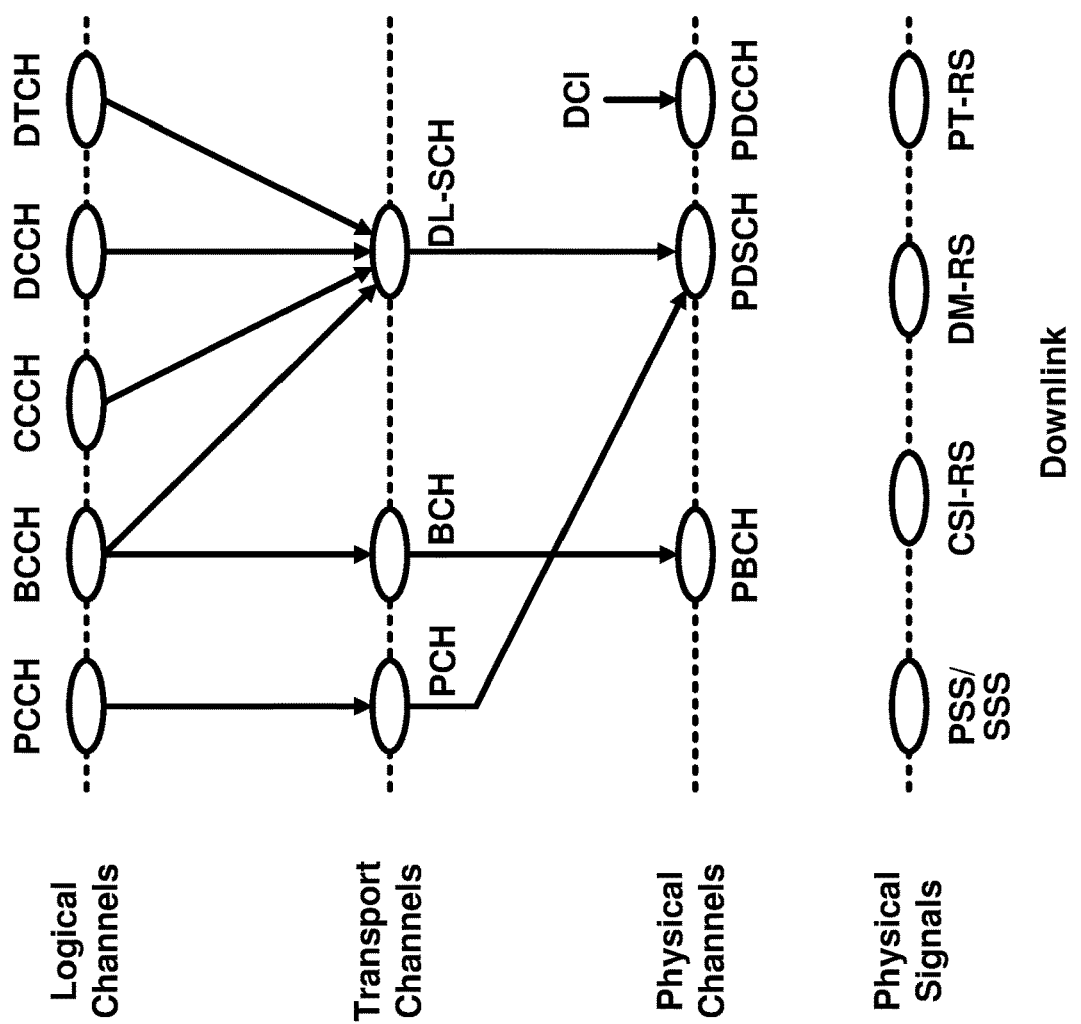
FIG. 5A shows an example mapping for downlink channels.

FIG. 5A shows an example mapping for downlink channels. The mapping for uplink channels may comprise mapping between channels (e.g., logical channels, transport channels, and physical channels) for downlink. FIG. 5B shows an example mapping for uplink channels. The mapping for uplink channels may comprise mapping between channels (e.g., logical channels, transport channels, and physical channels) for uplink. Information may be passed through/via channels between the RLC, the MAC, and the PHY layers of a protocol stack (e.g., the NR protocol stack). A logical channel may be used between the RLC and the MAC layers. The logical channel may be classified/indicated as a control channel that may carry control and/or configuration information (e.g., in the NR control plane), or as a traffic channel that may carry data (e.g., in the NR user plane). A logical channel may be classified/indicated as a dedicated logical channel that may be dedicated to a specific wireless device, and/or as a common logical channel that may be used by more than one wireless device (e.g., a group of wireless device).

A logical channel may be defined by the type of information it carries. The set of logical channels (e.g., in an NR configuration) may comprise one or more channels described below. A paging control channel (PCCH) may comprise/carry one or more paging messages used to page a wireless device whose location is not known to the network on a cell level. A broadcast control channel (BCCH) may comprise/carry system information messages in the form of a master information block (MIB) and several system information blocks (SIBs). The system information messages may be used by wireless devices to obtain information about how a cell is configured and how to operate within the cell. A common control channel (CCCH) may comprise/carry control messages together with random access. A dedicated control channel (DCCH) may comprise/carry control messages to/from a specific wireless device to configure the wireless device with configuration information. A dedicated traffic channel (DTCH) may comprise/carry user data to/from a specific wireless device.

Transport channels may be used between the MAC and PHY layers. Transport channels may be defined by how the information they carry is sent/transmitted (e.g., via an over the air interface). The set of transport channels (e.g., that may be defined by an NR configuration or any other configuration) may comprise one or more of the following channels. A paging channel (PCH) may comprise/carry paging messages that originated from the PCCH. A broadcast channel (BCH) may comprise/carry the MIB from the BCCH. A downlink shared channel (DL-SCH) may comprise/carry downlink data and signaling messages, including the SIBs from the BCCH. An uplink shared channel (UL-SCH) may comprise/carry uplink data and signaling messages. A random access channel (RACH) may provide a wireless device with an access to the network without any prior scheduling.

The PHY layer may use physical channels to pass/transfer information between processing levels of the PHY layer. A physical channel may have an associated set of time-frequency resources for carrying the information of one or more transport channels. The PHY layer may generate control information to support the low-level operation of the PHY layer. The PHY layer may provide/transfer the control information to the lower levels of the PHY layer via physical control channels (e.g., referred to as L1/L2 control channels). The set of physical channels and physical control channels (e.g., that may be defined by an NR configuration or any other configuration) may comprise one or more of the following channels. A physical broadcast channel (PBCH) may comprise/carry the MIB from the BCH. A physical downlink shared channel (PDSCH) may comprise/carry downlink data and signaling messages from the DL-SCH, as well as paging messages from the PCH. A physical downlink control channel (PDCCH) may comprise/carry downlink control information (DCI), which may comprise downlink scheduling commands, uplink scheduling grants, and uplink power control commands A physical uplink shared channel (PUSCH) may comprise/carry uplink data and signaling messages from the UL-SCH and in some instances uplink control information (UCI) as described below. A physical uplink control channel (PUCCH) may comprise/carry UCI, which may comprise HARQ acknowledgments, channel quality indicators (CQI), pre-coding matrix indicators (PMI), rank indicators (RI), and scheduling requests (SR). A physical random access channel (PRACH) may be used for random access.

The physical layer may generate physical signals to support the low-level operation of the physical layer, which may be similar to the physical control channels. As shown in FIG. 5A and FIG. 5B, the physical layer signals (e.g., that may be defined by an NR configuration or any other configuration) may comprise primary synchronization signals (PSS), secondary synchronization signals (SSS), channel state information reference signals (CSI-RS), demodulation reference signals (DM-RS), sounding reference signals (SRS), phase-tracking reference signals (PT RS), and/or any other signals.

One or more of the channels (e.g., logical channels, transport channels, physical channels, etc.) may be used to carry out functions associated with the control plan protocol stack (e.g., NR control plane protocol stack). FIG. 2B shows an example control plane configuration (e.g., an NR control plane protocol stack). As shown in FIG. 2B, the control plane configuration (e.g., the NR control plane protocol stack) may use substantially the same/similar one or more protocol layers (e.g., PHY 211 and 221, MAC 212 and 222, RLC 213 and 223, and PDCP 214 and 224) as the example user plane configuration (e.g., the NR user plane protocol stack). Similar four protocol layers may comprise the PHYs 211 and 221, the MACs 212 and 222, the RLCs 213 and 223, and the PDCPs 214 and 224. The control plane configuration (e.g., the NR control plane stack) may have radio resource controls (RRCs) 216 and 226 and NAS protocols 217 and 237 at the top of the control plane configuration (e.g., the NR control plane protocol stack), for example, instead of having the SDAPs 215 and 225. The control plane configuration may comprise an AMF 230 comprising the NAS protocol 237.

The NAS protocols 217 and 237 may provide control plane functionality between the wireless device 210 and the AMF 230 (e.g., the AMF 158A or any other AMF) and/or, more generally, between the wireless device 210 and a CN (e.g., the CN 152 or any other CN). The NAS protocols 217 and 237 may provide control plane functionality between the wireless device 210 and the AMF 230 via signaling messages, referred to as NAS messages. There may be no direct path between the wireless device 210 and the AMF 230 via which the NAS messages may be transported. The NAS messages may be transported using the AS of the Uu and NG interfaces. The NAS protocols 217 and 237 may provide control plane functionality, such as authentication, security, a connection setup, mobility management, session management, and/or any other functionality.

The RRCs 216 and 226 may provide/configure control plane functionality between the wireless device 210 and the base station 220 and/or, more generally, between the wireless device 210 and the RAN (e.g., the base station 220). The RRC layers 216 and 226 may provide/configure control plane functionality between the wireless device 210 and the base station 220 via signaling messages, which may be referred to as RRC messages. The RRC messages may be sent/transmitted between the wireless device 210 and the RAN (e.g., the base station 220) using signaling radio bearers and the same/similar PDCP, RLC, MAC, and PHY protocol layers. The MAC layer may multiplex control-plane and user-plane data into the same TB. The RRC layers 216 and 226 may provide/configure control plane functionality, such as one or more of the following functionalities: broadcast of system information related to AS and NAS; paging initiated by the CN or the RAN; establishment, maintenance and release of an RRC connection between the wireless device 210 and the RAN (e.g., the base station 220); security functions including key management; establishment, configuration, maintenance and release of signaling radio bearers and data radio bearers; mobility functions; QoS management functions; wireless device measurement reporting (e.g., the wireless device measurement reporting) and control of the reporting; detection of and recovery from radio link failure (RLF); and/or NAS message transfer. As part of establishing an RRC connection, RRC layers 216 and 226 may establish an RRC context, which may involve configuring parameters for communication between the wireless device 210 and the RAN (e.g., the base station 220).

Figure 6:
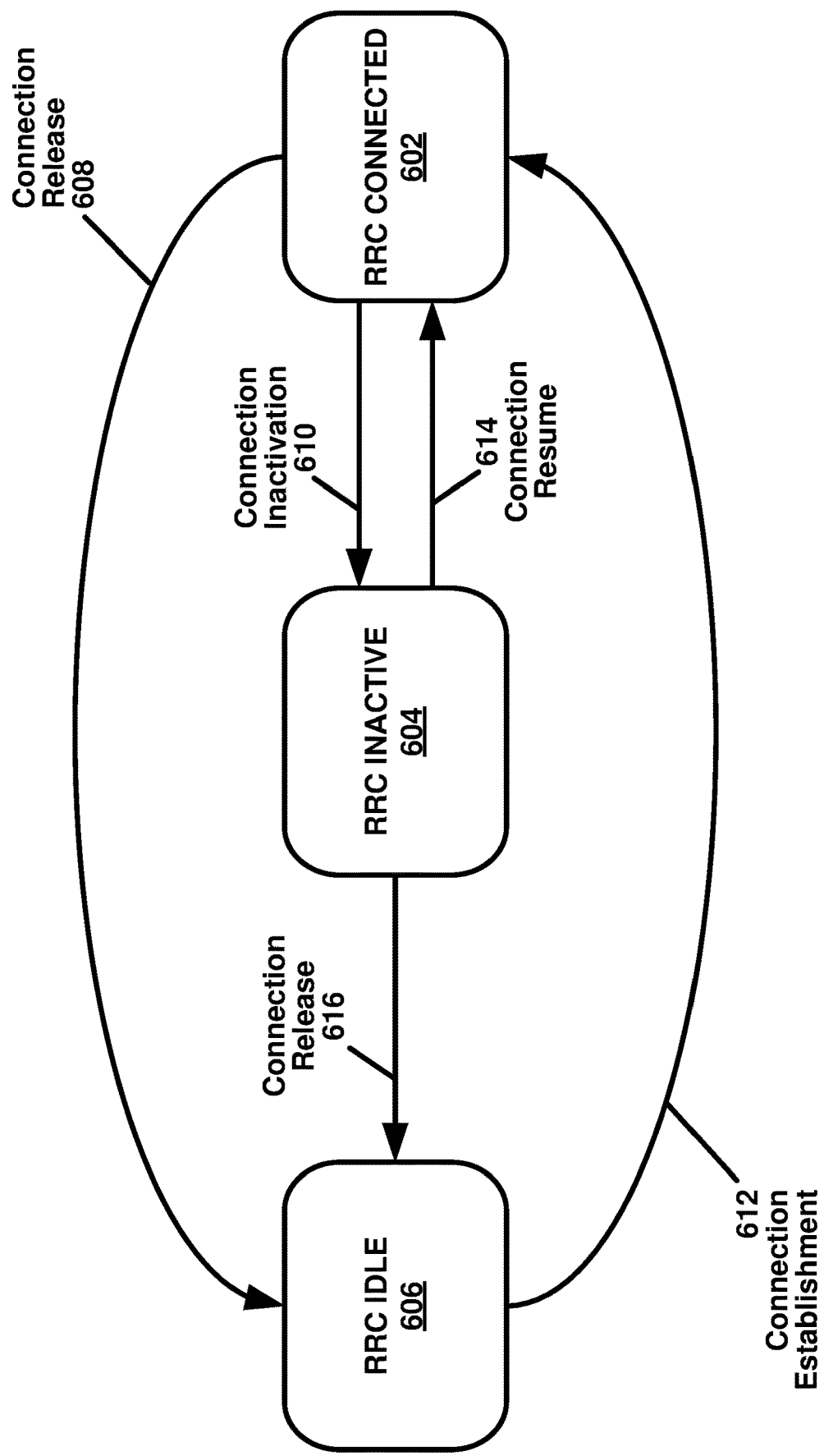
FIG. 6 shows example radio resource control (RRC) states and RRC state transitions.

FIG. 6 shows example RRC states and RRC state transitions. An RRC state of a wireless device may be changed to another RRC state (e.g., RRC state transitions of a wireless device). The wireless device may be substantially the same or similar to the wireless device 106, 210, or any other wireless device. A wireless device may be in at least one of a plurality of states, such as three RRC states comprising RRC connected 602 (e.g., RRC_CONNECTED), RRC idle 606 (e.g., RRC_IDLE), and RRC inactive 604 (e.g., RRC_INACTIVE). The RRC inactive 604 may be RRC connected but inactive.

An RRC connection may be established for the wireless device. For example, this may be during an RRC connected state. During the RRC connected state (e.g., during the RRC connected 602), the wireless device may have an established RRC context and may have at least one RRC connection with a base station. The base station may be similar to one of the one or more base stations (e.g., one or more base stations of the RAN 104 shown in FIG. 1A, one of the gNBs 160 or ng-eNBs 162 shown in FIG. 1B, the base station 220 shown in FIG. 2A and FIG. 2B, or any other base stations). The base station with which the wireless device is connected (e.g., has established an RRC connection) may have the RRC context for the wireless device. The RRC context, which may be referred to as a wireless device context (e.g., the UE context), may comprise parameters for communication between the wireless device and the base station. These parameters may comprise, for example, one or more of: AS contexts; radio link configuration parameters; bearer configuration information (e.g., relating to a data radio bearer, a signaling radio bearer, a logical channel, a QoS flow, and/or a PDU session); security information; and/or layer configuration information (e.g., PHY, MAC, RLC, PDCP, and/or SDAP layer configuration information). During the RRC connected state (e.g., the RRC connected 602), mobility of the wireless device may be managed/controlled by an RAN (e.g., the RAN 104 or the NG RAN 154). The wireless device may measure received signal levels (e.g., reference signal levels, reference signal received power, reference signal received quality, received signal strength indicator, etc.) based on one or more signals sent from a serving cell and neighboring cells. The wireless device may report these measurements to a serving base station (e.g., the base station currently serving the wireless device). The serving base station of the wireless device may request a handover to a cell of one of the neighboring base stations, for example, based on the reported measurements. The RRC state may transition from the RRC connected state (e.g., RRC connected 602) to an RRC idle state (e.g., the RRC idle 606) via a connection release procedure 608. The RRC state may transition from the RRC connected state (e.g., RRC connected 602) to the RRC inactive state (e.g., RRC inactive 604) via a connection inactivation procedure 610.

An RRC context may not be established for the wireless device. For example, this may be during the RRC idle state. During the RRC idle state (e.g., the RRC idle 606), an RRC context may not be established for the wireless device. During the RRC idle state (e.g., the RRC idle 606), the wireless device may not have an RRC connection with the base station. During the RRC idle state (e.g., the RRC idle 606), the wireless device may be in a sleep state for the majority of the time (e.g., to conserve battery power). The wireless device may wake up periodically (e.g., each discontinuous reception (DRX) cycle) to monitor for paging messages (e.g., paging messages set from the RAN). Mobility of the wireless device may be managed by the wireless device via a procedure of a cell reselection. The RRC state may transition from the RRC idle state (e.g., the RRC idle 606) to the RRC connected state (e.g., the RRC connected 602) via a connection establishment procedure 612, which may involve a random access procedure.

A previously established RRC context may be maintained for the wireless device. For example, this may be during the RRC inactive state. During the RRC inactive state (e.g., the RRC inactive 604), the RRC context previously established may be maintained in the wireless device and the base station. The maintenance of the RRC context may enable/allow a fast transition to the RRC connected state (e.g., the RRC connected 602) with reduced signaling overhead as compared to the transition from the RRC idle state (e.g., the RRC idle 606) to the RRC connected state (e.g., the RRC connected 602). During the RRC inactive state (e.g., the RRC inactive 604), the wireless device may be in a sleep state and mobility of the wireless device may be managed/controlled by the wireless device via a cell reselection. The RRC state may transition from the RRC inactive state (e.g., the RRC inactive 604) to the RRC connected state (e.g., the RRC connected 602) via a connection resume procedure 614. The RRC state may transition from the RRC inactive state (e.g., the RRC inactive 604) to the RRC idle state (e.g., the RRC idle 606) via a connection release procedure 616 that may be the same as or similar to connection release procedure 608.

An RRC state may be associated with a mobility management mechanism. During the RRC idle state (e.g., RRC idle 606) and the RRC inactive state (e.g., the RRC inactive 604), mobility may be managed/controlled by the wireless device via a cell reselection. The purpose of mobility management during the RRC idle state (e.g., the RRC idle 606) or during the RRC inactive state (e.g., the RRC inactive 604) may be to enable/allow the network to be able to notify the wireless device of an event via a paging message without having to broadcast the paging message over the entire mobile communications network. The mobility management mechanism used during the RRC idle state (e.g., the RRC idle 606) or during the RRC idle state (e.g., the RRC inactive 604) may enable/allow the network to track the wireless device on a cell-group level, for example, so that the paging message may be broadcast over the cells of the cell group that the wireless device currently resides within (e.g. instead of sending the paging message over the entire mobile communication network). The mobility management mechanisms for the RRC idle state (e.g., the RRC idle 606) and the RRC inactive state (e.g., the RRC inactive 604) may track the wireless device on a cell-group level. The mobility management mechanisms may do the tracking, for example, using different granularities of grouping. There may be a plurality of levels of cell-grouping granularity (e.g., three levels of cell-grouping granularity: individual cells; cells within a RAN area identified by a RAN area identifier (RAI); and cells within a group of RAN areas, referred to as a tracking area and identified by a tracking area identifier (TAI)).

Tracking areas may be used to track the wireless device (e.g., tracking the location of the wireless device at the CN level). The CN (e.g., the CN 102, the 5G CN 152, or any other CN) may send to the wireless device a list of TAIs associated with a wireless device registration area (e.g., a UE registration area). A wireless device may perform a registration update with the CN to allow the CN to update the location of the wireless device and provide the wireless device with a new the UE registration area, for example, if the wireless device moves (e.g., via a cell reselection) to a cell associated with a TAI that may not be included in the list of TAIs associated with the UE registration area.

RAN areas may be used to track the wireless device (e.g., the location of the wireless device at the RAN level). For a wireless device in an RRC inactive state (e.g., the RRC inactive 604), the wireless device may be assigned/provided/configured with a RAN notification area. A RAN notification area may comprise one or more cell identities (e.g., a list of RAIs and/or a list of TAIs). A base station may belong to one or more RAN notification areas. A cell may belong to one or more RAN notification areas. A wireless device may perform a notification area update with the RAN to update the RAN notification area of the wireless device, for example, if the wireless device moves (e.g., via a cell reselection) to a cell not included in the RAN notification area assigned/provided/configured to the wireless device.

A base station storing an RRC context for a wireless device or a last serving base station of the wireless device may be referred to as an anchor base station. An anchor base station may maintain an RRC context for the wireless device at least during a period of time that the wireless device stays in a RAN notification area of the anchor base station and/or during a period of time that the wireless device stays in an RRC inactive state (e.g., RRC inactive 604).

A base station (e.g., gNBs 160 in FIG. 1B or any other base station) may be split in two parts: a central unit (e.g., a base station central unit, such as a gNB CU) and one or more distributed units (e.g., a base station distributed unit, such as a gNB DU). A base station central unit (CU) may be coupled to one or more base station distributed units (DUs) using an F1 interface (e.g., an F1 interface defined in an NR configuration). The base station CU may comprise the RRC, the PDCP, and the SDAP layers. A base station distributed unit (DU) may comprise the RLC, the MAC, and the PHY layers.

The physical signals and physical channels (e.g., described with respect to FIG. 5A and FIG. 5B) may be mapped onto one or more symbols (e.g., orthogonal frequency divisional multiplexing (OFDM) symbols in an NR configuration or any other symbols). OFDM is a multicarrier communication scheme that sends/transmits data over F orthogonal subcarriers (or tones). The data may be mapped to a series of complex symbols (e.g., M-quadrature amplitude modulation (M-QAM) symbols or M-phase shift keying (M PSK) symbols or any other modulated symbols), referred to as source symbols, and divided into F parallel symbol streams, for example, before transmission of the data. The F parallel symbol streams may be treated as if they are in the frequency domain. The F parallel symbols may be used as inputs to an Inverse Fast Fourier Transform (IFFT) block that transforms them into the time domain. The IFFT block may take in F source symbols at a time, one from each of the F parallel symbol streams. The IFFT block may use each source symbol to modulate the amplitude and phase of one of F sinusoidal basis functions that correspond to the F orthogonal subcarriers. The output of the IFFT block may be F time-domain samples that represent the summation of the F orthogonal subcarriers. The F time-domain samples may form a single OFDM symbol. An OFDM symbol provided/output by the IFFT block may be sent/transmitted over the air interface on a carrier frequency, for example, after one or more processes (e.g., addition of a cyclic prefix) and up-conversion. The F parallel symbol streams may be mixed, for example, using a Fast Fourier Transform (FFT) block before being processed by the IFFT block. This operation may produce Discrete Fourier Transform (DFT)-precoded OFDM symbols and may be used by one or more wireless devices in the uplink to reduce the peak to average power ratio (PAPR). Inverse processing may be performed on the OFDM symbol at a receiver using an FFT block to recover the data mapped to the source symbols.

Figure 7:
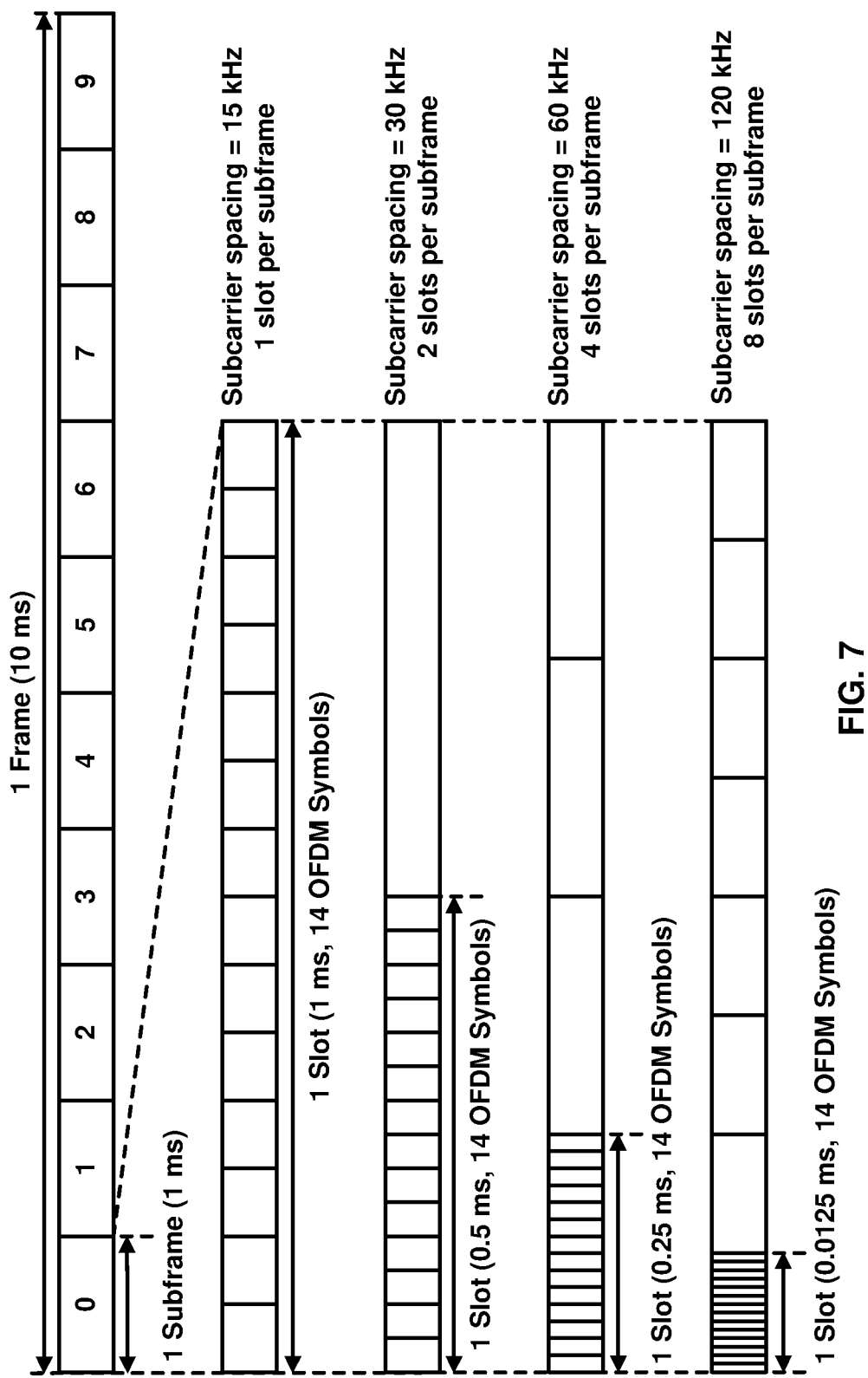
FIG. 7 shows an example configuration of a frame.

FIG. 7 shows an example configuration of a frame. The frame may comprise, for example, an NR radio frame into which OFDM symbols may be grouped. A frame (e.g., an NR radio frame) may be identified/indicated by a system frame number (SFN) or any other value. The SFN may repeat with a period of 1024 frames. One NR frame may be 10 milliseconds (ms) in duration and may comprise 10 subframes that are 1 ms in duration. A subframe may be divided into one or more slots (e.g., depending on numerologies and/or different subcarrier spacings). Each of the one or more slots may comprise, for example, 14 OFDM symbols per slot. Any quantity of symbols, slots, or duration may be used for any time interval.

The duration of a slot may depend on the numerology used for the OFDM symbols of the slot. A flexible numerology may be supported, for example, to accommodate different deployments (e.g., cells with carrier frequencies below 1 GHz up to cells with carrier frequencies in the mm-wave range). A flexible numerology may be supported, for example, in an NR configuration or any other radio configurations. A numerology may be defined in terms of subcarrier spacing and/or cyclic prefix duration. Subcarrier spacings may be scaled up by powers of two from a baseline subcarrier spacing of 15 kHz. Cyclic prefix durations may be scaled down by powers of two from a baseline cyclic prefix duration of 4.7 µs, for example, for a numerology in an NR configuration or any other radio configurations. Numerologies may be defined with the following subcarrier spacing/cyclic prefix duration combinations: 15 kHz/4.7 µs; 30 kHz/2.3 µs; 60 kHz/1.2 µs; 120 kHz/0.59 µs; 240 kHz/0.29 µs, and/or any other subcarrier spacing/cyclic prefix duration combinations.

A slot may have a fixed number/quantity of OFDM symbols (e.g., 14 OFDM symbols). A numerology with a higher subcarrier spacing may have a shorter slot duration and more slots per subframe. Examples of numerology-dependent slot duration and slots-per-subframe transmission structure are shown in FIG. 7 (the numerology with a subcarrier spacing of 240 kHz is not shown in FIG. 7). A subframe (e.g., in an NR configuration) may be used as a numerology-independent time reference. A slot may be used as the unit upon which uplink and downlink transmissions are scheduled. Scheduling (e.g., in an NR configuration) may be decoupled from the slot duration. Scheduling may start at any OFDM symbol. Scheduling may last for as many symbols as needed for a transmission, for example, to support low latency. These partial slot transmissions may be referred to as mini-slot or sub-slot transmissions.

Figure 8:
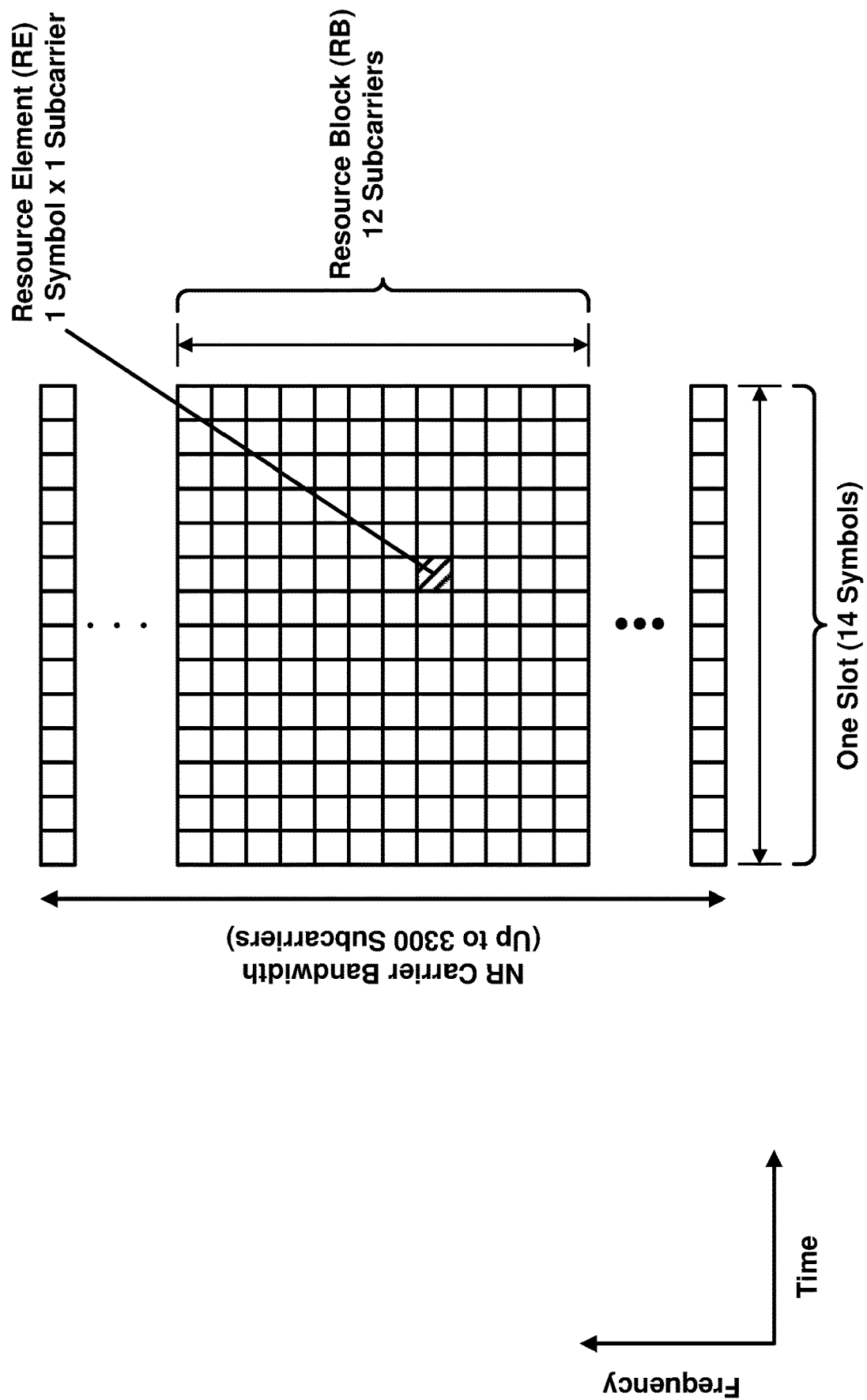
FIG. 8 shows an example resource configuration of one or more carriers.

FIG. 8 shows an example resource configuration of one or more carriers. The resource configuration of may comprise a slot in the time and frequency domain for an NR carrier or any other carrier. The slot may comprise resource elements (REs) and resource blocks (RBs). A resource element (RE) may be the smallest physical resource (e.g., in an NR configuration). An RE may span one OFDM symbol in the time domain by one subcarrier in the frequency domain, such as shown in FIG. 8. An RB may span twelve consecutive REs in the frequency domain, such as shown in FIG. 8. A carrier (e.g., an NR carrier) may be limited to a width of a certain quantity of RBs and/or subcarriers (e.g., 275 RBs or 275×12=3300 subcarriers). Such limitation(s), if used, may limit the carrier (e.g., NR carrier) frequency based on subcarrier spacing (e.g., carrier frequency of 50, 100, 200, and 400 MHz for subcarrier spacings of 15, 30, 60, and 120 kHz, respectively). A 400 MHz bandwidth may be set based on a 400 MHz per carrier bandwidth limit. Any other bandwidth may be set based on a per carrier bandwidth limit.

A single numerology may be used across the entire bandwidth of a carrier (e.g., an NR such as shown in FIG. 8). In other example configurations, multiple numerologies may be supported on the same carrier. NR and/or other access technologies may support wide carrier bandwidths (e.g., up to 400 MHz for a subcarrier spacing of 120 kHz). Not all wireless devices may be able to receive the full carrier bandwidth (e.g., due to hardware limitations and/or different wireless device capabilities). Receiving and/or utilizing the full carrier bandwidth may be prohibitive, for example, in terms of wireless device power consumption. A wireless device may adapt the size of the receive bandwidth of the wireless device, for example, based on the amount of traffic the wireless device is scheduled to receive (e.g., to reduce power consumption and/or for other purposes). Such an adaptation may be referred to as bandwidth adaptation.

Configuration of one or more bandwidth parts (BWPs) may support one or more wireless devices not capable of receiving the full carrier bandwidth. BWPs may support bandwidth adaptation, for example, for such wireless devices not capable of receiving the full carrier bandwidth. A BWP (e.g., a BWP of an NR configuration) may be defined by a subset of contiguous RBs on a carrier. A wireless device may be configured (e.g., via an RRC layer) with one or more downlink BWPs per serving cell and one or more uplink BWPs per serving cell (e.g., up to four downlink BWPs per serving cell and up to four uplink BWPs per serving cell). One or more of the configured BWPs for a serving cell may be active, for example, at a given time. The one or more BWPs may be referred to as active BWPs of the serving cell. A serving cell may have one or more first active BWPs in the uplink carrier and one or more second active BWPs in the secondary uplink carrier, for example, if the serving cell is configured with a secondary uplink carrier.

A downlink BWP from a set of configured downlink BWPs may be linked with an uplink BWP from a set of configured uplink BWPs (e.g., for unpaired spectra). A downlink BWP and an uplink BWP may be linked, for example, if a downlink BWP index of the downlink BWP and an uplink BWP index of the uplink BWP are the same. A wireless device may expect that the center frequency for a downlink BWP is the same as the center frequency for an uplink BWP (e.g., for unpaired spectra).

A base station may configure a wireless device with one or more control resource sets (CORESETs) for at least one search space. The base station may configure the wireless device with one or more CORESETS, for example, for a downlink BWP in a set of configured downlink BWPs on a primary cell (PCell) or on a secondary cell (SCell). A search space may comprise a set of locations in the time and frequency domains where the wireless device may monitor/find/detect/identify control information. The search space may be a wireless device-specific search space (e.g., a UE-specific search space) or a common search space (e.g., potentially usable by a plurality of wireless devices or a group of wireless user devices). A base station may configure a group of wireless devices with a common search space, on a PCell or on a primary secondary cell (PSCell), in an active downlink BWP.

A base station may configure a wireless device with one or more resource sets for one or more PUCCH transmissions, for example, for an uplink BWP in a set of configured uplink BWPs. A wireless device may receive downlink receptions (e.g., PDCCH or PDSCH) in a downlink BWP, for example, according to a configured numerology (e.g., a configured subcarrier spacing and/or a configured cyclic prefix duration) for the downlink BWP. The wireless device may send/transmit uplink transmissions (e.g., PUCCH or PUSCH) in an uplink BWP, for example, according to a configured numerology (e.g., a configured subcarrier spacing and/or a configured cyclic prefix length for the uplink BWP).

One or more BWP indicator fields may be provided/comprised in Downlink Control Information (DCI). A value of a BWP indicator field may indicate which BWP in a set of configured BWPs is an active downlink BWP for one or more downlink receptions. The value of the one or more BWP indicator fields may indicate an active uplink BWP for one or more uplink transmissions.

A base station may semi-statically configure a wireless device with a default downlink BWP within a set of configured downlink BWPs associated with a PCell. A default downlink BWP may be an initial active downlink BWP, for example, if the base station does not provide/configure a default downlink BWP to/for the wireless device. The wireless device may determine which BWP is the initial active downlink BWP, for example, based on a CORESET configuration obtained using the PBCH.

A base station may configure a wireless device with a BWP inactivity timer value for a PCell. The wireless device may start or restart a BWP inactivity timer at any appropriate time. The wireless device may start or restart the BWP inactivity timer, for example, if one or more conditions are satisfied. The one or more conditions may comprise at least one of: the wireless device detects DCI indicating an active downlink BWP other than a default downlink BWP for a paired spectra operation; the wireless device detects DCI indicating an active downlink BWP other than a default downlink BWP for an unpaired spectra operation; and/or the wireless device detects DCI indicating an active uplink BWP other than a default uplink BWP for an unpaired spectra operation. The wireless device may start/run the BWP inactivity timer toward expiration (e.g., increment from zero to the BWP inactivity timer value, or decrement from the BWP inactivity timer value to zero), for example, if the wireless device does not detect DCI during a time interval (e.g., 1 ms or 0.5 ms). The wireless device may switch from the active downlink BWP to the default downlink BWP, for example, if the BWP inactivity timer expires.

A base station may semi-statically configure a wireless device with one or more BWPs. A wireless device may switch an active BWP from a first BWP to a second BWP, for example, after (e.g., based on or in response to) receiving DCI indicating the second BWP as an active BWP. A wireless device may switch an active BWP from a first BWP to a second BWP, for example, after (e.g., based on or in response to) an expiry of the BWP inactivity timer (e.g., if the second BWP is the default BWP).

A downlink BWP switching may refer to switching an active downlink BWP from a first downlink BWP to a second downlink BWP (e.g., the second downlink BWP is activated and the first downlink BWP is deactivated). An uplink BWP switching may refer to switching an active uplink BWP from a first uplink BWP to a second uplink BWP (e.g., the second uplink BWP is activated and the first uplink BWP is deactivated). Downlink and uplink BWP switching may be performed independently (e.g., in paired spectrum/spectra). Downlink and uplink BWP switching may be performed simultaneously (e.g., in unpaired spectrum/spectra). Switching between configured BWPs may occur, for example, based on RRC signaling, DCI signaling, expiration of a BWP inactivity timer, and/or an initiation of random access.

Figure 9:
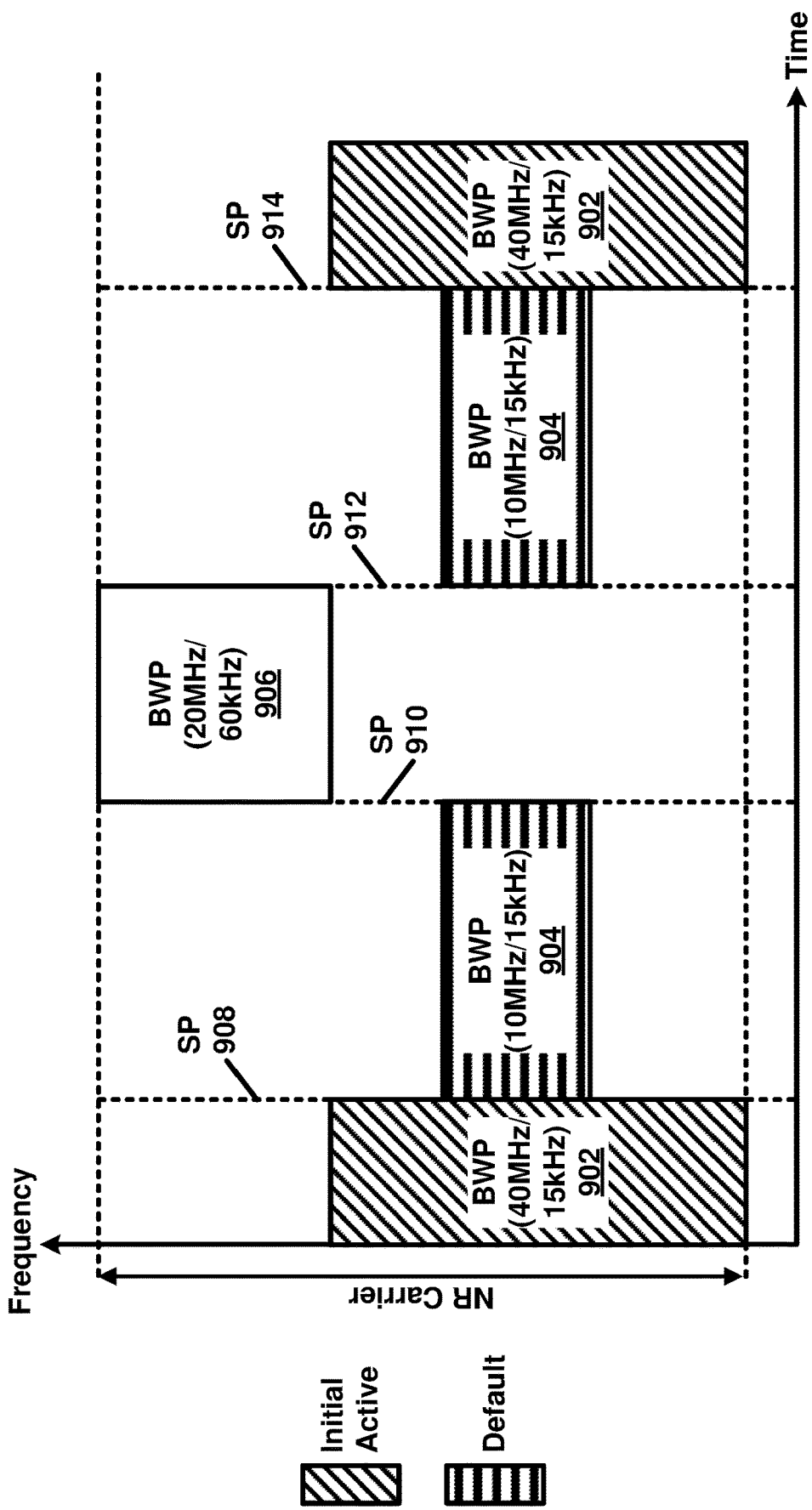
FIG. 9 shows an example configuration of bandwidth parts (BWPs).

FIG. 9 shows an example of configured BWPs. Bandwidth adaptation using multiple BWPs (e.g., three configured BWPs for an NR carrier) may be available. A wireless device configured with multiple BWPs (e.g., the three BWPs) may switch from one BWP to another BWP at a switching point. The BWPs may comprise: a BWP 902 having a bandwidth of 40 MHz and a subcarrier spacing of 15 kHz; a BWP 904 having a bandwidth of 10 MHz and a subcarrier spacing of 15 kHz; and a BWP 906 having a bandwidth of 20 MHz and a subcarrier spacing of 60 kHz. The BWP 902 may be an initial active BWP, and the BWP 904 may be a default BWP. The wireless device may switch between BWPs at switching points. The wireless device may switch from the BWP 902 to the BWP 904 at a switching point 908. The switching at the switching point 908 may occur for any suitable reasons. The switching at a switching point 908 may occur, for example, after (e.g., based on or in response to) an expiry of a BWP inactivity timer (e.g., indicating switching to the default BWP). The switching at the switching point 908 may occur, for example, after (e.g., based on or in response to) receiving DCI indicating BWP 904 as the active BWP. The wireless device may switch at a switching point 910 from an active BWP 904 to the BWP 906, for example, after or in response receiving DCI indicating BWP 906 as a new active BWP. The wireless device may switch at a switching point 912 from an active BWP 906 to the BWP 904, for example, after (e.g., based on or in response to) an expiry of a BWP inactivity timer. The wireless device may switch at the switching point 912 from an active BWP 906 to the BWP 904, for example, after or in response receiving DCI indicating BWP 904 as a new active BWP. The wireless device may switch at a switching point 914 from an active BWP 904 to the BWP 902, for example, after or in response receiving DCI indicating the BWP 902 as a new active BWP.

Wireless device procedures for switching BWPs on a secondary cell may be the same/similar as those on a primary cell, for example, if the wireless device is configured for a secondary cell with a default downlink BWP in a set of configured downlink BWPs and a timer value. The wireless device may use the timer value and the default downlink BWP for the secondary cell in the same/similar manner as the wireless device uses the timer value and/or default BWPs for a primary cell. The timer value (e.g., the BWP inactivity timer) may be configured per cell (e.g., for one or more BWPs), for example, via RRC signaling or any other signaling. One or more active BWPs may switch to another BWP, for example, based on an expiration of the BWP inactivity timer.

Figure 10A:
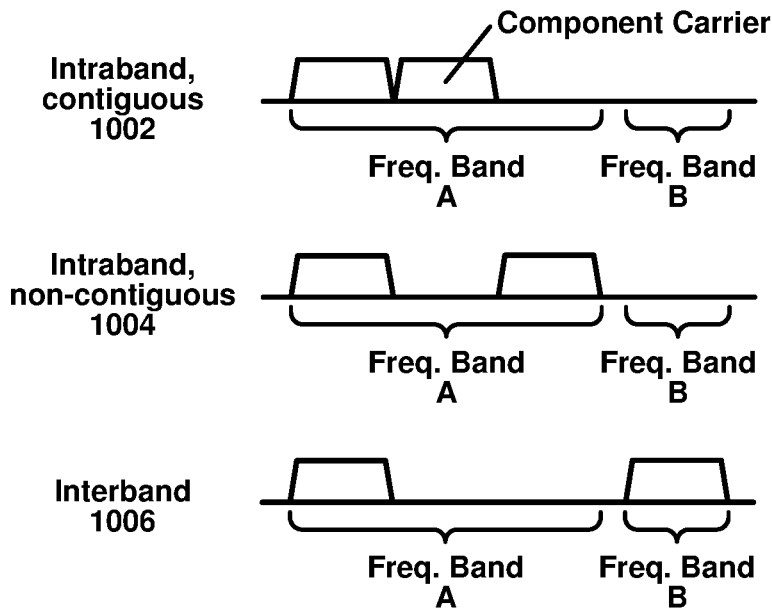
FIG. 10A shows example carrier aggregation configurations based on component carriers.

Two or more carriers may be aggregated and data may be simultaneously sent/transmitted to/from the same wireless device using carrier aggregation (CA) (e.g., to increase data rates). The aggregated carriers in CA may be referred to as component carriers (CCs). There may be a number/quantity of serving cells for the wireless device (e.g., one serving cell for a CC), for example, if CA is configured/used. The CCs may have multiple configurations in the frequency domain. FIG. 10A shows example CA configurations based on CCs. As shown in FIG. 10A, three types of CA configurations may comprise an intraband (contiguous) configuration 1002, an intraband (non-contiguous) configuration 1004, and/or an interband configuration 1006. In the intraband (contiguous) configuration 1002, two CCs may be aggregated in the same frequency band (frequency band A) and may be located directly adjacent to each other within the frequency band. In the intraband (non-contiguous) configuration 1004, two CCs may be aggregated in the same frequency band (frequency band A) but may be separated from each other in the frequency band by a gap. In the interband configuration 1006, two CCs may be located in different frequency bands (e.g., frequency band A and frequency band B, respectively).

A network may set the maximum quantity of CCs that can be aggregated (e.g., up to 32 CCs may be aggregated in NR, or any other quantity may be aggregated in other systems). The aggregated CCs may have the same or different bandwidths, subcarrier spacing, and/or duplexing schemes (TDD, FDD, or any other duplexing schemes). A serving cell for a wireless device using CA may have a downlink CC. One or more uplink CCs may be optionally configured for a serving cell (e.g., for FDD). The ability to aggregate more downlink carriers than uplink carriers may be useful, for example, if the wireless device has more data traffic in the downlink than in the uplink.

One of the aggregated cells for a wireless device may be referred to as a primary cell (PCell), for example, if a CA is configured. The PCell may be the serving cell that the wireless initially connects to or access to, for example, during or at an RRC connection establishment, an RRC connection reestablishment, and/or a handover. The PCell may provide/configure the wireless device with NAS mobility information and the security input. Wireless device may have different PCells. For the downlink, the carrier corresponding to the PCell may be referred to as the downlink primary CC (DL PCC). For the uplink, the carrier corresponding to the PCell may be referred to as the uplink primary CC (UL PCC). The other aggregated cells (e.g., associated with CCs other than the DL PCC and UL PCC) for the wireless device may be referred to as secondary cells (SCells). The SCells may be configured, for example, after the PCell is configured for the wireless device. An SCell may be configured via an RRC connection reconfiguration procedure. For the downlink, the carrier corresponding to an SCell may be referred to as a downlink secondary CC (DL SCC). For the uplink, the carrier corresponding to the SCell may be referred to as the uplink secondary CC (UL SCC).

Configured SCells for a wireless device may be activated or deactivated, for example, based on traffic and channel conditions. Deactivation of an SCell may cause the wireless device to stop PDCCH and PDSCH reception on the SCell and PUSCH, SRS, and CQI transmissions on the SCell. Configured SCells may be activated or deactivated, for example, using a MAC CE (e.g., the MAC CE described with respect to FIG. 4B). A MAC CE may use a bitmap (e.g., one bit per SCell) to indicate which SCells (e.g., in a subset of configured SCells) for the wireless device are activated or deactivated. Configured SCells may be deactivated, for example, after (e.g., based on or in response to) an expiration of an SCell deactivation timer (e.g., one SCell deactivation timer per SCell may be configured).

DCI may comprise control information, such as scheduling assignments and scheduling grants, for a cell. DCI may be sent/transmitted via the cell corresponding to the scheduling assignments and/or scheduling grants, which may be referred to as a self-scheduling. DCI comprising control information for a cell may be sent/transmitted via another cell, which may be referred to as a cross-carrier scheduling.

Uplink control information (UCI) may comprise control information, such as HARQ acknowledgments and channel state feedback (e.g., CQI, PMI, and/or RI) for aggregated cells. UCI may be sent/transmitted via an uplink control channel (e.g., a PUCCH) of the PCell or a certain SCell (e.g., an SCell configured with PUCCH). For a larger number of aggregated downlink CCs, the PUCCH of the PCell may become overloaded. Cells may be divided into multiple PUCCH groups.

Figure 10B:
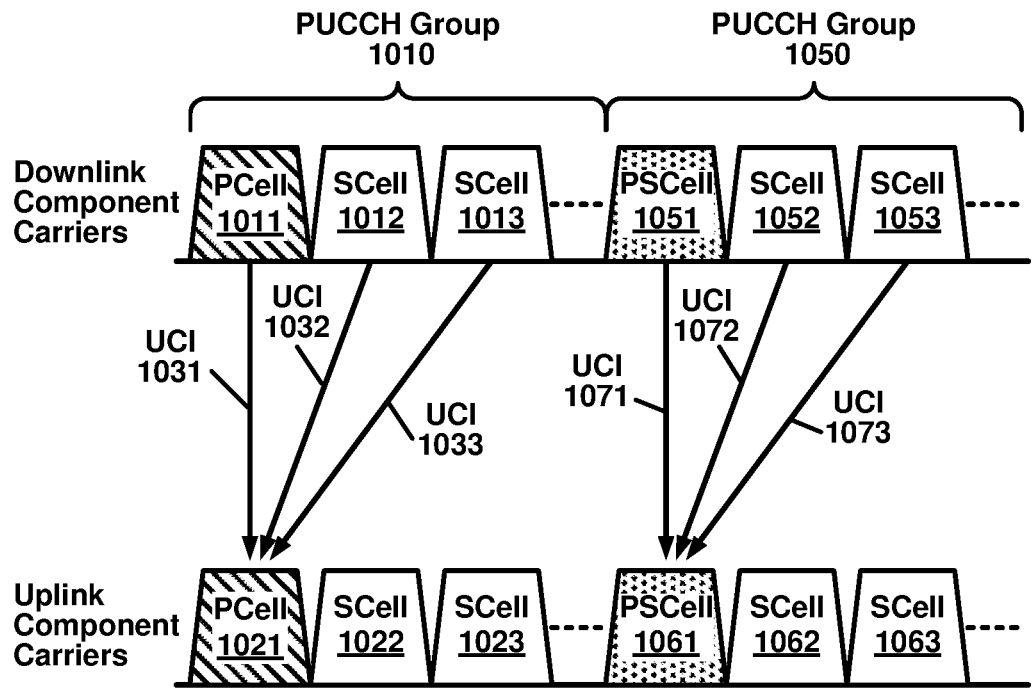
FIG. 10B shows example group of cells.

FIG. 10B shows example group of cells. Aggregated cells may be configured into one or more PUCCH groups (e.g., as shown in FIG. 10B). One or more cell groups or one or more uplink control channel groups (e.g., a PUCCH group 1010 and a PUCCH group 1050) may comprise one or more downlink CCs, respectively. The PUCCH group 1010 may comprise one or more downlink CCs, for example, three downlink CCs: a PCell 1011 (e.g., a DL PCC), an SCell 1012 (e.g., a DL SCC), and an SCell 1013 (e.g., a DL SCC). The PUCCH group 1050 may comprise one or more downlink CCs, for example, three downlink CCs: a PUCCH SCell (or PSCell) 1051 (e.g., a DL SCC), an SCell 1052 (e.g., a DL SCC), and an SCell 1053 (e.g., a DL SCC). One or more uplink CCs of the PUCCH group 1010 may be configured as a PCell 1021 (e.g., a UL PCC), an SCell 1022 (e.g., a UL SCC), and an SCell 1023 (e.g., a UL SCC). One or more uplink CCs of the PUCCH group 1050 may be configured as a PUCCH SCell (or PSCell) 1061 (e.g., a UL SCC), an SCell 1062 (e.g., a UL SCC), and an SCell 1063 (e.g., a UL SCC). UCI related to the downlink CCs of the PUCCH group 1010, shown as UCI 1031, UCI 1032, and UCI 1033, may be sent/transmitted via the uplink of the PCell 1021 (e.g., via the PUCCH of the PCell 1021). UCI related to the downlink CCs of the PUCCH group 1050, shown as UCI 1071, UCI 1072, and UCI 1073, may be sent/transmitted via the uplink of the PUCCH SCell (or PSCell) 1061 (e.g., via the PUCCH of the PUCCH SCell 1061). A single uplink PCell may be configured to send/transmit UCI relating to the six downlink CCs, for example, if the aggregated cells shown in FIG. 10B are not divided into the PUCCH group 1010 and the PUCCH group 1050. The PCell 1021 may become overloaded, for example, if the UCIs 1031, 1032, 1033, 1071, 1072, and 1073 are sent/transmitted via the PCell 1021. By dividing transmissions of UCI between the PCell 1021 and the PUCCH SCell (or PSCell) 1061, overloading may be prevented and/or reduced.

A PCell may comprise a downlink carrier (e.g., the PCell 1011) and an uplink carrier (e.g., the PCell 1021). An SCell may comprise only a downlink carrier. A cell, comprising a downlink carrier and optionally an uplink carrier, may be assigned with a physical cell ID and a cell index. The physical cell ID or the cell index may indicate/identify a downlink carrier and/or an uplink carrier of the cell, for example, depending on the context in which the physical cell ID is used. A physical cell ID may be determined, for example, using a synchronization signal (e.g., PSS and/or SSS) sent/transmitted via a downlink component carrier. A cell index may be determined, for example, using one or more RRC messages. A physical cell ID may be referred to as a carrier ID, and a cell index may be referred to as a carrier index. A first physical cell ID for a first downlink carrier may refer to the first physical cell ID for a cell comprising the first downlink carrier. Substantially the same/similar concept may apply to, for example, a carrier activation. Activation of a first carrier may refer to activation of a cell comprising the first carrier.

A multi-carrier nature of a PHY layer may be exposed/indicated to a MAC layer (e.g., in a CA configuration). A HARQ entity may operate on a serving cell. A transport block may be generated per assignment/grant per serving cell. A transport block and potential HARQ retransmissions of the transport block may be mapped to a serving cell.

For the downlink, a base station may send/transmit (e.g., unicast, multicast, and/or broadcast), to one or more wireless devices, one or more reference signals (RSs) (e.g., PSS, SSS, CSI-RS, DM-RS, and/or PT-RS). For the uplink, the one or more wireless devices may send/transmit one or more RSs to the base station (e.g., DM-RS, PT-RS, and/or SRS). The PSS and the SSS may be sent/transmitted by the base station and used by the one or more wireless devices to synchronize the one or more wireless devices with the base station. A synchronization signal (SS)/physical broadcast channel (PBCH) block may comprise the PSS, the SSS, and the PBCH. The base station may periodically send/transmit a burst of SS/PBCH blocks, which may be referred to as SSBs.

Figure 11A:
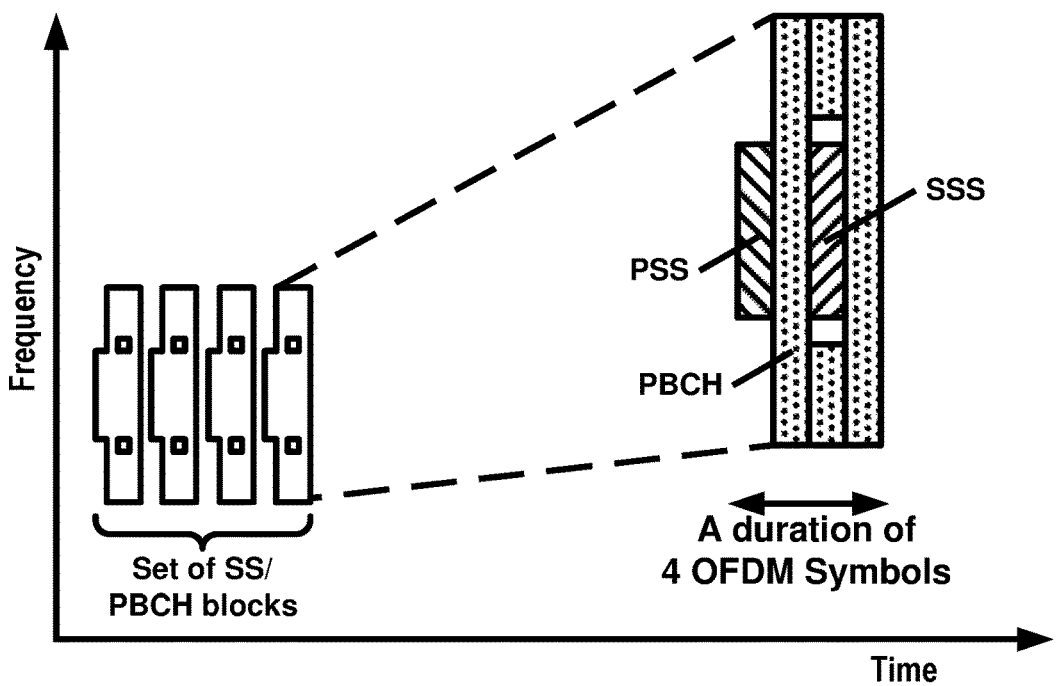
FIG. 11A shows an example mapping of one or more synchronization signal/physical broadcast channel (SS/PBCH) blocks.

FIG. 11A shows an example mapping of one or more SS/PBCH blocks. A burst of SS/PBCH blocks may comprise one or more SS/PBCH blocks (e.g., 4 SS/PBCH blocks, as shown in FIG. 11A). Bursts may be sent/transmitted periodically (e.g., every 2 frames, 20 ms, or any other durations). A burst may be restricted to a half-frame (e.g., a first half-frame having a duration of 5 ms). Such parameters (e.g., the number of SS/PBCH blocks per burst, periodicity of bursts, position of the burst within the frame) may be configured, for example, based on at least one of: a carrier frequency of a cell in which the SS/PBCH block is sent/transmitted; a numerology or subcarrier spacing of the cell; a configuration by the network (e.g., using RRC signaling); and/or any other suitable factor(s). A wireless device may assume a subcarrier spacing for the SS/PBCH block based on the carrier frequency being monitored, for example, unless the radio network configured the wireless device to assume a different subcarrier spacing.

The SS/PBCH block may span one or more OFDM symbols in the time domain (e.g., 4 OFDM symbols, as shown in FIG. 11A or any other quantity/number of symbols) and may span one or more subcarriers in the frequency domain (e.g., 240 contiguous subcarriers or any other quantity/number of subcarriers). The PSS, the SSS, and the PBCH may have a common center frequency. The PSS may be sent/transmitted first and may span, for example, 1 OFDM symbol and 127 subcarriers. The SSS may be sent/transmitted after the PSS (e.g., two symbols later) and may span 1 OFDM symbol and 127 subcarriers. The PBCH may be sent/transmitted after the PSS (e.g., across the next 3 OFDM symbols) and may span 240 subcarriers (e.g., in the second and fourth OFDM symbols as shown in FIG. 11A) and/or may span fewer than 240 subcarriers (e.g., in the third OFDM symbols as shown in FIG. 11A).

The location of the SS/PBCH block in the time and frequency domains may not be known to the wireless device (e.g., if the wireless device is searching for the cell). The wireless device may monitor a carrier for the PSS, for example, to find and select the cell. The wireless device may monitor a frequency location within the carrier. The wireless device may search for the PSS at a different frequency location within the carrier, for example, if the PSS is not found after a certain duration (e.g., 20 ms). The wireless device may search for the PSS at a different frequency location within the carrier, for example, as indicated by a synchronization raster. The wireless device may determine the locations of the SSS and the PBCH, respectively, for example, based on a known structure of the SS/PBCH block if the PSS is found at a location in the time and frequency domains. The SS/PBCH block may be a cell-defining SS block (CD-SSB). A primary cell may be associated with a CD-SSB. The CD-SSB may be located on a synchronization raster. A cell selection/search and/or reselection may be based on the CD-SSB.

The SS/PBCH block may be used by the wireless device to determine one or more parameters of the cell. The wireless device may determine a physical cell identifier (PCI) of the cell, for example, based on the sequences of the PSS and the SSS, respectively. The wireless device may determine a location of a frame boundary of the cell, for example, based on the location of the SS/PBCH block. The SS/PBCH block may indicate that it has been sent/transmitted in accordance with a transmission pattern. An SS/PBCH block in the transmission pattern may be a known distance from the frame boundary (e.g., a predefined distance for a RAN configuration among one or more networks, one or more base stations, and one or more wireless devices).

The PBCH may use a QPSK modulation and/or forward error correction (FEC). The FEC may use polar coding. One or more symbols spanned by the PBCH may comprise/carry one or more DM-RSs for demodulation of the PBCH. The PBCH may comprise an indication of a current system frame number (SFN) of the cell and/or a SS/PBCH block timing index. These parameters may facilitate time synchronization of the wireless device to the base station. The PBCH may comprise a MIB used to send/transmit to the wireless device one or more parameters. The MIB may be used by the wireless device to locate remaining minimum system information (RMSI) associated with the cell. The RMSI may comprise a System Information Block Type 1 (SIB1). The SIB1 may comprise information for the wireless device to access the cell. The wireless device may use one or more parameters of the MIB to monitor a PDCCH, which may be used to schedule a PDSCH. The PDSCH may comprise the SIB1. The SIB1 may be decoded using parameters provided/comprised in the MIB. The PBCH may indicate an absence of SIB 1. The wireless device may be pointed to a frequency, for example, based on the PBCH indicating the absence of SIB1. The wireless device may search for an SS/PBCH block at the frequency to which the wireless device is pointed.

The wireless device may assume that one or more SS/PBCH blocks sent/transmitted with a same SS/PBCH block index are quasi co-located (QCLed) (e.g., having substantially the same/similar Doppler spread, Doppler shift, average gain, average delay, and/or spatial Rx parameters). The wireless device may not assume QCL for SS/PBCH block transmissions having different SS/PBCH block indices. SS/PBCH blocks (e.g., those within a half-frame) may be sent/transmitted in spatial directions (e.g., using different beams that span a coverage area of the cell). A first SS/PBCH block may be sent/transmitted in a first spatial direction using a first beam, a second SS/PBCH block may be sent/transmitted in a second spatial direction using a second beam, a third SS/PBCH block may be sent/transmitted in a third spatial direction using a third beam, a fourth SS/PBCH block may be sent/transmitted in a fourth spatial direction using a fourth beam, etc.

A base station may send/transmit a plurality of SS/PBCH blocks, for example, within a frequency span of a carrier. A first PCI of a first SS/PBCH block of the plurality of SS/PBCH blocks may be different from a second PCI of a second SS/PBCH block of the plurality of SS/PBCH blocks. The PCIs of SS/PBCH blocks sent/transmitted in different frequency locations may be different or substantially the same.

The CSI-RS may be sent/transmitted by the base station and used by the wireless device to acquire/obtain/determine channel state information (CSI). The base station may configure the wireless device with one or more CSI-RSs for channel estimation or any other suitable purpose. The base station may configure a wireless device with one or more of the same/similar CSI-RSs. The wireless device may measure the one or more CSI-RSs. The wireless device may estimate a downlink channel state and/or generate a CSI report, for example, based on the measuring of the one or more downlink CSI-RSs. The wireless device may send/transmit the CSI report to the base station (e.g., based on periodic CSI reporting, semi-persistent CSI reporting, and/or aperiodic CSI reporting). The base station may use feedback provided by the wireless device (e.g., the estimated downlink channel state) to perform a link adaptation.

The base station may semi-statically configure the wireless device with one or more CSI-RS resource sets. A CSI-RS resource may be associated with a location in the time and frequency domains and a periodicity. The base station may selectively activate and/or deactivate a CSI-RS resource. The base station may indicate to the wireless device that a CSI-RS resource in the CSI-RS resource set is activated and/or deactivated.

The base station may configure the wireless device to report CSI measurements. The base station may configure the wireless device to provide CSI reports periodically, aperiodically, or semi-persistently. For periodic CSI reporting, the wireless device may be configured with a timing and/or periodicity of a plurality of CSI reports. For aperiodic CSI reporting, the base station may request a CSI report. The base station may command the wireless device to measure a configured CSI-RS resource and provide a CSI report relating to the measurement(s). For semi-persistent CSI reporting, the base station may configure the wireless device to send/transmit periodically, and selectively activate or deactivate the periodic reporting (e.g., via one or more activation/deactivation MAC CEs and/or one or more DCIs). The base station may configure the wireless device with a CSI-RS resource set and CSI reports, for example, using RRC signaling.

The CSI-RS configuration may comprise one or more parameters indicating, for example, up to 32 antenna ports (or any other quantity of antenna ports). The wireless device may be configured to use/employ the same OFDM symbols for a downlink CSI-RS and a CORESET, for example, if the downlink CSI-RS and CORESET are spatially QCLed and resource elements associated with the downlink CSI-RS are outside of the physical resource blocks (PRBs) configured for the CORESET. The wireless device may be configured to use/employ the same OFDM symbols for a downlink CSI-RS and SS/PBCH blocks, for example, if the downlink CSI-RS and SS/PBCH blocks are spatially QCLed and resource elements associated with the downlink CSI-RS are outside of PRBs configured for the SS/PBCH blocks.

Downlink DM-RSs may be sent/transmitted by a base station and received/used by a wireless device for a channel estimation. The downlink DM-RSs may be used for coherent demodulation of one or more downlink physical channels (e.g., PDSCH). A network (e.g., an NR network) may support one or more variable and/or configurable DM-RS patterns for data demodulation. At least one downlink DM-RS configuration may support a front-loaded DM-RS pattern. A front-loaded DM-RS may be mapped over one or more OFDM symbols (e.g., one or two adjacent OFDM symbols). A base station may semi-statically configure the wireless device with a number/quantity (e.g. a maximum number/quantity) of front-loaded DM-RS symbols for a PDSCH. A DM-RS configuration may support one or more DM-RS ports. A DM-RS configuration may support up to eight orthogonal downlink DM-RS ports per wireless device (e.g., for single user-MIMO). A DM-RS configuration may support up to 4 orthogonal downlink DM-RS ports per wireless device (e.g., for multiuser-MIMO). A radio network may support (e.g., at least for CP-OFDM) a common DM-RS structure for downlink and uplink. A DM-RS location, a DM-RS pattern, and/or a scrambling sequence may be the same or different. The base station may send/transmit a downlink DM-RS and a corresponding PDSCH, for example, using the same precoding matrix. The wireless device may use the one or more downlink DM-RSs for coherent demodulation/channel estimation of the PDSCH.

A transmitter (e.g., a transmitter of a base station) may use a precoder matrices for a part of a transmission bandwidth. The transmitter may use a first precoder matrix for a first bandwidth and a second precoder matrix for a second bandwidth. The first precoder matrix and the second precoder matrix may be different, for example, based on the first bandwidth being different from the second bandwidth. The wireless device may assume that a same precoding matrix is used across a set of PRBs. The set of PRBs may be determined/indicated/identified/denoted as a precoding resource block group (PRG).

A PDSCH may comprise one or more layers. The wireless device may assume that at least one symbol with DM-RS is present on a layer of the one or more layers of the PDSCH. A higher layer may configure one or more DM-RSs for a PDSCH (e.g., up to 3 DM-RSs for the PDSCH). Downlink PT-RS may be sent/transmitted by a base station and used by a wireless device, for example, for a phase-noise compensation. Whether a downlink PT-RS is present or not may depend on an RRC configuration. The presence and/or the pattern of the downlink PT-RS may be configured on a wireless device-specific basis, for example, using a combination of RRC signaling and/or an association with one or more parameters used/employed for other purposes (e.g., modulation and coding scheme (MCS)), which may be indicated by DCI. A dynamic presence of a downlink PT-RS, if configured, may be associated with one or more DCI parameters comprising at least MCS. A network (e.g., an NR network) may support a plurality of PT-RS densities defined in the time and/or frequency domains. A frequency domain density (if configured/present) may be associated with at least one configuration of a scheduled bandwidth. The wireless device may assume a same precoding for a DM-RS port and a PT-RS port. The quantity/number of PT-RS ports may be fewer than the quantity/number of DM-RS ports in a scheduled resource. Downlink PT-RS may be configured/allocated/confined in the scheduled time/frequency duration for the wireless device. Downlink PT-RS may be sent/transmitted via symbols, for example, to facilitate a phase tracking at the receiver.

The wireless device may send/transmit an uplink DM-RS to a base station, for example, for a channel estimation. The base station may use the uplink DM-RS for coherent demodulation of one or more uplink physical channels. The wireless device may send/transmit an uplink DM-RS with a PUSCH and/or a PUCCH. The uplink DM-RS may span a range of frequencies that is similar to a range of frequencies associated with the corresponding physical channel. The base station may configure the wireless device with one or more uplink DM-RS configurations. At least one DM-RS configuration may support a front-loaded DM-RS pattern. The front-loaded DM-RS may be mapped over one or more OFDM symbols (e.g., one or two adjacent OFDM symbols). One or more uplink DM-RSs may be configured to send/transmit at one or more symbols of a PUSCH and/or a PUCCH. The base station may semi-statically configure the wireless device with a number/quantity (e.g. the maximum number/quantity) of front-loaded DM-RS symbols for the PUSCH and/or the PUCCH, which the wireless device may use to schedule a single-symbol DM-RS and/or a double-symbol DM-RS. A network (e.g., an NR network) may support (e.g., for cyclic prefix orthogonal frequency division multiplexing (CP-OFDM)) a common DM-RS structure for downlink and uplink. A DM-RS location, a DM-RS pattern, and/or a scrambling sequence for the DM-RS may be substantially the same or different.

A PUSCH may comprise one or more layers. A wireless device may send/transmit at least one symbol with DM-RS present on a layer of the one or more layers of the PUSCH. A higher layer may configure one or more DM-RSs (e.g., up to three DM-RSs) for the PUSCH. Uplink PT-RS (which may be used by a base station for a phase tracking and/or a phase-noise compensation) may or may not be present, for example, depending on an RRC configuration of the wireless device. The presence and/or the pattern of an uplink PT-RS may be configured on a wireless device-specific basis (e.g., a UE-specific basis), for example, by a combination of RRC signaling and/or one or more parameters configured/employed for other purposes (e.g., MCS), which may be indicated by DCI. A dynamic presence of an uplink PT-RS, if configured, may be associated with one or more DCI parameters comprising at least MCS. A radio network may support a plurality of uplink PT-RS densities defined in time/frequency domain. A frequency domain density (if configured/present) may be associated with at least one configuration of a scheduled bandwidth. The wireless device may assume a same precoding for a DM-RS port and a PT-RS port. A quantity/number of PT-RS ports may be less than a quantity/number of DM-RS ports in a scheduled resource. An uplink PT-RS may be configured/allocated/confined in the scheduled time/frequency duration for the wireless device.

One or more SRSs may be sent/transmitted by a wireless device to a base station, for example, for a channel state estimation to support uplink channel dependent scheduling and/or a link adaptation. SRS sent/transmitted by the wireless device may enable/allow a base station to estimate an uplink channel state at one or more frequencies. A scheduler at the base station may use/employ the estimated uplink channel state to assign one or more resource blocks for an uplink PUSCH transmission for the wireless device. The base station may semi-statically configure the wireless device with one or more SRS resource sets. For an SRS resource set, the base station may configure the wireless device with one or more SRS resources. An SRS resource set applicability may be configured, for example, by a higher layer (e.g., RRC) parameter. An SRS resource in a SRS resource set of the one or more SRS resource sets (e.g., with the same/similar time domain behavior, periodic, aperiodic, and/or the like) may be sent/transmitted at a time instant (e.g., simultaneously), for example, if a higher layer parameter indicates beam management. The wireless device may send/transmit one or more SRS resources in SRS resource sets. A network (e.g., an NR network) may support aperiodic, periodic, and/or semi-persistent SRS transmissions. The wireless device may send/transmit SRS resources, for example, based on one or more trigger types. The one or more trigger types may comprise higher layer signaling (e.g., RRC) and/or one or more DCI formats. At least one DCI format may be used/employed for the wireless device to select at least one of one or more configured SRS resource sets. An SRS trigger type 0 may refer to an SRS triggered based on higher layer signaling. An SRS trigger type 1 may refer to an SRS triggered based on one or more DCI formats. The wireless device may be configured to send/transmit an SRS, for example, after a transmission of a PUSCH and a corresponding uplink DM-RS if a PUSCH and an SRS are sent/transmitted in a same slot. A base station may semi-statically configure a wireless device with one or more SRS configuration parameters indicating at least one of following: a SRS resource configuration identifier; a number of SRS ports; time domain behavior of an SRS resource configuration (e.g., an indication of periodic, semi-persistent, or aperiodic SRS); slot, mini-slot, and/or subframe level periodicity; an offset for a periodic and/or an aperiodic SRS resource; a number of OFDM symbols in an SRS resource; a starting OFDM symbol of an SRS resource; an SRS bandwidth; a frequency hopping bandwidth; a cyclic shift; and/or an SRS sequence ID.

An antenna port may be determined/defined such that the channel over which a symbol on the antenna port is conveyed can be inferred from the channel over which another symbol on the same antenna port is conveyed. The receiver may infer/determine the channel (e.g., fading gain, multipath delay, and/or the like) for conveying a second symbol on an antenna port, from the channel for conveying a first symbol on the antenna port, for example, if the first symbol and the second symbol are sent/transmitted on the same antenna port. A first antenna port and a second antenna port may be referred to as quasi co-located (QCLed), for example, if one or more large-scale properties of the channel over which a first symbol on the first antenna port is conveyed may be inferred from the channel over which a second symbol on a second antenna port is conveyed. The one or more large-scale properties may comprise at least one of: a delay spread; a Doppler spread; a Doppler shift; an average gain; an average delay; and/or spatial Receiving (Rx) parameters.

Channels that use beamforming may require beam management. Beam management may comprise a beam measurement, a beam selection, and/or a beam indication. A beam may be associated with one or more reference signals. A beam may be identified by one or more beamformed reference signals. The wireless device may perform a downlink beam measurement, for example, based on one or more downlink reference signals (e.g., a CSI-RS) and generate a beam measurement report. The wireless device may perform the downlink beam measurement procedure, for example, after an RRC connection is set up with a base station.

Figure 11B:
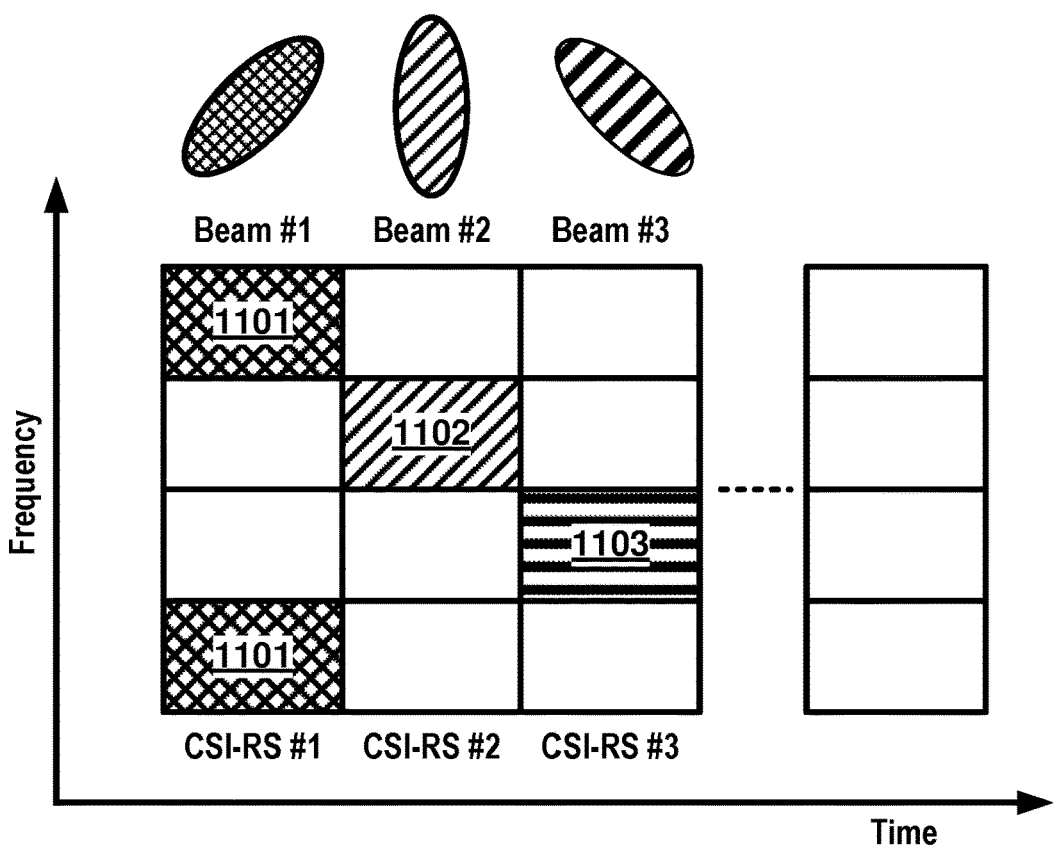
FIG. 11B shows an example mapping of one or more channel state information reference signals (CSI-RSs).

FIG. 11B shows an example mapping of one or more CSI-RSs. The CSI-RSs may be mapped in the time and frequency domains. Each rectangular block shown in FIG. 11B may correspond to a resource block (RB) within a bandwidth of a cell. A base station may send/transmit one or more RRC messages comprising CSI-RS resource configuration parameters indicating one or more CSI-RSs. One or more of parameters may be configured by higher layer signaling (e.g., RRC and/or MAC signaling) for a CSI-RS resource configuration. The one or more of the parameters may comprise at least one of: a CSI-RS resource configuration identity, a number of CSI-RS ports, a CSI-RS configuration (e.g., symbol and resource element (RE) locations in a subframe), a CSI-RS subframe configuration (e.g., a subframe location, an offset, and periodicity in a radio frame), a CSI-RS power parameter, a CSI-RS sequence parameter, a code division multiplexing (CDM) type parameter, a frequency density, a transmission comb, quasi co-location (QCL) parameters (e.g., QCL-scramblingidentity, crs-portscount, mbsfn-subframeconfiglist, csi-rs-configZPid, qcl-csi-rs-configNZPid), and/or other radio resource parameters.

One or more beams may be configured for a wireless device in a wireless device-specific configuration. Three beams are shown in FIG. 11B (beam #1, beam #2, and beam #3), but more or fewer beams may be configured. Beam #1 may be allocated with CSI-RS 1101 that may be sent/transmitted in one or more subcarriers in an RB of a first symbol. Beam #2 may be allocated with CSI-RS 1102 that may be sent/transmitted in one or more subcarriers in an RB of a second symbol. Beam #3 may be allocated with CSI-RS 1103 that may be sent/transmitted in one or more subcarriers in an RB of a third symbol. A base station may use other subcarriers in the same RB (e.g., those that are not used to send/transmit CSI-RS 1101) to send/transmit another CSI-RS associated with a beam for another wireless device, for example, by using frequency division multiplexing (FDM). Beams used for a wireless device may be configured such that beams for the wireless device use symbols different from symbols used by beams of other wireless devices, for example, by using time domain multiplexing (TDM). A wireless device may be served with beams in orthogonal symbols (e.g., no overlapping symbols), for example, by using the TDM.

CSI-RSs (e.g., CSI-RSs 1101, 1102, 1103) may be sent/transmitted by the base station and used by the wireless device for one or more measurements. The wireless device may measure an RSRP of configured CSI-RS resources. The base station may configure the wireless device with a reporting configuration, and the wireless device may report the RSRP measurements to a network (e.g., via one or more base stations) based on the reporting configuration. The base station may determine, based on the reported measurement results, one or more transmission configuration indication (TCI) states comprising a number of reference signals. The base station may indicate one or more TCI states to the wireless device (e.g., via RRC signaling, a MAC CE, and/or DCI). The wireless device may receive a downlink transmission with an Rx beam determined based on the one or more TCI states. The wireless device may or may not have a capability of beam correspondence. The wireless device may determine a spatial domain filter of a transmit (Tx) beam, for example, based on a spatial domain filter of the corresponding Rx beam, if the wireless device has the capability of beam correspondence. The wireless device may perform an uplink beam selection procedure to determine the spatial domain filter of the Tx beam, for example, if the wireless device does not have the capability of beam correspondence. The wireless device may perform the uplink beam selection procedure, for example, based on one or more sounding reference signal (SRS) resources configured to the wireless device by the base station. The base station may select and indicate uplink beams for the wireless device, for example, based on measurements of the one or more SRS resources sent/transmitted by the wireless device.

A wireless device may determine/assess (e.g., measure) a channel quality of one or more beam pair links, for example, in a beam management procedure. A beam pair link may comprise a Tx beam of a base station and an Rx beam of the wireless device. The Tx beam of the base station may send/transmit a downlink signal, and the Rx beam of the wireless device may receive the downlink signal. The wireless device may send/transmit a beam measurement report, for example, based on the assessment/determination. The beam measurement report may indicate one or more beam pair quality parameters comprising at least one of: one or more beam identifications (e.g., a beam index, a reference signal index, or the like), an RSRP, a precoding matrix indicator (PMI), a channel quality indicator (CQI), and/or a rank indicator (RI).

FIG. 12A shows examples of downlink beam management procedures. One or more downlink beam management procedures (e.g., downlink beam management procedures P1, P2, and P3) may be performed. Procedure P1 may enable a measurement (e.g., a wireless device measurement) on Tx beams of a TRP (or multiple TRPs) (e.g., to support a selection of one or more base station Tx beams and/or wireless device Rx beams). The Tx beams of a base station and the Rx beams of a wireless device are shown as ovals in the top row of P1 and bottom row of P1, respectively. Beamforming (e.g., at a TRP) may comprise a Tx beam sweep for a set of beams (e.g., the beam sweeps shown, in the top rows of P1 and P2, as ovals rotated in a counter-clockwise direction indicated by the dashed arrows). Beamforming (e.g., at a wireless device) may comprise an Rx beam sweep for a set of beams (e.g., the beam sweeps shown, in the bottom rows of P1 and P3, as ovals rotated in a clockwise direction indicated by the dashed arrows). Procedure P2 may be used to enable a measurement (e.g., a wireless device measurement) on Tx beams of a TRP (shown, in the top row of P2, as ovals rotated in a counter-clockwise direction indicated by the dashed arrow). The wireless device and/or the base station may perform procedure P2, for example, using a smaller set of beams than the set of beams used in procedure P1, or using narrower beams than the beams used in procedure P1. Procedure P2 may be referred to as a beam refinement. The wireless device may perform procedure P3 for an Rx beam determination, for example, by using the same Tx beam(s) of the base station and sweeping Rx beam(s) of the wireless device.

FIG. 12B shows examples of uplink beam management procedures. One or more uplink beam management procedures (e.g., uplink beam management procedures U1, U2, and U3) may be performed. Procedure U1 may be used to enable a base station to perform a measurement on Tx beams of a wireless device (e.g., to support a selection of one or more Tx beams of the wireless device and/or Rx beams of the base station). The Tx beams of the wireless device and the Rx beams of the base station are shown as ovals in the top row of U1 and bottom row of U1, respectively). Beamforming (e.g., at the wireless device) may comprise one or more beam sweeps, for example, a Tx beam sweep from a set of beams (shown, in the bottom rows of U1 and U3, as ovals rotated in a clockwise direction indicated by the dashed arrows). Beamforming (e.g., at the base station) may comprise one or more beam sweeps, for example, an Rx beam sweep from a set of beams (shown, in the top rows of U1 and U2, as ovals rotated in a counter-clockwise direction indicated by the dashed arrows). Procedure U2 may be used to enable the base station to adjust its Rx beam, for example, if the UE uses a fixed Tx beam. The wireless device and/or the base station may perform procedure U2, for example, using a smaller set of beams than the set of beams used in procedure P1, or using narrower beams than the beams used in procedure P1. Procedure U2 may be referred to as a beam refinement. The wireless device may perform procedure U3 to adjust its Tx beam, for example, if the base station uses a fixed Rx beam.

A wireless device may initiate/start/perform a beam failure recovery (BFR) procedure, for example, based on detecting a beam failure. The wireless device may send/transmit a BFR request (e.g., a preamble, UCI, an SR, a MAC CE, and/or the like), for example, based on the initiating the BFR procedure. The wireless device may detect the beam failure, for example, based on a determination that a quality of beam pair link(s) of an associated control channel is unsatisfactory (e.g., having an error rate higher than an error rate threshold, a received signal power lower than a received signal power threshold, an expiration of a timer, and/or the like).

The wireless device may measure a quality of a beam pair link, for example, using one or more reference signals (RSs) comprising one or more SS/PBCH blocks, one or more CSI-RS resources, and/or one or more DM-RSs. A quality of the beam pair link may be based on one or more of a block error rate (BLER), an RSRP value, a signal to interference plus noise ratio (SINR) value, an RSRQ value, and/or a CSI value measured on RS resources. The base station may indicate that an RS resource is QCLed with one or more DM-RSs of a channel (e.g., a control channel, a shared data channel, and/or the like). The RS resource and the one or more DM-RSs of the channel may be QCLed, for example, if the channel characteristics (e.g., Doppler shift, Doppler spread, an average delay, delay spread, a spatial Rx parameter, fading, and/or the like) from a transmission via the RS resource to the wireless device are similar or the same as the channel characteristics from a transmission via the channel to the wireless device.

A network (e.g., an NR network comprising a gNB and/or an ng-eNB) and/or the wireless device may initiate/start/perform a random access procedure. A wireless device in an RRC idle (e.g., an RRC_IDLE) state and/or an RRC inactive (e.g., an RRC_INACTIVE) state may initiate/perform the random access procedure to request a connection setup to a network. The wireless device may initiate/start/perform the random access procedure from an RRC connected (e.g., an RRC_CONNECTED) state. The wireless device may initiate/start/perform the random access procedure to request uplink resources (e.g., for uplink transmission of an SR if there is no PUCCH resource available) and/or acquire/obtain/determine an uplink timing (e.g., if an uplink synchronization status is non-synchronized). The wireless device may initiate/start/perform the random access procedure to request one or more system information blocks (SIBs) (e.g., other system information blocks, such as SIB2, SIB3, and/or the like). The wireless device may initiate/start/perform the random access procedure for a beam failure recovery request. A network may initiate/start/perform a random access procedure, for example, for a handover and/or for establishing time alignment for an SCell addition.

FIG. 13A shows an example four-step random access procedure. The four-step random access procedure may comprise a four-step contention-based random access procedure. A base station may send/transmit a configuration message 1310 to a wireless device, for example, before initiating the random access procedure. The four-step random access procedure may comprise transmissions of four messages comprising: a first message (e.g., Msg 1 1311), a second message (e.g., Msg 2 1312), a third message (e.g., Msg 3 1313), and a fourth message (e.g., Msg 4 1314). The first message (e.g., Msg 1 1311) may comprise a preamble (or a random access preamble). The first message (e.g., Msg 1 1311) may be referred to as a preamble. The second message (e.g., Msg 2 1312) may comprise as a random access response (RAR). The second message (e.g., Msg 2 1312) may be referred to as an RAR.

The configuration message 1310 may be sent/transmitted, for example, using one or more RRC messages. The one or more RRC messages may indicate one or more random access channel (RACH) parameters to the wireless device. The one or more RACH parameters may comprise at least one of: general parameters for one or more random access procedures (e.g., RACH-configGeneral); cell-specific parameters (e.g., RACH-ConfigCommon); and/or dedicated parameters (e.g., RACH-configDedicated). The base station may send/transmit (e.g., broadcast or multicast) the one or more RRC messages to one or more wireless devices. The one or more RRC messages may be wireless device-specific. The one or more RRC messages that are wireless device-specific may be, for example, dedicated RRC messages sent/transmitted to a wireless device in an RRC connected (e.g., an RRC_CONNECTED) state and/or in an RRC inactive (e.g., an RRC_INACTIVE) state. The wireless devices may determine, based on the one or more RACH parameters, a time-frequency resource and/or an uplink transmit power for transmission of the first message (e.g., Msg 1 1311) and/or the third message (e.g., Msg 3 1313). The wireless device may determine a reception timing and a downlink channel for receiving the second message (e.g., Msg 2 1312) and the fourth message (e.g., Msg 4 1314), for example, based on the one or more RACH parameters.

The one or more RACH parameters provided/configured/comprised in the configuration message 1310 may indicate one or more Physical RACH (PRACH) occasions available for transmission of the first message (e.g., Msg 1 1311). The one or more PRACH occasions may be predefined (e.g., by a network comprising one or more base stations). The one or more RACH parameters may indicate one or more available sets of one or more PRACH occasions (e.g., prach-Config-Index). The one or more RACH parameters may indicate an association between (a) one or more PRACH occasions and (b) one or more reference signals. The one or more RACH parameters may indicate an association between (a) one or more preambles and (b) one or more reference signals. The one or more reference signals may be SS/PBCH blocks and/or CSI-RSs. The one or more RACH parameters may indicate a quantity/number of SS/PBCH blocks mapped to a PRACH occasion and/or a quantity/number of preambles mapped to a SS/PBCH blocks.

The one or more RACH parameters provided/configured/comprised in the configuration message 1310 may be used to determine an uplink transmit power of first message (e.g., Msg 1 1311) and/or third message (e.g., Msg 3 1313). The one or more RACH parameters may indicate a reference power for a preamble transmission (e.g., a received target power and/or an initial power of the preamble transmission). There may be one or more power offsets indicated by the one or more RACH parameters. The one or more RACH parameters may indicate: a power ramping step; a power offset between SSB and CSI-RS; a power offset between transmissions of the first message (e.g., Msg 1 1311) and the third message (e.g., Msg 3 1313); and/or a power offset value between preamble groups. The one or more RACH parameters may indicate one or more thresholds, for example, based on which the wireless device may determine at least one reference signal (e.g., an SSB and/or CSI-RS) and/or an uplink carrier (e.g., a normal uplink (NUL) carrier and/or a supplemental uplink (SUL) carrier).

The first message (e.g., Msg 1 1311) may comprise one or more preamble transmissions (e.g., a preamble transmission and one or more preamble retransmissions). An RRC message may be used to configure one or more preamble groups (e.g., group A and/or group B). A preamble group may comprise one or more preambles. The wireless device may determine the preamble group, for example, based on a pathloss measurement and/or a size of the third message (e.g., Msg 3 1313). The wireless device may measure an RSRP of one or more reference signals (e.g., SSBs and/or CSI-RSs) and determine at least one reference signal having an RSRP above an RSRP threshold (e.g., rsrp-ThresholdSSB and/or rsrp-ThresholdCSI-RS). The wireless device may select at least one preamble associated with the one or more reference signals and/or a selected preamble group, for example, if the association between the one or more preambles and the at least one reference signal is configured by an RRC message.

The wireless device may determine the preamble, for example, based on the one or more RACH parameters provided/configured/comprised in the configuration message 1310. The wireless device may determine the preamble, for example, based on a pathloss measurement, an RSRP measurement, and/or a size of the third message (e.g., Msg 3 1313). The one or more RACH parameters may indicate: a preamble format; a maximum quantity/number of preamble transmissions; and/or one or more thresholds for determining one or more preamble groups (e.g., group A and group B). A base station may use the one or more RACH parameters to configure the wireless device with an association between one or more preambles and one or more reference signals (e.g., SSBs and/or CSI-RSs). The wireless device may determine the preamble to be comprised in first message (e.g., Msg 1 1311), for example, based on the association if the association is configured. The first message (e.g., Msg 1 1311) may be sent/transmitted to the base station via one or more PRACH occasions. The wireless device may use one or more reference signals (e.g., SSBs and/or CSI-RSs) for selection of the preamble and for determining of the PRACH occasion. One or more RACH parameters (e.g., ra-ssb-OccasionMskIndex and/or ra-OccasionList) may indicate an association between the PRACH occasions and the one or more reference signals.

The wireless device may perform a preamble retransmission, for example, if no response is received after (e.g., based on or in response to) a preamble transmission (e.g., for a period of time, such as a monitoring window for monitoring an RAR). The wireless device may increase an uplink transmit power for the preamble retransmission. The wireless device may select an initial preamble transmit power, for example, based on a pathloss measurement and/or a target received preamble power configured by the network. The wireless device may determine to resend/retransmit a preamble and may ramp up the uplink transmit power. The wireless device may receive one or more RACH parameters (e.g., PREAMBLE_POWER_RAMPING_STEP) indicating a ramping step for the preamble retransmission. The ramping step may be an amount of incremental increase in uplink transmit power for a retransmission. The wireless device may ramp up the uplink transmit power, for example, if the wireless device determines a reference signal (e.g., SSB and/or CSI-RS) that is the same as a previous preamble transmission. The wireless device may count the quantity/number of preamble transmissions and/or retransmissions, for example, using a counter parameter (e.g., PREAMBLE_TRANSMISSION_COUNTER). The wireless device may determine that a random access procedure has been completed unsuccessfully, for example, if the quantity/number of preamble transmissions exceeds a threshold configured by the one or more RACH parameters (e.g., preambleTransMax) without receiving a successful response (e.g., an RAR).

The second message (e.g., Msg 2 1312) (e.g., received by the wireless device) may comprise an RAR. The second message (e.g., Msg 2 1312) may comprise multiple RARs corresponding to multiple wireless devices. The second message (e.g., Msg 2 1312) may be received, for example, after (e.g., based on or in response to) the sending/transmitting of the first message (e.g., Msg 1 1311). The second message (e.g., Msg 2 1312) may be scheduled on the DL-SCH and may be indicated by a PDCCH, for example, using a random access radio network temporary identifier (RA RNTI). The second message (e.g., Msg 2 1312) may indicate that the first message (e.g., Msg 1 1311) was received by the base station. The second message (e.g., Msg 2 1312) may comprise a time-alignment command that may be used by the wireless device to adjust the transmission timing of the wireless device, a scheduling grant for transmission of the third message (e.g., Msg 3 1313), and/or a Temporary Cell RNTI (TC-RNTI). The wireless device may determine/start a time window (e.g., ra-ResponseWindow) to monitor a PDCCH for the second message (e.g., Msg 2 1312), for example, after sending/transmitting the first message (e.g., Msg 1 1311) (e.g., a preamble). The wireless device may determine the start time of the time window, for example, based on a PRACH occasion that the wireless device uses to send/transmit the first message (e.g., Msg 1 1311) (e.g., the preamble). The wireless device may start the time window one or more symbols after the last symbol of the first message (e.g., Msg 1 1311) comprising the preamble (e.g., the symbol in which the first message (e.g., Msg 1 1311) comprising the preamble transmission was completed or at a first PDCCH occasion from an end of a preamble transmission). The one or more symbols may be determined based on a numerology. The PDCCH may be mapped in a common search space (e.g., a Type1-PDCCH common search space) configured by an RRC message. The wireless device may identify/determine the RAR, for example, based on an RNTI. Radio network temporary identifiers (RNTIs) may be used depending on one or more events initiating/starting the random access procedure. The wireless device may use a RA-RNTI, for example, for one or more communications associated with random access or any other purpose. The RA-RNTI may be associated with PRACH occasions in which the wireless device sends/transmits a preamble. The wireless device may determine the RA-RNTI, for example, based on at least one of: an OFDM symbol index; a slot index; a frequency domain index; and/or a UL carrier indicator of the PRACH occasions. An example RA-RNTI may be determined as follows:

$$RA\text{-}RNTI = 1 + s\_id + 14 \times t\_id + 14 \times 80 \times f\_id + 14 \times 80 \times 8 \times ul\_carrier\_id$$

where s_id may be an index of a first OFDM symbol of the PRACH occasion (e.g., 0<s_id<14), t_id may be an index of a first slot of the PRACH occasion in a system frame (e.g., 0<f_id<80), f_id may be an index of the PRACH occasion in the frequency domain (e.g., 0<f_id<8), and ul_carrier_id may be a UL carrier used for a preamble transmission (e.g., 0 for an NUL carrier, and 1 for an SUL carrier).

The wireless device may send/transmit the third message (e.g., Msg 3 1313), for example, after (e.g., based on or in response to) a successful reception of the second message (e.g., Msg 2 1312) (e.g., using resources identified in the Msg 2 1312). The third message (e.g., Msg 3 1313) may be used, for example, for contention resolution in the contention-based random access procedure. A plurality of wireless devices may send/transmit the same preamble to a base station, and the base station may send/transmit an RAR that corresponds to a wireless device. Collisions may occur, for example, if the plurality of wireless device interpret the RAR as corresponding to themselves. Contention resolution (e.g., using the third message (e.g., Msg 3 1313) and the fourth message (e.g., Msg 4 1314)) may be used to increase the likelihood that the wireless device does not incorrectly use an identity of another the wireless device. The wireless device may comprise a device identifier in the third message (e.g., Msg 3 1313) (e.g., a C-RNTI if assigned, a TC RNTI comprised in the second message (e.g., Msg 2 1312), and/or any other suitable identifier), for example, to perform contention resolution.

The fourth message (e.g., Msg 4 1314) may be received, for example, after (e.g., based on or in response to) the sending/transmitting of the third message (e.g., Msg 3 1313). The base station may address the wireless on the PDCCH (e.g., the base station may send the PDCCH to the wireless device) using a C-RNTI, for example, If the C-RNTI was included in the third message (e.g., Msg 3 1313). The random access procedure may be determined to be successfully completed, for example, if the unique C RNTI of the wireless device is detected on the PDCCH (e.g., the PDCCH is scrambled by the C-RNTI). fourth message (e.g., Msg 4 1314) may be received using a DL-SCH associated with a TC RNTI, for example, if the TC RNTI is comprised in the third message (e.g., Msg 3 1313) (e.g., if the wireless device is in an RRC idle (e.g., an RRC_IDLE) state or not otherwise connected to the base station). The wireless device may determine that the contention resolution is successful and/or the wireless device may determine that the random access procedure is successfully completed, for example, if a MAC PDU is successfully decoded and a MAC PDU comprises the wireless device contention resolution identity MAC CE that matches or otherwise corresponds with the CCCH SDU sent/transmitted in third message (e.g., Msg 3 1313).

The wireless device may be configured with an SUL carrier and/or an NUL carrier. An initial access (e.g., random access) may be supported via an uplink carrier. A base station may configure the wireless device with multiple RACH configurations (e.g., two separate RACH configurations comprising: one for an SUL carrier and the other for an NUL carrier). For random access in a cell configured with an SUL carrier, the network may indicate which carrier to use (NUL or SUL). The wireless device may determine to use the SUL carrier, for example, if a measured quality of one or more reference signals (e.g., one or more reference signals associated with the NUL carrier) is lower than a broadcast threshold. Uplink transmissions of the random access procedure (e.g., the first message (e.g., Msg 1 1311) and/or the third message (e.g., Msg 3 1313)) may remain on, or may be performed via, the selected carrier. The wireless device may switch an uplink carrier during the random access procedure (e.g., between the Msg 1 1311 and the Msg 3 1313). The wireless device may determine and/or switch an uplink carrier for the first message (e.g., Msg 1 1311) and/or the third message (e.g., Msg 3 1313), for example, based on a channel clear assessment (e.g., a listen-before-talk).

FIG. 13B shows a two-step random access procedure. The two-step random access procedure may comprise a two-step contention-free random access procedure. Similar to the four-step contention-based random access procedure, a base station may, prior to initiation of the procedure, send/transmit a configuration message 1320 to the wireless device. The configuration message 1320 may be analogous in some respects to the configuration message 1310. The procedure shown in FIG. 13B may comprise transmissions of two messages: a first message (e.g., Msg 1 1321) and a second message (e.g., Msg 2 1322). The first message (e.g., Msg 1 1321) and the second message (e.g., Msg 2 1322) may be analogous in some respects to the first message (e.g., Msg 1 1311) and a second message (e.g., Msg 2 1312), respectively. The two-step contention-free random access procedure may not comprise messages analogous to the third message (e.g., Msg 3 1313) and/or the fourth message (e.g., Msg 4 1314).

The two-step (e.g., contention-free) random access procedure may be configured/initiated for a beam failure recovery, other SI request, an SCell addition, and/or a handover. A base station may indicate, or assign to, the wireless device a preamble to be used for the first message (e.g., Msg 1 1321). The wireless device may receive, from the base station via a PDCCH and/or an RRC, an indication of the preamble (e.g., ra-PreambleIndex).

The wireless device may start a time window (e.g., ra-ResponseWindow) to monitor a PDCCH for the RAR, for example, after (e.g., based on or in response to) sending/transmitting the preamble. The base station may configure the wireless device with one or more beam failure recovery parameters, such as a separate time window and/or a separate PDCCH in a search space indicated by an RRC message (e.g., recoverySearchSpaceId). The base station may configure the one or more beam failure recovery parameters, for example, in association with a beam failure recovery request. The separate time window for monitoring the PDCCH and/or an RAR may be configured to start after sending/transmitting a beam failure recovery request (e.g., the window may start any quantity of symbols and/or slots after sending/transmitting the beam failure recovery request). The wireless device may monitor for a PDCCH transmission addressed to a Cell RNTI (C-RNTI) on the search space. During the two-step (e.g., contention-free) random access procedure, the wireless device may determine that a random access procedure is successful, for example, after (e.g., based on or in response to) sending/transmitting first message (e.g., Msg 1 1321) and receiving a corresponding second message (e.g., Msg 2 1322). The wireless device may determine that a random access procedure has successfully been completed, for example, if a PDCCH transmission is addressed to a corresponding C-RNTI. The wireless device may determine that a random access procedure has successfully been completed, for example, if the wireless device receives an RAR comprising a preamble identifier corresponding to a preamble sent/transmitted by the wireless device and/or the RAR comprises a MAC sub-PDU with the preamble identifier. The wireless device may determine the response as an indication of an acknowledgement for an SI request.

FIG. 13C shows an example two-step random access procedure. Similar to the random access procedures shown in FIGS. 13A and 13B, a base station may, prior to initiation of the procedure, send/transmit a configuration message 1330 to the wireless device. The configuration message 1330 may be analogous in some respects to the configuration message 1310 and/or the configuration message 1320. The procedure shown in FIG. 13C may comprise transmissions of multiple messages (e.g., two messages comprising: a first message (e.g., Msg A 1331) and a second message (e.g., Msg B 1332)).

Msg A 1320 may be sent/transmitted in an uplink transmission by the wireless device. Msg A 1320 may comprise one or more transmissions of a preamble 1341 and/or one or more transmissions of a transport block 1342. The transport block 1342 may comprise contents that are similar and/or equivalent to the contents of the third message (e.g., Msg 3 1313) (e.g., shown in FIG. 13A). The transport block 1342 may comprise UCI (e.g., an SR, a HARQ ACK/NACK, and/or the like). The wireless device may receive the second message (e.g., Msg B 1332), for example, after (e.g., based on or in response to) sending/transmitting the first message (e.g., Msg A 1331). The second message (e.g., Msg B 1332) may comprise contents that are similar and/or equivalent to the contents of the second message (e.g., Msg 2 1312) (e.g., an RAR shown in FIG. 13A), the contents of the second message (e.g., Msg 2 1322) (e.g., an RAR shown in FIG. 13B) and/or the fourth message (e.g., Msg 4 1314) (e.g., shown in FIG. 13A).

The wireless device may start/initiate the two-step random access procedure (e.g., the two-step random access procedure shown in FIG. 13C) for a licensed spectrum and/or an unlicensed spectrum. The wireless device may determine, based on one or more factors, whether to start/initiate the two-step random access procedure. The one or more factors may comprise at least one of: a radio access technology in use (e.g., LTE, NR, and/or the like); whether the wireless device has a valid TA or not; a cell size; the RRC state of the wireless device; a type of spectrum (e.g., licensed vs. unlicensed); and/or any other suitable factors.

The wireless device may determine, based on two-step RACH parameters comprised in the configuration message 1330, a radio resource and/or an uplink transmit power for the preamble 1341 and/or the transport block 1342 (e.g., comprised in the first message (e.g., Msg A 1331)). The RACH parameters may indicate an MCS, a time-frequency resource, and/or a power control for the preamble 1341 and/or the transport block 1342. A time-frequency resource for transmission of the preamble 1341 (e.g., a PRACH) and a time-frequency resource for transmission of the transport block 1342 (e.g., a PUSCH) may be multiplexed using FDM, TDM, and/or CDM. The RACH parameters may enable the wireless device to determine a reception timing and a downlink channel for monitoring for and/or receiving second message (e.g., Msg B 1332).

The transport block 1342 may comprise data (e.g., delay-sensitive data), an identifier of the wireless device, security information, and/or device information (e.g., an International Mobile Subscriber Identity (IMSI)). The base station may send/transmit the second message (e.g., Msg B 1332) as a response to the first message (e.g., Msg A 1331). The second message (e.g., Msg B 1332) may comprise at least one of: a preamble identifier; a timing advance command; a power control command; an uplink grant (e.g., a radio resource assignment and/or an MCS); a wireless device identifier (e.g., a UE identifier for contention resolution); and/or an RNTI (e.g., a C-RNTI or a TC-RNTI). The wireless device may determine that the two-step random access procedure is successfully completed, for example, if a preamble identifier in the second message (e.g., Msg B 1332) corresponds to, or is matched to, a preamble sent/transmitted by the wireless device and/or the identifier of the wireless device in second message (e.g., Msg B 1332) corresponds to, or is matched to, the identifier of the wireless device in the first message (e.g., Msg A 1331) (e.g., the transport block 1342).

A wireless device and a base station may exchange control signaling (e.g., control information). The control signaling may be referred to as L1/L2 control signaling and may originate from the PHY layer (e.g., layer 1) and/or the MAC layer (e.g., layer 2) of the wireless device or the base station. The control signaling may comprise downlink control signaling sent/transmitted from the base station to the wireless device and/or uplink control signaling sent/transmitted from the wireless device to the base station.

The downlink control signaling may comprise at least one of: a downlink scheduling assignment; an uplink scheduling grant indicating uplink radio resources and/or a transport format; slot format information; a preemption indication; a power control command; and/or any other suitable signaling. The wireless device may receive the downlink control signaling in a payload sent/transmitted by the base station via a PDCCH. The payload sent/transmitted via the PDCCH may be referred to as downlink control information (DCI). The PDCCH may be a group common PDCCH (GC-PDCCH) that is common to a group of wireless devices. The GC-PDCCH may be scrambled by a group common RNTI.

A base station may attach one or more cyclic redundancy check (CRC) parity bits to DCI, for example, in order to facilitate detection of transmission errors. The base station may scramble the CRC parity bits with an identifier of a wireless device (or an identifier of a group of wireless devices), for example, if the DCI is intended for the wireless device (or the group of the wireless devices). Scrambling the CRC parity bits with the identifier may comprise Modulo-2 addition (or an exclusive-OR operation) of the identifier value and the CRC parity bits. The identifier may comprise a 16-bit value of an RNTI.

DCIs may be used for different purposes. A purpose may be indicated by the type of an RNTI used to scramble the CRC parity bits. DCI having CRC parity bits scrambled with a paging RNTI (P-RNTI) may indicate paging information and/or a system information change notification. The P-RNTI may be predefined as "FFFE" in hexadecimal. DCI having CRC parity bits scrambled with a system information RNTI (SI-RNTI) may indicate a broadcast transmission of the system information. The SI-RNTI may be predefined as "FFFF" in hexadecimal. DCI having CRC parity bits scrambled with a random access RNTI (RA-RNTI) may indicate a random access response (RAR). DCI having CRC parity bits scrambled with a cell RNTI (C-RNTI) may indicate a dynamically scheduled unicast transmission and/or a triggering of PDCCH-ordered random access. DCI having CRC parity bits scrambled with a temporary cell RNTI (TC-RNTI) may indicate a contention resolution (e.g., a Msg 3 analogous to the Msg 3 1313 shown in FIG. 13A). Other RNTIs configured for a wireless device by a base station may comprise a Configured Scheduling RNTI (CS RNTI), a Transmit Power Control-PUCCH RNTI (TPC PUCCH-RNTI), a Transmit Power Control-PUSCH RNTI (TPC-PUSCH-RNTI), a Transmit Power Control-SRS RNTI (TPC-SRS-RNTI), an Interruption RNTI (INT-RNTI), a Slot Format Indication RNTI (SFI-RNTI), a Semi-Persistent CSI RNTI (SP-CSI-RNTI), a Modulation and Coding Scheme Cell RNTI (MCS-C RNTI), and/or the like.

A base station may send/transmit DCIs with one or more DCI formats, for example, depending on the purpose and/or content of the DCIs. DCI format 0_0 may be used for scheduling of a PUSCH in a cell. DCI format 0_0 may be a fallback DCI format (e.g., with compact DCI payloads). DCI format 0_1 may be used for scheduling of a PUSCH in a cell (e.g., with more DCI payloads than DCI format 0_0). DCI format 1_0 may be used for scheduling of a PDSCH in a cell. DCI format 1_0 may be a fallback DCI format (e.g., with compact DCI payloads). DCI format 1_1 may be used for scheduling of a PDSCH in a cell (e.g., with more DCI payloads than DCI format 1_0). DCI format 2_0 may be used for providing a slot format indication to a group of wireless devices. DCI format 2_1 may be used for informing/notifying a group of wireless devices of a physical resource block and/or an OFDM symbol where the group of wireless devices may assume no transmission is intended to the group of wireless devices. DCI format 2_2 may be used for transmission of a transmit power control (TPC) command for PUCCH or PUSCH. DCI format 2_3 may be used for transmission of a group of TPC commands for SRS transmissions by one or more wireless devices. DCI format(s) for new functions may be defined in future releases. DCI formats may have different DCI sizes, or may share the same DCI size.

The base station may process the DCI with channel coding (e.g., polar coding), rate matching, scrambling and/or QPSK modulation, for example, after scrambling the DCI with an RNTI. A base station may map the coded and modulated DCI on resource elements used and/or configured for a PDCCH. The base station may send/transmit the DCI via a PDCCH occupying a number of contiguous control channel elements (CCEs), for example, based on a payload size of the DCI and/or a coverage of the base station. The number of the contiguous CCEs (referred to as aggregation level) may be 1, 2, 4, 8, 16, and/or any other suitable number. A CCE may comprise a number (e.g., 6) of resource-element groups (REGs). A REG may comprise a resource block in an OFDM symbol. The mapping of the coded and modulated DCI on the resource elements may be based on mapping of CCEs and REGs (e.g., CCE-to-REG mapping).

Figure 14A:
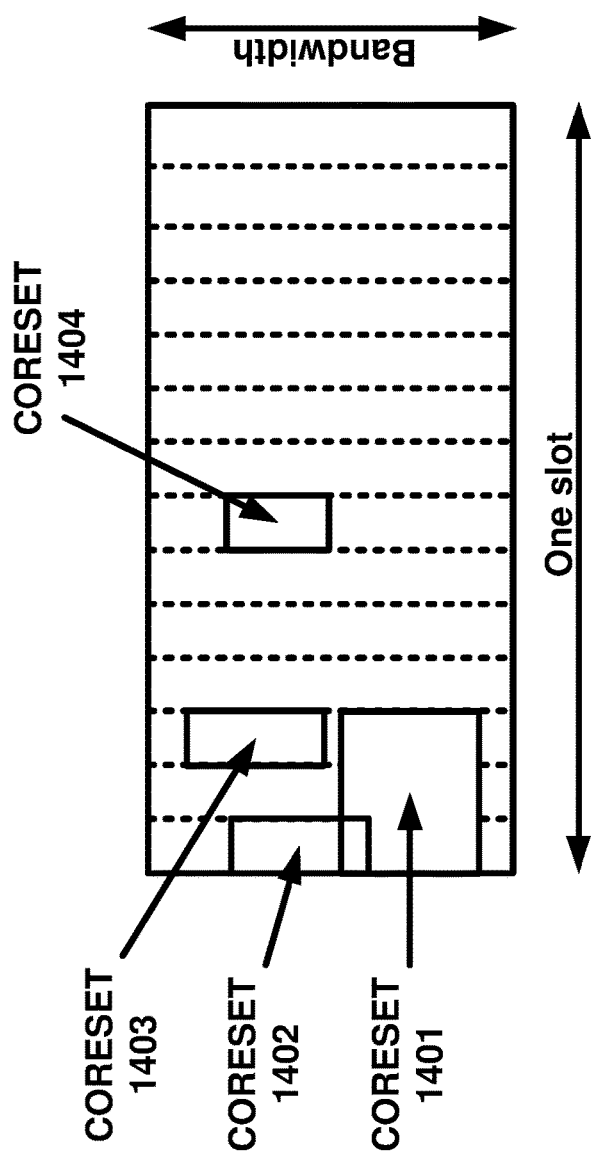
FIG. 14A shows an example of control resource set (CORESET) configurations.

FIG. 14A shows an example of CORESET configurations. The CORESET configurations may be for a bandwidth part or any other frequency bands. The base station may send/transmit DCI via a PDCCH on one or more control resource sets (CORESETs). A CORESET may comprise a time-frequency resource in which the wireless device attempts/tries to decode DCI using one or more search spaces. The base station may configure a size and a location of the CORESET in the time-frequency domain. A first CORESET 1401 and a second CORESET 1402 may occur or may be set/configured at the first symbol in a slot. The first CORESET 1401 may overlap with the second CORESET 1402 in the frequency domain. A third CORESET 1403 may occur or may be set/configured at a third symbol in the slot. A fourth CORESET 1404 may occur or may be set/configured at the seventh symbol in the slot. CORESETs may have a different number of resource blocks in frequency domain.

Figure 14B:
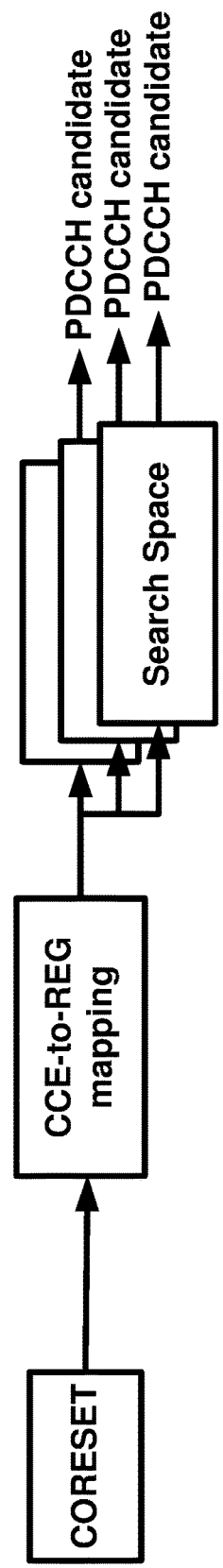
FIG. 14B shows an example of a control channel element to resource element group (CCE-to-REG) mapping.

FIG. 14B shows an example of a CCE-to-REG mapping. The CCE-to-REG mapping may be performed for DCI transmission via a CORESET and PDCCH processing. The CCE-to-REG mapping may be an interleaved mapping (e.g., for the purpose of providing frequency diversity) or a non-interleaved mapping (e.g., for the purposes of facilitating interference coordination and/or frequency-selective transmission of control channels). The base station may perform different or same CCE-to-REG mapping on different CORESETs. A CORESET may be associated with a CCE-to-REG mapping (e.g., by an RRC configuration). A CORESET may be configured with an antenna port QCL parameter. The antenna port QCL parameter may indicate QCL information of a DM-RS for a PDCCH reception via the CORESET.

The base station may send/transmit, to the wireless device, one or more RRC messages comprising configuration parameters of one or more CORESETs and one or more search space sets. The configuration parameters may indicate an association between a search space set and a CORESET. A search space set may comprise a set of PDCCH candidates formed by CCEs (e.g., at a given aggregation level). The configuration parameters may indicate at least one of: a number of PDCCH candidates to be monitored per aggregation level; a PDCCH monitoring periodicity and a PDCCH monitoring pattern; one or more DCI formats to be monitored by the wireless device; and/or whether a search space set is a common search space set or a wireless device-specific search space set (e.g., a UE-specific search space set). A set of CCEs in the common search space set may be predefined and known to the wireless device. A set of CCEs in the wireless device-specific search space set (e.g., the UE-specific search space set) may be configured, for example, based on the identity of the wireless device (e.g., C-RNTI).

As shown in FIG. 14B, the wireless device may determine a time-frequency resource for a CORESET based on one or more RRC messages. The wireless device may determine a CCE-to-REG mapping (e.g., interleaved or non-interleaved, and/or mapping parameters) for the CORESET, for example, based on configuration parameters of the CORESET. The wireless device may determine a number (e.g., at most 10) of search space sets configured on/for the CORESET, for example, based on the one or more RRC messages. The wireless device may monitor a set of PDCCH candidates according to configuration parameters of a search space set. The wireless device may monitor a set of PDCCH candidates in one or more CORESETs for detecting one or more DCIs. Monitoring may comprise decoding one or more PDCCH candidates of the set of the PDCCH candidates according to the monitored DCI formats. Monitoring may comprise decoding DCI content of one or more PDCCH candidates with possible (or configured) PDCCH locations, possible (or configured) PDCCH formats (e.g., the number of CCEs, the number of PDCCH candidates in common search spaces, and/or the number of PDCCH candidates in the wireless device-specific search spaces) and possible (or configured) DCI formats. The decoding may be referred to as blind decoding. The wireless device may determine DCI as valid for the wireless device, for example, after (e.g., based on or in response to) CRC checking (e.g., scrambled bits for CRC parity bits of the DCI matching an RNTI value). The wireless device may process information comprised in the DCI (e.g., a scheduling assignment, an uplink grant, power control, a slot format indication, a downlink preemption, and/or the like).

The wireless device may send/transmit uplink control signaling (e.g., UCI) to a base station. The uplink control signaling may comprise HARQ acknowledgements for received DL-SCH transport blocks. The wireless device may send/transmit the HARQ acknowledgements, for example, after (e.g., based on or in response to) receiving a DL-SCH transport block. Uplink control signaling may comprise CSI indicating a channel quality of a physical downlink channel. The wireless device may send/transmit the CSI to the base station. The base station, based on the received CSI, may determine transmission format parameters (e.g., comprising multi-antenna and beamforming schemes) for downlink transmission(s). Uplink control signaling may comprise scheduling requests (SR). The wireless device may send/transmit an SR indicating that uplink data is available for transmission to the base station. The wireless device may send/transmit UCI (e.g., HARQ acknowledgements (HARQ-ACK), CSI report, SR, and the like) via a PUCCH or a PUSCH. The wireless device may send/transmit the uplink control signaling via a PUCCH using one of several PUCCH formats.

There may be multiple PUCCH formats (e.g., five PUCCH formats). A wireless device may determine a PUCCH format, for example, based on a size of UCI (e.g., a quantity/number of uplink symbols of UCI transmission and a number of UCI bits). PUCCH format 0 may have a length of one or two OFDM symbols and may comprise two or fewer bits. The wireless device may send/transmit UCI via a PUCCH resource, for example, using PUCCH format 0 if the transmission is over/via one or two symbols and the quantity/number of HARQ-ACK information bits with positive or negative SR (HARQ-ACK/SR bits) is one or two. PUCCH format 1 may occupy a number of OFDM symbols (e.g., between four and fourteen OFDM symbols) and may comprise two or fewer bits. The wireless device may use PUCCH format 1, for example, if the transmission is over/via four or more symbols and the number of HARQ-ACK/SR bits is one or two. PUCCH format 2 may occupy one or two OFDM symbols and may comprise more than two bits. The wireless device may use PUCCH format 2, for example, if the transmission is over/via one or two symbols and the quantity/number of UCI bits is two or more. PUCCH format 3 may occupy a number of OFDM symbols (e.g., between four and fourteen OFDM symbols) and may comprise more than two bits. The wireless device may use PUCCH format 3, for example, if the transmission is four or more symbols, the quantity/number of UCI bits is two or more, and the PUCCH resource does not comprise an orthogonal cover code (OCC). PUCCH format 4 may occupy a number of OFDM symbols (e.g., between four and fourteen OFDM symbols) and may comprise more than two bits. The wireless device may use PUCCH format 4, for example, if the transmission is four or more symbols, the quantity/number of UCI bits is two or more, and the PUCCH resource comprises an OCC.

The base station may send/transmit configuration parameters to the wireless device for a plurality of PUCCH resource sets, for example, using an RRC message. The plurality of PUCCH resource sets (e.g., up to four sets in NR, or up to any other quantity of sets in other systems) may be configured on an uplink BWP of a cell. A PUCCH resource set may be configured with a PUCCH resource set index, a plurality of PUCCH resources with a PUCCH resource being identified by a PUCCH resource identifier (e.g., pucch-Resourceid), and/or a number (e.g. a maximum number) of UCI information bits the wireless device may send/transmit using one of the plurality of PUCCH resources in the PUCCH resource set. The wireless device may select one of the plurality of PUCCH resource sets, for example, based on a total bit length of the UCI information bits (e.g., HARQ-ACK, SR, and/or CSI) if configured with a plurality of PUCCH resource sets. The wireless device may select a first PUCCH resource set having a PUCCH resource set index equal to "0," for example, if the total bit length of UCI information bits is two or fewer. The wireless device may select a second PUCCH resource set having a PUCCH resource set index equal to "1," for example, if the total bit length of UCI information bits is greater than two and less than or equal to a first configured value. The wireless device may select a third PUCCH resource set having a PUCCH resource set index equal to "2," for example, if the total bit length of UCI information bits is greater than the first configured value and less than or equal to a second configured value. The wireless device may select a fourth PUCCH resource set having a PUCCH resource set index equal to "3," for example, if the total bit length of UCI information bits is greater than the second configured value and less than or equal to a third value (e.g., 1406, 1706, or any other quantity of bits).

The wireless device may determine a PUCCH resource from the PUCCH resource set for UCI (HARQ-ACK, CSI, and/or SR) transmission, for example, after determining a PUCCH resource set from a plurality of PUCCH resource sets. The wireless device may determine the PUCCH resource, for example, based on a PUCCH resource indicator in DCI (e.g., with DCI format 1_0 or DCI for 1_1) received on/via a PDCCH. An n-bit (e.g., a three-bit) PUCCH resource indicator in the DCI may indicate one of multiple (e.g., eight) PUCCH resources in the PUCCH resource set. The wireless device may send/transmit the UCI (HARQ-ACK, CSI and/or SR) using a PUCCH resource indicated by the PUCCH resource indicator in the DCI, for example, based on the PUCCH resource indicator.

Figure 15A:
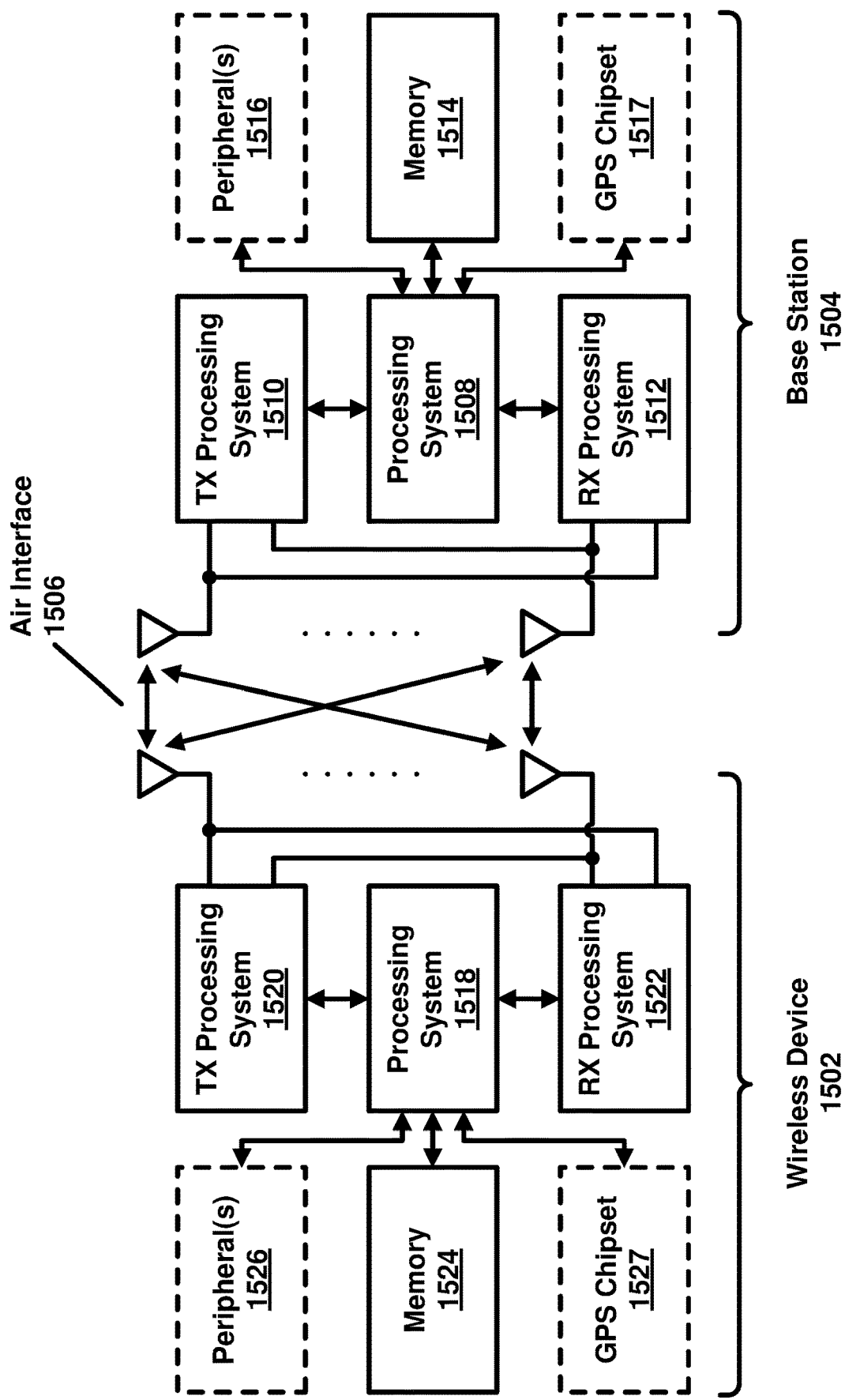
FIG. 15A shows an example of communications between a wireless device and a base station.

FIG. 15A shows an example communications between a wireless device and a base station. A wireless device 1502 and a base station 1504 may be part of a communication network, such as the communication network 100 shown in FIG. 1A, the communication network 150 shown in FIG. 1B, or any other communication network. A communication network may comprise more than one wireless device and/or more than one base station, with substantially the same or similar configurations as those shown in FIG. 15A.

The base station 1504 may connect the wireless device 1502 to a core network (not shown) via radio communications over the air interface (or radio interface) 1506. The communication direction from the base station 1504 to the wireless device 1502 over the air interface 1506 may be referred to as the downlink. The communication direction from the wireless device 1502 to the base station 1504 over the air interface may be referred to as the uplink. Downlink transmissions may be separated from uplink transmissions, for example, using various duplex schemes (e.g., FDD, TDD, and/or some combination of the duplexing techniques).

For the downlink, data to be sent to the wireless device 1502 from the base station 1504 may be provided/transferred/sent to the processing system 1508 of the base station 1504. The data may be provided/transferred/sent to the processing system 1508 by, for example, a core network. For the uplink, data to be sent to the base station 1504 from the wireless device 1502 may be provided/transferred/sent to the processing system 1518 of the wireless device 1502. The processing system 1508 and the processing system 1518 may implement layer 3 and layer 2 OSI functionality to process the data for transmission. Layer 2 may comprise an SDAP layer, a PDCP layer, an RLC layer, and a MAC layer, for example, described with respect to FIG. 2A, FIG. 2B, FIG. 3, and FIG. 4A. Layer 3 may comprise an RRC layer, for example, described with respect to FIG. 2B.

The data to be sent to the wireless device 1502 may be provided/transferred/sent to a transmission processing system 1510 of base station 1504, for example, after being processed by the processing system 1508. The data to be sent to base station 1504 may be provided/transferred/sent to a transmission processing system 1520 of the wireless device 1502, for example, after being processed by the processing system 1518. The transmission processing system 1510 and the transmission processing system 1520 may implement layer 1 OSI functionality. Layer 1 may comprise a PHY layer, for example, described with respect to FIG. 2A, FIG. 2B, FIG. 3, and FIG. 4A. For sending/transmission processing, the PHY layer may perform, for example, forward error correction coding of transport channels, interleaving, rate matching, mapping of transport channels to physical channels, modulation of physical channel, multiple-input multiple-output (MIMO) or multi-antenna processing, and/or the like.

A reception processing system 1512 of the base station 1504 may receive the uplink transmission from the wireless device 1502. The reception processing system 1512 of the base station 1504 may comprise one or more TRPs. A reception processing system 1522 of the wireless device 1502 may receive the downlink transmission from the base station 1504. The reception processing system 1522 of the wireless device 1502 may comprise one or more antenna panels. The reception processing system 1512 and the reception processing system 1522 may implement layer 1 OSI functionality. Layer 1 may include a PHY layer, for example, described with respect to FIG. 2A, FIG. 2B, FIG. 3, and FIG. 4A. For receive processing, the PHY layer may perform, for example, error detection, forward error correction decoding, deinterleaving, demapping of transport channels to physical channels, demodulation of physical channels, MIMO or multi-antenna processing, and/or the like.

The base station 1504 may comprise multiple antennas (e.g., multiple antenna panels, multiple TRPs, etc.). The wireless device 1502 may comprise multiple antennas (e.g., multiple antenna panels, etc.). The multiple antennas may be used to perform one or more MIMO or multi-antenna techniques, such as spatial multiplexing (e.g., single-user MIMO or multi-user MIMO), transmit/receive diversity, and/or beamforming. The wireless device 1502 and/or the base station 1504 may have a single antenna.

The processing system 1508 and the processing system 1518 may be associated with a memory 1514 and a memory 1524, respectively. Memory 1514 and memory 1524 (e.g., one or more non-transitory computer readable mediums) may store computer program instructions or code that may be executed by the processing system 1508 and/or the processing system 1518, respectively, to carry out one or more of the functionalities (e.g., one or more functionalities described herein and other functionalities of general computers, processors, memories, and/or other peripherals). The transmission processing system 1510 and/or the reception processing system 1512 may be coupled to the memory 1514 and/or another memory (e.g., one or more non-transitory computer readable mediums) storing computer program instructions or code that may be executed to carry out one or more of their respective functionalities. The transmission processing system 1520 and/or the reception processing system 1522 may be coupled to the memory 1524 and/or another memory (e.g., one or more non-transitory computer readable mediums) storing computer program instructions or code that may be executed to carry out one or more of their respective functionalities.

The processing system 1508 and/or the processing system 1518 may comprise one or more controllers and/or one or more processors. The one or more controllers and/or one or more processors may comprise, for example, a general-purpose processor, a digital signal processor (DSP), a microcontroller, an application specific integrated circuit (ASIC), a field programmable gate array (FPGA) and/or other programmable logic device, discrete gate and/or transistor logic, discrete hardware components, an on-board unit, or any combination thereof. The processing system 1508 and/or the processing system 1518 may perform at least one of signal coding/processing, data processing, power control, input/output processing, and/or any other functionality that may enable the wireless device 1502 and/or the base station 1504 to operate in a wireless environment.

The processing system 1508 may be connected to one or more peripherals 1516. The processing system 1518 may be connected to one or more peripherals 1526. The one or more peripherals 1516 and the one or more peripherals 1526 may comprise software and/or hardware that provide features and/or functionalities, for example, a speaker, a microphone, a keypad, a display, a touchpad, a power source, a satellite transceiver, a universal serial bus (USB) port, a hands-free headset, a frequency modulated (FM) radio unit, a media player, an Internet browser, an electronic control unit (e.g., for a motor vehicle), and/or one or more sensors (e.g., an accelerometer, a gyroscope, a temperature sensor, a radar sensor, a lidar sensor, an ultrasonic sensor, a light sensor, a camera, and/or the like). The processing system 1508 and/or the processing system 1518 may receive input data (e.g., user input data) from, and/or provide output data (e.g., user output data) to, the one or more peripherals 1516 and/or the one or more peripherals 1526. The processing system 1518 in the wireless device 1502 may receive power from a power source and/or may be configured to distribute the power to the other components in the wireless device 1502. The power source may comprise one or more sources of power, for example, a battery, a solar cell, a fuel cell, or any combination thereof. The processing system 1508 may be connected to a Global Positioning System (GPS) chipset 1517. The processing system 1518 may be connected to a Global Positioning System (GPS) chipset 1527. The GPS chipset 1517 and the GPS chipset 1527 may be configured to determine and provide geographic location information of the wireless device 1502 and the base station 1504, respectively.

Figure 15B:
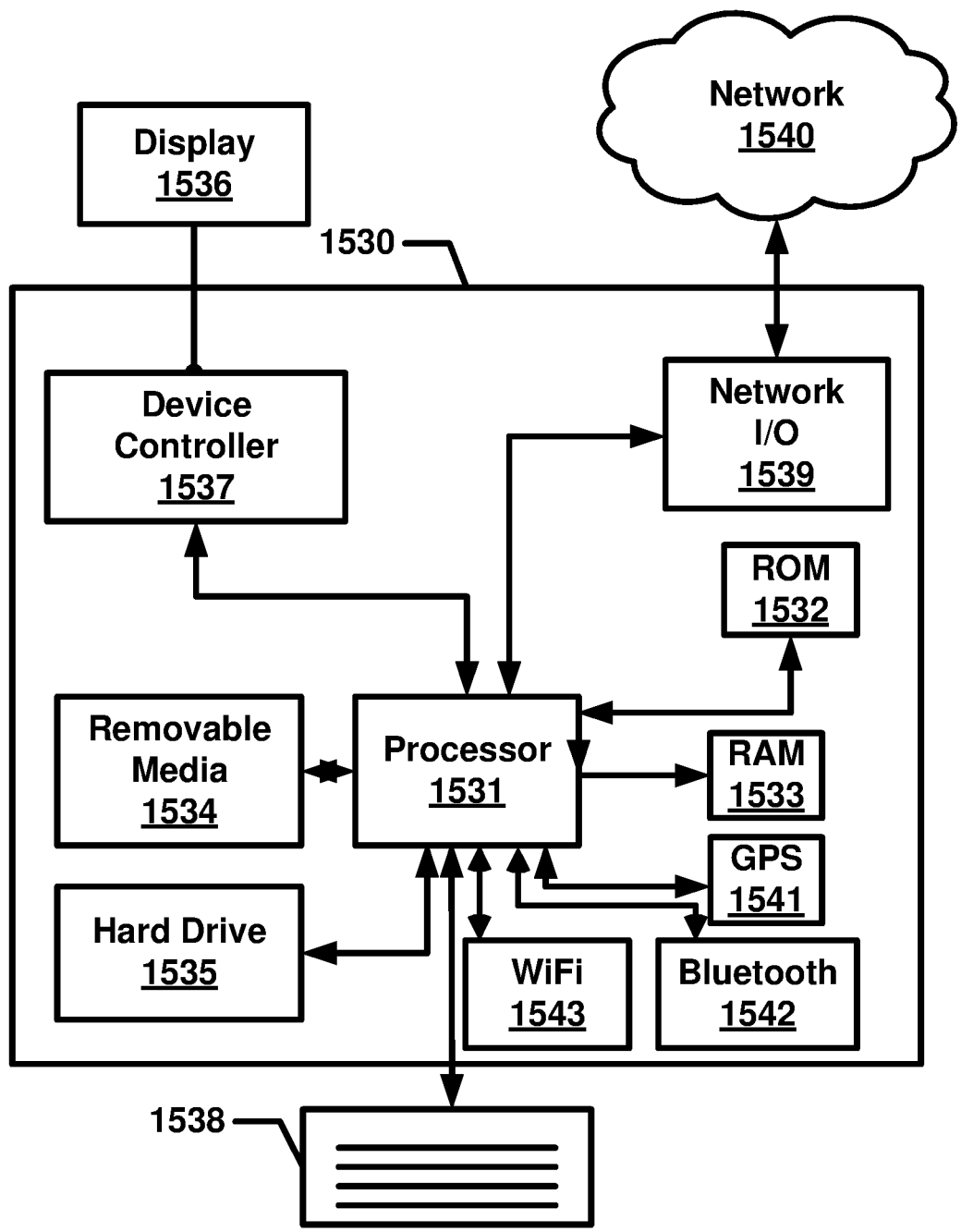
FIG. 15B shows example elements of a computing device that may be used to implement any of the various devices described herein.

FIG. 15B shows example elements of a computing device that may be used to implement any of the various devices described herein, including, for example, the base station 160A, 160B, 162A, 162B, 220, and/or 1504, the wireless device 106, 156A, 156B, 210, and/or 1502, or any other base station, wireless device, AMF, UPF, network device, or computing device described herein. The computing device 1530 may include one or more processors 1531, which may execute instructions stored in the random-access memory (RAM) 1533, the removable media 1534 (such as a Universal Serial Bus (USB) drive, compact disk (CD) or digital versatile disk (DVD), or floppy disk drive), or any other desired storage medium. Instructions may also be stored in an attached (or internal) hard drive 1535. The computing device 1530 may also include a security processor (not shown), which may execute instructions of one or more computer programs to monitor the processes executing on the processor 1531 and any process that requests access to any hardware and/or software components of the computing device 1530 (e.g., ROM 1532, RAM 1533, the removable media 1534, the hard drive 1535, the device controller 1537, a network interface 1539, a GPS 1541, a Bluetooth interface 1542, a WiFi interface 1543, etc.). The computing device 1530 may include one or more output devices, such as the display 1536 (e.g., a screen, a display device, a monitor, a television, etc.), and may include one or more output device controllers 1537, such as a video processor. There may also be one or more user input devices 1538, such as a remote control, keyboard, mouse, touch screen, microphone, etc. The computing device 1530 may also include one or more network interfaces, such as a network interface 1539, which may be a wired interface, a wireless interface, or a combination of the two. The network interface 1539 may provide an interface for the computing device 1530 to communicate with a network 1540 (e.g., a RAN, or any other network). The network interface 1539 may include a modem (e.g., a cable modem), and the external network 1540 may include communication links, an external network, an in-home network, a provider's wireless, coaxial, fiber, or hybrid fiber/coaxial distribution system (e.g., a DOCSIS network), or any other desired network. Additionally, the computing device 1530 may include a location-detecting device, such as a global positioning system (GPS) microprocessor 1541, which may be configured to receive and process global positioning signals and determine, with possible assistance from an external server and antenna, a geographic position of the computing device 1530.

The example in FIG. 15B may be a hardware configuration, although the components shown may be implemented as software as well. Modifications may be made to add, remove, combine, divide, etc. components of the computing device 1530 as desired. Additionally, the components may be implemented using basic computing devices and components, and the same components (e.g., processor 1531, ROM storage 1532, display 1536, etc.) may be used to implement any of the other computing devices and components described herein. For example, the various components described herein may be implemented using computing devices having components such as a processor executing computer-executable instructions stored on a computer-readable medium, as shown in FIG. 15B. Some or all of the entities described herein may be software based, and may co-exist in a common physical platform (e.g., a requesting entity may be a separate software process and program from a dependent entity, both of which may be executed as software on a common computing device).

FIG. 16A shows an example structure for uplink transmission. Processing of a baseband signal representing a physical uplink shared channel may comprise/perform one or more functions. The one or more functions may comprise at least one of: scrambling; modulation of scrambled bits to generate complex-valued symbols; mapping of the complex-valued modulation symbols onto one or several transmission layers; transform precoding to generate complex-valued symbols; precoding of the complex-valued symbols; mapping of precoded complex-valued symbols to resource elements; generation of complex-valued time-domain Single Carrier-Frequency Division Multiple Access (SC-FDMA), CP-OFDM signal for an antenna port, or any other signals; and/or the like. An SC-FDMA signal for uplink transmission may be generated, for example, if transform precoding is enabled. A CP-OFDM signal for uplink transmission may be generated, for example, if transform precoding is not enabled (e.g., as shown in FIG. 16A). These functions are examples and other mechanisms for uplink transmission may be implemented.

FIG. 16B shows an example structure for modulation and up-conversion of a baseband signal to a carrier frequency. The baseband signal may be a complex-valued SC-FDMA, CP-OFDM baseband signal (or any other baseband signals) for an antenna port and/or a complex-valued Physical Random Access Channel (PRACH) baseband signal. Filtering may be performed/employed, for example, prior to transmission.

FIG. 16C shows an example structure for downlink transmissions. Processing of a baseband signal representing a physical downlink channel may comprise/perform one or more functions. The one or more functions may comprise: scrambling of coded bits in a codeword to be sent/transmitted on/via a physical channel; modulation of scrambled bits to generate complex-valued modulation symbols; mapping of the complex-valued modulation symbols onto one or several transmission layers; precoding of the complex-valued modulation symbols on a layer for transmission on the antenna ports; mapping of complex-valued modulation symbols for an antenna port to resource elements; generation of complex-valued time-domain OFDM signal for an antenna port; and/or the like. These functions are examples and other mechanisms for downlink transmission may be implemented.

FIG. 16D shows an example structure for modulation and up-conversion of a baseband signal to a carrier frequency. The baseband signal may be a complex-valued OFDM baseband signal for an antenna port or any other signal. Filtering may be performed/employed, for example, prior to transmission.

A wireless device may receive, from a base station, one or more messages (e.g. RRC messages) comprising configuration parameters of a plurality of cells (e.g., a primary cell, one or more secondary cells). The wireless device may communicate with at least one base station (e.g., two or more base stations in dual-connectivity) via the plurality of cells. The one or more messages (e.g. as a part of the configuration parameters) may comprise parameters of PHY, MAC, RLC, PCDP, SDAP, RRC layers for configuring the wireless device. The configuration parameters may comprise parameters for configuring PHY and MAC layer channels, bearers, etc. The configuration parameters may comprise parameters indicating values of timers for PHY, MAC, RLC, PCDP, SDAP, RRC layers, and/or communication channels.

A timer may begin running, for example, if it is started, and continue running until it is stopped or until it expires. A timer may be started, for example, if it is not running or restarted if it is running A timer may be associated with a value (e.g., the timer may be started or restarted from a value or may be started from zero and expire if it reaches the value). The duration of a timer may not be updated, for example, until the timer is stopped or expires (e.g., due to BWP switching). A timer may be used to measure a time period/window for a process. With respect to an implementation and/or procedure related to one or more timers or other parameters, it will be understood that there may be multiple ways to implement the one or more timers or other parameters. One or more of the multiple ways to implement a timer may be used to measure a time period/window for the procedure. A random access response window timer may be used for measuring a window of time for receiving a random access response. The time difference between two time stamps may be used, for example, instead of starting a random access response window timer and determine the expiration of the timer. A process for measuring a time window may be restarted, for example, if a timer is restarted. Other example implementations may be configured/provided to restart a measurement of a time window.

A base station may configure a wireless device with one or more SRS resource sets. A base station may configure a wireless device with one or more SRS resource sets, for example, by a higher layer parameter (e.g., SRS-Resource-Set). The base station may configure the wireless device with one or more SRS resources by a higher layer parameter (e.g., SRS-Resource), for example, for an SRS resource set of the one or more SRS resource sets. The wireless device may indicate a maximum value of a number/quantity of the one or more SRS resources to the base station (e.g., by SRS_capability). The base station may configure an applicability of the SRS resource set by a higher layer parameter usage in the higher layer parameter (e.g., SRS-ResourceSet).

The wireless device may send (e.g., transmit), at a given time instant, one SRS resource of the one or more SRS resources in each SRS resource set (e.g., simultaneously, during a same time period). The wireless device may send (e.g., transmit), at a given time instant, one SRS resource of the one or more SRS resources in each SRS resource set (e.g., simultaneously, during a same time period), for example, if the higher layer parameter usage is set to an indication, such as 'BeamManagement' and/or the like. The wireless device may determine that the one SRS resource of the one or more SRS resources in each SRS resource set may have the same time domain behavior in a same BWP (e.g., uplink BWP). The wireless device may send (e.g., transmit) the one SRS resource of the one or more SRS resources in each SRS resource set in the same BWP simultaneously. The wireless device may send (e.g., transmit) the one SRS resource of the one or more SRS resources in each SRS resource set in the same BWP simultaneously, for example, based on determining that the one SRS resource of the one or more SRS resources in each SRS resource set may have the same time domain behavior in a same BWP (e.g., uplink BWP).

The wireless device may send (e.g., transmit), at a given time instant, only one SRS resource in each of the one or more SRS resource sets (e.g., simultaneously or substantially simultaneously). The wireless device may send (e.g., transmit), at a given time instant, only one SRS resource in each of the one or more SRS resource sets (e.g., simultaneously or substantially simultaneously), for example, if the higher layer parameter usage is set to an indication, such as 'BeamManagement' and/or the like. The wireless device may determine that the only one SRS resource in each of the one or more SRS resource sets may have the same time domain behavior in a same BWP (e.g., uplink BWP). The wireless device may send (e.g., transmit) the only one SRS resource in each of the one or more SRS resource sets in the same BWP simultaneously. The wireless device may send (e.g., transmit) the only one SRS resource in each of the one or more SRS resource sets in the same BWP simultaneously, for example, based on determining that the only one SRS resource in each of the one or more SRS resource sets may have the same time domain behavior in a same BWP (e.g., uplink BWP).

The wireless device may send (e.g., transmit), at a given time instant, one SRS resource in each of one or more SRS resource sets simultaneously. The wireless device may send (e.g., transmit), at a given time instant, one SRS resource in each of one or more SRS resource sets simultaneously, for example, if the higher layer parameter usage is set to an indication, such as 'BeamManagement' and/or the like. The wireless device may determine that the one SRS resource in each of the one or more SRS resource sets may have the same time domain behavior in a same BWP (e.g., uplink BWP). The wireless device may send (e.g., transmit) the one SRS resource in each of the one or more SRS resource sets in the same BWP simultaneously. The wireless device may send (e.g., transmit) the one SRS resource in each of the one or more SRS resource sets in the same BWP simultaneously, for example, based on determining that the one SRS resource in each of the one or more SRS resource sets may have the same time domain behavior in a same BWP (e.g., uplink BWP).

The one or more SRS resource sets may comprise at least a first SRS resource set and/or a second SRS resource set. The first SRS resource set may comprise one or more first SRS resources. The one or more first SRS resources may comprise a first SRS resource and a second SRS resource. The second SRS resource set may comprise one or more second SRS resources. The one or more second SRS resources may comprise a third SRS resource and a fourth SRS resource.

Time domain behaviors in a BWP may be the same. For example, first time domain behavior of the first SRS resource and a third time domain behavior of the third SRS resource may be the same in a BWP. The wireless device may send (e.g., transmit), in a given time instant in the BWP, the first SRS resource of the first SRS resource set and the third SRS resource of the second SRS resource set simultaneously (or substantially simultaneously or during a same time period). The wireless device may send (e.g., transmit), in a given time instant in the BWP, the first SRS resource of the first SRS resource set and the third SRS resource of the second SRS resource set simultaneously (or substantially simultaneously or during a same time period), for example, if the higher layer parameter usage is set to an indication, such as 'BeamManagement' and/or the like. The wireless device may send (e.g., transmit), in a given time instant in the BWP, the first SRS resource of the first SRS resource set and the third SRS resource of the second SRS resource set simultaneously (or substantially simultaneously or during a same time period), for example, based on the first time domain behavior of the first SRS resource and the third time domain behavior of the third SRS resource being the same.

Time behaviors may be different in a BWP. For example, a first time domain behavior of the first SRS resource and a fourth time domain behavior of the fourth SRS resource may be different in a BWP. The wireless device may not send (e.g., transmit), in a given time instant in the BWP, the first SRS resource of the first SRS resource set and the fourth SRS resource of the second SRS resource set simultaneously (or substantially simultaneously or during a same time period). The wireless device may not send (e.g., transmit), in a given time instant in the BWP, the first SRS resource of the first SRS resource set and the fourth SRS resource of the second SRS resource set simultaneously (or substantially simultaneously or during a same time period), for example, if the higher layer parameter usage is set to an indication, such as 'BeamManagement' and/or the like. The wireless device may not send (e.g., transmit), in a given time instant in the BWP, the first SRS resource of the first SRS resource set and the fourth SRS resource of the second SRS resource set simultaneously, for example, based on the first time domain behavior of the first SRS resource and the fourth time domain behavior of the fourth SRS resource being different.

A second time domain behavior of the second SRS resource and a fourth time domain behavior of the fourth SRS resource may be the same in a BWP. The wireless device may send (e.g., transmit), in a given time instant in the BWP, the second SRS resource of the first SRS resource set and the fourth SRS resource of the second SRS resource set simultaneously (or substantially simultaneously or during a same time period). The wireless device may send (e.g., transmit), in a given time instant in the BWP, the second SRS resource of the first SRS resource set and the fourth SRS resource of the second SRS resource set simultaneously (or substantially simultaneously or during a same time period), for example, if the higher layer parameter usage is set to an indication, such as 'BeamManagement' and/or the like. The wireless device may send (e.g., transmit), in a given time instant in the BWP, the second SRS resource of the first SRS resource set and the fourth SRS resource of the second SRS resource set simultaneously (or substantially simultaneously or during a same time period), for example, based on the second time domain behavior of the second SRS resource and the fourth time domain behavior of the fourth SRS resource being the same.

A second time domain behavior of the second SRS resource and a third time domain behavior of the third SRS resource may be different in a BWP. The wireless device may not send (e.g., transmit), in a given time instant in the BWP, the second SRS resource of the first SRS resource set and the third SRS resource of the second SRS resource set simultaneously (or substantially simultaneously or during a same time period). The wireless device may not send (e.g., transmit), in a given time instant in the BWP, the second SRS resource of the first SRS resource set and the third SRS resource of the second SRS resource set simultaneously (or substantially simultaneously or during a same time period), for example, if the higher layer parameter usage is set to an indication, such as 'BeamManagement' and/or the like. The wireless device may not send (e.g., transmit), in a given time instant in the BWP, the second SRS resource of the first SRS resource set and the third SRS resource of the second SRS resource set simultaneously (or substantially simultaneously or during a same time period), for example, based on the second time domain behavior of the second SRS resource and the third time domain behavior of the third SRS resource being different.

The higher layer parameter SRS-Resource may configure (e.g., semi-statically) at least one of: an SRS resource index (e.g., provided by a higher layer parameter srs-ResourceId) indicating a configuration of an SRS resource; a time domain behavior of the configuration of the SRS resource (e.g., indicated by a higher layer parameter resourceType); an SRS sequence ID (e.g., provided by a higher layer parameter sequenceId; and a configuration of a spatial relation between a reference RS and a target SRS. The base station may configure the wireless device with a higher layer parameter spatialRelationInfo. The higher layer parameter spatialRelationInfo may comprise an index (ID) of the reference RS. The domain behavior of an SRS resource may be a periodic transmission, a semi-persistent transmission, or an aperiodic SRS transmission. A time domain behavior of an SRS resource may comprise a transmission periodicity, a transmission offset of the SRS resource, etc.

The wireless device may determine that a higher layer parameter (e.g., servingCellId) indicating a serving cell may be present in another higher layer parameter (e.g., spatialRelationInfo). The wireless device may determine that the reference RS may be a first RS (e.g., SS/PBCH block, CSI-RS) configured on the serving cell. The wireless device may determine that the reference RS may be a first RS (e.g., SS/PBCH block, CSI-RS) configured on the serving cell, for example, based on determining that a higher layer parameter servingCellId indicating a serving cell may be present in the higher layer parameter spatialRelationInfo.

The wireless device may determine that a higher layer parameter (e.g., uplinkBWP) indicating an uplink BWP and a higher layer parameter (e.g., servingCellId) indicating a serving cell may be present in the higher layer parameter spatialRelationInfo. The wireless device may determine that the reference RS may be a first RS (e.g., SRS) configured on the uplink BWP of the serving cell. The wireless device may determine that the reference RS may be a first RS (e.g., SRS) configured on the uplink BWP of the serving cell, for example, based on determining that a higher layer parameter (e.g., uplinkBWP) indicating an uplink BWP and a higher layer parameter (e.g., servingCellId) indicating a serving cell may be present in another higher layer parameter (e.g., spatialRelationInfo).

The base station may configure the target SRS on a serving cell. The wireless device may determine that a higher layer parameter (e.g., servingCellId) may be absent in a higher layer parameter (e.g., spatialRelationInfo). The wireless device may determine that the reference RS may be a first RS (e.g., SS/PBCH block, CSI-RS) configured on the serving cell. The wireless device may determine that the reference RS may be a first RS (e.g., SS/PBCH block, CSI-RS) configured on the serving cell, for example, based on determining that a higher layer parameter (e.g., servingCellId) may be absent in a higher layer parameter (e.g., spatialRelationInfo).

The base station may configure the target SRS on a serving cell. The wireless device may determine that a higher layer parameter (e.g., servingCellId) is absent and a higher layer parameter (e.g., uplinkBWP) indicating an uplink BWP is present in another higher layer parameter (e.g., spatialRelationInfo). The wireless device may determine that the reference RS may be a first RS (e.g., SRS) configured on the uplink BWP the serving cell. The wireless device may determine that the reference RS may be a first RS (e.g., SRS) configured on the uplink BWP the serving cell, based on determining that a higher layer parameter (e.g., servingCellId) is absent and a higher layer parameter (e.g., uplinkBWP) indicating an uplink BWP is present in another higher layer parameter (e.g., spatialRelationInfo).

A wireless device may send (e.g., transmit) PUSCH and SRS in a same slot. The base station may configure the wireless device to send (e.g., transmit) the SRS. The base station may configure the wireless device to send (e.g., transmit) the SRS, for example, based on sending (e.g., transmitting) the PUSCH and SRS in the same slot. The base station may configure the wireless device to send (e.g., transmit) the SRS, for example, based on the transmission of the PUSCH (and the corresponding DM-RS).

A base station may configure a wireless device with one or more SRS resource configurations. A higher layer parameter (e.g., resourceType) in a higher layer SRS parameter (e.g., SRS-Resource) may be set to "periodic". The base station may configure the wireless device with a higher layer parameter (e.g., spatialRelationInfo). The higher layer parameter spatialRelationInfo may comprise an ID of a reference RS (e.g., ssb-Index, csi-RS-Index, srs).

The reference RS may be a SS/PBCH block. The reference RS may be a CSI-RS (e.g., periodic CSI-RS, semi-persistent CSI-RS, aperiodic CSI-RS). The wireless device may use a spatial domain receiving filter to receive the reference RS. The wireless device may send (e.g., transmit) a target SRS resource with a spatial domain transmission filter same as the spatial domain receiving filter. The wireless device may send (e.g., transmit) a target SRS resource with a spatial domain transmission filter same as the spatial domain receiving filter, for example, based on the higher layer parameter spatialRelationInfo indicating the reference RS (e.g., by the ID of the reference RS) being the SS/PBCH block or the CSI-RS. The wireless device may send (e.g., transmit) a target SRS resource with the spatial domain receiving filter. The wireless device may send (e.g., transmit) a target SRS resource with the spatial domain receiving filter, for example, based on a higher layer parameter (e.g., spatialRelationInfo) indicating the reference RS (e.g., by the ID of the reference RS), The reference RS may be an SRS (e.g., periodic SRS, semi-persistent SRS, aperiodic SRS). The wireless device may use a spatial domain transmission filter to send (e.g., transmit) the reference RS. The wireless device may send (e.g., transmit) a target SRS resource with the spatial domain transmission filter. The wireless device may send (e.g., transmit) a target SRS resource with the spatial domain transmission filter, for example, based on a higher layer parameter (e.g., spatialRelationInfo) indicating the reference RS (e.g., by the ID of the reference RS) being the SRS, The base station may activate and/or deactivate one or more configured SRS resource sets (e.g., semi-persistent SRS resource sets) of a serving cell. The base station may activate and/or deactivate one or more configured SRS resource sets (e.g., semi-persistent SRS resource sets) of a serving cell, for example, by sending an SP SRS Activation/Deactivation MAC CE. The one or more configured SRS resource sets may be initially deactivated upon configuration. The one or more configured SRS resource sets may be deactivated based on a handover.

A base station may configure a wireless device with one or more SRS resource sets (e.g., semi-persistent SRS resource sets). A higher layer parameter (e.g., resourceType) in a higher layer SRS parameter (e.g., SRS-Resource) may be set to an indication of "semi-persistent" and/or the like. The wireless device may receive an activation command (e.g., SP SRS Activation/Deactivation MAC CE). The wireless device may receive an activation command (e.g., SP SRS Activation/Deactivation MAC CE), for example, for an SRS resource set of the one or more SRS resource sets. The wireless device may receive an activation command (e.g., SP SRS Activation/Deactivation MAC CE), for example, from the base station. A PDSCH may carry the activation command. The wireless device may send (e.g., transmit) an HARQ-ACK. The wireless device may send (e.g., transmit) an HARQ-ACK, for example, for the PDSCH in a slot n. The wireless device may use one or more assumptions/actions for an SRS transmission of the SRS resource set starting from the slot $n+3N_{slot}^{subframe,\mu}+1$. The wireless device may use one or more assumptions/actions for an SRS transmission of the SRS resource set starting from the slot $n+3N_{slot}^{subframe,\mu}+1$, for example, based on sending (e.g., transmitting) the HARQ-ACK for the PDSCH in the slot n. The activation command may comprise one or more spatial relation assumptions. The activation command may comprise one or more spatial relation assumptions, for example, for one or more SRS resources of the SRS resource set. A first field (e.g., Resource IDi) in the activation command may comprise an identifier of a resource (e.g., SS/PBCH block, NZP CSI-RS, SRS) used for spatial relationship derivation. A first field (e.g., Resource IDi) in the activation command may comprise an identifier of a resource (e.g., SS/PBCH block, NZP CSI-RS, SRS) used for spatial relationship derivation, for example, for an SRS resource of the one or more SRS resources. The one or more spatial relation assumptions may be provided by a list of references to one or more reference signal IDs (e.g., SSB-Index, SRS-ResourceId, etc.). The one or more spatial relation assumptions may be provided on the basis of one spatial relation assumption per SRS resource of the (activated) SRS resource set. A spatial relation assumption of the one or more spatial relation assumption may be provided by a reference to an ID of a reference RS. The reference RS may be SS/PBCH block, NZP CSI-RS resource, or SRS.

A Resource Serving Cell ID field indicating a serving cell may be present in the activation command. The reference RS may be an SS/PBCH block resource or a NZP CSI-RS resource. The reference RS (e.g., SS/PBCH block, NZP CSI-RS resource) may be configured on the serving cell. The reference RS (e.g., SS/PBCH block, NZP CSI-RS resource) may be configured on the serving cell, for example, based on the Resource Serving Cell ID field being present and the reference RS being the SS/PBCH block resource or the NZP CSI-RS resource.

The base station may configure the (activated) SRS resource set on a serving cell. A Resource Serving Cell ID field may be absent in the activation command. The reference RS (e.g., SS/PBCH block, NZP CSI-RS resource) may be configured on the serving cell. The reference RS (e.g., SS/PBCH block, NZP CSI-RS resource) may be configured on the serving cell, for example, based on the Resource Serving Cell ID field being absent and/or the base station configuring the SRS resource set on the serving cell.

A Resource Serving Cell ID field indicating a serving cell and a Resource BWP ID field indicating an uplink BWP may be present in the activation command. The reference RS (e.g., SRS resource) may be configured on the uplink BWP of the serving cell. The reference RS (e.g., SRS resource) may be configured on the uplink BWP of the serving cell, for example, based on the Resource Serving Cell ID field and the Resource BWP ID field being present.

The base station may configure the SRS resource set on an uplink BWP of a serving cell. A Resource Serving Cell ID field and a Resource BWP ID field may be absent in the activation command. The reference RS (e.g., SRS resource) may be configured on the uplink BWP of the serving cell. The reference RS (e.g., SRS resource) may be configured on the uplink BWP of the serving cell, for example, based on the Resource Serving Cell ID field and the Resource BWP ID field being absent and the SRS resource set being configured on the uplink BWP of the serving cell.

The base station may configure an SRS resource in the (activated) SRS resource set with a higher layer parameter spatialRelationInfo. The wireless device may assume that a reference RS (e.g., indicated by an ID of the reference RS) in the activation command overrides a second reference RS configured in the higher layer parameter spatialRelationInfo. The wireless device may assume/determine that a reference RS (e.g., indicated by an ID of the reference RS) in the activation command overrides a second reference RS configured in a higher layer parameter (e.g., spatialRelation-Info), for example, based on the SRS resource, in the (activated) SRS resource set, being configured with the higher layer parameter (e.g., spatialRelationInfo).

The wireless device may receive a deactivation command (e.g., SP SRS Activation/Deactivation MAC CE). The wireless device may receive a deactivation command (e.g., SP SRS Activation/Deactivation MAC CE), for example, from the base station. The wireless device may receive a deactivation command (e.g., SP SRS Activation/Deactivation MAC CE), for example, for an (activated) SRS resource set of the one or more SRS resource sets. A PDSCH may carry the deactivation command. The wireless device may send (e.g., transmit) an HARQ-ACK for the PDSCH in a slot n. The wireless device may use one or more assumptions/actions for a cessation of an SRS transmission of the (deactivated) SRS resource set starting from the slot $n+3N_{slot}^{subframe,\mu}+1$. The wireless device may use one or more assumptions/actions for a cessation of an SRS transmission of the (deactivated) SRS resource set starting from the slot $n+3N_{slot}^{subframe,\mu}+1$, for example, based on sending (e.g., transmitting) the HARQ-ACK for the PDSCH in the slot n.

A wireless device may activate a semi-persistent SRS resource configuration on an uplink BWP of a serving cell. A wireless device may activate a semi-persistent SRS resource configuration on an uplink BWP of a serving cell, for example, based on receiving, from a base station, an activation command for the semi-persistent SRS resource configuration.

The wireless device may not receive, from the base station, a deactivation command for the semi-persistent SRS resource configuration. The uplink BWP may be an active uplink BWP of the serving cell. The wireless device may consider the semi-persistent SRS resource configuration active. The wireless device may consider the semi-persistent SRS resource configuration active, for example, based on the uplink BWP being the active uplink BWP of the serving cell and not receiving the deactivation command for the semi-persistent SRS resource configuration. The wireless device may send (e.g., transmit) an SRS transmission. The wireless device may send (e.g., transmit) an SRS transmission, for example, according to the semi-persistent SRS resource configuration. The wireless device may send (e.g., transmit) an SRS transmission, for example, via the uplink BWP of the serving cell. The wireless device may send (e.g., transmit) an SRS transmission, for example, based on considering the semi-persistent SRS resource configuration active.

The uplink BWP may not be an active uplink BWP of the serving cell. The uplink BWP not being the active uplink BWP may comprise the uplink BWP being deactivated in the serving cell. The wireless device may assume/determine that the semi-persistent SRS configuration is suspended in the UL BWP of the serving cell. The wireless device may assume/determine that the semi-persistent SRS configuration is suspended in the UL BWP of the serving cell, for example, based on not receiving the deactivation command for the semi-persistent SRS resource configuration and the uplink BWP being deactivated. The semi-persistent SRS configuration being suspended in the UL BWP may comprise that the wireless device may reactivate the semi-persistent SRS configuration. The semi-persistent SRS configuration being suspended in the UL BWP may comprise that the wireless device may reactivate the semi-persistent SRS configuration, for example, if the UL BWP becomes an active UL BWP of the serving cell.

A first SRS resource of an SRS resource set may have a first time domain behavior (e.g., periodic, semi-persistent, aperiodic). A second SRS resource of the SRS resource set may have a second time domain behavior (e.g., periodic, semi-persistent, aperiodic). The wireless device may expect/determine that the first time domain behavior and the second time behavior are the same. The wireless device may expect/determine that the first time domain behavior and the second time behavior are the same, for example, based on the first SRS resource and the second SRS resource being in the (same) SRS resource set. The wireless device may not expect/not determine that the first time domain behavior and the second time behavior are different. The wireless device may not expect/not determine that the first time domain behavior and the second time behavior are different, for example, based on the first SRS resource and the second SRS resource being in the (same) SRS resource set.

An SRS resource of an SRS resource set may have a first time domain behavior (e.g., periodic, semi-persistent, aperiodic). The SRS resource set may have a second time domain behavior (e.g., periodic, semi-persistent, aperiodic). The wireless device may expect/determine that the first time domain behavior and the second time behavior are the same. The wireless device may expect/determine that the first time domain behavior and the second time behavior are the same, for example, based on the SRS resource being associated with the SRS resource set. The wireless device may not expect/not determine that the first time domain behavior and the second time behavior are different. The wireless device may not expect/not determine that the first time domain behavior and the second time behavior are different, for example, based on the SRS resource and the SRS resource set being associated. The SRS resource being associated with the SRS resource set may comprise that the SRS resource set comprises the SRS resource. The SRS resource being associated with the SRS resource set may comprise that the SRS resource is an element of the SRS resource set.

A base station may configure a wireless device with a PUCCH. A base station may configure a wireless device with a PUCCH, for example, on at least one first symbol on a carrier (e.g., SUL, NUL). The PUCCH may carry/comprise one or more CSI reports. The PUCCH may carry/comprise one or more L1-RSRP reports. The PUCCH may carry/comprise HARQ-ACK and/or SR. The base station may configure the wireless device with an SRS configuration on the carrier. The SRS configuration may be a semi-persistent SRS configuration. The SRS configuration may be a periodic SRS configuration. The wireless device may determine that the PUCCH and an SRS transmission of the SRS configuration overlap in at least one symbol. The wireless device may determine that the at least one first symbol of the PUCCH and at least one second symbol of the SRS transmission of the SRS configuration may overlap in the at least one symbol. The wireless device may not perform the SRS transmission, on the carrier, on the at least one symbol. The wireless device may not perform the SRS transmission, on the carrier, on the at least one symbol, for example, based on determining that the at least one first symbol of the PUCCH and at least one second symbol of the SRS transmission of the SRS configuration may overlap in the at least one symbol.

A base station may configure a wireless device with a PUCCH. A base station may configure a wireless device with a PUCCH, for example, on at least one first symbol on a carrier (e.g., SUL, NUL). The PUCCH may carry/comprise HARQ-ACK and/or SR. The base station may trigger an SRS configuration on the carrier. The SRS configuration may be an aperiodic SRS configuration. The wireless device may determine that the PUCCH and an SRS transmission of the SRS configuration overlap in at least one symbol. The wireless device may determine that the at least one first symbol of the PUCCH and at least one second symbol of the SRS transmission of the SRS configuration may overlap in the at least one symbol. The wireless device may not perform the SRS transmission, on the carrier, on the at least one symbol. The wireless device may not perform the SRS transmission, on the carrier, on the at least one symbol, for example, based on determining that the at least one first symbol of the PUCCH and/or at least one second symbol of the SRS transmission of the SRS configuration may overlap in the at least one symbol. The not performing the SRS transmission may comprise dropping the SRS transmission on the at least one symbol. The wireless device may perform the SRS transmission on at least one third symbol of the at least one second symbol. The at least one third symbol may not overlap with the at least one symbol.

A base station may configure a wireless device with a PUCCH. A base station may configure a wireless device with a PUCCH, for example, on at least one first symbol on a carrier (e.g., SUL, NUL). The PUCCH may carry/comprise one or more semi-persistent CSI reports. The PUCCH may carry/comprise one or more periodic CSI reports. The PUCCH may carry/comprise one or more semi-persistent L1-RSRP reports. The PUCCH may carry/comprise one or more periodic L1-RSRP reports. The base station may trigger an SRS configuration on the carrier. The SRS configuration may be an aperiodic SRS configuration. The wireless device may determine that the PUCCH and an SRS transmission of the SRS configuration overlap in at least one symbol. The wireless device may determine that the at least one first symbol of the PUCCH and at least one second symbol of the SRS transmission of the SRS configuration being the aperiodic SRS configuration may overlap in the at least one symbol. The wireless device may not send (e.g., transmit) the PUCCH, on the carrier, on the at least one symbol. The wireless device may not send (e.g., transmit) the PUCCH, on the carrier, on the at least one symbol, for example, based on determining that the at least one first symbol of the PUCCH and at least one second symbol of the SRS transmission of the SRS configuration being the aperiodic SRS configuration may overlap in the at least one symbol.

A wireless device may not send (e.g., transmit) an SRS and a PUCCH/PUSCH simultaneously. A wireless device may not send (e.g., transmit) an SRS and a PUCCH/PUSCH simultaneously, for example, in an intra-band CA or in an inter-band CA band-band combination. A base station may not configure the wireless device with an SRS transmission from a first carrier and a PUCCH/PUSCH (e.g., PUSCH/UL DM-RS/UL PT-RS/PUCCH formats) in a second carrier in the same symbol. A base station may not configure the wireless device with an SRS transmission from a first carrier and a PUCCH/PUSCH (e.g., PUSCH/UL DM-RS/UL PT-RS/PUCCH formats) in a second carrier in the same symbol, for example, based on not sending (e.g., transmitting) the SRS and the PUCCH/PUSCH simultaneously. The first carrier may be different from the second carrier.

A wireless device may not send (e.g., transmit) an SRS and a PRACH simultaneously. A wireless device may not send (e.g., transmit) an SRS and a PRACH simultaneously, for example, in an intra-band CA or in an inter-band CA band-band combination. The wireless device may not send (e.g., transmit) an SRS from a first carrier and a PRACH from a second carrier simultaneously. The wireless device may not send (e.g., transmit) an SRS from a first carrier and a PRACH from a second carrier simultaneously (or substantially simultaneously or during a same time period), for example, based on not sending (e.g., transmitting) the SRS and the PRACH simultaneously. The first carrier may be different from the second carrier.

A base station may configure a wireless device with a periodic SRS transmission. A base station may configure a wireless device with a periodic SRS transmission, for example, on at least one symbol (e.g., OFDM symbol). The base station may configure an SRS resource with a higher layer parameter (e.g., resourceType) set as an indication, such as 'aperiodic' and/or the like. The base station may trigger the SRS resource on the at least one symbol. The wireless device may send (e.g., transmit) the (aperiodic) SRS resource on the (overlapped) at least one symbol. The wireless device may send (e.g., transmit) the (aperiodic) SRS resource on the (overlapped) at least one symbol, for example, based on the SRS resource with the higher layer parameter resourceType set to an indication of 'aperiodic,' and/or the like, being triggered on the at least one symbol configured with the periodic SRS transmission. The wireless device may not perform the periodic SRS transmission on the at least one symbol. The wireless device may not perform the periodic SRS transmission on the at least one symbol, for example, based on the SRS resource with the higher layer parameter resourceType set as an indication of 'aperiodic,' and/or the like, being triggered on the at least one symbol configured with the periodic SRS transmission. The not performing the periodic SRS transmission may comprise that the wireless device may not send (e.g., transmit) an SRS associated with the periodic SRS transmission on the (overlapped) at least one symbol.

A base station may configure a wireless device with a semi-persistent SRS transmission. A base station may configure a wireless device with a semi-persistent SRS transmission, for example, on at least one symbol (e.g., OFDM symbol). The base station may configure an SRS resource with a higher layer parameter (e.g., resourceType) set to an indication such as 'aperiodic and/or the like'. The base station may trigger the SRS resource on the at least one symbol. The wireless device may send (e.g., transmit) the (aperiodic) SRS resource on the (overlapped) at least one symbol. The wireless device may send (e.g., transmit) the (aperiodic) SRS resource on the (overlapped) at least one symbol, for example, based on the SRS resource with the higher layer parameter resourceType set to an indication such as 'aperiodic,' and/or the like, being triggered on the at least one symbol configured with the semi-persistent SRS transmission. The wireless device may not perform the semi-persistent SRS transmission on the at least one symbol. The wireless device may not perform the semi-persistent SRS transmission on the at least one symbol, for example, based on the SRS resource with the higher layer parameter resourceType set to an indication such as 'aperiodic,' and/or the like, being triggered on the at least one symbol configured with the semi-persistent SRS transmission. The not performing the semi-persistent SRS transmission may comprise that the wireless device may not send (e.g., transmit) an SRS associated with the semi-persistent SRS transmission on the (overlapped) at least one symbol.

A base station may configure a wireless device with a periodic SRS transmission. A base station may configure a wireless device with a periodic SRS transmission, for example, on at least one symbol (e.g., OFDM symbol). The base station may configure an SRS resource with a higher layer parameter resourceType set to an indication such as 'semi-persistent,' and/or the like. The base station may trigger the SRS resource on the at least one symbol. The wireless device may send (e.g., transmit) the (semi-persistent) SRS resource on the (overlapped) at least one symbol. The wireless device may send (e.g., transmit) the (semi-persistent) SRS resource on the (overlapped) at least one symbol, for example, based on the SRS resource with the higher layer parameter resourceType set to an indication such as 'semi-persistent,' and/or the like, being triggered on the at least one symbol configured with the periodic SRS transmission. The wireless device may not perform the periodic SRS transmission on the at least one symbol. The wireless device may not perform the periodic SRS transmission on the at least one symbol, for example, based on the SRS resource with the higher layer parameter resourceType set to an indication such as 'semi-persistent,' and/or the like, being triggered on the at least one symbol configured with the periodic SRS transmission. The not performing the periodic SRS transmission may comprise that the wireless device may not send (e.g., transmit) an SRS associated with the periodic SRS transmission on the (overlapped) at least one symbol.

A wireless device may be configured with one or more serving cells. A wireless device may be configured with one or more serving cells, for example, by a base station. The base station may activate one or more second serving cells of the one or more serving cells. The base station may configure each activated serving cell of the one or more second serving cells with a respective PDCCH monitoring. The wireless device may monitor a set of PDCCH candidates in one or more CORESETs on an active DL BWP of each activated serving cell configured with the respective PDCCH monitoring. The wireless device may monitor the set of PDCCH candidates in the one or more CORESETs according to corresponding search space sets. The monitoring may comprise decoding each PDCCH candidate of the set of PDCCH candidates according to monitored DCI formats.

A set of PDCCH candidates for a wireless device to monitor may be defined in terms of PDCCH search space sets. A search space set may be a common search space (CSS) set or a wireless device specific search space (USS) set.

One or more PDCCH monitoring occasions may be associated with a SS/PBCH block. The SS/PBCH block may be QCLed with a CSI-RS. A TCI state of an active BWP may comprise the CSI-RS. The active BWP may comprise a CORESET identified with index being equal to zero (e.g., CORESET zero). The wireless device may determine the TCI state by the most recent of: an indication by a MAC CE activation command or a random access procedure that is not initiated by a PDCCH order that triggers a non-contention based random access procedure. A wireless device may monitor corresponding PDCCH candidates at the one or more PDCCH monitoring occasions. A wireless device may monitor corresponding PDCCH candidates at the one or more PDCCH monitoring occasions, for example, for a DCI format with CRC scrambled by a C-RNTI. A wireless device may monitor corresponding PDCCH candidates at the one or more PDCCH monitoring occasions, for example, based on the one or more PDCCH monitoring occasions being associated with the SS/PBCH block.

A base station may configure a wireless device with one or more DL BWPs in a serving cell. The wireless device may be provided by a higher layer signaling with one or more (e.g., 2, 3) CORESETs. The wireless device may be provided by a higher layer signaling with one or more (e.g., 2, 3) CORESETs, for example, for a DL BWP of the one or more DL BWPs. For a CORESET of the one or more CORESETs, the base station may provide the wireless device, by a higher layer parameter (e.g., ControlResourceSet), at least one of: a CORESET index (e.g., provided by higher layer parameter controlResourceSetId), a DM-RS scrambling sequence initialization value (e.g., provided by a higher layer parameter pdcch-DMRS-ScramblingID); a number/quantity of consecutive symbols (e.g., provided by a higher layer parameter duration), a set of resource blocks (e.g., provided by higher layer parameter frequencyDomainResources), CCE-to-REG mapping parameters (e.g., provided by higher layer parameter cce-REG-MappingType), an antenna port QCL (e.g., from a set of antenna port QCLs provided by a first higher layer parameter tci-StatesPDCCH-ToAddList and a second higher layer parameter tci-StatesPDCCH-ToReleaseList), and an indication for a presence and/or absence of a TCI field for a DCI format (e.g., DCI format 1_1) sent (e.g., transmitted) by a PDCCH in the CORESET (e.g., provided by higher layer parameter TCI-PresentInDCI). The antenna port QCL may indicate a QCL information (QCL-Info) of one or more DM-RS antenna ports for a PDCCH reception in the CORESET. The CORESET index may be unique among the one or more DL BWPs of the serving cell. The wireless device may consider/determine that a TCI field is absent/disabled in the DCI format. The wireless device may consider/determine that a TCI field is absent/disabled in the DCI format, for example, if a higher layer parameter (e.g., TCI-PresentInDCI) is absent.

A first higher layer parameter (e.g., tci-StatesPDCCH-ToAddList) and a second higher layer parameter (e.g., tci-StatesPDCCH-ToReleaseList) may provide a subset of TCI states defined in a configuration (e.g., pdsch-Config). The wireless device may use the subset of the TCI states to provide one or more QCL relationships between one or more RS in a TCI state of the subset of the TCI states and one or more DM-RS ports of a PDCCH reception in the CORESET.

A base station may configure a CORESET for a wireless device. A CORESET index (e.g., provided by higher layer parameter such as controlResourceSetId) of the CORESET may be non-zero. The base station may not provide the wireless device with a configuration of one or more TCI states for the CORESET. The base station may not provide the wireless device with a configuration of one or more TCI states for the CORESET, for example, by a first higher layer parameter (e.g., tci-StatesPDCCH-ToAddList) and/or a second higher layer parameter (e.g., tci-StatesPDCCH-ToReleaseList). The wireless device may assume/determine that one or more DM-RS antenna ports for a PDCCH reception in the CORESET is QCLed with an RS (e.g., SS/PBCH block). The wireless device may assume/determine that one or more DM-RS antenna ports for a PDCCH reception in the CORESET is QCLed with an RS (e.g., SS/PBCH block), for example, based on not being provided with the configuration of the one or more TCI states for the CORESET. The wireless device may identify/indicate the RS in an initial access procedure.

A base station may configure a CORESET for a wireless device. A CORESET index (e.g., provided by higher layer parameter such as controlResourceSetId) of the CORESET may be non-zero. The base station may provide the wireless device with an initial configuration of at least two TCI states for the CORESET. The base station may provide the wireless device with an initial configuration of at least two TCI states for the CORESET, for example, by a first higher layer parameter (e.g., tci-StatesPDCCH-ToAddList) and/or a second higher layer parameter (e.g., tci-StatesPDCCH-ToReleaseList). The wireless device may receive the initial configuration of the at least two TCI states from the base station. The wireless device may not receive a MAC CE activation command for at least one of the at least two TCI states for the CORESET. The wireless device may assume/determine that one or more DM-RS antenna ports for a PDCCH reception in the CORESET is QCLed with an RS (e.g., SS/PBCH block). The wireless device may assume that one or more DM-RS antenna ports for a PDCCH reception in the CORESET is QCLed with an RS (e.g., SS/PBCH block), for example, based on being provided with the initial configuration for the CORESET and not receiving the MAC CE activation command for the CORESET. The wireless device may identify/indicate the RS in an initial access procedure.

A base station may configure a CORESET for a wireless device. A CORESET index (e.g., provided by higher layer parameter such as controlResourceSetId) of the CORESET may be equal to zero. The wireless device may not receive a MAC CE activation command for a TCI state for the CORESET. The wireless device may assume/determine that one or more DM-RS antenna ports for a PDCCH reception in the CORESET is QCLed with an RS (e.g., SS/PBCH block). The wireless device may assume/determine that one or more DM-RS antenna ports for a PDCCH reception in the CORESET is QCLed with an RS (e.g., SS/PBCH block), for example, based on not receiving the MAC CE activation command. The wireless device may identify/indicate the RS in an initial access procedure. The wireless device may identify/indicate the RS from a most recent random access procedure. The wireless device may not initiate the most recent random access procedure. The wireless device may not initiate the most recent random access procedure, for example, based on receiving a PDCCH order triggering a non-contention based random access procedure.

A base station may provide a wireless device with a single TCI state for a CORESET. The base station may provide the single TCI state by a first higher layer parameter (e.g., tci-StatesPDCCH-ToAddList) and/or a second higher layer parameter (e.g., tci-StatesPDCCH-ToReleaseList). The wireless device may assume that one or more DM-RS antenna ports for a PDCCH reception in the CORESET is QCLed with one or more DL RSs configured by the single TCI state. The wireless device may assume that one or more DM-RS antenna ports for a PDCCH reception in the CORESET is QCLed with one or more DL RSs configured by the single TCI state, for example, based on being provided with the single TCI state for the CORESET.

A base station may configure a CORESET for a wireless device. The base station may provide the wireless device with a configuration of at least two TCI states for the CORESET. The base station may provide the wireless device with a configuration of at least two TCI states for the CORESET, for example, by a first higher layer parameter tci-StatesPDCCH-ToAddList and/or a second higher layer parameter tci-StatesPDCCH-ToReleaseList. The wireless device may receive the configuration of the at least two TCI states from the base station. The wireless device may receive a MAC CE activation command for at least one of the at least two TCI states for the CORESET. The wireless device may assume/determine that one or more DM-RS antenna ports for a PDCCH reception in the CORESET is QCLed with one or more DL RSs configured by the at least one of the at least two TCI states. The wireless device may assume/determine that one or more DM-RS antenna ports for a PDCCH reception in the CORESET is QCLed with one or more DL RSs configured by the at least one of the at least two TCI states, for example, based on receiving the MAC CE activation command for the at least one of the at least two TCI states.

A base station may configure a CORESET for a wireless device. A CORESET index (e.g., provided by higher layer parameter controlResourceSetId) of the CORESET may be equal to zero. The base station may provide the wireless device with a configuration of at least two TCI states for the CORESET. The wireless device may receive the configuration of the at least two TCI states from the base station. The wireless device may receive a MAC CE activation command for at least one of the at least two TCI states for the CORESET. The wireless device may expect/determine that a QCL type (e.g., QCL-TypeD) of a first RS (e.g., CSI-RS) in the at least one of the at least two TCI states is provided by a second RS (e.g., SS/PBCH block). The wireless device may expect/determine that a QCL type (e.g., QCL-TypeD) of a first RS (e.g., CSI-RS) in the at least one of the at least two TCI states is provided by a second RS (e.g., SS/PBCH block), for example, based on the CORESET index being equal to zero. The wireless device may expect/determine that a QCL type (e.g., QCL-TypeD) of a first RS (e.g., CSI-RS) in the at least one of the at least two TCI states is spatial QCLed with a second RS (e.g., SS/PBCH block). The wireless device may expect/determine that a QCL type (e.g., QCL-TypeD) of a first RS (e.g., CSI-RS) in the at least one of the at least two TCI states is spatial QCLed with a second RS (e.g., SS/PBCH block), for example, based on the CORESET index being equal to zero.

A wireless device may receive a MAC CE activation command. A wireless device may receive a MAC CE activation command, for example, for at least one of at least two TCI states for a CORESET. A PDSCH (e.g., a PDSCH transmission) may provide the MAC CE activation command. The wireless device may send (e.g., transmit) a HARQ-ACK information for the PDSCH (e.g., PDSCH transmission) in a slot. The wireless device may use the MAC CE activation command. The wireless device may use the MAC CE activation command, for example, if the wireless device receives the MAC CE activation command for the at least one of the at least two TCI states for the CORESET. The wireless device may use the MAC CE activation command, for example, based on sending (e.g., transmitting) HARQ-ACK information in the slot. The wireless device may use the MAC CE activation command, for example, after (e.g., 3 msec, 5 msec, or any other duration) and/or based on (e.g., in response to) the slot. A first BWP may be active in the second slot. A first BWP may be active in the second slot, for example, if the wireless device applies the MAC CE activation command in a second slot. The first BWP may be an active BWP. The first BWP may be an active BWP, for example, based on the first BWP being active in the second slot.

A base station may configure a wireless device with one or more DL BWPs in a serving cell. The wireless device may be provided by higher layers with one or more (e.g., 3, 5, 10, or any other quantity) search space sets. The wireless device may be provided by higher layers with one or more (e.g., 3, 5, 10, or any other quantity) search space sets, for example, for a DL BWP of the one or more DL BWPs. For a search space set of the one or more search space sets, the wireless device may be provided, by a higher layer parameter (e.g., SearchSpace), at least one of: a search space set index (e.g., provided by higher layer parameter searchSpaceId), an association between the search space set and a CORESET (e.g., provided by a higher layer parameter such as controlResourceSetId); a PDCCH monitoring periodicity of a first number of slots and a PDCCH monitoring offset of a second number/quantity of slots (e.g., provided by a higher layer parameter such as monitoringSlotPeriodicityAndOffset); a PDCCH monitoring pattern within a slot, indicating first symbol(s) of the CORESET within the slot for PDCCH monitoring, (e.g., provided by a higher layer parameter such as monitoringSymbolsWithinSlot); a duration of a third number/quantity of slots (e.g., provided by a higher layer parameter duration); a number/quantity of PDCCH candidates; an indication that the search space set is either a common search space set or a wireless device-specific search space set (e.g., provided by a higher layer parameter searchSpaceType). The duration may indicate a number/quantity of slots that the search space set may exist.

A wireless device may not expect/determine two PDCCH monitoring occasions on an active DL BWP in a same CORESET to be separated by a non-zero number of symbols that is smaller than the CORESET duration. A wireless device may not expect/determine two PDCCH monitoring occasions on an active DL BWP in a same CORESET to be separated by a non-zero number of symbols that is smaller than the CORESET duration, for example, for a same search space set or for different search space sets. The wireless device may determine a PDCCH monitoring occasion on an active DL BWP. The wireless device may determine a PDCCH monitoring occasion on an active DL BWP, for example, based on the PDCCH monitoring periodicity, the PDCCH monitoring offset, and the PDCCH monitoring pattern within a slot. The wireless device may determine that a PDCCH monitoring occasion exists in a slot. The wireless device may determine that a PDCCH monitoring occasion exists in a slot, for example, for the search space set. The wireless device may monitor at least one PDCCH for the search space set for the duration of third number/quantity of slots (e.g., consecutive) starting from the slot.

A wireless device may monitor one or more PDCCH candidates. A wireless device may monitor one or more PDCCH candidates, for example, in a USS set on an active DL BWP of a serving cell. A base station may not configure the wireless device with a carrier indicator field. The wireless device may monitor the one or more PDCCH candidates without the carrier indicator field. The wireless device may monitor the one or more PDCCH candidates without the carrier indicator field, for example, based on not being configured with the carrier indicator field.

A wireless device may monitor one or more PDCCH candidates. A wireless device may monitor one or more PDCCH candidates, for example, in a USS set on an active DL BWP of a serving cell. A base station may configure the wireless device with a carrier indicator field. The wireless device may monitor the one or more PDCCH candidates with the carrier indicator field. The wireless device may monitor the one or more PDCCH candidates with the carrier indicator field, for example, based on being configured with the carrier indicator field.

A base station may configure a wireless device to monitor one or more PDCCH candidates with a carrier indicator field in a first cell. The carrier indicator field may indicate a second cell. The carrier indicator field may correspond to a second cell. The wireless device may not expect/determine not to monitor the one or more PDCCH candidates on an active DL BWP of the second cell. The wireless device may not expect/determine not to monitor the one or more PDCCH candidates on an active DL BWP of the second cell, for example, based on monitoring the one or more PDCCH candidates, with the carrier indicator field, in the first cell, indicating the second cell.

A wireless device may monitor one or more PDCCH candidates on an active DL BWP of a serving cell. The wireless device may monitor the one or more PDCCH candidates for the serving cell. The wireless device may monitor the one or more PDCCH candidates for the serving cell, for example, based on monitoring the one or more PDCCH candidates on the active DL BWP of the serving cell.

A wireless device may monitor one or more PDCCH candidates on an active DL BWP of a serving cell. The wireless device may monitor the one or more PDCCH candidates at least for the serving cell. The wireless device may monitor the one or more PDCCH candidates at least for the serving cell, for example, based on monitoring the one or more PDCCH candidates on the active DL BWP of the serving cell. The wireless device may monitor the one or more PDCCH candidates for the serving cell and at least a second serving cell.

A base station may configure a wireless device with one or more cells. The base station may configure the wireless device for a single-cell operation. The base station may configure the wireless device for a single-cell operation, for example, if a number of the one or more cells is one. The base station may configure the wireless device for an operation with a CA in a same frequency band (e.g., intra-band). The base station may configure the wireless device for an operation with a CA in a same frequency band (e.g., intra-band), for example, if a number/quantity of the one or more cells is more than one.

The wireless device may monitor one or more PDCCH candidates. The wireless device may monitor one or more PDCCH candidates, for example, in overlapping PDCCH monitoring occasions in a plurality of CORESETs on active DL BWP(s) of the one or more cells. The plurality of the CORESETs may have a different QCL type property (e.g., QCL-TypeD property).

A first PDCCH monitoring occasion in a first CORESET, of the plurality of CORESETs, of a first cell of the one or more cells may overlap with a second PDCCH monitoring occasion in a second CORESET, of the plurality of CORESETs, of the first cell. The wireless device may monitor at least one first PDCCH candidate in the first PDCCH monitoring occasion on an active DL BWP, of the active DL BWP(s), of the first cell. The wireless device may monitor at least one second PDCCH candidate in the second PDCCH monitoring occasion on the active DL BWP, of the active DL BWP(s), of the first cell.

A first PDCCH monitoring occasion in a first CORESET, of the plurality of CORESETs, of a first cell of the one or more cells may overlap with a second PDCCH monitoring occasion in a second CORESET, of the plurality of CORESETs, of a second cell of the one or more cells. The wireless device may monitor at least one first PDCCH candidate in the first PDCCH monitoring occasion on a first active DL BWP, of the active DL BWP(s), of the first cell. The wireless device may monitor at least one second PDCCH candidate in the second PDCCH monitoring occasion on a second active DL BWP, of the active DL BWP(s), of the second cell. A first QCL type property (e.g., QCL-TypeD) of the first CORESET may be different from a second QCL type property (e.g., QCL-TypeD) of the second CORESET.

A base station may indicate, to a wireless device, a TCI state. A base station may indicate, to a wireless device, a TCI state, for example, for a PDCCH reception for a CORESET of a serving cell. A base station may indicate, to a wireless device, a TCI state, for example, by sending a TCI state indication for wireless device-specific PDCCH MAC CE. A base station (e.g., a MAC entity of the base station) may indicate to lower layers (e.g., PHY) the information regarding the TCI state indication for the wireless device-specific PDCCH MAC CE. A MAC entity may indicate to lower layers (e.g., PHY) the information regarding the TCI state indication for the wireless device-specific PDCCH MAC CE, for example, if the MAC entity of the wireless device receives a TCI state indication for wireless device-specific PDCCH MAC CE on/for a serving cell.

A TCI state indication for wireless device-specific PDCCH MAC CE may be identified/indicated by a MAC PDU subheader with LCID. The TCI state indication for wireless device-specific PDCCH MAC CE may have a fixed size of 16 bits (or any other quantity of bits) comprising one or more fields. The one or more fields may comprise a serving cell ID, a CORESET ID, a TCI state ID, and/or a reserved bit. The serving cell ID may indicate the identity of the serving cell for which the TCI state indication for the wireless device-specific PDCCH MAC CE is used. The length of the serving cell ID may be n bits (e.g., n=5 bits or any other quantity of bits).

The CORESET ID may indicate a CORESET. The CORESET may be identified/indicated with a CORESET ID (e.g., ControlResourceSetId). The TCI State may be indicated by the CORESET ID. The length of the CORESET ID may be n3 bits (e.g., n3=4 bits, or any other quantity of bits). The TCI state ID may indicate a TCI state identified/indicated by TCI-StateId. The TCI state may be applicable to the CORESET identified/indicated by the CORESET ID. The length of the TCI state ID may be n4 bits (e.g., n4=6 bits, or any other quantity of bits).

An information element ControlResourceSet may be used to configure a time/frequency CORESET. An information element ControlResourceSet may be used to configure a time/frequency CORESET, for example, in which to search for DCI. An information element TCI-State may associate one or two DL reference signals with a corresponding QCL type. The information element TCI-State may comprise one or more fields including TCI-StateId and QCL-Info. The QCL-Info may comprise one or more second fields. The one or more second fields may comprise serving cell index, BWP ID, a reference signal index (e.g., SSB-index, NZP-CSI-RS-ResourceID), and/or a QCL type (e.g., QCL-TypeA, QCL-TypeB, QCL-TypeC, QCL-TypeD). The TCI-StateID may identify/indicate a configuration of a TCI state.

The serving cell index may indicate a serving cell. The serving cell index may indicate a serving cell, for example, in which a reference signal indicated by the reference signal index is located. The information element TCI-State may be used for a serving cell in which the information element TCI-State is configured. The information element TCI-State may be used for a serving cell in which the information element TCI-State is configured, for example, if the serving cell index is absent in an information element TCI-State. The reference signal may be located on a second serving cell other than the serving cell in which the information element TCI-State is configured. The reference signal may be located on a second serving cell other than the serving cell in which the information element TCI-State is configured, for example, if the QCL-Type is configured as first type (e.g., TypeD, TypeA, TypeB). The BWP ID may indicate a downlink BWP of the serving cell in which the reference signal is located.

An information element SearchSpace may define/indicate how/where to search for PDCCH candidates in a search space. The search space may be identified/indicated by a searchSpaceId field in the information element SearchSpace. Each search space may be associated with a CORESET (e.g., ControlResourceSet). The CORESET may be identified/indicated by a field (e.g., controlResourceSetId field) in the information element SearchSpace. The controlResourceSetId field may indicate the CORESET applicable for the SearchSpace.

A wireless device may be configured with a first set of BWPs (e.g., at most four BWPs, or up to any other maximum quantity) for reception of one or more signals. A wireless device may be configured with a first set of BWPs (e.g., at most four BWPs, or up to any other maximum quantity) for reception of one or more signals, for example, by higher layers with a parameter such as BWP-Downlink. A wireless device may be configured with a first set of BWPs (e.g., at most four BWPs, or up to any other maximum quantity) for reception, for example, in a DL bandwidth (e.g., DL BWP set) for the serving cell. A wireless device may be configured with a first set of BWPs (e.g., at most four BWPs, or up to any other maximum quantity) for reception, for example, if configured for operation in BWPs of a serving cell. A wireless device may be configured with a second set of BWPs (e.g., at most four BWPs, or up to any other maximum quantity) for transmission of one or more signals. A wireless device may be configured with a second set of BWPs (e.g., at most four BWPs, or up to any other maximum quantity) for transmission, for example, by higher layers with a parameter such as BWP-Uplink. A wireless device may be configured with a second set of BWPs (e.g., at most four BWPs, or up to any other maximum quantity) for transmission, for example, in a UL bandwidth (e.g., UL BWP set) for the serving cell. A wireless device may be configured with a second set of BWPs (e.g., at most four BWPs, or up to any other maximum quantity) for transmission, for example, if configured for operation in BWPs of a serving cell.

The base station may not provide a wireless device with a higher layer parameter such as initialDownlinkBWP. An initial active DL BWP may be defined/indicated. An initial active DL BWP may be defined/indicated, for example, based on not providing the wireless device with the higher layer parameter such as initialDownlinkBWP. An initial active DL BWP may be defined/indicated, for example, by a location, a number/quantity of contiguous PRBs, and/or a subcarrier spacing (SCS) and a cyclic prefix for PDCCH reception in a CORESET for Type0-PDCCH common search space (CSS) set. The contiguous PRBs may start from a first PRB with a lowest index among PRBs of the CORESET for a set (e.g., the Type0-PDCCH CSS set).

The base station may provide a wireless device with a higher layer parameter such as initialDownlinkBWP. An initial active DL BWP may be provided by the higher layer parameter such as initialDownlinkBWP. An initial active DL BWP may be provided by the higher layer parameter such as initialDownlinkBWP. An initial active DL BWP may be provided by the higher layer parameter such as initialDownlinkBWP, for example, based on providing of a wireless device with a higher layer parameter such as initialDownlinkBWP.

A base station may provide a wireless device with an initial active UL BWP by a higher layer parameter (e.g., initialUplinkBWP). A base station may provide a wireless device with an initial active UL BWP by a higher layer parameter (e.g., initialUplinkBWP), for example, for operation on a cell (e.g., primary cell, secondary cell). The base station may provide the wireless device with a second initial active uplink BWP on the supplementary uplink carrier by a second higher layer parameter (e.g., initialUplinkBWP in supplementaryUplink). The base station may provide the wireless device with a second initial active uplink BWP on the supplementary uplink carrier by a second higher layer parameter (e.g., initialUplinkBWP in supplementaryUplink), for example, if configured with a supplementary uplink carrier (SUL), A wireless device may have a dedicated BWP configuration. The wireless device may be provided by a higher layer parameter (e.g., firstActiveDownlinkBWP-Id). The wireless device may be provided by a higher layer parameter (e.g., firstActiveDownlinkBWP-Id), for example, based on the wireless device having the dedicated BWP configuration. The higher layer parameter may indicate a first active DL BWP for receptions.

The wireless device may be provided by a higher layer parameter (e.g., firstActiveUplinkBWP-Id). The wireless device may be provided by a higher layer parameter (e.g., firstActiveUplinkBWP-Id), for example, based on the wireless device having the dedicated BWP configuration. The higher layer parameter may indicate a first active UL BWP for transmissions on a carrier (e.g., SUL, NUL) of a serving cell (e.g., primary cell, secondary cell).

A base station may configure a wireless device for a serving cell. A base station may configure a wireless device for a serving cell (e.g., for a DL BWP in a first set of BWPs and/or an UL BWP in a second set of BWPs), with at least one of: a subcarrier spacing provided by a higher layer parameter subcarrierSpacing; a cyclic prefix provided by a higher layer parameter cyclicPrefix; an index in the first set of BWPs or in the second set of BWPs by a higher layer parameter bwp-Id (e.g., bwp-Id); a third set of BWP-common and a fourth set of BWP-dedicated parameters by a higher layer parameter such as bwp-Common and a higher layer parameter such as bwp-Dedicated, respectively. The base station may configure (e.g., further configure) the wireless device for the serving cell with a common RB $N_{BWP}^{start}O_{carrier}+RB_{start}$ and/or a number/quantity of contiguous RBs $N_{BWP}^{size}=L_{RB}$ provided by a higher layer parameter such as locationAndBandwidth. The higher layer parameter such as locationAndBandwidth may indicate an offset $RB_{start}$ and a length $L_{RB}$ as Resource indicator value (RIV), setting $N_{BWP}^{size}=275$, and a value $O_{carrier}$ provided by a higher layer parameter such as offsetToCarrier for the higher layer parameter such as subcarrierSpacing. A DL BWP, from a first set of BWPs, with a DL BWP index provided by a higher layer parameter bwp-Id (e.g., bwp-Id) may be linked with an UL BWP, from a second set of BWPs, with an UL BWP index provided by a higher layer parameter bwp-Id (e.g., bwp-Id). A DL BWP, from a first set of BWPs, with a DL BWP index provided by a higher layer parameter bwp-Id (e.g., bwp-Id) may be linked with an UL BWP, from a second set of BWPs, with an UL BWP index provided by a higher layer parameter bwp-Id (e.g., bwp-Id), for example, for an unpaired spectrum operation. A DL BWP, from a first set of BWPs, with a DL BWP index provided by a higher layer parameter bwp-Id (e.g., bwp-Id) may be linked with an UL BWP, from a second set of BWPs, with an UL BWP index provided by a higher layer parameter bwp-Id (e.g., bwp-Id), for example, if the DL BWP index of the DL BWP is same as the UL BWP index of the UL BWP.

A DL BWP index of a DL BWP may be the same as an UL BWP index of an UL BWP. A wireless device may not expect (or determine not) to receive a configuration (e.g., RRC configuration). A wireless device may not expect (or determine not) to receive a configuration (e.g., RRC configuration), for example, for an unpaired spectrum operation. A wireless device may not expect (or determine not) to receive a configuration (e.g., RRC configuration) in which a first center frequency for the DL BWP is different from a second center frequency for the UL BWP, for example, based on the DL BWP index of the DL BWP being the same as the UL BWP index of the UL BWP. A base station may configure a wireless device with one or more CORESETs for every type (or at least some types) of common search space (CSS) sets and/or for wireless device-specific search space (USS). A base station may configure a wireless device with one or more CORESETs for every type (or at least some types) of common search space (CSS) sets and/or for wireless device-specific search space (USS), for example, for a DL BWP in a first set of BWPs on a serving cell (e.g., primary cell). The wireless device may not expect (or determine not) to be configured without a common search space set on a primary cell (or on the PSCell). The wireless device may not expect (or determine not) to be configured without a common search space set on a primary cell (or on the PSCell), for example, in an active DL BWP.

A base station may provide a wireless device with a higher layer parameter such as controlResourceSetZero and a higher layer parameter such as searchSpaceZero. A base station may provide a wireless device with a higher layer parameter such as controlResourceSetZero and a higher layer parameter such as searchSpaceZero, for example, in a higher layer parameter such as PDCCH-ConfigSIB1 and/or a higher layer parameter such as PDCCH-ConfigCommon. The wireless device may determine a CORESET for a search space set from the higher layer parameter such as controlResourcesetZero. The wireless device may determine a CORESET for a search space set from the higher layer parameter such as controlResourcesetZero, for example, based on providing a wireless device with a higher layer parameter such as controlResourceSetZero and a higher layer parameter such as searchSpaceZero. The wireless device may determine corresponding PDCCH monitoring occasions. The wireless device may determine corresponding PDCCH monitoring occasions, for example, based on providing a wireless device with a higher layer parameter such as controlResourceSetZero and a higher layer parameter such as searchSpaceZero. An active DL BWP of a serving cell may not be an initial DL BWP of the serving cell. The wireless device may determine the PDCCH monitoring occasions for the search space set. The wireless device may determine the PDCCH monitoring occasions for the search space set, for example, if the active DL BWP is not the initial DL BWP of the serving cell. The wireless device may determine the PDCCH monitoring occasions for the search space set, for example, based on a bandwidth of the CORESET being within the active DL BWP and the active DL BWP having the same SCS configuration and same cyclic prefix as the initial DL BWP. A base station may configure a wireless device with one or more resource sets (e.g., time-frequency resources/occasions) for PUCCH transmissions. A base station may configure a wireless device with one or more resource sets (e.g., time-frequency resources/occasions) for PUCCH transmissions, for example, for an UL BWP in a second set of BWPs of a serving cell (e.g., primary cell or PUCCH SCell).

A wireless device may receive PDCCH and PDSCH in a DL BWP. A wireless device may receive PDCCH and PDSCH in a DL BWP, for example, according to a configured subcarrier spacing and CP length for the DL BWP. A wireless device may send (e.g., transmit) PUCCH and PUSCH in an UL BWP. A wireless device may send (e.g., transmit) PUCCH and PUSCH in an UL BWP, for example, according to a configured subcarrier spacing and CP length for the UL BWP.

A BWP indicator field may be configured in a DCI format (e.g., DCI format 1_1). A value of the BWP indicator field may indicate an active DL BWP. A value of the BWP indicator field may indicate an active DL BWP, for example, from a first set of BWPs, for one or more DL receptions. The BWP indicator field may indicate a DL BWP different from the active DL BWP. The wireless device may set the DL BWP as a current active DL BWP. The wireless device may set the DL BWP as a current active DL BWP, for example, based on the BWP indicator field indicating the DL BWP different from the active DL BWP. The setting the DL BWP as a current active DL BWP may comprise activating the DL BWP and deactivating the active DL BWP.

A BWP indicator field may be configured in a DCI format (e.g., DCI format 0_1). A value of the BWP indicator field may indicate an active UL BWP. A value of the BWP indicator field may indicate an active UL BWP, for example, from a second set of BWPs, for one or more UL transmissions. The BWP indicator field may indicate an UL BWP different from the active UL BWP. The wireless device may set the UL BWP as a current active UL BWP. The wireless device may set the UL BWP as a current active UL BWP, for example, based on the BWP indicator field indicating the UL BWP different from the active UL BWP. The setting the UL BWP as a current active UL BWP may comprise activating the UL BWP and deactivating the active UL BWP.

A DCI format (e.g., DCI format 1_1) indicating an active DL BWP change may comprise a time domain resource assignment field. The time domain resource assignment field may provide a slot offset value for a PDSCH reception. The slot offset value may be smaller than a delay required by a wireless device for the active DL BWP change. The wireless device may not expect (or determine not) to detect the DCI format indicating the active DL BWP change. The wireless device may not expect (or determine not) to detect the DCI format indicating the active DL BWP change, for example, based on the slot offset value being smaller than the delay required by the wireless device for the active DL BWP change.

A DCI format (e.g., DCI format 0_1) indicating an active UL BWP change may comprise a time domain resource assignment field. The time domain resource assignment field may provide a slot offset value for a PUSCH transmission. The slot offset value may be smaller than a delay required by a wireless device for the active UL BWP change. The wireless device may not expect (or determine not) to detect the DCI format indicating the active UL BWP change. The wireless device may not expect (or determine not) to detect the DCI format indicating the active UL BWP change, for example, based on the slot offset value being smaller than the delay required by the wireless device for the active UL BWP change.

A wireless device may receive a PDCCH in a slot of a scheduling cell. The wireless device may detect a DCI format (e.g., DCI format 1_1), in the PDCCH of the scheduling cell. The wireless device may detect a DCI format (e.g., DCI format 1_1), in the PDCCH of the scheduling cell, for example, indicating an active DL BWP change for a serving cell. The DCI format may comprise a time domain resource assignment field. The time domain resource assignment field may provide a slot offset value for a PDSCH transmission. The slot offset value may indicate a second slot. The wireless device may not be required to receive or send (e.g., transmit) in the serving cell for a time duration from the end of a third symbol of the slot until the beginning of the second slot. The wireless device may not be required to receive or send (e.g., transmit) in the serving cell for a time duration from the end of a third symbol of the slot until the beginning of the second slot, for example, based on detecting the DCI format indicating the active DL BWP change.

A wireless device may receive a PDCCH in a slot of a scheduling cell. The wireless device may detect a DCI format (e.g., DCI format 0_1). The wireless device may detect a DCI format (e.g., DCI format 0_1), for example, in the PDCCH of the scheduling cell, indicating an active UL BWP change for a serving cell. The DCI format may comprise a time domain resource assignment field. The time domain resource assignment field may provide a slot offset value for a PUSCH transmission. The slot offset value may indicate a second slot. The wireless device may not be required to receive or send (e.g., transmit) in the serving cell for a time duration from the end of a third symbol of the slot until the beginning of the second slot. The wireless device may not be required to receive or send (e.g., transmit) in the serving cell for a time duration from the end of a third symbol of the slot until the beginning of the second slot, for example, based on detecting the DCI format indicating the active UL BWP change.

A wireless device may expect/determine to detect a DCI format 0_1 indicating active UL BWP change/switch. A wireless device may expect/determine to detect a DCI format 0_1 indicating active UL BWP change/switch, for example, if a corresponding PDCCH for the detected DCI format 0_1 is received within first 3 symbols of a slot. A wireless device may expect/determine to detect a DCI format 1_1 indicating active DL BWP change/switch. A wireless device may expect/determine to detect a DCI format 1_1 indicating active DL BWP change/switch, for example, if a corresponding PDCCH for the detected DCI format 1_1 is received within first 3 symbols of a slot. A wireless device may not expect (or determine not) to detect a DCI format 0_1 indicating active UL BWP change/switch. A wireless device may not expect (or determine not) to detect a DCI format 0_1 indicating active UL BWP change/switch, for example, if a corresponding PDCCH is received based on the first 3 symbols of a slot. A wireless device may not expect (or determine not) to detect a DCI format 1_1 indicating active DL BWP change/switch. A wireless device may not expect (or determine not) to detect a DCI format 1_1 indicating active DL BWP change/switch, for example, if a corresponding PDCCH is received based on the first 3 symbols of a slot.

An active DL BWP change may comprise switching from the active DL BWP of a serving cell to a DL BWP of the serving cell. The switching from the active DL BWP to the DL BWP may comprise setting the DL BWP as a current active DL BWP and deactivating the active DL BWP. An active UL BWP change may comprise switching from the active UL BWP of a serving cell to a UL BWP of the serving cell. The switching from the active UL BWP to the UL BWP may comprise setting the UL BWP as a current active UL BWP and/or deactivating the active UL BWP.

A base station may provide a wireless device with a higher layer parameter such as defaultDownlinkBWP-Id. A base station may provide a wireless device with a higher layer parameter such as defaultDownlinkBWP-Id, for example, for a serving cell (e.g., PCell, SCell). The higher layer parameter such as defaultDownlinkBWP-Id may indicate a default DL BWP among the first set of (configured) BWPs of the serving cell.

A base station may not provide a wireless device with a higher layer parameter such as defaultDownlinkBWP-Id. The wireless device may set the initial active DL BWP as a default DL BWP. The wireless device may set the initial active DL BWP as a default DL BWP, for example, based on not being provided by the higher layer parameter such as defaultDownlinkBWP-Id. The default DL BWP may be the initial active DL BWP. The default DL BWP may be the initial active DL BWP, for example, based on not being provided by the higher layer parameter such as defaultDownlinkBWP-Id.

A base station may provide a wireless device with a higher layer parameter such as BWP-InactivityTimer. The higher layer parameter such as BWP-InactivityTimer may indicate a BWP inactivity timer with a timer value for a serving cell (e.g., primary cell, secondary cell). The wireless device may decrement the BWP inactivity timer at the end of a subframe for frequency range 1 (e.g., FR1, sub-6 GHz) or at the end of a half subframe for frequency range 2 (e.g., FR2, millimeter-waves). The wireless device may decrement the BWP inactivity timer at the end of a subframe for frequency range 1 (e.g., FR1, sub-6 GHz) or at the end of a half subframe for frequency range 2 (e.g., FR2, millimeter-waves), for example, if provided with the higher layer such as parameter BWP-InactivityTimer and/or if the BWP inactivity timer is running. The wireless device may decrement the BWP inactivity timer at the end of a subframe for frequency range 1 (e.g., FR1, sub-6 GHz) or at the end of a half subframe for frequency range 2 (e.g., FR2, millimeter-waves), for example, based on not restarting the BWP inactivity timer for an interval of the subframe for the frequency range 1 or an interval of the half subframe for the frequency range 2.

A wireless device may perform an active DL BWP change for a serving cell. A wireless device may perform an active DL BWP change for a serving cell, for example, based on an expiry of a BWP inactivity timer associated with the serving cell. The wireless device may not be required to receive or send (e.g., transmit) in the serving cell for a time duration from the beginning of a subframe for frequency range 1 or of half of a subframe for frequency range 2. The time duration may start/be immediately. The time duration may start/be immediately (or a duration after), for example, based on expiry of the BWP inactivity timer. The time duration may last until the beginning of a slot where the wireless device can receive and/or send (e.g., transmit).

A base station may provide a wireless device with a higher layer parameter such as firstActiveDownlinkBWP-Id of a serving cell (e.g., secondary cell). The higher layer parameter such as firstActiveDownlinkBWP-Id may indicate a DL BWP on the serving cell (e.g., secondary cell). The wireless device may use the DL BWP as a first active DL BWP on the serving cell. The wireless device may use the DL BWP as a first active DL BWP on the serving cell, for example, based on being provided by the higher layer parameter such as firstActiveDownlinkBWP-Id A base station may provide a wireless device with a higher layer parameter such as firstActiveUplinkBWP-Id on a carrier (e.g., SUL, NUL) of a serving cell (e.g., secondary cell). The higher layer parameter such as firstActiveUplinkBWP-Id may indicate an UL BWP. The wireless device may use the UL BWP as a first active UL BWP on the carrier of the serving cell. The wireless device may use the UL BWP as a first active UL BWP on the carrier of the serving cell, for example, based on being provided by the higher layer parameter such as firstActiveUplinkBWP-Id.

A wireless device may not expect (determine not) to send (e.g., transmit) a PUCCH with HARQ-ACK information on a PUCCH resource indicated by a DCI format 1_0 or a DCI format 1_1. A wireless device may not expect (determine not) to send (e.g., transmit) a PUCCH with HARQ-ACK information on a PUCCH resource indicated by a DCI format 1_0 or a DCI format 1_1, for example, for paired spectrum operation. A wireless device may not expect (determine not) to send (e.g., transmit) a PUCCH with HARQ-ACK information on a PUCCH resource indicated by a DCI format 1_0 or a DCI format 1_1, for example, if the wireless device changes its active UL BWP on a primary cell between a time of a detection of the DCI format 1_0 or the DCI format 1_1 and a time of a corresponding PUCCH transmission with the HARQ-ACK information. A wireless device may not monitor PDCCH. A wireless device may not monitor PDCCH, for example, if the wireless device performs RRM measurements over a bandwidth that is not within the active DL BWP for the wireless device.

A first BWP may be associated with a first CORESET and/or a second CORESET. A wireless device may receive activation command(s) (e.g., a MAC CE) activating a first TCI state (or a first beam) for the first CORESET and/or a second TCI state (or a second beam) for the second CORESET. The wireless device may monitor the first CORESET. The wireless device may monitor the first CORESET, for example, after receiving the activation command(s). The wireless device may monitor the first CORESET, for example, based on the first TCI state. The wireless device may monitor the second CORESET. The wireless device may monitor the second CORESET, for example, after receiving the activation command(s). The wireless device may monitor the second CORESET, for example, based on the second TCI state. The wireless device may use the old TCI states of the first BWP (e.g., the first TCI state and the second TCI state) to monitor CORESET(s) of a second BWP. The wireless device may use the old TCI states of the first BWP (e.g., the first TCI state and the second TCI state) to monitor CORESET(s) of the second BWP, for example, if/when the wireless device switches from the first BWP to the second BWP. The wireless device may use the old TCI states of the first BWP (e.g., the first TCI state and the second TCI state) to monitor CORESET(s) of the second BWP, for example, at least until the wireless device receives activation command(s) activating TCI states for the CORESET(s). The second BWP may be associated with a third CORESET and/or a fourth CORESET. The wireless device may use the first TCI state of the first CORESET and/or the second TCI state of the second CORESET in the first BWP to monitor the third CORESET and/or the fourth CORESET in the second BWP. The wireless device may use the first TCI state of the first CORESET and the second TCI state of the second CORESET in the first BWP to monitor the third CORESET and the fourth CORESET in the second BWP, for example, at least until the wireless device receives activation command(s) activating a third TCI state for the third CORESET and a fourth TCI state for the fourth CORESET.

At least some wireless devices may not be configured to map the old TCI states of the first BWP (e.g., the first TCI state and the second TCI state) to the CORESET(s) of the second BWP. For example, a wireless device may not be configured to determine the TCI state of the old TCI states that should be used to monitor the third CORESET and/or the fourth CORESET in the second BWP. The wireless device may not receive DCI. The wireless device may not receive DCI, for example, if the mapping between the old TCI states of the first BWP and the CORESET(s) in the second BWP is not specified/indicated. The wireless device may not be configured to determine which TCI state of the first BWP (e.g., the first TCI state or the second TCI state) will be used to monitor a single CORESET in the second BWP. The wireless device may not be configured to determine which TCI state of the first BWP (e.g., the first TCI state or the second TCI state) will be used to monitor a single CORESET in the second BWP, for example, if the second BWP has a single CORESET (e.g., the third CORESET only). The wireless device may not receive DCI in the single CORESET of the second BWP. The wireless device may not receive DCI in the single CORESET of the second BWP, for example, if the wireless device uses the first TCI state to monitor the single CORESET and the base station assumes the wireless device is using the second TCI state to monitor the single CORESET.

At least some wireless devices may not be configured to determine whether to use the first TCI state of the first CORESET in the first BWP to monitor a third CORESET and/or a fourth CORESET in the second BWP. The wireless device may not be configured to determine whether to use the first TCI state of the first CORESET in the first BWP to monitor a third CORESET and/or a fourth CORESET in the second BWP, for example, if the second BWP has a third CORESET and a fourth CORESET. The wireless device may not be configured to determine whether to use the second TCI state of the second CORESET in the first BWP to monitor the third CORESET and/or the fourth CORESET in the second BWP. The wireless device may not receive any downlink control information in the third CORESET and the fourth CORESET of the second BWP. The wireless device may not receive any downlink control information in the third CORESET and the fourth CORESET of the second BWP, for example, if the wireless device uses the first TCI state to monitor the third CORESET and the second TCI state to monitor the fourth CORESET, and if the base station assumes the wireless device is using the first TCI state to monitor the fourth CORESET and the wireless device is using the second TCI state to monitor the third CORESET.

At least some wireless device may not be configured to determine how to map the first TCI state and/or the second TCI state to a third CORESET, a fourth CORESET and/or a fifth CORESET. The wireless device may not be configured to determine how to map the first TCI state and/or the second TCI state to a third CORESET, a fourth CORESET and/or a fifth CORESET, for example, if the second BWP has a third CORESET, a fourth CORESET and a fifth CORESET. The wireless device may not be configured to determine which of the CORESETs (e.g., third CORESET, fourth CORESET, fifth CORESET) in the second BWP should use the first TCI state and which of the CORESETs (e.g., third CORESET, fourth CORESET, fifth CORESET) in the second BWP should use the second TCI state. The wireless device may not receive any downlink control information in the third CORESET, the fourth CORESET, and/or the fifth CORESET of the second BWP. The wireless device may not receive any downlink control information in the third CORESET, the fourth CORESET, and/or the fifth CORESET of the second BWP, for example, if the wireless device is not be configured to determine the TCI states that should be used in the CORESETs (e.g., third CORESET, fourth CORESET, fifth CORESET) of the second BWP.

As described herein, a wireless device may monitor CORESET(s) of a second BWP. The wireless device may monitor the CORESET(s) of the second BWP, for example, if/when the wireless device switches from a first BWP to the second BWP. The wireless device may monitor the CORESET(s) of the second BWP, for example, at least until the wireless device receives activation command(s) activating TCI state(s) for CORESET(s) in the second BWP. The wireless device may monitor the CORESET(s) of the second BWP, for example, based on a TCI state, among old TCI states (e.g., TCI states used to monitor CORESETs in the first BWP), with a lowest (or highest) TCI state index. The wireless device may receive DCI in the CORESET(s) of the second BWP, for example, based on monitoring the CORESET(s) of the second BWP based on a TCI state, among old TCI states (e.g., TCI states used to monitor CORESETs in the first BWP), with a lowest (or highest) TCI state index.

The wireless device may monitor the CORESET(s) of the second BWP, for example, based on a TCI state of a CORESET, among CORESETs in the first BWP, with the lowest CORESET index. The wireless device may receive DCI in the CORESET(s) of the second BWP, for example, based on monitoring the CORESET(s) of the second BWP based a TCI state of a CORESET, among CORESETs in the first BWP, with the lowest CORESET index. The wireless device may not detect a beam failure, for example, based on receiving the DCI in the CORESET(s) of the second BWP. The wireless device may not initiate/perform a BFR procedure, for example, based on receiving the DCI in the CORESET(s) of the second BWP. The error rate (e.g., BLER) may be reduced, for example, based on receiving the DCI in the CORESET(s) of the second BWP. The wireless device may not increase power consumption, for example, based on receiving the DCI in the CORESET(s) of the second BWP. The latency/delay may be reduced, for example, based on receiving the DCI in the CORESET(s) of the second BWP.

The wireless device may monitor the CORESET(s) of a second BWP, for example, based on a TCI state of a CORESET, among CORESETs in a first BWP, in which the wireless device received the last (or most recent) DCI before switching from the first BWP to the second BWP. The wireless device may receive DCI in the CORESET(s) of the second BWP, for example, based on monitoring the CORESET(s) of the second BWP. The wireless device may monitor the CORESET(s) of the second BWP, for example, based on a TCI state of a CORESET, among CORESETs in the first BWP, in which the wireless device received the last (or most recent) DCI before switching from the first BWP to the second BWP.

The wireless device may monitor the CORESET(s) of a second BWP, for example, based on a TCI state of a CORESET, among CORESETs in a first BWP, which is monitored last (or most recent) before switching to the second BWP. The wireless device may receive DCI in the CORESET(s) of the second BWP, for example, based on monitoring the CORESET(s) of the second BWP. The wireless device may monitor the CORESET(s) of the second BWP, for example, based on a TCI state of a CORESET, among CORESETs in the first BWP, which may be monitored last (or most recent) before switching to the second BWP.

The wireless device may monitor the CORESET(s) of a second BWP, for example, based on a mapping (e.g., cyclic mapping) between the CORESETs in a first BWP and CORESET(s) in the second BWP. The wireless device may determine the TCI states of the CORESET(s) in the second BWP. The wireless device may determine the TCI states of the CORESET(s) in the second BWP, for example, based on mapping between the CORESETs in the first BWP and CORESET(s) in the second BWP. The first CORESET in the first BWP may mapped to the third CORESET in the second BWP in the mapping. The second CORESET in the first BWP may be mapped to the fourth CORESET in the second BWP in the mapping. The first CORESET in the first BWP may be mapped to the fifth CORESET in the second BWP in the mapping. The wireless device may receive DCI in the CORESET(s) of the second BWP, for example, based on monitoring the CORESET(s) of the second BWP. The wireless device may monitor the CORESET(s) of the second BWP, for example, based on a mapping (e.g., cyclic mapping) between the CORESETs in the first BWP and CORESET(s) in the second BWP.

A base station may send (e.g., transmit) a first PDSCH (e.g., dynamically scheduled or period semi-persistent PDSCH). A base station may send (e.g., transmit) a second PDSCH (e.g., dynamically scheduled PDSCH, periodic or semi-persistent PDSCH). In at least some wireless communications, a wireless device may not receive the first PDSCH and the second PDSCH (e.g., both PDSCHs). A wireless device may not receive the first PDSCH and the second PDSCH (e.g., both PDSCHs), for example, if a first PDSCH (e.g., dynamically scheduled PDSCH) overlaps in time with a second PDSCH (e.g., periodic or semi-persistent PDSCH). The wireless device may only receive one of the overlapped PDSCHs (e.g., dynamic PDSCH or the semi-persistent PDSCH associated with the lowest SPS index).

A base station may comprise multiple transmission and reception points (TRPs). TRPs may send (e.g., transmit), to a wireless device and/or receive from a wireless device, one or more messages. The wireless device may be capable of receiving overlapped PDSCHs simultaneously (or substantially simultaneously or during a same time period), for example, if the wireless is configured to use multiple TRPs. The wireless device may be capable of receiving both overlapped PDSCHs simultaneously (or substantially simultaneously or during a same time period), for example, if a wireless device is capable of supporting multiple TRPs (multi-TRPs). At least some wireless devices that may drop at least one of the overlapped PDSCHs may not be efficient for reception of one or more PDSCHs. Dropping at least one of the overlapped PDSCHs may not be efficient for reception of one or more PDSCHs, for example, if the wireless device supports multi-TRPs.

As described herein, a wireless device may receive a first PDSCH (e.g., dynamically scheduled, or periodic or semi-persistent PDSCH) transmission and a second PDSCH (e.g., dynamically scheduled, or periodic or semi-persistent PDSCH) transmission. The wireless device may receive a first PDSCH (e.g., dynamically scheduled PDSCH) transmission associated with a first CORESET group index (e.g., TRP-1) and a second PDSCH (e.g., periodic or semi-persistent PDSCH) transmission associated with a second CORESET group index (e.g., TRP-2). The wireless device may receive a first PDSCH (e.g., dynamically scheduled PDSCH) transmission associated with a first CORESET group index (e.g., TRP-1) and a second PDSCH (e.g., periodic or semi-persistent PDSCH) transmission associated with a second CORESET group index (e.g., TRP-2), for example, if the first PDSCH transmission associated with the first CORESET group index (e.g., TRP-1) overlaps in time with the second PDSCH transmission associated with the second CORESET group index (e.g., TRP-2). The wireless device may receive a first PDSCH (e.g., dynamically scheduled PDSCH) transmission associated with a first CORESET group index (e.g., TRP-1) and a second PDSCH (e.g., periodic or semi-persistent PDSCH) transmission associated with a second CORESET group index (e.g., TRP-2), for example, if the first CORESET group index (e.g., TRP-1) and the second CORESET group index (e.g., TRP-2) are different. The wireless device may receive the overlapped PDSCH transmissions (e.g., the first PDSCH transmission and the second PDSCH transmission), for example, based on a difference between the CORESET group indexes of the overlapped PDSCH transmissions. The QoS requirements (e.g., in terms of delay, data rate, error rate, and/or any other quality/service requirement) may improve, for example, based on receiving the overlapped PDSCH transmissions. The wireless device may not increase power consumption, for example, for example, based on receiving the overlapped PDSCH transmissions.

The wireless device may receive a first PDSCH (e.g., dynamically scheduled, or periodic or semi-persistent PDSCH) transmission and may skip receiving a second PDSCH (e.g., periodic or semi-persistent PDSCH) transmission. The wireless device may receive a first PDSCH (e.g., dynamically scheduled, or periodic or semi-persistent PDSCH) transmission associated with a first CORESET group index (e.g., TRP-1) and may skip receiving a second PDSCH (e.g., periodic or semi-persistent PDSCH) transmission associated with a second CORESET group index (e.g., TRP-1). The wireless device may receive only a first PDSCH transmission associated with a first CORESET group index (e.g., TRP-1) and may skip receiving a second PDSCH transmission associated with a second CORESET group index (e.g., TRP-1), for example, if the first PDSCH transmission associated with the first CORESET group index (e.g., TRP-1) overlaps in time with the second PDSCH transmission associated with the second CORESET group index (e.g., TRP-1). The wireless device may receive only a first PDSCH (e.g., dynamically scheduled, or periodic or semi-persistent PDSCH) transmission associated with a first CORESET group index (e.g., TRP-1) and may skip receiving a second PDSCH (e.g., periodic or semi-persistent PDSCH) transmission associated with a second CORESET group index (e.g., TRP-1), for example, if the CORESET group indexes of the first PDSCH transmission and the second PDSCH transmission are the same. The wireless device may receive only one overlapped PDSCH transmission (e.g., the first PDSCH transmission) and skip receiving the other overlapped PDSCH transmission (e.g., the second PDSCH transmission), for example, if the CORESET group indexes of the overlapped PDSCH transmissions (e.g., the first PDSCH transmission and the second PDSCH transmission) are the same.

The wireless device may skip receiving a first PDSCH (e.g., dynamically scheduled, or periodic or semi-persistent PDSCH) transmission and may receive a second PDSCH (e.g., dynamically scheduled, or periodic or semi-persistent PDSCH) transmission. The wireless device may skip receiving a first PDSCH (e.g., dynamically scheduled, or periodic or semi-persistent PDSCH) transmission associated with a first CORESET group index (e.g., TRP-1) and may receive a second PDSCH (e.g., dynamically scheduled, or periodic or semi-persistent PDSCH) transmission associated with a second CORESET group index (e.g., TRP-1). The wireless device may skip receiving a first PDSCH transmission associated with a first CORESET group index (e.g., TRP-1) and may receive a second PDSCH transmission associated with a second CORESET group index (e.g., TRP-1), for example, if the first PDSCH transmission associated with the first CORESET group index (e.g., TRP-1) overlaps in time with the second PDSCH transmission associated with the second CORESET group index (e.g., TRP-1). The wireless device may skip receiving a first PDSCH (e.g., dynamically scheduled, or periodic or semi-persistent PDSCH) transmission associated with a first CORESET group index (e.g., TRP-1) and may receive a second PDSCH (e.g., dynamically scheduled, or periodic or semi-persistent PDSCH) transmission associated with a second CORESET group index (e.g., TRP-1), for example, if the CORESET group indexes of the first PDSCH transmission and the second PDSCH transmission are the same. The wireless device may receive only one overlapped PDSCH transmission (e.g., the second PDSCH transmission) and skip receiving the other overlapped PDSCH transmission (e.g., the first PDSCH transmission), for example, if the CORESET group indexes of the overlapped PDSCH transmissions (e.g., the first PDSCH transmission and the second PDSCH transmission) are the same.

Figure 17:
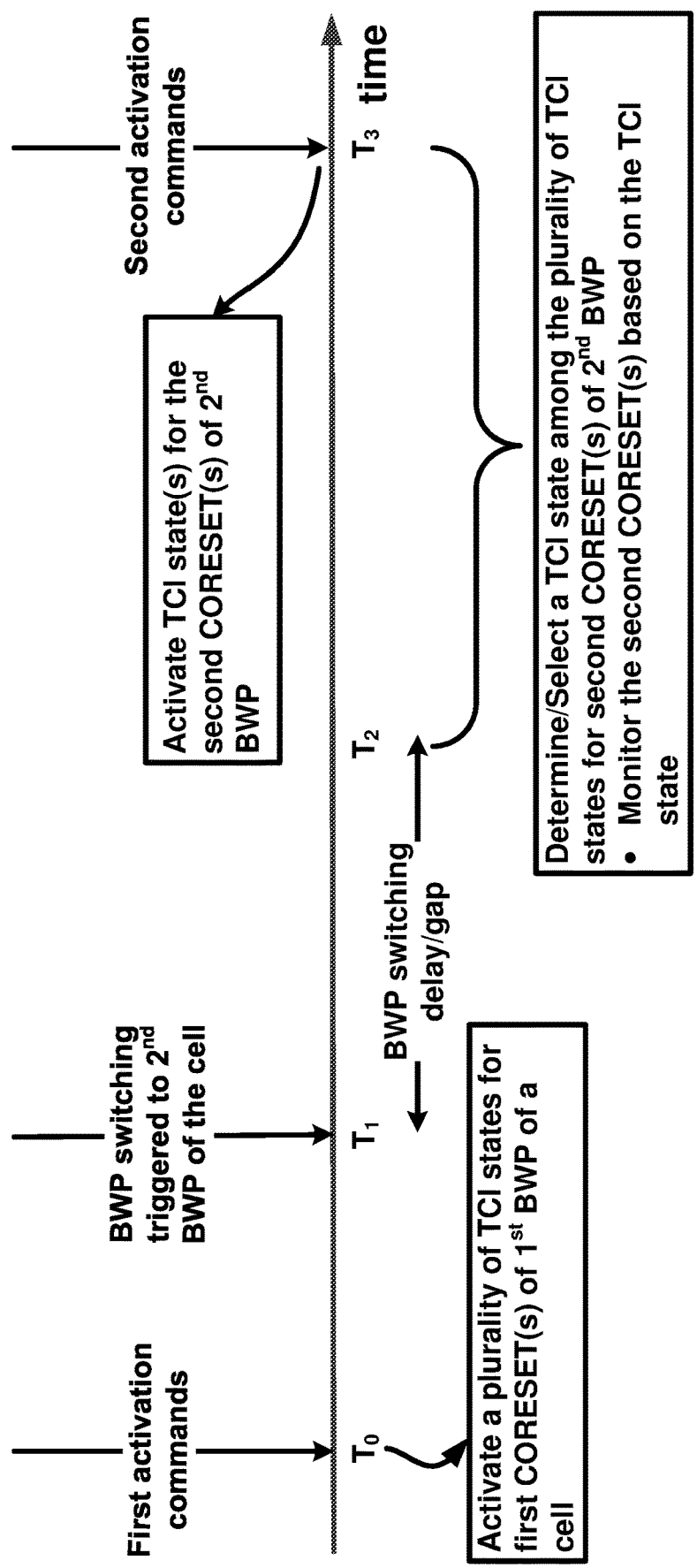
FIG. 17 shows an example of beam management.

FIG. 17 shows an example of beam management. A wireless device may receive one or more first activation commands, for example, activating, for the one or more first CORESETs of the first BWP, a plurality of activated TCI states among a first plurality of TCI states. The wireless device may switch from the first BWP to the second BWP. The wireless device may monitor, for the DCI, the PDCCH in/via the one or more second CORESETs of the second BWP based on an activated TCI state. The wireless device may determine/select the activated TCI state among the plurality of activated TCI states. The wireless device may monitor, for the DCI, the PDCCH in/via the one or more second CORESETs of the second BWP based on the activated TCI state, for example, until receiving one or more second activation commands activating, for the one or more second CORESETs, one or more activated TCI states among a plurality of TCI states.

Figure 18:
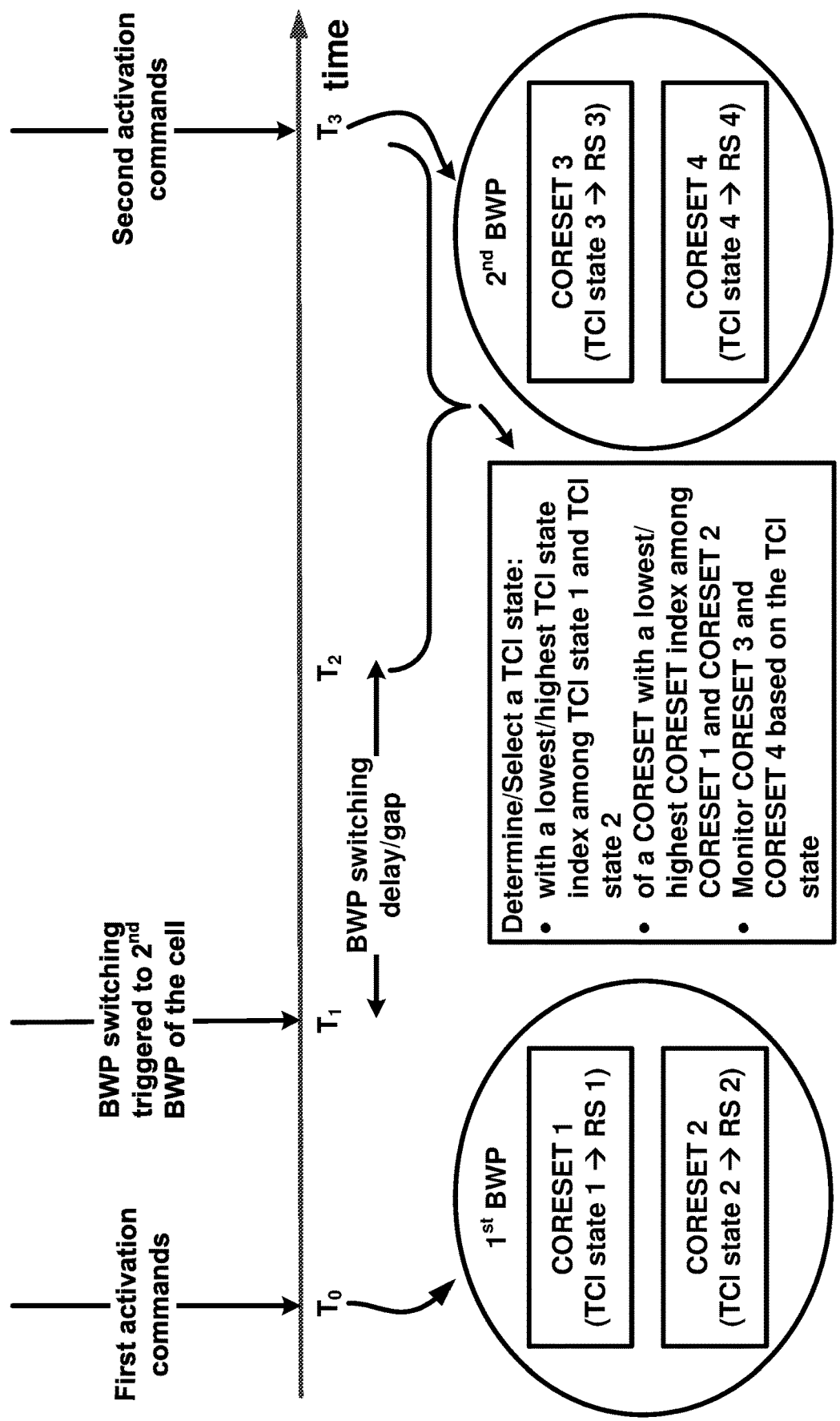
FIG. 18 shows an example of beam management.

FIG. 18 shows an example of beam management. A wireless device may receive one or more first activation commands, for example, activating, for the one or more first CORESETs of the first BWP, a plurality of activated TCI states among a first plurality of TCI states. The wireless device may switch from the first BWP to the second BWP. The wireless device may monitor, for the DCI, the PDCCH in/via the one or more second CORESETs of the second BWP based on an activated TCI state. The wireless device may determine/select the activated TCI state with a lowest (or highest) TCI state index among the plurality of TCI state indexes of the plurality of activated TCI states. The wireless device may determine/select the activated TCI state of a CORESET with a lowest (or highest) CORESET index among the CORESET indexes of the one or more first CORESETs. The wireless device may monitor, for the DCI, the PDCCH in/via the one or more second CORESETs of the second BWP based on the activated TCI state, for example, until receiving one or more second activation commands activating, for the one or more second CORESETs, one or more activated TCI states among a plurality of TCI states.

Figure 19:
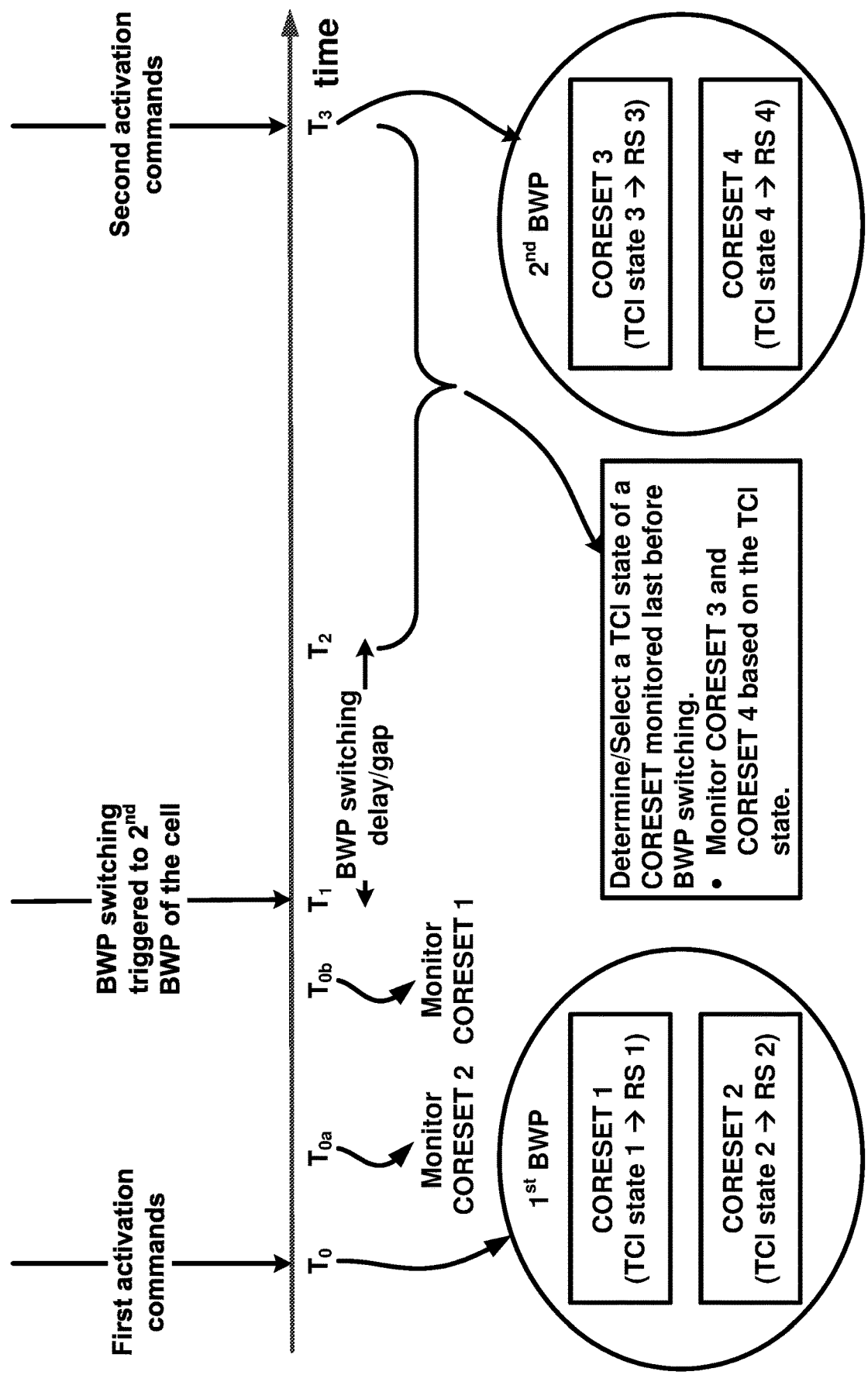
FIG. 19 shows an example of beam management.

FIG. 19 shows an example of beam management. A wireless device may receive one or more first activation commands, for example, activating, for the one or more first CORESETs of the first BWP, a plurality of activated TCI states among a first plurality of TCI states. The wireless device may switch from the first BWP to the second BWP. The wireless device may monitor, for the DCI, the PDCCH in/via the one or more second CORESETs of the second BWP based on an activated TCI state. The wireless device may determine/select the activated TCI state of a CORESET (or associated or linked to) with a search space set that is monitored last (or latest or most recent). The search space set that is monitored last (or latest or most recent) may comprise the search space set that is monitored last (or latest or most recent), for example, based on switching from the first BWP to the second BWP. The wireless device may monitor, for the DCI, the PDCCH in/via the one or more second CORESETs of the second BWP based on the activated TCI state, for example, until receiving one or more second activation commands activating, for the one or more second CORESETs, one or more activated TCI states among a plurality of TCI states.

FIG. 17, FIG. 18, and FIG. 19 show examples of beam management. A wireless device may receive one or more messages. The wireless device may receive the one or more messages, for example, from a base station. The one or more messages may comprise one or more configuration parameters for a cell. The cell may comprise a plurality of BWPs comprising a first BWP (e.g., 1st BWP in FIG. 18 and FIG. 19) and a second BWP (e.g., 2nd BWP in FIG. 18 and FIG. 19). The first BWP may be a first downlink BWP. The second BWP may be a second downlink BWP. The first BWP may be a first uplink BWP. The second BWP may be a second uplink BWP.

The one or more configuration parameters may indicate a first plurality of TCI states for one or more first CORESETs of the first BWP. The one or more configuration parameters may indicate the one or more first CORESETs for the first BWP of the cell. The first BWP may comprise the one or more first CORESETs.

The one or more configuration parameters may indicate one or more TCI states for one or more second CORESETs of the second BWP. The one or more configuration parameters may indicate the one or more second CORESETs for the second BWP of the cell. The second BWP may comprise the one or more second CORESETs. The first plurality of TCI states may provide QCL relationships between downlink reference signals in a TCI state of the first plurality of TCI states and PDCCH DM-RS ports in the first BWP. The one or more TCI states may provide QCL relationships between downlink reference signals in a TCI state of the one or more TCI states and PDCCH DM-RS ports in the second BWP.

A TCI state may indicate/comprise one or more QCL-Info. Each QCL-Info of the one or more QCL-Info may comprise/indicate a respective reference signal (e.g., referenceSignal, SS/PBCH block, CSI-RS) and/or a respective QCL type (e.g., QCL-Type). A QCL-Info of the one or more QCL-Info may comprise/indicate a reference signal. A QCL-Info of the one or more QCL-Info may comprise/indicate a QCL-Type. The QCL-Type may be TypeA, TypeB, TypeC, or TypeD.

The one or more configuration parameters may indicate TCI state indexes (e.g., provided by a higher layer parameter tci-StateID) for the first plurality of TCI states. Each TCI state of the first plurality of TCI states may be identified/indicated by a respective TCI state index of the TCI state indexes. A first TCI state of the first plurality of TCI states may be identified/indicated by a first TCI state index of the TCI state indexes. A second TCI state of the first plurality of TCI states may be identified/indicated by a second TCI state index of the TCI state indexes.

The one or more first CORESETs may comprise a first CORESET (e.g., CORESET 1 in FIG. 18 and FIG. 19). The one or more first CORESETs may comprise a second CORESET (e.g., CORESET 2 in FIG. 18 and FIG. 19). The first plurality of TCI states may comprise one or more first TCI states for the first CORESET. The first plurality of TCI states may comprise one or more second TCI states for the second CORESET.

The one or more second CORESETs may comprise a third CORESET (e.g., CORESET 3 in FIG. 18 and FIG. 19). The one or more second CORESETs may comprise a fourth CORESET (e.g., CORESET 4 in FIG. 18 and FIG. 19). The one or more TCI states may comprise one or more third TCI states for the third CORESET. The one or more TCI states may comprise one or more fourth TCI states for the fourth CORESET.

The wireless device may activate the first BWP. The activating the first BWP may comprise that the wireless device sets the first BWP as a first active BWP of the cell. The activating the first BWP may comprise that the wireless device sets the first BWP in an active state. The activating the first BWP may comprise switching the first BWP from an inactive state to an active state.

The one or more configuration parameters may indicate CORESET indexes (e.g., provided by a higher layer parameter such as ControlResourceSetId) for the one or more first CORESETs. Each CORESET of the one or more first CORESETs may be identified/indicated by a respective CORESET index of the CORESET indexes. The first CORESET may be identified/indicated by a first CORESET index of the CORESET indexes. The second CORESET may be identified/indicated by a second CORESET index of the CORESET indexes.

The wireless device may receive one or more first activation commands (e.g., TCI State Indication for wireless device-specific PDCCH MAC CE, first activation commands at time T0 in FIG. 17-FIG. 19). The wireless device may receive one or more first activation commands (e.g., TCI State Indication for wireless device-specific PDCCH MAC CE, first activation commands at time T0 in FIG. 17-FIG. 19), for example, activating, for the one or more first CORESETs of the first BWP, a plurality of activated TCI states among the first plurality of TCI states. Each activation command of the one or more first activation commands may activate a TCI state for a respective CORESET of the one or more first CORESETs. Each activation command of the one or more first activation commands may activate a TCI state, among the plurality of activated TCI states, for a respective CORESET of the one or more first CORESETs. The wireless device may activate/use each TCI state of the plurality of activated TCI states for a respective CORESET of the one or more first CORESETs. The wireless device may activate/use each TCI state of the plurality of activated TCI states for a (single, only one) CORESET of the one or more first CORESETs. The plurality of activated TCI states may be applicable for PDCCH reception (in the one or more first CORESETs) in the first BWP of the cell.

The wireless device may receive a first activation command (e.g., TCI State Indication for wireless device-specific PDCCH MAC CE). The wireless device may receive a first activation command (e.g., TCI State Indication for wireless device-specific PDCCH MAC CE), for example, at time T0 in FIG. 17-FIG. 19. The wireless device may receive a first activation command (e.g., TCI State Indication for wireless device-specific PDCCH MAC CE), for example, activating a first TCI state (e.g., TCI state 1 in FIG. 18 and FIG. 19) of the one or more first TCI states of the first CORESET. The first activation command may have a field indicating/comprising a first TCI state index (e.g., provided by a higher layer parameter tci-StateID) of the first TCI state. The wireless device may activate the first TCI state for the first CORESET. The wireless device may activate the first TCI state for the first CORESET, for example, based on the field indicating the first TCI state, The wireless device may receive a second activation command (e.g., TCI State Indication for wireless device-specific PDCCH MAC CE). The wireless device may receive a second activation command (e.g., TCI State Indication for wireless device-specific PDCCH MAC CE), for example, at time T0 in FIG. 17-FIG. 19. The wireless device may receive a second activation command (e.g., TCI State Indication for wireless device-specific PDCCH MAC CE), for example, activating a second TCI state (e.g., TCI state 2 in FIG. 18 and FIG. 19) of the one or more second TCI states of the second CORESET. The second activation command may have a field indicating/comprising a second TCI state index (e.g., provided by a higher layer parameter tci-StateID) of the second TCI state. The wireless device may activate the second TCI state for the second CORESET. The wireless device may activate the second TCI state for the second CORESET, for example, based on the field indicating the second TCI state. The plurality of activated TCI states may comprise the first TCI state for the first CORESET and the second TCI state for the second CORESET.

The first TCI state may be associated with and/or applicable to a reception of PDCCH in the first CORESET of the first BWP. The first TCI state being associated with and/or applicable to the reception of PDCCH in the first CORESET of the first BWP may comprise that (the wireless device determines that) at least one DM-RS port of the PDCCH is QCLed with a first reference signal (e.g., RS 1 indicated by TCI state 1 in FIG. 18 and FIG. 19) indicated by the first TCI state with respect to a first QCL type (e.g., QCL-TypeD) indicated by the first TCI state. The first TCI state being associated with and/or applicable to the reception of PDCCH in the first CORESET of the first BWP may comprise that the wireless device receives the PDCCH with DCI in/via the first CORESET of the first BWP. The first TCI state being associated with and/or applicable to the reception of PDCCH in the first CORESET of the first BWP may comprise that the wireless device receives the PDCCH with DCI in/via the first CORESET of the first BWP, for example, based on the first TCI state. The receiving the PDCCH in/via the first CORESET based on the first TCI state may comprise that (the wireless device determines that) at least one DM-RS port of the PDCCH is QCLed with the first reference signal (indicated by the first TCI state) with respect to the first QCL type (indicated by the first TCI state).

The second TCI state may be associated with and/or applicable to a reception of PDCCH in the second CORESET of the first BWP. The second TCI state being associated with and/or applicable to the reception of PDCCH in the second CORESET of the first BWP may comprise that (the wireless device determines that) at least one DM-RS port of the PDCCH is QCLed with a second reference signal (e.g., RS 2 indicated by TCI state 2 in FIG. 18 and FIG. 19) indicated by the second TCI state with respect to a second QCL type (e.g., QCL-TypeD) indicated by the second TCI state. The second TCI state being associated with and/or applicable to the reception of PDCCH in the second CORESET of the first BWP may comprise that the wireless device receives the PDCCH with DCI in/via the second CORESET of the first BWP. The second TCI state being associated with and/or applicable to the reception of PDCCH in the second CORESET of the first BWP may comprise that the wireless device receives the PDCCH with DCI in/via the second CORESET of the first BWP, for example, based on the second TCI state. The receiving the PDCCH in/via the second CORESET based on the second TCI state may comprise that (the wireless device determines that) at least one DM-RS port of the PDCCH is QCLed with the second reference signal (indicated by the second TCI state) with respect to the second QCL type (indicated by the second TCI state).

The one or more configuration parameters may indicate a plurality of TCI state indexes (e.g., provided by a higher layer parameter tci-StateID). The one or more configuration parameters may indicate a plurality of TCI state indexes (e.g., provided by a higher layer parameter tci-StateID), for example, for the plurality of activated TCI states. Each TCI state of the plurality of activated TCI states may be identified/indicated by a respective TCI state index of the plurality of TCI state indexes. A first TCI state of the plurality of activated TCI states may be identified/indicated by a first TCI state index of the plurality of TCI state indexes. A second TCI state of the plurality of activated TCI states may be identified/indicated by a second TCI state index of the plurality of TCI state indexes. The TCI state indexes of the first plurality of TCI states may comprise the plurality of TCI state indexes of the plurality of activated TCI states.

The wireless device may switch from the first BWP to the second BWP of the cell (e.g., at time T1 in FIG. 17-FIG. 19). The switching from the first BWP to the second BWP may comprise activating the second BWP as a second active BWP of the cell. The activating the second BWP may comprise that the wireless device sets the second BWP in an active state. The switching from the first BWP to the second BWP may comprise deactivating the first BWP. The deactivating the first BWP may comprise that the wireless device sets the first BWP in an inactive state. The wireless device may switch from the first BWP to the second BWP. The wireless device may switch from the first BWP to the second BWP, for example, based on expiry of a BWP inactivity timer. The one or more configuration parameters may indicate the BWP inactivity timer for the cell. The second BWP may be a default BWP (e.g., default downlink BWP) of the cell. The wireless device may switch from the first BWP to the second BWP, for example, based on receiving a downlink signal (e.g., DCI, RRC, MAC CE) indicating the second BWP. A field in the downlink signal may indicate the second BWP (e.g., or comprise a BWP index identifying/indicating the second BWP). The wireless device may switch from the first BWP to the second BWP, for example, based on initiating a random access procedure. The random access procedure may be initiated for the cell.

The wireless device may switch from the first BWP to the second BWP. The wireless device may switch from the first BWP to the second BWP, for example, for a BWP switching delay (e.g., BWP switching delay/gap in FIG. 17-FIG. 19). The wireless device may initiate the switching from the first BWP to the second BWP at a first time (e.g., time T1 in FIG. 17-FIG. 19). The wireless device may complete the switching from the first BWP to the second BWP at a second time (e.g., time T2 in FIG. 17-FIG. 19). The BWP switching delay may be the difference between the second time and the first time (e.g., T2−T1 in FIG. 17-FIG. 19). The wireless device may determine/select an activated TCI state among the plurality of activated TCI states. The wireless device may determine/select an activated TCI state among the plurality of activated TCI states, for example, based on switching from the first BWP to the second BWP. The wireless device may determine/select an activated TCI state among the plurality of activated TCI states, for example, for the one or more second CORESETs of the second BWP.

The activated TCI state may be associated with and/or applicable for a reception of PDCCH. The activated TCI state may be associated with and/or applicable for a reception of PDCCH, for example, in the one or more second CORESETs of the second BWP of the cell. The activated TCI state may be associated with and/or applicable for a reception of PDCCH, for example, in each CORESET of the one or more second CORESETs in the second BWP.

The activated TCI state may comprise/indicate a reference signal. The reference signal comprise a downlink reference signal (e.g., SSB, CSI-RS, DM-RS). The reference signal may comprise an uplink reference signal (e.g., SRS, DM-RS). The activated TCI state may comprise/indicate a QCL type (e.g., QCL-TypeA, QCL-TypeD, etc.). The QCL type may comprise QCL-TypeD. The activated TCI state may indicate the QCL type for the reference signal.

The wireless device may monitor PDCCH in/via the one or more second CORESETs (e.g., CORESET 3, CORESET 4 in FIG. 18 and FIG. 19) of the second BWP. The wireless device may monitor PDCCH in/via the one or more second CORESETs (e.g., CORESET 3, CORESET 4 in FIG. 18 and FIG. 19) of the second BWP, for example, for DCI. The wireless device may monitor PDCCH in/via the one or more second CORESETs (e.g., CORESET 3, CORESET 4 in FIG. 18 and FIG. 19) of the second BWP for DCI, for example, based on the activated TCI state. The monitoring the PDCCH in/via the one or more second CORESETs of the second BWP for the DCI based on the activated TCI state may comprise monitoring, for the DCI, the PDCCH in/via each CORESET of the one or more second CORESETs of the second BWP based on the activated TCI state.

The wireless device may receive the PDCCH with the DCI. The wireless device may receive the PDCCH with the DCI, for example, via the one or more second CORESETs. The wireless device may receive the PDCCH with the DCI. The wireless device may receive the PDCCH with the DCI, for example, based on the activated TCI state. The wireless device may receive the PDCCH with the DCI, for example, if monitoring, for the DCI, the PDCCH. The receiving, via the one or more second CORESETs, the PDCCH with the DCI based on the activated TCI state may comprise receiving, via each CORESET of the one or more second CORESETs, the PDCCH with the DCI based on the activated TCI state.

The activated TCI state may be associated with and/or applicable to a reception of PDCCH with DCI. The activated TCI state may be associated with and/or applicable to a reception of PDCCH with DCI, for example, in a CORESET (e.g., CORESET 3, CORESET 4 in FIG. 18 and FIG. 19) of the one or more second CORESETs of the second BWP. The monitoring, for the DCI, the PDCCH in/via a CORESET (e.g., CORESET 3, CORESET 4 in FIG. 18 and FIG. 19) of the one or more second CORESETs of the second BWP based on the activated TCI state may comprise that (the wireless device determines that) at least one DM-RS port of the PDCCH with the DCI received in the CORESET is QCLed with the reference signal indicated by the activated TCI state with respect to the QCL type (e.g., QCL-TypeD) indicated by the activated TCI state.

The wireless device may receive, via a CORESET (e.g., CORESET 3, CORESET 4 in FIG. 18 and FIG. 19) of the one or more second CORESETs, the PDCCH with the DCI, for example, based on the activated TCI state. The wireless device may determine that at least one DM-RS port of the PDCCH with the DCI is QCLed with the reference signal (indicated by the activated TCI state) with respect to the QCL type (indicated by the activated TCI state). The receiving, via a CORESET (e.g., CORESET 3, CORESET 4 in FIG. 18 and FIG. 19) of the one or more second CORESETs, the PDCCH with the DCI based on the activated TCI state may comprise that (the wireless device determines that) at least one DM-RS port of the PDCCH with the DCI is QCLed with the reference signal (indicated by the activated TCI state) with respect to the QCL type (indicated by the activated TCI state). The wireless device may monitor, for the DCI, the PDCCH in/via the one or more second CORESETs of the second BWP based on the activated TCI state. The wireless device may monitor, for the DCI, the PDCCH in/via the one or more second CORESETs of the second BWP based on the activated TCI state, for example, until receiving one or more second activation commands (e.g., TCI State Indication for wireless device-specific PDCCH MAC CE, Second activation commands at time T3 in FIG. 17-FIG. 19) activating, for the one or more second CORESETs, one or more activated TCI states among the one or more TCI states.

An activation command (e.g., each activation command) of the one or more second activation commands may activate a TCI state for a respective CORESET of the one or more second CORESETs. An activation command (e.g., each activation command) of the one or more second activation commands may activate a TCI state, among the one or more activated TCI states, for a respective CORESET of the one or more second CORESETs. The wireless device may activate/use each TCI state of the one or more activated TCI states for a respective CORESET of the one or more second CORESETs. The wireless device may activate/use each TCI state of the one or more activated TCI states for a (single, only one) CORESET of the one or more second CORESETs. The one or more activated TCI states may be associated with and/or applicable for PDCCH reception in the one or more second CORESETs of the second BWP of the cell.

The wireless device may receive a third activation command (e.g., TCI State Indication for wireless device-specific PDCCH MAC CE). The wireless device may receive a third activation command (e.g., TCI State Indication for wireless device-specific PDCCH MAC CE), for example, at time T3 in FIG. 17-FIG. 19. The wireless device may receive a third activation command (e.g., TCI State Indication for wireless device-specific PDCCH MAC CE), for example, activating a third TCI state (e.g., TCI state 3 in FIG. 18 and FIG. 19) of the one or more third TCI states of the third CORESET. The third activation command may have a field indicating/comprising a third TCI state index (e.g., provided by a higher layer parameter tci-StateID) of the third TCI state. The wireless device may activate the third TCI state for the third CORESET. The wireless device may activate the third TCI state for the third CORESET, for example, based on the field indicating the third TCI state.

The wireless device may receive a fourth activation command (e.g., TCI State Indication for wireless device-specific PDCCH MAC CE). The wireless device may receive a fourth activation command (e.g., TCI State Indication for wireless device-specific PDCCH MAC CE), for example, at time T0 in FIG. 17-FIG. 19. The wireless device may receive a fourth activation command (e.g., TCI State Indication for wireless device-specific PDCCH MAC CE), for example, activating a fourth TCI state (e.g., TCI state 4 in FIG. 18 and FIG. 19) of the one or more fourth TCI states of the fourth CORESET. The fourth activation command may have a field indicating/comprising a fourth TCI state index (e.g., provided by a higher layer parameter tci-StateID) of the fourth TCI state. The wireless device may activate the fourth TCI state for the fourth CORESET. The wireless device may activate the fourth TCI state for the fourth CORESET, for example, based on the field indicating the fourth TCI state. The one or more activated TCI states may comprise the third TCI state for the third CORESET and the fourth TCI state for the fourth CORESET.

The third TCI state may be associated with and/or applicable to a reception of PDCCH in the third CORESET of the second BWP. The third TCI state being associated with and/or applicable to the reception of PDCCH in the third CORESET of the second BWP may comprise that (the wireless device determines that) at least one DM-RS port of the PDCCH is QCLed with a third reference signal (e.g., RS 3 indicated by TCI state 3 in FIG. 18 and FIG. 19) indicated by the third TCI state with respect to a third QCL type (e.g., QCL-TypeD) indicated by the third TCI state. The third TCI state being associated with and/or applicable to the reception of PDCCH in the third CORESET of the second BWP may comprise that the wireless device receives the PDCCH with DCI in/via the third CORESET of the second BWP. The third TCI state being associated with and/or applicable to the reception of PDCCH in the third CORESET of the second BWP may comprise that the wireless device receives the PDCCH with DCI in/via the third CORESET of the second BWP, for example, based on the third TCI state. The receiving the PDCCH in/via the third CORESET based on the third TCI state may comprise that (the wireless device determines that) at least one DM-RS port of the PDCCH is QCLed with the third reference signal (indicated by the third TCI state) with respect to the third QCL type (indicated by the third TCI state).

The fourth TCI state may be associated with and/or applicable to a reception of PDCCH in the fourth CORESET of the second BWP. The fourth TCI state being associated with and/or applicable to the reception of PDCCH in the fourth CORESET of the second BWP may comprise that (the wireless device determines that) at least one DM-RS port of the PDCCH is QCLed with a fourth reference signal (e.g., RS 4 indicated by TCI state 4 in FIG. 18 and FIG. 19) indicated by the fourth TCI state with respect to a fourth QCL type (e.g., QCL-TypeD) indicated by the fourth TCI state. The fourth TCI state being associated with and/or applicable to the reception of PDCCH in the fourth CORESET of the second BWP may comprise that the wireless device receives the PDCCH with DCI in/via the fourth CORESET of the second BWP based on the fourth TCI state. The receiving the PDCCH in/via the fourth CORESET based on the fourth TCI state may comprise that (the wireless device determines that) at least one DM-RS port of the PDCCH is QCLed with the fourth reference signal (indicated by the fourth TCI state) with respect to the fourth QCL type (indicated by the fourth TCI state).

The selecting the activated TCI state may be based on a rule (e.g., a predefined rule) between the wireless device and the base station. The determining/selecting the activated TCI state among the plurality of activated TCI states may be based on the TCI state indexes (e.g., provided by a higher layer parameter tci-StateID). The determining/selecting the activated TCI state among the plurality of activated TCI states may be based on the plurality of TCI state indexes of the plurality of activated TCI states.

The wireless device may determine/select the activated TCI state with a lowest (or highest) TCI state index among the plurality of TCI state indexes of the plurality of activated TCI states. The plurality of activated TCI states may comprise a first TCI state (e.g., TCI state 1 in FIG. 18) identified/indicated by a first TCI state index and a second TCI state (e.g., TCI state 2 in FIG. 18) identified by a second TCI state index. The determining/selecting the activated TCI state among the first TCI state and the second TCI state may be based on the first TCI state index and the second TCI state index. The wireless device may determine/select the activated TCI state with a lowest (or highest) TCI state index among the first TCI state index and the second TCI state index.

The first TCI state index may be lower than the second TCI state index. The wireless device may determine/select the first TCI state as the activated TCI state. The wireless device may determine/select the first TCI state as the activated TCI state, for example, based on the first TCI state index being lower than the second TCI state index. The wireless device may determine/select the second TCI state as the activated TCI state. The wireless device may determine/select the second TCI state as the activated TCI state, for example, based on the first TCI state index being lower than the second TCI state index.

The first TCI state index may be higher than the second TCI state index. The wireless device may determine/select the first TCI state as the activated TCI state. The wireless device may determine/select the first TCI state as the activated TCI state, for example, based on the first TCI state index being higher than the second TCI state index. The wireless device may determine/select the second TCI state as the activated TCI state. The wireless device may determine/select the second TCI state as the activated TCI state, for example, based on the first TCI state index being higher than the second TCI state index.

The determining/selecting the activated TCI state among the plurality of activated TCI states may be based on the CORESET indexes (e.g., provided by a higher layer parameter ControlResourceSetId) for the one or more first CORESETs. The wireless device may determine/select the activated TCI state of a CORESET with a lowest (or highest) CORESET index among the CORESET indexes of the one or more first CORESETs. The plurality of activated TCI states for the one or more first CORESETs may comprise a first TCI state (e.g., TCI state 1 in FIG. 18) of a first CORESET (e.g., CORESET 1 in FIG. 18) identified/indicated by a first CORESET index and a second TCI state (e.g., TCI state 2 in FIG. 18) of a second CORESET (e.g., CORESET 2 in FIG. 18) identified/indicated by a second CORESET index. The determining/selecting the activated TCI state among the first TCI state and the second TCI state may be based on the first CORESET index and the second CORESET index. The wireless device may determine/select the activated TCI state of a CORESET with a lowest (or highest) CORESET index. The wireless device may determine/select the activated TCI state of a CORESET with a lowest (or highest) CORESET index, for example, among the first CORESET index of the first CORESET and the second CORESET index of the second CORESET.

The first CORESET index may be lower than the second CORESET index. The wireless device may determine/select the first TCI state of the first CORESET as the activated TCI state. The wireless device may determine/select the first TCI state of the first CORESET as the activated TCI state, for example, based on the first CORESET index being lower than the second CORESET index. The wireless device may determine/select the second TCI state of the second CORESET as the activated TCI state. The wireless device may determine/select the second TCI state of the second CORESET as the activated TCI state, for example, based on the first CORESET index being lower than the second CORESET index.

The first CORESET index may be higher than the second CORESET index. The wireless device may determine/select the first TCI state of the first CORESET as the activated TCI state. The wireless device may determine/select the first TCI state of the first CORESET as the activated TCI state, for example, based on the first CORESET index being higher than the second CORESET index. The wireless device may determine/select the second TCI state of the second CORESET as the activated TCI state. The wireless device may determine/select the second TCI state of the second CORESET as the activated TCI state, for example, based on the first CORESET index being higher than the second CORESET index.

The determining/selecting the activated TCI state among the plurality of activated TCI states may be based on reception times of one or more first activation commands for the one or more first CORESETs. The wireless device may determine/select the activated TCI state of a CORESET with an activation command that is received last (or latest or most recent) among the one or more first activation commands of the one or more first CORESETs. The activation command that is received last (or latest or most recent) may comprise the activation command that is received last (or latest or more recent). The activation command that is received last (or latest or most recent) may comprise the activation command that is received last (or latest or more recent), for example, based on switching from the first BWP to the second BWP (e.g., before time T1 in FIG. 19).

The one or more first activation commands for the one or more first CORESETs may comprise a first activation command. The one or more first activation commands for the one or more first CORESETs may comprise a first activation command, for example, for a first CORESET (e.g., CORESET 1 in FIG. 19). The one or more first activation commands for the one or more first CORESETs may comprise a first activation command, for example, activating a first TCI state (e.g., TCI state 1 in FIG. 19). The one or more first activation commands for the one or more first CORESETs may comprise a second activation command. The one or more first activation commands for the one or more first CORESETs may comprise a second activation command, for example, for a second CORESET (e.g., CORESET 2 in FIG. 19). The one or more first activation commands for the one or more first CORESETs may comprise a second activation command, for example, activating a second TCI state (e.g., TCI state 2 in FIG. 19). The wireless device may receive the first activation command at a first reception time (e.g., at time T0*a* in FIG. 19). The wireless device may receive the second activation command at a second reception time (e.g., at time T0*b* in FIG. 19).

The determining/selecting the activated TCI state among the first TCI state and the second TCI state may be based on the first reception time and the second reception time. The wireless device may determine/select the activated TCI state of a CORESET with a latest (or more recent or last) activation command reception time. The wireless device may determine/select the activated TCI state of a CORESET with a latest (or more recent or last) activation command reception time, for example, among the first reception time of the first activation command for the first CORESET and the second reception time of the second activation command for the second CORESET.

The determining/selecting the activated TCI state among the plurality of activated TCI states may be based on reception times of DCI via the one or more first CORESETs. The wireless device may determine/select the activated TCI state of a CORESET. The wireless device may determine/select the activated TCI state of a CORESET, for example, among the one or more first CORESETs. The wireless device may determine/select the activated TCI state of a CORESET, for example, that the wireless device receives DCI last (or latest or most recent). The wireless device may receive the DCI, for example, based on switching from the first BWP to the second BWP (e.g., before time T1 in FIG. 19). The DCI may schedule a transport block (e.g., PDSCH, PUSCH). The DCI may be the last DCI received in the first BWP. The DCI may be the last DCI received in the first BWP, for example, based on switching from the first BWP to the second BWP (e.g., before time T1 in FIG. 19).

The wireless device may receive a first DCI. The wireless device may receive a first DCI, for example, via a first CORESET (e.g., CORESET 1 in FIG. 19) of the one or more first CORESETs. The first DCI may schedule a first transport block (e.g., PDSCH, PUSCH). The wireless device may receive the first DCI, for example, based on a first TCI state (e.g., TCI state 1 in FIG. 19). The wireless device may receive the first DCI, for example, at a first reception time (e.g., at time T0*a* in FIG. 19). The wireless device may receive a second DCI. The wireless device may receive a second DCI, for example, via a second CORESET (e.g., CORESET 2 in FIG. 19) of the one or more first CORESETs. The second DCI may schedule a second transport block (e.g., PDSCH, PUSCH). The wireless device may receive the second DCI, for example, based on a second TCI state (e.g., TCI state 2 in FIG. 19). The wireless device may receive the second DCI, for example, at a second reception time (e.g., at time T0*b* in FIG. 19).

The determining/selecting the activated TCI state among the plurality of activated TCI states may be based on monitoring times of search space sets for (or associated with) the one or more first CORESETs. The wireless device may determine/select the activated TCI state of a CORESET (or associated or linked to) with a search space set that is monitored last (or latest or most recent). The wireless device may determine/select the activated TCI state of a CORESET (or associated or linked to) with a search space set that is monitored last (or latest or most recent), for example, among monitoring times of search space sets of (or associated with or linked to) the one or more first CORESETs. The search space set that is monitored last (or latest or most recent) may comprise the search space set that is monitored last (or latest or most recent), for example, based on switching from the first BWP to the second BWP (e.g., before time T1 in FIG. 19).

The monitoring times for the search space sets for the one or more first CORESETs may comprise a first reception time (e.g., at time T0*a* in FIG. 19). The monitoring times for the search space sets for the one or more first CORESETs may comprise a first reception time (e.g., at time T0*a* in FIG. 19), for example, for a first search space set associated with a first CORESET (e.g., CORESET 1 in FIG. 19) of the one or more first CORESETs. The wireless device may monitor the first search space set. The wireless device may monitor the first search space set, for example, based on a first TCI state (e.g., TCI state 1 in FIG. 19) of the plurality of activated TCI states.

The monitoring times for the search space sets for the one or more first CORESETs may comprise a second reception time (e.g., at time T0b in FIG. 19). The monitoring times for the search space sets for the one or more first CORESETs may comprise a second reception time (e.g., at time T0*b* in FIG. 19), for example, for a second search space set associated with a second CORESET (e.g., CORESET 2 in FIG. 19) of the one or more first CORESETs. The wireless device may monitor the second search space set. The wireless device may monitor the second search space set, for example, based on a second TCI state (e.g., TCI state 2 in FIG. 19) of the plurality of activated TCI states.

The first reception time may be later (or more recent) than the second reception time. The wireless device may determine/select the first TCI state of the first CORESET as the activated TCI state. The wireless device may determine/select the first TCI state of the first CORESET as the activated TCI state, for example, based on the first reception time being later (or more recent) than the second reception time. The wireless device may determine/select the second TCI state of the second CORESET as the activated TCI state. The wireless device may determine/select the second TCI state of the second CORESET as the activated TCI state, for example, based on the first reception time being later (or more recent) than the second reception time.

The first reception time may be earlier (or less recent) than the second reception time. The wireless device may determine/select the first TCI state of the first CORESET as the activated TCI state. The wireless device may determine/select the first TCI state of the first CORESET as the activated TCI state, for example, based on the first reception time being earlier (or less recent) than the second reception time. The wireless device may determine/select the second TCI state of the second CORESET as the activated TCI state. The wireless device may determine/select the second TCI state of the second CORESET as the activated TCI state, for example, based on the first reception time being earlier (or less recent) than the second reception time.

The one or more configuration parameters may indicate a second plurality of TCI states for PDSCH reception in the first BWP. The second plurality of TCI states may comprise the first plurality of TCI states. The first plurality of TCI states may be a subset of the second plurality of TCI states. The wireless device may receive one or more activation commands (e.g., TCI State Indication for wireless device-specific PDSCH MAC CE). The wireless device may receive one or more activation commands (e.g., TCI State Indication for wireless device-specific PDSCH MAC CE), for example, activating, for the first BWP, a second plurality of activated TCI states among the second plurality of TCI states.

The one or more configuration parameters may indicate a second plurality of TCI state indexes (e.g., provided by a higher layer parameter tci-StateID). The one or more configuration parameters may indicate a second plurality of TCI state indexes (e.g., provided by a higher layer parameter tci-StateID), for example, for the second plurality of activated TCI states. Each TCI state of the second plurality of activated TCI states may be identified by a respective TCI state index of the second plurality of TCI state indexes. A first TCI state of the second plurality of activated TCI states may be identified by a first TCI state index of the second plurality of TCI state indexes. A second TCI state of the second plurality of activated TCI states may be identified by a second TCI state index of the second plurality of TCI state indexes. The wireless device may determine/select an activated TCI state among the second plurality of activated TCI states. The wireless device may determine/select an activated TCI state among the second plurality of activated TCI states, for example, based on switching from the first BWP to the second BWP. The wireless device may determine/select an activated TCI state among the second plurality of activated TCI states, for example, for the one or more second CORESETs of the second BWP.

The determining/selecting the activated TCI state among the second plurality of activated TCI states may be based on the second plurality of TCI state indexes of the second plurality of activated TCI states. The wireless device may determine/select the activated TCI state with a lowest (or highest) TCI state index among the second plurality of TCI state indexes of the second plurality of activated TCI states. The second plurality of activated TCI states may comprise a first TCI state identified/indicated by a first TCI state index and a second TCI state identified by a second TCI state index. The determining/selecting the activated TCI state among the first TCI state and the second TCI state may be based on the first TCI state index and the second TCI state index. The wireless device may determine/select the activated TCI state with a lowest (or highest) TCI state index among the first TCI state index and the second TCI state index.

The first TCI state index may be lower than the second TCI state index. The wireless device may determine/select the first TCI state as the activated TCI state. The wireless device may determine/select the first TCI state as the activated TCI state, for example, based on the first TCI state index being lower than the second TCI state index. The wireless device may determine/select the second TCI state as the activated TCI state. The wireless device may determine/select the second TCI state as the activated TCI state, for example, based on the first TCI state index being lower than the second TCI state index.

The first TCI state index may be higher than the second TCI state index. The wireless device may determine/select the first TCI state as the activated TCI state. The wireless device may determine/select the first TCI state as the activated TCI state, for example, based on the first TCI state index being higher than the second TCI state index. The wireless device may determine/select the second TCI state as the activated TCI state. The wireless device may determine/select the second TCI state as the activated TCI state, for example, based on the first TCI state index being higher than the second TCI state index.

The determining/selecting the activated TCI state among the plurality of activated TCI states may be based on reception times of transport blocks (e.g., PDSCHs). The determining/selecting the activated TCI state among the plurality of activated TCI states may be based on reception times of transport blocks (e.g., PDSCHs), for example, via the first BWP. The wireless device may determine/select the activated TCI state of a transport block, among transport blocks, that the wireless device receives last (or latest or most recent). The wireless device may receive the transport block, for example, based on switching from the first BWP to the second BWP (e.g., before time T1 in FIG. 19). The transport block may be the last transport block received in the first BWP. The transport block may be the last transport block received in the first BWP, for example, based on switching from the first BWP to the second BWP (e.g., before time T1 in FIG. 19).

The wireless device may receive a first transport block. The wireless device may receive a first transport block, for example, at a first reception time (e.g., at time T0$a$ in FIG. 19). The wireless device may receive the first transport block, for example, based on a first TCI state. The wireless device may receive a second transport block. The wireless device may receive a second transport block, for example, at a second reception time (e.g., at time T0$b$ in FIG. 19). The wireless device may receive the second transport block, for example, based on a second TCI state.

The first reception time may be later (or more recent) than the second reception time. The wireless device may determine/select the first TCI state as the activated TCI state. The wireless device may determine/select the first TCI state as the activated TCI state, for example, based on the first reception time being later (or more recent) than the second reception time. The wireless device may determine/select the second TCI state as the activated TCI state. The wireless device may determine/select the second TCI state as the activated TCI state, for example, based on the first reception time being later (or more recent) than the second reception time.

The first reception time may be earlier (or less recent) than the second reception time. The wireless device may determine/select the first TCI state as the activated TCI state. The wireless device may determine/select the first TCI state as the activated TCI state, for example, based on the first reception time being earlier (or less recent) than the second reception time. The wireless device may determine/select the second TCI state as the activated TCI state. The wireless device may determine/select the second TCI state as the activated TCI state, for example, based on the first reception time being earlier (or less recent) than the second reception time. The wireless device may determine/select an activated TCI state among the plurality of activated TCI states for a CORESET in the one or more second CORESETs of the second BWP. The wireless device may determine/select an activated TCI state among the plurality of activated TCI states for a CORESET in the one or more second CORESETs of the second BWP, for example, based on switching from the first BWP to the second BWP.

A first CORESET (e.g., CORESET 1 in FIG. 19), with a first TCI state, in the one or more first CORESETs may have a lowest (or highest) CORESET index. A first CORESET (e.g., CORESET 1 in FIG. 19), with a first TCI state, in the one or more first CORESETs may have a lowest (or highest) CORESET index, for example, among the CORESET indexes of the one or more first CORESETs. A third CORESET (e.g., CORESET 3 in FIG. 19) in the one or more second CORESETs may have a lowest (or highest) CORESET index. A third CORESET (e.g., CORESET 3 in FIG. 19) in the one or more second CORESETs may have a lowest (or highest) CORESET index, for example, among CORESET indexes of the one or more second CORESETs. The wireless device may determine/select the first TCI state of the first CORESET as the activated TCI state for the third CORESET of the second BWP. The wireless device may determine/select the first TCI state of the first CORESET as the activated TCI state for the third CORESET of the second BWP, for example, based on the first CORESET having the lowest (or highest) CORESET index and second CORESET having the lowest (or highest) CORESET index.

A second CORESET (e.g., CORESET 2 in FIG. 19), with a second TCI state, in the one or more first CORESETs may have a second lowest (or highest) CORESET index. A second CORESET (e.g., CORESET 2 in FIG. 19), with a second TCI state, in the one or more first CORESETs may have a second lowest (or highest) CORESET index, for example, among the CORESET indexes of the one or more first CORESETs. A fourth CORESET (e.g., CORESET 4 in FIG. 19) in the one or more second CORESETs may have a second lowest (or highest) CORESET index. A fourth CORESET (e.g., CORESET 4 in FIG. 19) in the one or more second CORESETs may have a second lowest (or highest) CORESET index, for example, among CORESET indexes of the one or more second CORESETs. The wireless device may determine/select the second TCI state of the second CORESET as the activated TCI state for the fourth CORESET of the second BWP. The wireless device may determine/select the second TCI state of the second CORESET as the activated TCI state for the fourth CORESET of the second BWP, for example, based on the second CORESET having the second lowest (or highest) CORESET index and second CORESET having the second lowest (or highest) CORESET index.

A number of the one or more second CORESETs may be greater than a number/quantity of the one or more first CORESETs. The one or more first CORESETs may comprise a first CORESET with a lowest (or highest) CORESET index and a second CORESET. The one or more first CORESETs may comprise a first CORESET with a lowest (or highest) CORESET index and a second CORESET, for example, with a second lowest (or highest) CORESET index among the CORESET indexes of the one or more first CORESETs. The one or more second CORESETs may comprise a third CORESET with a lowest (or highest) CORESET index, a fourth CORESET with a second lowest (or highest) CORESET index, and a fifth CORESET with a third lowest (or highest) CORESET index among CORESET indexes of the one or more second CORESETs. The wireless device may determine/select a first TCI state of the first CORESET as the activated TCI state for the third CORESET of the second BWP. The wireless device may determine/select a second TCI state of the second CORESET as the activated TCI state for the fourth CORESET of the second BWP. The wireless device may determine/select the first TCI state of the first CORESET as the activated TCI state for the fifth CORESET of the second BWP.

A number of the one or more second CORESETs may be less than a number/quantity of the one or more first CORESETs. The one or more first CORESETs may comprise a first CORESET with a lowest (or highest) CORESET index, a second CORESET with a second lowest (or highest) CORESET index, and a fifth CORESET with a third lowest (or highest) CORESET index among the CORESET indexes of the one or more first CORESETs. The one or more second CORESETs may comprise a third CORESET with a lowest (or highest) CORESET index and a fourth CORESET with a second lowest (or highest) CORESET index among CORESET indexes of the one or more second CORESETs. The wireless device may determine/select a first TCI state of the first CORESET as the activated TCI state for the third CORESET of the second BWP. The wireless device may determine/select a second TCI state of the second CORESET as the activated TCI state for the fourth CORESET of the second BWP.

The wireless device may determine that the one or more TCI states for the second BWP comprise a TCI state (or one TCI state or a single TCI state) for a CORESET among the one or more second CORESETs of the second BWP. The wireless device may determine that the one or more TCI states for the second BWP comprise a TCI state (or one TCI state or a single TCI state) for a CORESET among the one or more second CORESETs of the second BWP, for example, based on switching from the first BWP to the second BWP. The wireless device may determine/select the TCI state of the CORESET for the one or more second CORESETs of the second BWP. The wireless device may determine/select the TCI state of the CORESET for the one or more second CORESETs of the second BWP, for example, based on determining that the one or more TCI states for the second BWP comprise the TCI state (or one TCI state or a single TCI state) for the CORESET, The CORESET may the third CORESET (e.g., CORESET 3 in FIG. 18 and FIG. 19). The CORESET may the third CORESET (e.g., CORESET 3 in FIG. 18 and FIG. 19), for example, if the one or more third TCI states of the third CORESET comprise a TCI state (or one TCI state or a single TCI state). The TCI state may be TCI state 3 in FIG. 18 and FIG. 19. The CORESET may be the fourth CORESET (e.g., CORESET 4 in FIG. 18 and FIG. 19). The CORESET may be the fourth CORESET (e.g., CORESET 4 in FIG. 18 and FIG. 19), for example, if the one or more fourth TCI states of the fourth CORESET comprise a TCI state (or one TCI state or a single TCI state). The TCI state may be TCI state 4 in FIG. 18 and FIG. 19.

The wireless device may determine that the one or more TCI states for the second BWP comprise a TCI state (or one TCI state or a single TCI state) for a plurality of CORESETs among the one or more second CORESETs of the second BWP. The wireless device may determine that the one or more TCI states for the second BWP comprise a TCI state (or one TCI state or a single TCI state) for a plurality of CORESETs among the one or more second CORESETs of the second BWP, for example, based on switching from the first BWP to the second BWP. The wireless device may select/determine a CORESET with a lowest (or highest) CORESET index among CORESET indexes of the plurality of CORESETs. The wireless device may select/determine a CORESET with a lowest (or highest) CORESET index among CORESET indexes of the plurality of CORESETs, for example, based on determining that the one or more TCI states for the second BWP comprise a TCI state (or one TCI state or a single TCI state) for a plurality of CORESETs among the one or more second CORESETs of the second BWP. The wireless device may determine/select the TCI state of the CORESET for the one or more second CORESETs of the second BWP. The wireless device may determine/select the TCI state of the CORESET for the one or more second CORESETs of the second BWP, for example, based on selecting/determining the CORESET with a lowest (or highest) CORESET index among CORESET indexes of the plurality of CORESETs.

FIG. 20 shows an example of beam management. At step 2002, a wireless device may receive one or more first activation commands. The one or more first activation commands may activate a plurality of TCI states for one or more first CORESETs of a first BWP of a cell. At step 2004, the wireless device may switch from the first BWP to a second BWP of the cell. At step 2006, the wireless device may select/determine an activated TCI state among the plurality of TCI states for one or more second CORESETs of the second BWP. The wireless device may select/determine an activated TCI state among the plurality of TCI states for one or more second CORESETs of the second BWP, for example, based on switching from the first BWP to a second BWP of the cell. At step 2008, the wireless device may receive, via the one or more second CORESETs, DCI. The wireless device may receive, via the one or more second CORESETs, DCI, for example, based on the activated TCI state.

A wireless device may receive one or more first activation commands. The one or more first activation commands may activate a plurality of TCI states for one or more first CORESETs in a first CORESET group of a first BWP of a cell. The wireless device may switch from the first BWP to a second BWP of the cell. The wireless device may determine one or more second CORESETs, among a plurality of CORESETs in the second BWP, that are in the first CORESET group. The wireless device may determine one or more second CORESETs, among a plurality of CORESETs in the second BWP, that are in the first CORESET group, for example, based on switching from the first BWP to a second BWP of the cell. The wireless device may select/determine an activated TCI state among the plurality of TCI states for the one or more second CORESETs of the second BWP. The wireless device may receive, via the one or more second CORESETs, DCI. The wireless device may receive, via the one or more second CORESETs, DCI, for example, based on the activated TCI state.

Figure 21:
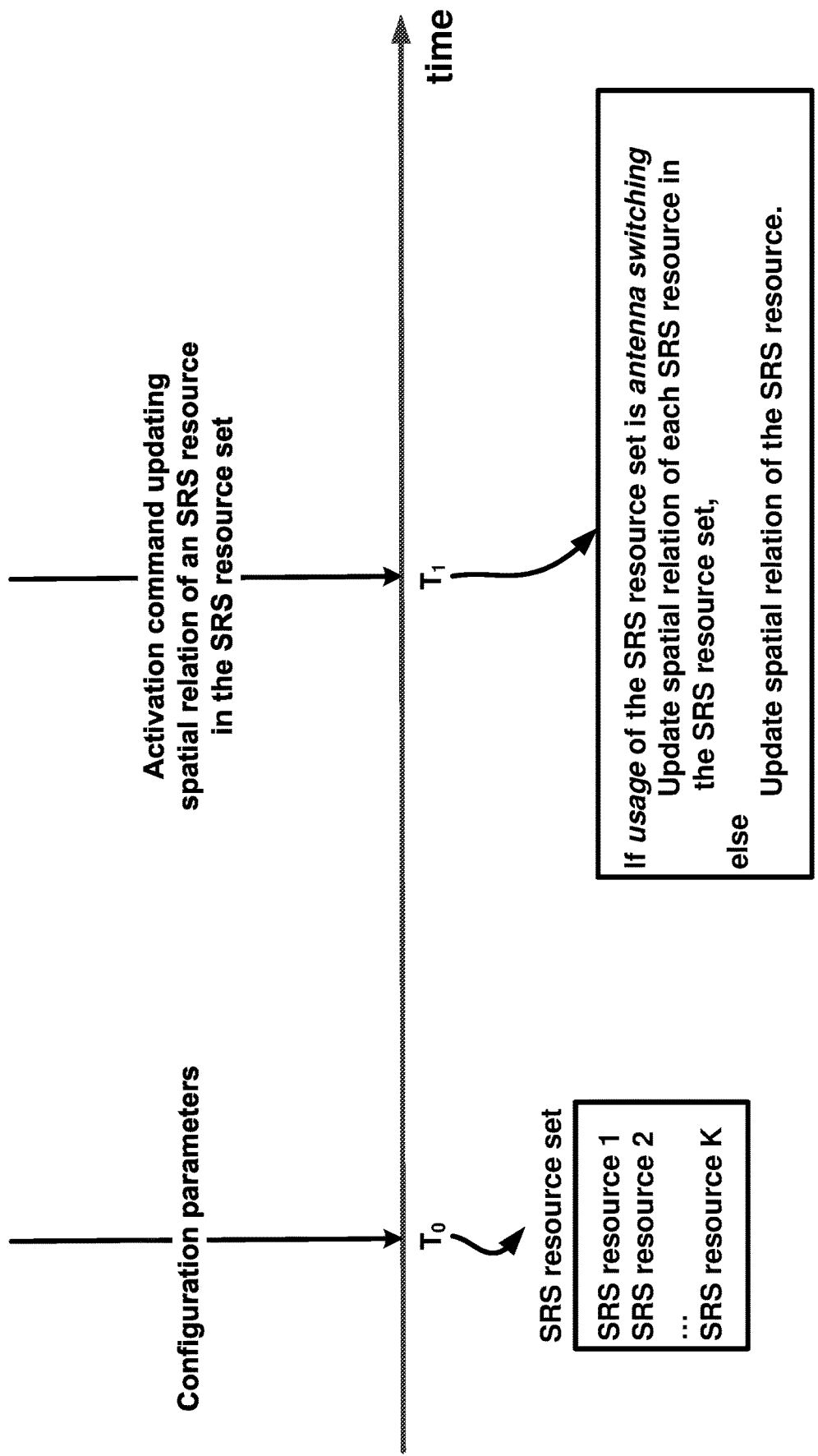
FIG. 21 shows an example of sounding reference signal (SRS) configuration.

FIG. 21 shows an example of a sounding reference signal (SRS) configuration. A wireless device may receive one or more messages. The wireless device may receive the one or more messages from a base station. The one or more messages may comprise one or more configuration parameters. The one or more configuration parameters may be for a cell. The cell may be a primary cell (PCell). The cell may be a secondary cell (SCell). The cell may be a secondary cell configured with PUCCH (e.g., PUCCH SCell). The cell may be an unlicensed cell. The cell may be an unlicensed cell, for example, operating in an unlicensed band. The cell may be a licensed cell. The cell may be a licensed cell, for example, operating in a licensed band. The cell may comprise a plurality of BWPs. The plurality of BWPs may comprise one or more uplink BWPs comprising an uplink BWP of the cell. The plurality of BWPs may comprise one or more downlink BWPs comprising a downlink BWP of the cell.

A BWP of the plurality of BWPs may be in an active state or an inactive state (e.g., in one of an active state and an inactive state). The wireless device may monitor a downlink channel/signal (e.g., PDCCH, DCI, CSI-RS, PDSCH) on/for/via the downlink BWP. The wireless device may monitor a downlink channel/signal (e.g., PDCCH, DCI, CSI-RS, PDSCH) on/for/via the downlink BWP, for example, in the active state of a downlink BWP of the one or more downlink BWPs. The wireless device may receive a PDSCH transmission on/via the downlink BWP. The wireless device may receive a PDSCH transmission on/via the downlink BWP, for example, in the active state of a downlink BWP of the one or more downlink BWPs. The wireless device may not monitor a downlink channel/signal (e.g., PDCCH, DCI, CSI-RS, PDSCH) on/for the downlink BWP. The wireless device may not monitor a downlink channel/signal (e.g., PDCCH, DCI, CSI-RS, PDSCH) on/for the downlink BWP, for example, in the inactive state of a downlink BWP of the one or more downlink BWPs. The wireless device may not receive a PDSCH transmission on/via the downlink BWP. The wireless device may not receive a PDSCH transmission on/via the downlink BWP, for example, in the inactive state of a downlink BWP of the one or more downlink BWPs.

The wireless device may send (e.g., transmit) an uplink signal/channel (e.g., PUCCH, preamble, PUSCH, PRACH, SRS, etc.) via the uplink BWP. The wireless device may send (e.g., transmit) an uplink signal/channel (e.g., PUCCH, preamble, PUSCH, PRACH, SRS, etc.) via the uplink BWP, for example, in the active state of an uplink BWP of the one or more uplink BWPs. The wireless device may not send (e.g., transmit) an uplink signal/channel (e.g., PUCCH, preamble, PUSCH, PRACH, SRS, etc.) via the uplink BWP. The wireless device may not send (e.g., transmit) an uplink signal/channel (e.g., PUCCH, preamble, PUSCH, PRACH, SRS, etc.) via the uplink BWP, for example, in the inactive state of an uplink BWP of the one or more uplink BWPs.

The wireless device may activate the downlink BWP of the one or more downlink BWPs of the cell. The activating the downlink BWP may comprise that the wireless device sets the downlink BWP as an active downlink BWP of the cell. The activating the downlink BWP may comprise that the wireless device sets the downlink BWP in the active state. The activating the downlink BWP may comprise switching the downlink BWP from the inactive state to the active state.

The wireless device may activate the uplink BWP of the one or more uplink BWPs of the cell. The activating the uplink BWP may comprise that the wireless device sets the uplink BWP as an active uplink BWP of the cell. The activating the uplink BWP may comprise that the wireless device sets the uplink BWP in the active state. The activating the uplink BWP may comprise switching the uplink BWP from the inactive state to the active state.

The one or more configuration parameters (e.g., Configuration parameters at time T0 in FIG. 21) may indicate one or more SRS resource sets for the uplink BWP of the cell. The one or more SRS resource sets may comprise an SRS resource set (e.g., SRS resource set in FIG. 21). The SRS resource set may comprise a plurality of SRS resources (e.g., SRS resource 1, SRS resource 2, . . . , SRS resource K in FIG. 21).

The one or more configuration parameters may indicate SRS resource set indexes (e.g., provided by a higher layer parameter SRS-ResourceSetId) for the one or more SRS resource sets. Each SRS resource set of the one or more SRS resource sets may be identified by a respective SRS resource set index of the SRS resource set indexes. The SRS resource set may be identified by an SRS resource set index of the SRS resource set indexes.

The one or more configuration parameters may indicate SRS resource indexes (e.g., provided by a higher layer parameter SRS-ResourceId) for the plurality of SRS resources in the SRS resource set. Each SRS resource of the plurality of SRS resources may be identified by a respective SRS resource index of the SRS resource indexes. A first SRS resource of the plurality of SRS resources may be identified by a first SRS resource index of the SRS resource indexes. A second SRS resource of the plurality of SRS resources may be identified by a second SRS resource index of the SRS resource indexes.

The one or more configuration parameters may indicate spatial relations (e.g., provided by a higher layer parameter spatialRelationInfo) for the plurality of SRS resources in the SRS resource set. Each SRS resource of the plurality of SRS resources may be configured/provided/indicated by a respective spatial relation of the spatial relations. A first SRS resource of the plurality of SRS resources may be configured/provided/indicated by a first spatial relation, of the spatial relations, indicating a first reference signal (e.g., SS/PBCH block, CSI-RS, SRS). A second SRS resource of the plurality of SRS resources may be configured/provided/indicated by a second spatial relation, of the spatial relations, indicating a second reference signal.

The one or more configuration parameters may indicate SRS resource set usages (e.g., provided by a higher layer parameter usage, for example, usage may be 'beamManagement', 'codebook', 'non-codebook', 'AntennaSwitching,' and/or the like) for the one or more SRS resource sets. Each SRS resource set of the one or more SRS resource sets may be identified/configured/indicated by a respective SRS resource set usage of the SRS resource set usages. The SRS resource set may be identified/configured/indicated by an SRS resource set usage (e.g., 'beamManagement', 'codebook', 'non-codebook', 'AntennaSwitching,' and/or the like) of the SRS resource set usages.

The wireless device may receive an activation command (e.g., at time T1 in FIG. 21). The activation command may be a MAC CE (e.g., Semi-persistent SRS Activation/Deactivation MAC CE, Aperiodic SRS Activation/Deactivation MAC CE, etc.). The activation command may be DCI. The activation command may be an RRC message (or signaling, e.g., RRC reconfiguration message).

The activation command may comprise a field indicating/comprising a cell index of the cell. The one or more configuration parameters may indicate the cell index identifying the cell (e.g., by a higher layer parameter ServCellIndex). The activation command may comprise a field indicating/comprising a BWP index of the uplink BWP. The one or more configuration parameters may indicate the BWP index identifying/indicating the uplink BWP (e.g., by a higher layer parameter BWP-Id). The activation command may comprise a field indicating/comprising the SRS resource set index of the SRS resource set. The activation command may indicate an SRS resource of the plurality of SRS resources in the SRS resource set. The activation command may comprise a field indicating/comprising an SRS resource index of the SRS resource. The activation command may indicate a reference signal (e.g., SS/PBCH block, CSI-RS, SRS, etc.). The activation command may comprise a field indicating/comprising a reference signal index (e.g., SSB index, SRS-ResourceId, NZP CSI-RS resource index, CSI-RS index) of (or identifying) the reference signal. The one or more configuration parameters may indicate the reference signal index for the reference signal. The activation command may indicate the reference signal for spatial relationship derivation for the SRS resource. The activation command may indicate the reference signal to update a spatial relation of the SRS resource. The spatial relation may provide/indicate a spatial setting for transmission of an SRS via the SRS resource. The wireless device may determine a spatial domain transmission filter. The wireless device may determine a spatial domain transmission filter, for example, for transmission of the SRS via the SRS resource. The wireless device may determine a spatial domain transmission filter, for example, based on the reference signal.

The reference signal may be a downlink signal. The downlink signal may comprise an SS/PBCH block. The downlink signal may comprise a CSI-RS (e.g., periodic CSI-RS, semi-persistent CSI-RS, aperiodic CSI-RS). The downlink signal may comprise a DM-RS (e.g., for PUCCH, PUSCH, etc.). The wireless device may use a spatial domain receiving filter to receive the downlink signal. The wireless device may send (e.g., transmit) the SRS, via the SRS resource, with a spatial domain transmission filter that is the same as the spatial domain receiving filter. The wireless device may send (e.g., transmit) the SRS, via the SRS resource, with a spatial domain transmission filter that is the same as the spatial domain receiving filter, for example, based on the reference signal (e.g., indicated by the spatial relation) being the downlink signal. The wireless device may send (e.g., transmit) the SRS, via the SRS resource, with the spatial domain receiving filter. The wireless device may send (e.g., transmit) the SRS, via the SRS resource, with the spatial domain receiving filter, for example, based on the reference signal (e.g., indicated by the spatial relation) being the downlink signal.

The reference signal may be an uplink signal (e.g., periodic SRS, semi-persistent SRS, aperiodic SRS, DM-RS). The wireless device may use a spatial domain transmission filter to send (e.g., transmit) the uplink signal. The wireless device may send (e.g., transmit) the SRS, via the SRS resource, with a spatial domain transmission filter that is the same as the spatial domain transmission filter used to send (e.g., transmit) the uplink signal. The wireless device may send (e.g., transmit) the SRS, via the SRS resource, with a spatial domain transmission filter that is the same as the spatial domain transmission filter used to send (e.g., transmit) the uplink signal, for example, based on the reference signal (e.g., indicated by the spatial relation) being the uplink signal.

The SRS resource set usage of the SRS resource set may be antenna switching (e.g., higher layer parameter usage="antennaSwitching," and/or the like). The one or more configuration parameters may indicate antenna switching for the SRS resource set usage of the SRS resource set. The wireless device may determine that the SRS resource set usage of the SRS resource set is antenna switching. The wireless device may update a spatial relation of each SRS resource of the plurality of SRS resources with the reference signal indicated by the activation command. The wireless device may update a spatial relation of each SRS resource of the plurality of SRS resources with the reference signal indicated by the activation command, for example, based on determining that the SRS resource set usage of the SRS resource set is antenna switching. The wireless device may update a respective spatial relation of each SRS resource of the plurality of SRS resources with the reference signal indicated by the activation command. The wireless device may update a respective spatial relation of each SRS resource of the plurality of SRS resources with the reference signal indicated by the activation command, for example, based on determining that the SRS resource set usage of the SRS resource set is antenna switching.

The base station may not send (e.g., transmit) a separate activation command to update the respective spatial relation of each SRS resource of the plurality of SRS resources. The base station may not send (e.g., transmit) a separate activation command to update the respective spatial relation of each SRS resource of the plurality of SRS resources, for example, based on the wireless device updating the respective spatial relation of each SRS resource of the plurality of SRS resources with the reference signal. The not sending (e.g., transmitting) a separate activation command to update the respective spatial relation of each SRS resource of the plurality of SRS resources may save signaling overhead and exchange, leading to increased power saving and reduced interference to other cells and/or wireless devices.

The wireless device may determine the spatial domain transmission filter. The wireless device may determine the spatial domain transmission filter, for example, for transmission of the SRS via the SRS resource. The wireless device may determine the spatial domain transmission filter, for example, based on the reference signal indicated by the activation command. The updating the respective spatial relation of each SRS resource of the plurality of SRS resources with the reference signal may comprise that the wireless device sends (e.g., transmit) an SRS, via each SRS resource of the plurality of SRS resources, with the spatial domain transmission filter. The updating the respective spatial relation of each SRS resource of the plurality of SRS resources with the reference signal may comprise that the wireless device sends (e.g., transmits) a respective SRS, via each SRS resource of the plurality of SRS resources, with the spatial domain transmission filter that is determined based on the reference signal.

The updating the respective spatial relation of each SRS resource of the plurality of SRS resources with the reference signal may comprise that the reference signal overrides an initial reference signal in a respective spatial relation (e.g., configured by a higher layer parameter such as SpatialRelationInfo) of each SRS resource of the plurality of SRS resources. The plurality of SRS resources may comprise a first SRS resource with a first spatial relation indicating a first reference signal. The plurality of SRS resources may comprise a second SRS resource with a second spatial relation indicating a second reference signal. The updating the respective spatial relation of each SRS resource of the plurality of SRS resources with the reference signal may comprise that the reference signal in the activation command overrides the first reference signal in the first spatial relation and the second reference signal in the second spatial relation. The updating the respective spatial relation of each SRS resource of the plurality of SRS resources with the reference signal may comprise that the wireless device replaces the first reference signal in the first spatial relation of the first SRS resource with the reference signal and the second reference signal in the second spatial relation of the second SRS resource with the reference signal.

The SRS resource set usage of the SRS resource set may not be antenna switching. The one or more configuration parameters may not indicate Antenna Switching for the SRS resource set usage of the SRS resource set. The wireless device may determine that the SRS resource set usage of the SRS resource set is not Antenna Switching. The SRS resource set usage of the SRS resource set may be beam management (e.g., higher layer parameter usage="beamManagement," and/or the like). The SRS resource set usage of the SRS resource set may be codebook (e.g., higher layer parameter usage="codebook," and/or the like). The SRS resource set usage of the SRS resource set may be non-codebook (e.g., higher layer parameter usage="nonCodebook," and/or the like). The wireless device may update the spatial relation of the SRS resource with the reference signal indicated by the activation command. The wireless device may update the spatial relation of the SRS resource with the reference signal indicated by the activation command, for example, based on determining that the SRS resource set usage of the SRS resource set is not antenna switching. The updating the spatial relation of the SRS resource with the reference signal may comprise that the wireless device determines a spatial domain transmission filter. The updating the spatial relation of the SRS resource with the reference signal may comprise that the wireless device determines a spatial domain transmission filter, for example, for transmission of an SRS via the SRS resource. The updating the spatial relation of the SRS resource with the reference signal may comprise that the wireless device determines a spatial domain transmission filter, for example, based on the reference signal indicated by the activation command. The wireless device may not update a spatial relation of each SRS resource of the plurality of SRS resources, other than the SRS resource, with the reference signal indicated by the activation command. The wireless device may not update a spatial relation of each SRS resource of the plurality of SRS resources, other than the SRS resource, with the reference signal indicated by the activation command, for example, based on determining that the SRS resource set usage of the SRS resource set is not Antenna Switching. The wireless device may not update a respective spatial relation of each SRS resource of the plurality of SRS resources, other than the SRS resource, with the reference signal indicated by the activation command. The wireless device may not update a respective spatial relation of each SRS resource of the plurality of SRS resources, other than the SRS resource, with the reference signal indicated by the activation command, for example, based on determining that the SRS resource set usage of the SRS resource set is not Antenna Switching. The wireless device may not update a spatial relation of a second SRS resource, of the plurality of SRS resources, different from the SRS resource, with the reference signal indicated by the activation command. The wireless device may not update a spatial relation of a second SRS resource, of the plurality of SRS resources, different from the SRS resource, with the reference signal indicated by the activation command, for example, based on determining that the SRS resource set usage of the SRS resource set is not antenna switching.

Figure 22:
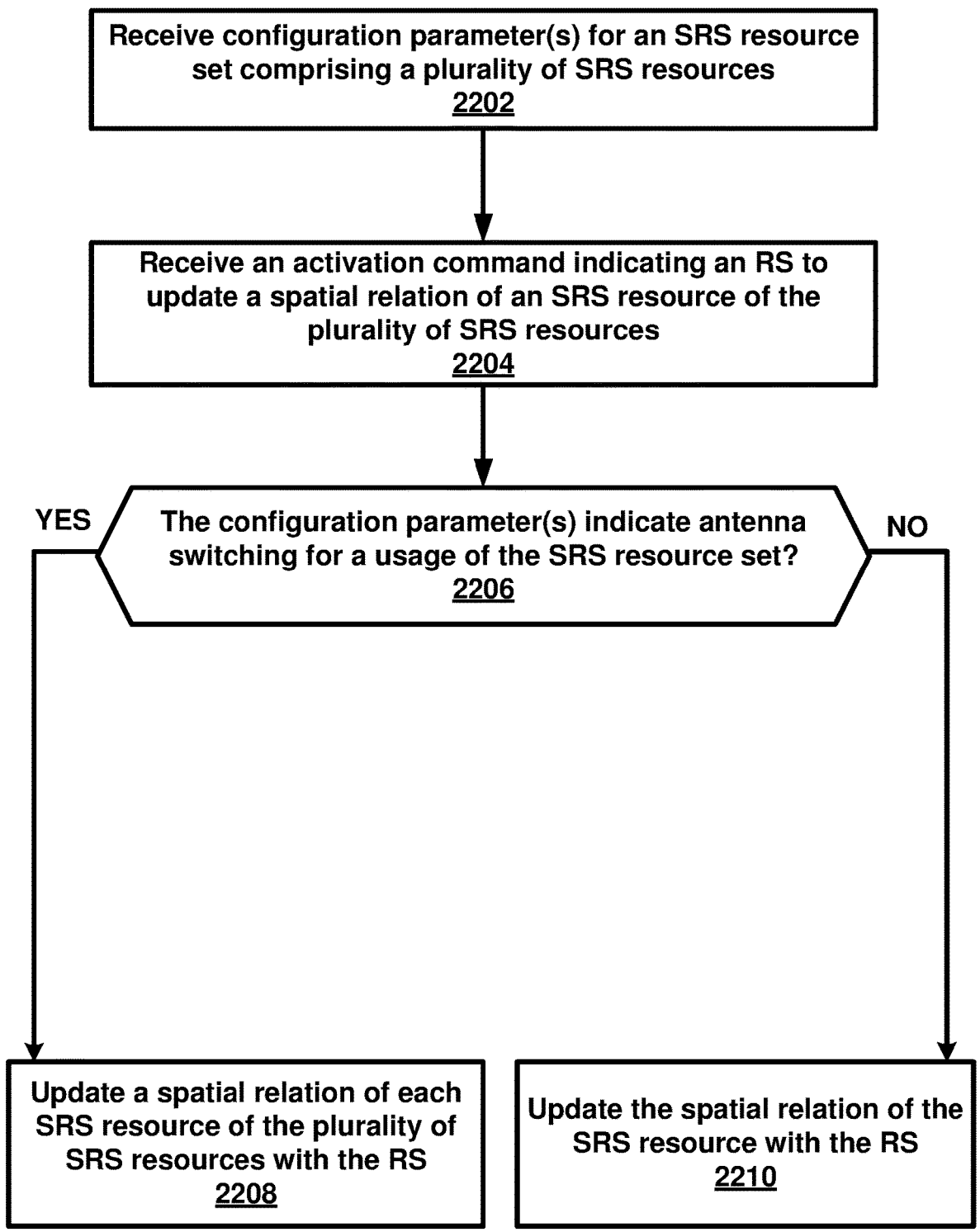
FIG. 22 shows an example of a sounding reference signal (SRS) configuration procedure.

FIG. 22 shows an example of a sounding reference signal (SRS) configuration procedure. At step 2202, a wireless device may receive one or more messages. The one or more messages may comprise one or more configuration parameters for an SRS resource set. The SRS resource set may comprise a plurality of SRS resources. At step 2204, the wireless device may receive an activation command indicating a reference signal to update a spatial relation of an SRS resource of the plurality of SRS resources.

At step 2206, the wireless device may determine whether the one or more configuration parameters indicate antenna switching for an SRS resource set usage. The wireless device may determine that the one or more configuration parameters indicate antenna switching for an SRS resource set usage (e.g., higher layer parameter usage="antennaSwitching," and/or the like) of the SRS resource set. At step 2208, the wireless device may update a spatial relation of each SRS resource of the plurality of SRS resources with the reference signal. The wireless device may update a spatial relation of each SRS resource of the plurality of SRS resources with the reference signal, for example, based on determining that the one or more configuration parameters indicate antenna switching for an SRS resource set usage (e.g., higher layer parameter usage="antennaSwitching," and/or the like) of the SRS resource set.

The wireless device may determine that the one or more configuration parameters do not indicate antenna switching for an SRS resource set usage (e.g., higher layer parameter usage="codebook" or "nonCodebook" or "beamManagement," and/or the like) of the SRS resource set. At step 2210, the wireless device may update the spatial relation of the SRS resource with the reference signal. The wireless device may update the spatial relation of the SRS resource with the reference signal, for example, based on determining that the one or more configuration parameters do not indicate antenna switching for an SRS resource set usage (e.g., higher layer parameter usage="codebook" or "nonCodebook" or "beamManagement," and/or the like) of the SRS resource set. The wireless device may not update a spatial relation of a second SRS resource, of the plurality of SRS resources, different from the SRS resource with the reference signal. The wireless device may not update a spatial relation of a second SRS resource, of the plurality of SRS resources, different from the SRS resource with the reference signal, for example, based on determining that the one or more configuration parameters do not indicate antenna switching for an SRS resource set usage (e.g., higher layer parameter usage="codebook" or "nonCodebook" or "beamManagement," and/or the like) of the SRS resource set.

Figure 23:
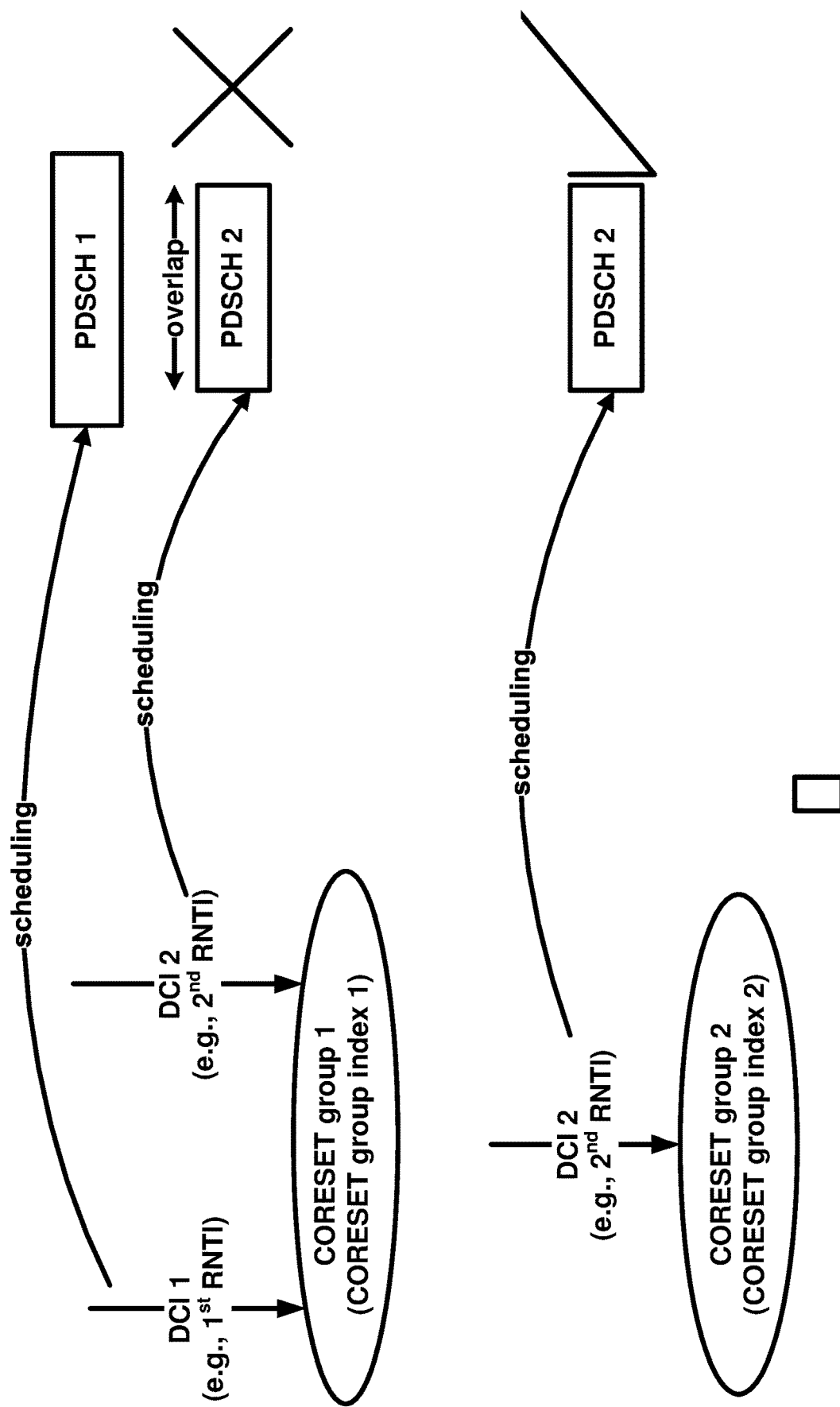
FIG. 23 shows an example of overlapping downlink signal reception by a wireless device.

FIG. 23 shows an example of overlapping downlink signal reception by a wireless device. A base station may determine to send (e.g., transmit) a first DCI (e.g., DCI 1 in FIG. 23) scheduling a first transport block (e.g., PDSCH 1 in FIG. 23) for a cell. A base station may determine to send (e.g., transmit) a first DCI (e.g., DCI 1 in FIG. 23) scheduling a first transport block (e.g., PDSCH 1 in FIG. 23) for a cell, for example, to a wireless device. The base station may (e.g., further) determine to send (e.g., transmit) a second DCI (e.g., DCI 2 in FIG. 23) scheduling a second transport block (e.g., PDSCH 2 in FIG. 23) for the cell.

Figure 24:
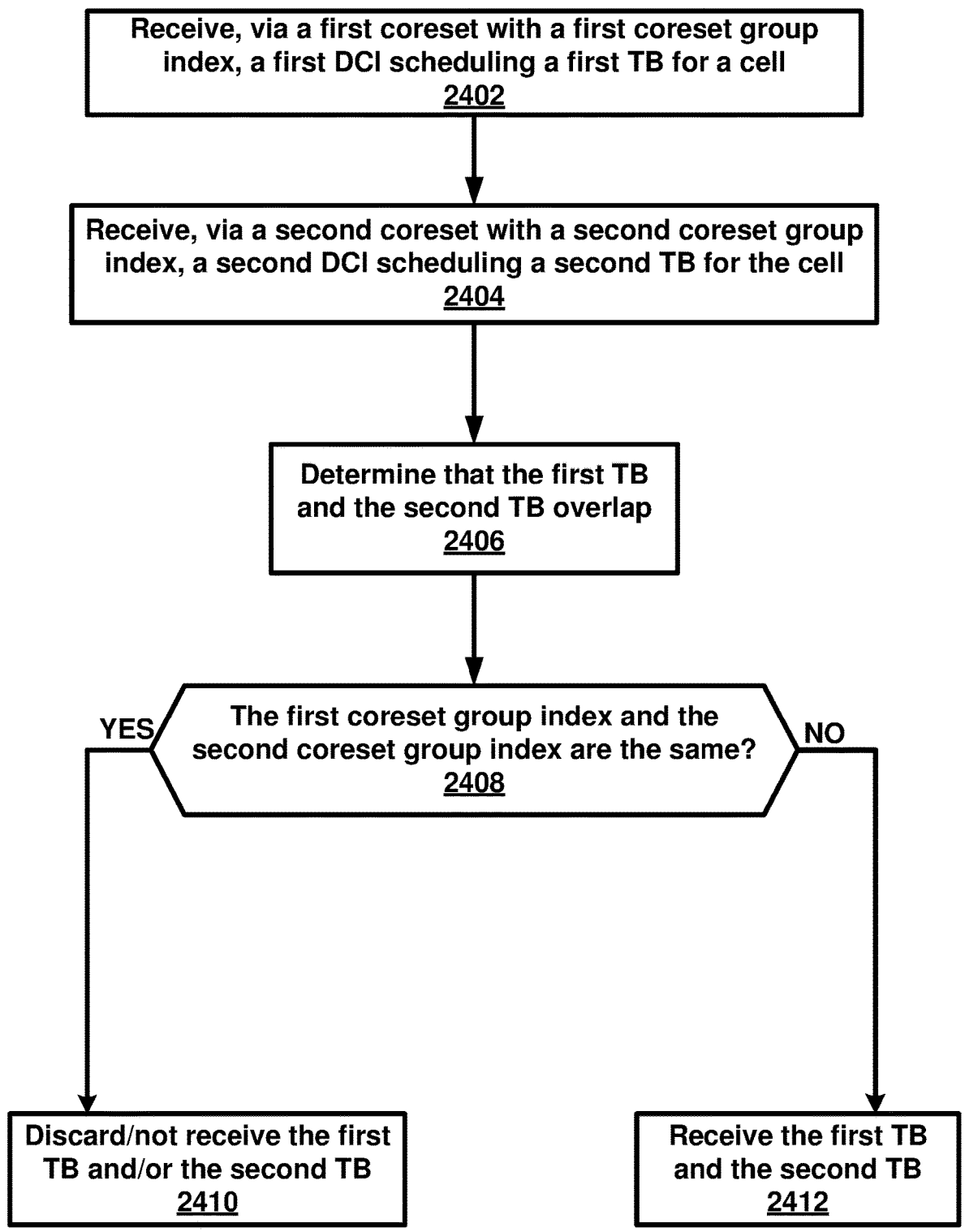
FIG. 24 shows an example of an overlapping downlink signal reception procedure.

FIG. 24 shows an example of an overlapping downlink signal reception procedure. The overlapping downlink signal reception procedure may be similar to the procedure described with respect to FIG. 23. At step 2402, a base station may send, and a wireless device may receive, via a first CORESET with a first CORESET group index, first DCI scheduling a first transport block for a cell. At step 2404, a base station may send, and a wireless device may receive, via a second CORESET with a second CORESET group index, a second DCI scheduling a second TB for the cell. At step 2406, the wireless device (and/or the base station) may determine that the first transport block and the second transport block overlap (e.g., overlap in FIG. 23). The first transport block and the second transport block overlapping may comprise that the first transport block and the second transport block overlap in time (e.g., in at least one symbol, in at least one slot, in at least one mini-slot, at least one frame, etc.). The first transport block and the second transport block overlapping in time may comprise that the first transport block and the second transport block partially overlap in time. The first transport block and the second transport block overlapping in time may comprise the first transport block and the second transport block fully overlap in time.

The base station may send (e.g., transmit) the first DCI. The base station may send (e.g., transmit) the first DCI, for example, based on determining that the first transport block and the second transport block overlap. The base station may send (e.g., transmit) the first DCI, for example, via a first CORESET with a first CORESET group index (e.g., CORESET group index 1 in FIG. 23). The base station may send (e.g., transmit) the second DCI. The base station may send (e.g., transmit) the second DCI, for example, based on determining that the first transport block and the second transport block overlap. The base station may send (e.g., transmit) the second DCI, for example, via a second CORESET with a second CORESET group index (e.g., CORESET group index 2 in FIG. 23) that may be different from the first CORESET group index.

The base station may send (e.g., transmit) the first DCI. The base station may send (e.g., transmit) the first DCI, for example, based on determining that the first transport block and the second transport block overlap. The base station may send (e.g., transmit) the first DCI, for example, via a first CORESET in a first CORESET group (e.g., CORESET group 1 in FIG. 23). The base station may send (e.g., transmit) the second DCI. The base station may send (e.g., transmit) the second DCI, for example, based on determining that the first transport block and the second transport block overlap. The base station may send (e.g., transmit) the second DCI, for example, via a second CORESET in a second CORESET group (e.g., CORESET group 2 in FIG. 23) that may be different from the first CORESET group. The second CORESET group may be different from the first CORESET group based on a first CORESET group index of the first CORESET group being different from a second CORESET group index of the second CORESET group.

A base station may determine to send (e.g., transmit) a first DCI scheduling a first transport block for a cell. A base station may determine to send (e.g., transmit) a first DCI scheduling a first transport block for a cell, for example, to a wireless device. The base station may determine that the first transport block overlaps with a second transport block scheduled for the cell. The second transport block may be scheduled by a second DCI. The second transport block may be scheduled by a second DCI, for example, that is sent (e.g., transmitted) via a second CORESET. The second CORESET may be configured/identified with a second CORESET group index. A second CORESET group may comprise the second CORESET. The base station may send (e.g., transmit), via the second CORESET, the second DCI scheduling the second transport block. The wireless device may receive the second DCI via the second CORESET. The second transport block may be periodic (e.g., SPS PDSCH).

The base station may send (e.g., transmit) the first DCI via a first CORESET with a first CORESET group index that is different from the second CORESET group index. The base station may send (e.g., transmit) the first DCI via a first CORESET with a first CORESET group index that is different from the second CORESET group index, for example, based on determining that the first transport block overlaps with the second transport block. The base station may send (e.g., transmit) the first DCI via a first CORESET in a first CORESET group that is different from the second CORESET group. The base station may send (e.g., transmit) the first DCI via a first CORESET in a first CORESET group that is different from the second CORESET group, for example, based on determining that the first transport block overlaps with the second transport block. The base station may not send (e.g., transmit) the first DCI via a first CORESET with a first CORESET group index that is the same as the second CORESET group index. The base station may not send (e.g., transmit) the first DCI via a first CORESET with a first CORESET group index that is the same as the second CORESET group index, for example, based on determining that the first transport block overlaps with the second transport block. The base station may not send (e.g., transmit) the first DCI via a first CORESET in a first CORESET group that is the same as the second CORESET group. The base station may not send (e.g., transmit) the first DCI via a first CORESET in a first CORESET group that is the same as the second CORESET group, for example, based on determining that the first transport block overlaps with the second transport block. The first transport block may be a PDSCH. The second transport block may be a PDSCH.

At step 2408, the wireless device may determine whether the first CORESET group index and the second CORESET group index are the same. The wireless device may receive the first DCI via the first CORESET. The wireless device may receive the second DCI via the second CORESET. At step 2412, the wireless device may decode/receive the first transport block and the second transport block. The wireless device may decode/receive the first transport block and the second transport block, for example, based on receiving the first DCI via the first CORESET with the first CORESET group index and the second DCI via the second CORESET with the second CORESET group index that is different from the first CORESET group index.

The wireless device may receive the first DCI via the first CORESET. The wireless device may receive the second DCI via the second CORESET. The wireless device may decode/receive the first transport block and the second transport block. The wireless device may decode/receive the first transport block and the second transport block, for example, based on receiving the first DCI via the first CORESET in the first CORESET group and the second DCI via the second CORESET in the second CORESET group that is different from the first CORESET group. The first transport block may be a PUSCH. The second transport block may be a PUSCH.

The wireless device may receive the first DCI via the first CORESET. The wireless device may receive the second DCI via the second CORESET. The wireless device may send (e.g., transmit) the first transport block and the second transport block. The wireless device may send (e.g., transmit) the first transport block and the second transport block, for example, based on receiving the first DCI via the first CORESET with the first CORESET group index and the second DCI via the second CORESET with the second CORESET group index that is different from the first CORESET group index.

The wireless device may receive the first DCI via the first CORESET. The wireless device may receive the second DCI via the second CORESET. The wireless device may send (e.g., transmit) the first transport block and the second transport block. The wireless device may send (e.g., transmit) the first transport block and the second transport block, for example, based on receiving the first DCI via the first CORESET in the first CORESET group and the second DCI via the second CORESET in the second CORESET group that is different from the first CORESET group.

The base station may send (e.g., transmit) one or more messages comprising one or more configuration parameters. The base station may send (e.g., transmit) one or more messages comprising one or more configuration parameters, for example, to the wireless device. The one or more configuration parameters may indicate the first CORESET group index for the first CORESET. The one or more configuration parameters may indicate the second CORESET group index for the second CORESET.

A wireless device may receive one or more messages comprising one or more configuration parameters. A wireless device may receive one or more messages comprising one or more configuration parameters, for example, from a base station. The one or more configuration parameters may indicate a plurality of CORESET groups comprising a first CORESET group (e.g., CORESET group 1 in FIG. 23) and a second CORESET group (e.g., CORESET group 2 in FIG. 23).

Each CORESET in the first CORESET group may be identified/configured/provided with a first CORESET group index (e.g., CORESET group index 1 in FIG. 23). The one or more configuration parameters may indicate the first CORESET group index for the first CORESET group (or for each CORESET in the first CORESET group). Each CORESET in the second CORESET group may be identified/configured/provided with a second CORESET group index (e.g., CORESET group index 2 in FIG. 23). The one or more configuration parameters may indicate the second CORESET group index for the second CORESET group (or for each CORESET in the second CORESET group).

The wireless device may receive a first DCI (e.g., DCI 1 in FIG. 23) scheduling a first transport block (e.g., PDSCH 1 in FIG. 23) for a cell. The wireless device may receive the first DCI via a first CORESET in the first CORESET group (e.g., CORESET group 1 in FIG. 23). The first CORESET may be identified/configured/provided with the first CORESET group index (e.g., CORESET group index 1 in FIG. 23). The wireless device may receive a second DCI (e.g., DCI 2 in FIG. 23) scheduling a second transport block (e.g., PDSCH 2 in FIG. 23) for the cell. The wireless device may receive the second DCI via a second CORESET.

The first CORESET group (e.g., CORESET group 1 in FIG. 23) may comprise the second CORESET. The second CORESET may be identified/configured/provided with a second CORESET group index that is same as the first CORESET group index (e.g., CORESET group index 1 in FIG. 23). The second CORESET may be identified/configured/provided with a second CORESET group index that is same as the first CORESET group index (e.g., CORESET group index 1 in FIG. 23), for example, based on the first CORESET group comprising the second CORESET.

The first CORESET and the second CORESET may be the same. The first CORESET and the second CORESET being the same may comprise that a first CORESET index of the first CORESET and a second CORESET index of the second CORESET are the same. The first CORESET and the second CORESET may be different. The first CORESET and the second CORESET being different may comprise that a first CORESET index of the first CORESET and a second CORESET index of the second CORESET are different.

As described above, at step 2406, the wireless device may determine that the first transport block and the second transport block overlap. The wireless device may determine that the first CORESET group index and the second CORESET group index are the same. At step 2410, the wireless device may drop/discard/not receive the first transport block and/or the second transport block. The wireless device may drop/discard/not receive the first transport block and the second transport block, for example, based on determining that the first transport block and the second transport block overlap and the first CORESET group index and the second CORESET group index are the same. The dropping/discarding/not receiving the first transport block and the second transport block may comprise that the wireless device does not decode/receive the first transport block and the second transport block.

The wireless device may determine that the first transport block and the second transport block overlap. The wireless device may determine that the first CORESET group index and the second CORESET group index are the same. The wireless device may drop/discard the first transport block and receive the second transport block. The wireless device may drop/discard the first transport block and receive the second transport block, for example, based on determining that the first transport block and the second transport block overlap and the first CORESET group index and the second CORESET group index are the same. The dropping/discarding the first transport block may comprise that the wireless device does not decode/receive the first transport block. The receiving the second transport block may comprise that the wireless device decodes the second transport block.

The wireless device may determine that the first transport block and the second transport block overlap. The wireless device may determine that the first CORESET group index and the second CORESET group index are the same. The wireless device may drop/discard the second transport block and receive the first transport block. The wireless device may drop/discard the second transport block and receive the first transport block, for example, based on determining that the first transport block and the second transport block overlap and the first CORESET group index and the second CORESET group index are the same. The dropping/discarding the second transport block may comprise that the wireless device does not decode/receive the second transport block. The receiving the first transport block may comprise that the wireless device decodes the first transport block.

The wireless device may determine that the first transport block and the second transport block overlap. The wireless device may determine that the first CORESET group comprises the first CORESET and the second CORESET. The wireless device may drop/discard the first transport block and the second transport block. The wireless device may drop/discard the first transport block and the second transport block, for example, based on determining that the first transport block and the second transport block overlap and the first CORESET group comprises the first CORESET and the second CORESET. The wireless device may drop/discard the first transport block and receive the second transport block. The wireless device may drop/discard the first transport block and receive the second transport block, for example, based on determining that the first transport block and the second transport block overlap and the first CORESET group comprises the first CORESET and the second CORESET. The wireless device may drop/discard the second transport block and receive the first transport block. The wireless device may drop/discard the second transport block and receive the first transport block, for example, based on determining that the first transport block and the second transport block overlap and the first CORESET group comprises the first CORESET and the second CORESET.

The second CORESET group (e.g., CORESET group 2 in FIG. 23) may comprise the second CORESET. The second CORESET may be identified/configured/provided with a second CORESET group index (e.g., CORESET group index 2 in FIG. 23) that is different from the first CORESET group index (e.g., CORESET group index 1 in FIG. 23). The second CORESET may be identified/configured/provided with a second CORESET group index (e.g., CORESET group index 2 in FIG. 23) that is different from the first CORESET group index (e.g., CORESET group index 1 in FIG. 23), for example, based on the second CORESET group comprising the second CORESET.

The wireless device may determine that the first transport block and the second transport block overlap (e.g., partially overlap in time or fully overlap in time). The wireless device may determine that the first CORESET group index and the second CORESET group index are different. The wireless device may receive the first transport block and the second transport block. The wireless device may receive the first transport block and the second transport block, for example, based on determining that the first transport block and the second transport block overlap and the first CORESET group index and the second CORESET group index are different. The receiving the first transport block and the second transport block may comprise that the wireless device decodes the first transport block and the second transport block.

The receiving the first transport block and the second transport block may further depend on a capability of the wireless device. The wireless device may receive the first transport block and the second transport block. The wireless device may receive the first transport block and the second transport block, for example, based on the wireless device being capable of receiving a plurality of overlapping transport blocks scheduled for the same cell. The wireless device may not receive the first transport block and the second transport block. The wireless device may not receive the first transport block and the second transport block, for example, based on the wireless device not being capable of receiving a plurality of overlapping transport blocks scheduled for the same cell.

The wireless device may determine that the first transport block and the second transport block overlap. The wireless device may determine that the first CORESET group comprising the first CORESET and the second CORESET group comprising the second CORESET are different. The wireless device may receive the first transport block and the second transport block. The wireless device may receive the first transport block and the second transport block, for example, based on determining that the first transport block and the second transport block overlap and the first CORESET group comprising the first CORESET and the second CORESET group comprising the second CORESET are different. The receiving the first transport block and the second transport block may comprise that the wireless device decodes the first transport block and the second transport block.

The one or more configuration parameters may indicate a first CORESET group index for the first CORESET. The one or more configuration parameters may not indicate a second CORESET group index for the second CORESET. The wireless device may add/include/group the first CORESET in a first CORESET group and add/include/group the second CORESET in a second CORESET group that is different from the first CORESET group. The wireless device may add/include/group the first CORESET in a first CORESET group and add/include/group the second CORESET in a second CORESET group that is different from the first CORESET group, for example, based on the one or more configuration parameters indicating the first CORESET group index for the first CORESET and not indicating the second CORESET group index for the second CORESET.

A second cell that is different from the cell may comprise the first CORESET group (e.g., cross-carrier scheduling). A second cell that is different from the cell may comprise the second CORESET group (e.g., cross-carrier scheduling). A second cell index of the second cell and a cell index of the cell may be different. A second cell index of the second cell and a cell index of the cell may be different, for example, if the second cell is different from the cell.

A second cell that is same as the cell may comprise the first CORESET group (e.g., self-scheduling). A second cell that is same as the cell may comprise the second CORESET (e.g., self-scheduling). A second cell index of the second cell and a cell index of the cell may be the same. A second cell index of the second cell and a cell index of the cell may be the same, for example, if the second cell is the same as the cell.

The cell may comprise the first CORESET (e.g., self-scheduling). The cell may comprise the second CORESET (e.g., self-scheduling). A second cell different from the cell may comprise the first CORESET (e.g., cross-carrier scheduling). A second cell different from the cell may comprise the second CORESET (e.g., cross-carrier scheduling). The first DCI may be with a CRC scrambled by a first RNTI. The first RNTI (e.g., 1st RNTI in FIG. 23) may be C-RNTI. The first RNTI may be MCS C-RNTI. The second DCI may be with a CRC scrambled by a second RNTI (e.g., 2nd RNTI in FIG. 23). The second RNTI may be C-RNTI. The second RNTI may be CS-RNTI.

The cell may comprise a plurality of transmission and reception points (TRPs). The plurality of TRPs may comprise at least a first TRP and a second TRP. The plurality of TRPs may comprise any quantity of TRPs. The first TRP may send (e.g., transmit) a downlink signal/channel (e.g., PDSCH, PDCCH, DCI) via a first CORESET group. Transmitting the downlink signal/channel (e.g., PDCCH, DCI) via the first CORESET group may comprise that the first TRP may send (e.g., transmit) the downlink signal/channel via a CORESET among the first CORESET group. The first TRP may not send (e.g., not transmit) a downlink signal/channel (e.g., PDSCH, PDCCH, DCI) via a second CORESET group that is different from the first CORESET group. Not sending (e.g., not transmitting) the downlink signal/channel (e.g., PDSCH, PDCCH, DCI) via the second CORESET group may comprise that the first TRP may not send (e.g., not transmit) the downlink signal/channel via a CORESET among the second CORESET group. The second TRP may send (e.g., transmit) a downlink signal/channel (e.g., PDSCH, PDCCH, DCI) via the second CORESET group. Sending (e.g., transmitting) the downlink signal/channel (e.g., PDCCH, DCI) via the second CORESET group may comprise that the second TRP may send (e.g., transmit) the downlink signal/channel via a CORESET among the second CORESET group. The second TRP may not send (e.g., not transmit) a downlink signal/channel (e.g., PDCCH, DCI) via the first CORESET group. Not sending (e.g., not transmitting) the downlink signal/channel (e.g., PDCCH, DCI) via the first CORESET group may comprise that the second TRP may not send (e.g., not transmit) the downlink signal/channel via a CORESET among the first CORESET group.

The one or more configuration parameters may indicate TRP indexes for the plurality of TRPs. Each TRP of the plurality of TRPs may be identified/indicated by a respective TRP index of the TRP indexes. A first TRP of the plurality of TRPs may be identified/indicated by a first TRP index of the TRP indexes. A second TRP of the plurality of TRPs may be identified/indicated by a second TRP index of the TRP indexes. The first TRP index may be equal to a first CORESET group index. The first TRP index and the first CORESET group index may be the same. The first TRP index may comprise the first CORESET group index. The second TRP index may be equal to a second CORESET group index. The second TRP index and the second CORESET group index may be the same. The second TRP index may comprise the second CORESET group index.

A wireless device may perform a method comprising multiple operations. The wireless device may determine that a first physical downlink shared channel (PDSCH) transmission, associated with a first control resource set (coreset) group index, overlaps in time with a second PDSCH transmission associated with a second coreset group index. The wireless device may receive the first PDSCH transmission. The wireless device may determine, based on the first coreset group index and the second coreset group index, whether to receive the second PDSCH transmission. A determination to receive the second PDSCH transmission may be based on the first coreset group index and the second coreset group index being different values. The wireless device may also perform one or more additional operations. The wireless device may receive, based on the first coreset group index and the second coreset group index being different values, the second PDSCH transmission. The wireless device may send an acknowledgement of reception of the first PDSCH transmission and the second PDSCH transmission. The wireless device may not receive (e.g., drop), based on the first coreset group index and the second coreset group index being a same value, the second PDSCH transmission. The not receiving (e.g., dropping) the second PDSCH transmission may comprise at least one of: discarding the second PDSCH transmission from a buffer; or refraining from decoding the second PDSCH transmission. The first coreset group index and the second coreset group index may be the same value. The receiving the first PDSCH transmission may be based on a determination that the first PDSCH transmission has a higher priority than the second PDSCH transmission. The wireless device may not receive (e.g., drop) the second PDSCH transmission. The second PDSCH transmission may be a semi-persistent PDSCH transmission. The determining whether to receive the second PDSCH transmission may be further based on a capability of the wireless device for simultaneous reception of at least two transmissions. The first PDSCH transmission may partially overlap in time with the second PDSCH transmission by partially overlapping in time with the second PDSCH transmission in at least one of: a symbol; a slot; or a subframe. The wireless device may receive, via a first coreset, first downlink control information (DCI) scheduling the first PDSCH transmission. The wireless device may receive, via a second coreset, second DCI scheduling the second PDSCH transmission. A cyclic redundancy check (CRC) of the first DCI may be scrambled by a first radio network temporary identifier (RNTI). A CRC of the second DCI may be scrambled by a second RNTI. The first RNTI may comprise at least one of: a cell RNTI (C-RNTI), or a modulation coding scheme cell RNTI (MCS-C-RNTI). The second RNTI may comprise a configured scheduling RNTI (CS-RNTI). The wireless device may determine that a third PDSCH transmission, scheduled via a third coreset associated with a third coreset group index, overlaps in time with a fourth PDSCH transmission scheduled via a fourth coreset associated with a fourth coreset group index. The wireless device may receive, based on the third coreset group index and the fourth coreset group index being different, the third PDSCH transmission and the fourth PDSCH transmission. The third PDSCH transmission may overlap in time with the fourth PDSCH transmission by partially overlapping in time with the fourth PDSCH transmission. At least one of: the first PDSCH transmission may overlap in time with the second PDSCH transmission by fully overlapping in time with the second PDSCH transmission; or the third PDSCH transmission may overlap in time with the fourth PDSCH transmission by fully overlapping in time with the fourth PDSCH transmission. The wireless device may receive one or more messages comprising one or more configuration parameters for a cell. The one or more configuration parameters may indicate: the first coreset group index for a first coreset; and the second coreset group index for a second coreset. Systems, devices and media may be configured with the method. A wireless device may comprise one or more processors; and memory storing instructions that, when executed, cause the wireless device to perform the described method, additional operations and/or include the additional elements. A system may comprise a wireless device configured to perform the described method, additional operations and/or include the additional elements; and a base station configured to send the first PDSCH transmission and the second PDSCH transmission. A computer-readable medium may store instructions that, when executed, cause performance of the described method, additional operations and/or include the additional elements.

A wireless device may perform a method comprising multiple operations. The wireless device may determine that a first physical downlink shared channel (PDSCH) transmission, associated with a first control resource set (coreset) group index, overlaps in time with a second PDSCH transmission associated with a second coreset group index. The wireless device may receive the first PDSCH transmission. The wireless device may receive, based on a determination that the first coreset group index and the second coreset group index are different, the second PDSCH transmission. The wireless device may also perform one or more additional operations. The second PDSCH transmission may comprise a semi-persistent PDSCH transmission. The receiving the second PDSCH transmission may be further based on a capability of the wireless device for simultaneous reception of at least two transmissions. The first PDSCH transmission may partially overlap in time with the second PDSCH transmission by partially overlapping in time with the second PDSCH transmission in at least one of: a symbol; a slot; or a subframe. The wireless device may receive, via a first coreset, first downlink control information (DCI) scheduling the first PDSCH transmission. A cyclic redundancy check (CRC) of the first DCI may be scrambled by a first radio network temporary identifier (RNTI). The wireless device may receive, via a second coreset, second DCI scheduling the second PDSCH transmission. A CRC of the second DCI may be scrambled by a second RNTI. The first RNTI may comprise at least one of: a cell RNTI (C-RNTI), or a modulation coding scheme cell RNTI (MCS-C-RNTI). The second RNTI may comprise a configured scheduling RNTI (CS-RNTI). The wireless device may send an acknowledgement of reception of the first PDSCH transmission and the second PDSCH transmission. The wireless device may determine that a third PDSCH transmission scheduled via a third coreset with a third coreset group index overlaps in time with a fourth PDSCH transmission scheduled via a fourth coreset with a fourth coreset group index. The wireless device may receive, based on the third coreset group index and the fourth coreset group index being different, the third PDSCH transmission and the fourth PDSCH transmission. The third PDSCH transmission may overlap in time with the fourth PDSCH transmission by partially overlapping in time with the fourth PDSCH transmission. At least one of: the first PDSCH transmission may overlap in time with the second PDSCH transmission by fully overlapping in time with the second PDSCH transmission; or the third PDSCH transmission may overlap in time with the fourth PDSCH transmission by fully overlapping in time with the fourth PDSCH transmission. The wireless device may receive one or more messages comprising one or more configuration parameters for a cell. The one or more configuration parameters may indicate: the first coreset group index for a first coreset; and the second coreset group index for a second coreset. Systems, devices and media may be configured with the method. A wireless device may comprise one or more processors; and memory storing instructions that, when executed, cause the wireless device to perform the described method, additional operations and/or include the additional elements. A system may comprise a wireless device configured to perform the described method, additional operations and/or include the additional elements; and a base station configured to send the first PDSCH transmission and the second PDSCH transmission. A computer-readable medium may store instructions that, when executed, cause performance of the described method, additional operations and/or include the additional elements.

A base station may perform a method comprising multiple operations. The base station may send, to a wireless device via a first control resource set (coreset) associated with a first coreset group index, first downlink control information (DCI) scheduling a first physical downlink shared channel (PDSCH) transmission. The base station may send, based on a capability of the wireless device and via a second coreset associated with a second coreset group index, second DCI scheduling a second PDSCH transmission. The first PDSCH transmission may overlap in time with the second PDSCH transmission. The first coreset group index may be different from the second coreset group index. The base station may send the first PDSCH transmission and the second PDSCH transmission overlapping in time. The base station may receive, from the wireless device, an acknowledgement of reception of the first PDSCH transmission and the second PDSCH transmission. The base station may also perform one or more additional operations. The second PDSCH transmission may be a semi-persistent PDSCH transmission. The base station may receive, from the wireless device, an indication of the capability of the wireless device. The capability may comprise a capability of the wireless device for simultaneous reception of at least two transmissions. The first PDSCH transmission may partially overlap in time with the second PDSCH transmission by partially overlapping in time with the second PDSCH transmission in at least one of: a symbol; a slot; or a subframe. A cyclic redundancy check (CRC) of the first DCI may be scrambled by a first radio network temporary identifier (RNTI). A CRC of the second DCI may be scrambled by a second RNTI. The first RNTI may comprise at least one of: a cell RNTI (C-RNTI), or a modulation coding scheme cell RNTI (MCS-C-RNTI). The second RNTI may comprise a configured scheduling RNTI (CS-RNTI). A third PDSCH transmission may overlap in time with a fourth PDSCH transmission by partially overlapping in time with the fourth PDSCH transmission. At least one of: the first PDSCH transmission may overlap in time with the second PDSCH transmission by fully overlapping in time with the second PDSCH transmission; or a third PDSCH transmission may overlap in time with a fourth PDSCH transmission by fully overlapping in time with the fourth PDSCH transmission. The base station may send one or more messages comprising one or more configuration parameters for a cell. The one or more configuration parameters may indicate: the first coreset group index for a first coreset; and the second coreset group index for a second coreset. Systems, devices and media may be configured with the method. A base station may comprise one or more processors; and memory storing instructions that, when executed, cause the base station to perform the described method, additional operations and/or include the additional elements. A system may comprise a base station configured to perform the described method, additional operations and/or include the additional elements; and a wireless device configured to send the acknowledgement of reception of the first PDSCH transmission and the second PDSCH transmission. A computer-readable medium may store instructions that, when executed, cause performance of the described method, additional operations and/or include the additional elements.

A wireless device may perform a method comprising multiple operations. The wireless device may determine that a physical downlink shared channel (PDSCH) transmission scheduled via a first control resource set (coreset) with a first coreset group index overlaps in time with a semi-persistent PDSCH transmission scheduled via a second coreset with a second coreset group index. The wireless device may select, based on the first coreset group index and the second coreset group index being the same, a selected PDSCH transmission among the semi-persistent PDSCH transmission and the PDSCH transmission. The wireless device may receive the selected PDSCH transmission. The wireless device may also perform one or more additional operations. The wireless device may drop an unselected PDSCH transmission, among the semi-persistent PDSCH transmission and the PDSCH transmission, that is different from the selected PDSCH transmission. The dropping the unselected PDSCH transmission may comprise at least one of not receiving or decoding the unselected PDSCH transmission. The wireless device may determine that a second PDSCH transmission scheduled via a third coreset with a third coreset group index overlaps in time with a second semi-persistent PDSCH transmission scheduled via a fourth coreset with a fourth coreset group index. The wireless device may receive, based on the third coreset group index and the fourth coreset group index being different, the second semi-persistent PDSCH transmission and the second PDSCH transmission. The receiving the second semi-persistent PDSCH transmission and the second PDSCH transmission may be further based on a capability of the wireless device on a simultaneous reception. The PDSCH transmission may overlap in time with the semi-persistent PDSCH transmission by partially overlapping in time with the semi-persistent PDSCH transmission. The PDSCH transmission may partially overlap in time with the semi-persistent PDSCH transmission by partially overlapping in time with the second PDSCH transmission in at least one of: a symbol; a slot; or a subframe. The wireless device may receive one or more messages comprising one or more configuration parameters for a cell. The one or more configuration parameters may indicate: the first coreset group index for the first coreset; and the second coreset group index for the second coreset. The wireless device may receive, via the first coreset, first downlink control information (DCI) scheduling the PDSCH transmission for the cell. A cyclic redundancy check (CRC) of the first DCI may be scrambled by a first radio network temporary identifier (RNTI). The first RNTI may comprise at least one of: a cell RNTI (C-RNTI), or a modulation coding scheme cell RNTI (MCS-C-RNTI). The wireless device may receive, via the second coreset, second DCI scheduling the semi-persistent PDSCH transmission for the cell. A CRC of the second DCI may be scrambled by a second RNTI. The second RNTI may be a configured scheduling RNTI (CS-RNTI). Systems, devices and media may be configured with the method. A wireless device may comprise one or more processors; and memory storing instructions that, when executed, cause the wireless device to perform the described method, additional operations and/or include the additional elements. A system may comprise a wireless device configured to perform the described method, additional operations and/or include the additional elements; and a base station configured to send the semi-persistent PDSCH transmission and the PDSCH transmission. A computer-readable medium may store instructions that, when executed, cause performance of the described method, additional operations and/or include the additional elements.

A base station may perform a method comprising multiple operations. The base station may determine to transmit a physical downlink shared channel (PDSCH) transmission in a time slot. The base station may transmit, via a coreset with a first coreset group index and based on determining that the PDSCH transmission overlaps in the time slot with a periodic semi-persistent PDSCH transmission associated with a second control resource set (coreset) group index, a downlink control information (DCI) scheduling the PDSCH transmission. The first coreset group index may be different from the second coreset group index. The base station may transmit, in the time slot, the periodic semi-persistent PDSCH transmission and the PDSCH transmission. The base station may also perform one or more additional operations. The PDSCH transmission may partially overlap in time with the periodic semi-persistent PDSCH transmission by partially overlapping in the time slot with the periodic semi-persistent PDSCH transmission in at least one of: a symbol; a slot; or a subframe. A cyclic redundancy check (CRC) of the DCI may be scrambled by a radio network temporary identifier (RNTI). The RNTI may comprise at least one of: a cell RNTI (C-RNTI), or a modulation coding scheme cell RNTI (MCS-C-RNTI). The PDSCH transmission may overlap in the time slot with the periodic semi-persistent PDSCH transmission by partially overlapping in the time slot with the periodic semi-persistent PDSCH transmission. The base station may send one or more messages comprising one or more configuration parameters for a cell. The one or more configuration parameters may indicate: the first coreset group index for the first coreset; and the second coreset group index for a second coreset. Systems, devices and media may be configured with the method. A base station may comprise one or more processors; and memory storing instructions that, when executed, cause the base station to perform the described method, additional operations and/or include the additional elements. A system may comprise a base station configured to perform the described method, additional operations and/or include the additional elements; and a wireless device configured to receive the periodic semi-persistent PDSCH transmission and the PDSCH transmission. A computer-readable medium may store instructions that, when executed, cause performance of the described method, additional operations and/or include the additional elements.

A wireless device may perform a method comprising multiple operations. The wireless device may receive one or more messages comprising one or more configuration parameters indicating: a plurality of control resource sets (coresets) of a first bandwidth part (BWP) of a cell; and one or more coresets for a second BWP of the cell. The wireless device may switch from the first BWP to the second BWP as an active BWP. The wireless device may determine, for the one or more coresets, a transmission configuration indicator (TCI) state of a coreset among a plurality of TCI states of the plurality of coresets. The determining may be based on at least one of: the TCI state having a lowest or highest TCI state index among a plurality of TCI state indexes of the plurality of TCI states; the coreset having a lowest coreset index among a plurality of coreset indexes of the plurality of coresets; the coreset being associated with a most recent downlink control information (DCI) received prior to the switching; or the coreset being associated with a search space set that is monitored last prior to the switching. The wireless device may receive, via the one or more coresets, DCI based on the TCI state. The wireless device may also perform one or more additional operations. The wireless device may monitor, via the plurality of coresets, second DCI based on the plurality of TCI states. Each TCI state of the plurality of TCI states may be associated with a respective coreset of the plurality of coresets. The wireless device may receive one or more first activation commands activating the plurality of TCI states for the plurality of coresets. Each activation command of the one or more first activation commands may activate a respective TCI state of the plurality of TCI states for a coreset of the plurality of coresets. The determining may be further based on receiving an activation command, of the one or more first activation commands, indicating the TCI state the coreset in a reception time that is latest among reception times of the one or more first activation commands. The wireless device may determine a mapping between the coreset and the one or more coresets. The determining the TCI of the coreset may be further based on the determining the mapping. The determining the mapping may be based on: a coreset index of the coreset; and one or more coreset indexes of the one or more coresets. The receiving the DCI based on the TCI state may be at least until receiving one or more second activation commands activating one or more TCI states for the one or more coresets. The one or more configuration parameters may indicate the plurality of TCI state indexes for the plurality of TCI states. Each TCI state of the plurality of TCI states may be identified with a respective TCI state index of the plurality of TCI states indexes. The one or more configuration parameters may indicate the plurality of coreset indexes for the plurality of coresets. Each coreset of the plurality of coresets may be indicated by a respective coreset index of the plurality of coreset indexes. The most recent DCI may be configured to schedule a transport block. The one or more configuration parameters may indicate the coreset for the search space set. The TCI state may indicate a reference signal. The receiving the DCI based on the TCI state may comprise at least one demodulation reference signal (DM-RS) port of a physical downlink control channel with the DCI being quasi co-located with the reference signal. The at least one DM-RS port of the physical downlink control channel may be quasi co-located with the reference signal based on a quasi co-location type. The TCI state may indicate a quasi co-location type. The first BWP may be a first active BWP of the cell. The switching may be based on at least one of: an expiry of an BWP inactivity timer; receiving a downlink information indicating the second downlink BWP; or initiating a random-access procedure. The wireless device may monitor, via the one or more coresets, the DCI based on the TCI state. The receiving the DCI may be during the monitoring. Systems, devices and media may be configured with the method. A wireless device may comprise one or more processors; and memory storing instructions that, when executed, cause the wireless device to perform the described method, additional operations and/or include the additional elements. A system may comprise a wireless device configured to perform the described method, additional operations and/or include the additional elements; and a base station configured to send the one or more messages. A computer-readable medium may store instructions that, when executed, cause performance of the described method, additional operations and/or include the additional elements.

One or more of the operations described herein may be conditional. For example, one or more operations may be performed if certain criteria are met, such as in a wireless device, a base station, a radio environment, a network, a combination of the above, and/or the like. Example criteria may be based on one or more conditions such as wireless device and/or network node configurations, traffic load, initial system set up, packet sizes, traffic characteristics, a combination of the above, and/or the like. If the one or more criteria are met, various examples may be used. It may be possible to implement any portion of the examples described herein in any order and based on any condition.

A base station may communicate with one or more of wireless devices. Wireless devices and/or base stations may support multiple technologies, and/or multiple releases of the same technology. Wireless devices may have some specific capability(ies) depending on wireless device category and/or capability(ies). A base station may comprise multiple sectors, cells, and/or portions of transmission entities. A base station communicating with a plurality of wireless devices may refer to a base station communicating with a subset of the total wireless devices in a coverage area. Wireless devices referred to herein may correspond to a plurality of wireless devices compatible with a given LTE, 5G, or other 3GPP or non-3GPP release with a given capability and in a given sector of a base station. A plurality of wireless devices may refer to a selected plurality of wireless devices, a subset of total wireless devices in a coverage area, and/or any group of wireless devices. Such devices may operate, function, and/or perform based on or according to drawings and/or descriptions herein, and/or the like. There may be a plurality of base stations and/or a plurality of wireless devices in a coverage area that may not comply with the disclosed methods, for example, because those wireless devices and/or base stations may perform based on older releases of LTE, 5G, or other 3GPP or non-3GPP technology.

One or more parameters, fields, and/or information elements (IEs), may comprise one or more information objects, values, and/or any other information. An information object may comprise one or more other objects. At least some (or all) parameters, fields, IEs, and/or the like may be used and can be interchangeable depending on the context. If a meaning or definition is given, such meaning or definition controls.

One or more elements in examples described herein may be implemented as modules. A module may be an element that performs a defined function and/or that has a defined interface to other elements. The modules may be implemented in hardware, software in combination with hardware, firmware, wetware (e.g., hardware with a biological element) or a combination thereof, all of which may be behaviorally equivalent. For example, modules may be implemented as a software routine written in a computer language configured to be executed by a hardware machine (such as C, C++, Fortran, Java, Basic, Matlab or the like) or a modeling/simulation program such as Simulink, Stateflow, GNU Octave, or Lab VIEWMathScript. Additionally or alternatively, it may be possible to implement modules using physical hardware that incorporates discrete or programmable analog, digital and/or quantum hardware. Examples of programmable hardware may comprise: computers, microcontrollers, microprocessors, application-specific integrated circuits (ASICs); field programmable gate arrays (FPGAs); and/or complex programmable logic devices (CPLDs). Computers, microcontrollers and/or microprocessors may be programmed using languages such as assembly, C, C++ or the like. FPGAs, ASICs and CPLDs are often programmed using hardware description languages (HDL), such as VHSIC hardware description language (VHDL) or Verilog, which may configure connections between internal hardware modules with lesser functionality on a programmable device. The above-mentioned technologies may be used in combination to achieve the result of a functional module.

One or more features described herein may be implemented in a computer-usable data and/or computer-executable instructions, such as in one or more program modules, executed by one or more computers or other devices. Generally, program modules include routines, programs, objects, components, data structures, etc. that perform particular tasks or implement particular abstract data types when executed by a processor in a computer or other data processing device. The computer executable instructions may be stored on one or more computer readable media such as a hard disk, optical disk, removable storage media, solid state memory, RAM, etc. The functionality of the program modules may be combined or distributed as desired. The functionality may be implemented in whole or in part in firmware or hardware equivalents such as integrated circuits, field programmable gate arrays (FPGA), and the like. Particular data structures may be used to more effectively implement one or more features described herein, and such data structures are contemplated within the scope of computer executable instructions and computer-usable data described herein.

A non-transitory tangible computer readable media may comprise instructions executable by one or more processors configured to cause operations of multi-carrier communications described herein. An article of manufacture may comprise a non-transitory tangible computer readable machine-accessible medium having instructions encoded thereon for enabling programmable hardware to cause a device (e.g., a wireless device, wireless communicator, a wireless device, a base station, and the like) to allow operation of multi-carrier communications described herein. The device, or one or more devices such as in a system, may include one or more processors, memory, interfaces, and/or the like. Other examples may comprise communication networks comprising devices such as base stations, wireless devices or user equipment (wireless device), servers, switches, antennas, and/or the like. A network may comprise any wireless technology, including but not limited to, cellular, wireless, WiFi, 4G, 5G, any generation of 3GPP or other cellular standard or recommendation, any non-3GPP network, wireless local area networks, wireless personal area networks, wireless ad hoc networks, wireless metropolitan area networks, wireless wide area networks, global area networks, satellite networks, space networks, and any other network using wireless communications. Any device (e.g., a wireless device, a base station, or any other device) or combination of devices may be used to perform any combination of one or more of steps described herein, including, for example, any complementary step or steps of one or more of the above steps.

Although examples are described above, features and/or steps of those examples may be combined, divided, omitted, rearranged, revised, and/or augmented in any desired manner Various alterations, modifications, and improvements will readily occur to those skilled in the art. Such alterations, modifications, and improvements are intended to be part of this description, though not expressly stated herein, and are intended to be within the spirit and scope of the descriptions herein. Accordingly, the foregoing description is by way of example only, and is not limiting.

The invention claimed is:

1. A method comprising:
receiving, by a wireless device, first downlink control information (DCI) scheduling a first physical downlink shared channel (PDSCH) transmission associated with a first control resource set (CORESET) group index;
receiving second DCI activating a scheduling configuration associated with a second CORESET group index, wherein the first PDSCH transmission overlaps in time with a semi-persistent scheduling (SPS) PDSCH transmission associated with the scheduling configuration;
receiving the first PDSCH transmission; and
determining, based on whether the first CORESET group index and the second CORESET group index are different values, whether to receive the SPS PDSCH transmission.

2. The method of claim 1, further comprising:
receiving, based on the first CORESET group index and the second CORESET group index being different values, the SPS PDSCH transmission; and
sending an acknowledgement of reception of the first PDSCH transmission and the SPS PDSCH transmission.

3. The method of claim 1, further comprising:
not receiving, based on the first CORESET group index and the second CORESET group index being a same value, the SPS PDSCH transmission.

4. The method of claim 3, wherein the not receiving the SPS PDSCH transmission comprises at least one of:
discarding the SPS PDSCH transmission from a buffer; or
refraining from decoding the SPS PDSCH transmission.

5. The method of claim 1, wherein the first CORESET group index and the second CORESET group index are the same value, wherein the receiving the first PDSCH transmission is based on a determination that the first PDSCH transmission has a higher priority than the SPS PDSCH transmission, and wherein the method further comprises not receiving the SPS PDSCH transmission.

6. The method of claim 1, wherein the determining whether to receive the SPS PDSCH transmission is further based on a capability of the wireless device for simultaneous reception of at least two transmissions.

7. The method of claim 1, wherein the first PDSCH transmission overlaps in time with the SPS PDSCH transmission by partially overlapping in time with the SPS PDSCH transmission in at least one of:
a symbol;
a slot; or
a subframe.

8. The method of claim 1, wherein the first DCI scheduling the first PDSCH is received via a first CORESET, and wherein the second DCI scheduling the SPS PDSCH is received via a second CORESET.

9. The method of claim 1, wherein:
a cyclic redundancy check (CRC) of the first DCI is scrambled by a first radio network temporary identifier (RNTI); and
a CRC of the second DCI is scrambled by a second RNTI.

10. A method comprising:
receiving, by a wireless device, first downlink control information (DCI) scheduling a first physical downlink shared channel (PDSCH) transmission associated with a first control resource set (CORESET) group index;
receiving second DCI activating a scheduling configuration associated with a second CORESET group index, wherein the first PDSCH transmission overlaps in time with a semi-persistent scheduling (SPS) PDSCH transmission associated with the scheduling configuration;

receiving the first PDSCH transmission; and receiving, based on the first CORESET group index and the second CORESET group index being different, the SPS PDSCH transmission.

11. The method of claim 10, wherein the receiving the SPS PDSCH transmission is further based on a capability of the wireless device for simultaneous reception of at least two transmissions.

12. The method of claim 10, wherein the first PDSCH transmission partially overlaps in time with the SPS PDSCH transmission in at least one of:
a symbol;
a slot; or
a subframe.

13. The method of claim 10, wherein the first DCI scheduling the first PDSCH is received via a first CORESET and a cyclic redundancy check (CRC) of the first DCI is scrambled by a first radio network temporary identifier (RNTI) and wherein the second DCI scheduling the SPS PDSCH is received via a first CORESET and CRC of the second DCI is scrambled by a second RNTI.

14. The method of claim 10, wherein:
a cyclic redundancy check (CRC) of the first DCI is scrambled by a first radio network temporary identifier (RNTI); and
a CRC of the second DCI is scrambled by a second RNTI.

15. The method of claim 10, further comprising:
sending an acknowledgement of reception of the first PDSCH transmission and the SPS PDSCH transmission.

16. The method of claim 10, wherein the receiving the first PDSCH transmission is based on a determination that the first PDSCH transmission has a higher priority than the SPS PDSCH transmission.

17. A method comprising:
sending, by a base station to a wireless device via a first control resource set (CORESET) associated with a first CORESET group index, first downlink control information (DCI) scheduling a first physical downlink shared channel (PDSCH) transmission;

sending, based on a capability of the wireless device and via a second CORESET associated with a second CORESET group index, second DCI activating a scheduling configuration associated with the second CORESET group index, wherein the first PDSCH transmission overlaps in time with a semi-persistent scheduling (SPS) PDSCH transmission associated with the scheduling configuration, and wherein the first CORESET group index is different from the second CORESET group index;

sending the first PDSCH transmission and the SPS PDSCH transmission overlapping in time; and receiving, from the wireless device, an acknowledgement of reception of the first PDSCH transmission and the SPS PDSCH transmission.

18. The method of claim 17, further comprising:
receiving, from the wireless device, an indication of the capability of the wireless device, wherein the capability comprises a capability of the wireless device for simultaneous reception of at least two transmissions.

19. The method of claim 17, wherein the first PDSCH transmission overlaps in time with the SPS PDSCH transmission by partially overlapping in time with the SPS PDSCH transmission in at least one of:
a symbol;
a slot; or
a subframe.

20. The method of claim 17, wherein:
a cyclic redundancy check (CRC) of the first DCI is scrambled by a first radio network temporary identifier (RNTI); and
a CRC of the second DCI is scrambled by a second RNTI.

* * * * *

UNITED STATES PATENT AND TRADEMARK OFFICE
CERTIFICATE OF CORRECTION

PATENT NO. : 11,523,381 B2
APPLICATION NO. : 17/039168
DATED : December 6, 2022
INVENTOR(S) : Cirik et al.

It is certified that error appears in the above-identified patent and that said Letters Patent is hereby corrected as shown below:

On the Title Page

Page 2, Column 1, Item (56) Other Publications, Line 6:
Delete "Netwrok;" and insert --Network;-- therefor Page 2, Column 1, Item (56) Other Publications, Line 10:
Delete "specation (Relesae" and insert --specification (Release-- therefor Page 2, Column 2, Item (56) Other Publications, Line 31:
Delete "draftCR" and insert --draft CR-- therefor In the Specification Column 9, Detailed Description, Line 41:
Delete "SDAPS" and insert --SDAPs-- therefor Column 11, Detailed Description, Line 56:
Delete "laters" and insert --layers-- therefor Column 12, Detailed Description, Line 24:
Delete "223" and insert --212-- therefor Column 13, Detailed Description, Line 52:
After "commands", insert --.-- therefor Column 25, Detailed Description, Line 38:
Delete "SIB 1." and insert --SIB1.-- therefor Column 35, Detailed Description, Line 50:
Delete "0<s_id<14)," and insert --0≤s_id<14),-- therefor Signed and Sealed this
Thirtieth Day of January, 2024

Katherine Kelly Vidal
*Director of the United States Patent and Trademark Office*

CERTIFICATE OF CORRECTION (continued)
U.S. Pat. No. 11,523,381 B2

Column 35, Detailed Description, Line 52:
Delete "0<f_id<80)," and insert --0≤t_id<80),-- therefor Column 35, Detailed Description, Line 53:
Delete "0<f_id<8)," and insert --0≤f_id<8),-- therefor Column 37, Detailed Description, Line 60:
Delete "1320" and insert --1331-- therefor Column 37, Detailed Description, Line 61:
Delete "1320" and insert --1331-- therefor Column 47, Detailed Description, Line 24:
After "running", insert --.-- therefor Column 66, Detailed Description, Line 5:
Delete "$N_{BWP}^{start}O_{carrier}+RB_{start}$"
And insert -- $N_{BWP}^{start} = O_{carrier} + RB_{start}$ -- therefor Column 77, Detailed Description, Line 59:
Delete "T0" and insert --$T_0$-- therefor Column 77, Detailed Description, Line 62:
Delete "T0" and insert --$T_0$-- therefor Column 78, Detailed Description, Line 17:
Delete "T0" and insert --$T_0$-- therefor Column 78, Detailed Description, Line 35:
Delete "T0" and insert --$T_0$-- therefor Column 79, Detailed Description, Line 50:
Delete "T1" and insert --$T_1$-- therefor Column 80, Detailed Description, Line 12:
Delete "T1" and insert --$T_1$-- therefor Column 80, Detailed Description, Line 15:
Delete "T2" and insert --$T_2$-- therefor Column 80, Detailed Description, Line 17:
Delete "T2-T1" and insert --$T_2$-$T_1$-- therefor Column 81, Detailed Description, Line 42:
Delete "T3" and insert --$T_3$-- therefor

CERTIFICATE OF CORRECTION (continued)
U.S. Pat. No. 11,523,381 B2

Column 81, Detailed Description, Line 67:
Delete "T3" and insert --$T_3$-- therefor Column 82, Detailed Description, Line 8:
Delete "tci-StateID)" and insert --tci-StateID)-- therefor Column 82, Detailed Description, Line 18:
Delete "T0" and insert --$T_0$-- therefor Column 84, Detailed Description, Line 54:
Delete "T1" and insert --$T_1$-- therefor Column 85, Detailed Description, Line 7:
Delete "T0*a*" and insert --$T_{0a}$-- therefor Column 85, Detailed Description, Line 9:
Delete "T0*b*" and insert --$T_{0b}$-- therefor Column 85, Detailed Description, Line 33:
Delete "T1" and insert --$T_1$-- therefor Column 85, Detailed Description, Line 38:
Delete "T1" and insert --$T_1$-- therefor Column 85, Detailed Description, Line 47:
Delete "T0*a*" and insert --$T_{0a}$-- therefor Column 85, Detailed Description, Line 47:
After "19).", insert --¶-- therefor Column 85, Detailed Description, Line 56:
Delete "T0*b*" and insert --$T_{0b}$-- therefor Column 86, Detailed Description, Line 5:
Delete "T1" and insert --$T_1$-- therefor Column 86, Detailed Description, Line 9:
Delete "T0*a*" and insert --$T_{0a}$-- therefor Column 86, Detailed Description, Line 11:
Delete "T0*a*" and insert --$T_{0a}$-- therefor Column 86, Detailed Description, Line 22:
Delete "TO*b*" and insert --$T_{0b}$-- therefor

CERTIFICATE OF CORRECTION (continued)
U.S. Pat. No. 11,523,381 B2

Column 86, Detailed Description, Line 24:
Delete "T0*b*" and insert --$T_{0b}$-- therefor Column 88, Detailed Description, Line 10:
Delete "T1" and insert --$T_1$-- therefor Column 88, Detailed Description, Line 15:
Delete "T1" and insert --$T_1$-- therefor Column 88, Detailed Description, Line 18:
Delete "T0*a*" and insert --$T_{0a}$-- therefor Column 88, Detailed Description, Line 23:
Delete "TOb" and insert --$T_{0b}$-- therefor Column 92, Detailed Description, Line 40:
Delete "T0" and insert --$T_0$-- therefor Column 93, Detailed Description, Line 25:
Delete "T1" and insert --$T_1$-- therefor Column 110, Detailed Description, Line 53:
Delete "Lab VIEWMathScript." and insert --LabVIEWMathScript.-- therefor Column 111, Detailed Description, Lines 56-57:
After "manner", insert --.-- therefor In the Claims Column 113, Claim 13, Line 19:
After "(RNTI)", insert --,-- therefor